US012777778B2

United States Patent

(12) United States Patent
Yamazaki et al.

(10) Patent No.: US 12,777,778 B2
(45) Date of Patent: Oct. 27, 2026

(54) DISPLAY DEVICE, DISPLAY MODULE, ELECTRONIC DEVICE, AND METHOD FOR MANUFACTURING DISPLAY DEVICE

(71) Applicant: Semiconductor Energy Laboratory Co., Ltd., Atsugi (JP)

(72) Inventors: Shunpei Yamazaki, Setagaya (JP); Shinya Sasagawa, Chigasaki (JP); Ryota Hodo, Atsugi (JP); Kentaro Sugaya, Isehara (JP); Yoshikazu Hiura, Atsugi (JP); Takahiro Fujie, Isehara (JP); Yasuhiro Jinbo, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 359 days.

(21) Appl. No.: 18/292,983

(22) PCT Filed: Jul. 22, 2022

(86) PCT No.: PCT/IB2022/056780

§ 371 (c)(1),
(2) Date: Jan. 29, 2024

(87) PCT Pub. No.: WO2023/012565

PCT Pub. Date: Feb. 9, 2023

(65) Prior Publication Data

US 2024/0389393 A1 Nov. 21, 2024

(30) Foreign Application Priority Data

Aug. 5, 2021 (JP) ................................ 2021-129042
Aug. 5, 2021 (JP) ................................ 2021-129050
Nov. 11, 2021 (JP) ................................ 2021-184033

(51) Int. Cl.
*H10K 59/122* (2023.01)
*H10K 50/17* (2023.01)
(Continued)

(52) U.S. Cl.
CPC ........... *H10K 59/122* (2023.02); *H10K 50/17* (2023.02); *H10K 50/18* (2023.02);
(Continued)

(58) Field of Classification Search
CPC ...... H10K 59/122; H10K 50/17; H10K 50/18; H10K 59/1201; H10K 59/38; H10K 59/35
See application file for complete search history.

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

CN 001509127 A 6/2004
CN 001653855 A 8/2005
(Continued)

OTHER PUBLICATIONS

Miyoshi.K et al., "Development of Low Temperature Curable Positive-Tone Polyimide Materials for Organic Electro Luminescence Displays", Kobunshi Ronbunshu, Apr. 1, 2011, vol. 68, No. 4, pp. 160-170.
(Continued)

*Primary Examiner* — Evan G Clinton
(74) *Attorney, Agent, or Firm* — Eric J. Robinson; Robinson Intellectual Property Law Office, P.C.

(57) ABSTRACT

A display device with high display quality is provided. The display device includes a plurality of light-emitting devices each including a pixel electrode, a light-emitting layer, a functional layer, a common layer, and a common electrode in this order and includes an insulating layer positioned between side surfaces of the light-emitting layers adjacent to each other. The light-emitting layer and the functional layer
(Continued)

each having an island shape are provided in each light-emitting device, and the plurality of light-emitting devices share the common layer. The common layer and the common electrode are provided to cover the insulating layer. In a cross-sectional view, an end portion of the insulating layer has a tapered shape with a taper angle greater than 0° and less than 90°. The plurality of light-emitting devices each contain a first light-emitting material emitting blue light and a second light-emitting material emitting light having a longer wavelength than blue. A coloring layer is provided to overlap with each of the plurality of light-emitting devices.

16 Claims, 40 Drawing Sheets

(51) Int. Cl.

| | |
|---|---|
| ***H10K 50/18*** | (2023.01) |
| ***H10K 59/12*** | (2023.01) |
| ***H10K 59/38*** | (2023.01) |
| ***H10K 71/20*** | (2023.01) |

(52) U.S. Cl.
CPC ......... *H10K 59/1201* (2023.02); *H10K 59/38* (2023.02); *H10K 71/231* (2023.02)

(56) References Cited

U.S. PATENT DOCUMENTS

| | | | |
|---|---|---|---|
| 7,034,453 | B2 | 4/2006 | Kai et al. |
| 7,038,651 | B2 | 5/2006 | Nitta et al. |
| 7,332,854 | B2 | 2/2008 | Kai et al. |
| 7,352,350 | B2 | 4/2008 | Nitta et al. |
| 7,534,557 | B2 | 5/2009 | Tachikawa et al. |
| 7,642,701 | B2 | 1/2010 | Kai et al. |
| 7,914,976 | B2 | 3/2011 | Tachikawa et al. |
| 8,129,902 | B2 | 3/2012 | Kai et al. |
| 10,170,040 | B2 | 1/2019 | Ogawa et al. |
| 10,304,386 | B2 | 5/2019 | Ogawa et al. |
| 11,094,903 | B2 | 8/2021 | Ohsawa et al. |
| 11,588,125 | B2 | 2/2023 | Ohsawa et al. |
| 11,678,550 | B2 | 6/2023 | Kato |
| 2002/0072139 | A1 | 6/2002 | Kashiwabara |
| 2004/0119419 | A1 | 6/2004 | Kai et al. |
| 2005/0153058 | A1 | 7/2005 | Tachikawa et al. |
| 2011/0148290 | A1 | 6/2011 | Oota |
| 2012/0256204 | A1 | 10/2012 | Yoshizumi et al. |
| 2012/0273804 | A1 | 11/2012 | Hatano |
| 2012/0276484 | A1 | 11/2012 | Izumi et al. |
| 2013/0084531 | A1 | 4/2013 | Hamaguchi et al. |
| 2013/0084664 | A1 | 4/2013 | Yoshitoku et al. |
| 2013/0084666 | A1 | 4/2013 | Oshige |
| 2013/0280839 | A1 | 10/2013 | Sonoda et al. |
| 2013/0295705 | A1 | 11/2013 | Sonoda et al. |
| 2014/0004640 | A1 | 1/2014 | Hamaguchi et al. |
| 2014/0004642 | A1 | 1/2014 | Otsuka et al. |
| 2015/0060826 | A1 | 3/2015 | Matsumoto et al. |
| 2015/0069360 | A1 | 3/2015 | Sato |
| 2015/0076476 | A1 | 3/2015 | Odaka et al. |
| 2016/0172595 | A1 | 6/2016 | Malinowski et al. |
| 2016/0315133 | A1 | 10/2016 | Sato |
| 2017/0141167 | A1 | 5/2017 | Naganuma |
| 2017/0250362 | A1 | 8/2017 | Hiraga |
| 2017/0256754 | A1 | 9/2017 | Defranco et al. |
| 2018/0090068 | A1 | 3/2018 | Ogawa et al. |
| 2018/0190908 | A1 | 7/2018 | Ke et al. |
| 2019/0073951 | A1* | 3/2019 | Ogawa .................. G02F 1/1343 |
| 2020/0057330 | A1 | 2/2020 | Yamazaki et al. |
| 2020/0203662 | A1 | 6/2020 | Mollard et al. |
| 2021/0104697 | A1 | 4/2021 | Ohsawa et al. |
| 2021/0265432 | A1 | 8/2021 | Kato |
| 2022/0208880 | A1* | 6/2022 | Kim ..................... H10K 59/122 |
| 2023/0209851 | A1 | 6/2023 | Ohsawa et al. |
| 2023/0301151 | A1 | 9/2023 | Kato |

FOREIGN PATENT DOCUMENTS

| | | | | |
|---|---|---|---|---|
| CN | 110476267 | A | | 11/2019 |
| CN | 112314056 | A | | 2/2021 |
| JP | 2000-036385 | A | | 2/2000 |
| JP | 2003-059663 | A | | 2/2003 |
| JP | 2003-332051 | A | | 11/2003 |
| JP | 2004-192935 | A | | 7/2004 |
| JP | 2008-098106 | A | | 4/2008 |
| JP | 2008108482 | A | * | 5/2008 |
| JP | 2008-147072 | A | | 6/2008 |
| JP | 2008-251270 | A | | 10/2008 |
| JP | 2009-058897 | A | | 3/2009 |
| JP | 2014-120218 | A | | 6/2014 |
| JP | 2014-135251 | A | | 7/2014 |
| JP | 2014-232568 | A | | 12/2014 |
| JP | 2015-115178 | A | | 6/2015 |
| JP | 2016-197494 | A | | 11/2016 |
| JP | 2017-157314 | A | | 9/2017 |
| JP | 2018-054728 | A | | 4/2018 |
| JP | 2018-201012 | A | | 12/2018 |
| JP | 2019-179696 | A | | 10/2019 |
| JP | 2020-160305 | A | | 10/2020 |
| KR | 10-0931279 | | | 12/2009 |
| KR | 2019-0131569 | A | | 11/2019 |
| TW | 201902904 | | | 1/2019 |
| WO | WO-2003/096754 | | | 11/2003 |
| WO | WO-2018/087625 | | | 5/2018 |
| WO | WO-2018/185642 | | | 10/2018 |
| WO | WO-2020/004086 | | | 1/2020 |

OTHER PUBLICATIONS

International Search Report (Application No. PCT/IB2022/056780) Dated Oct. 18, 2022.

Written Opinion (Application No. PCT/IB2022/056780) Dated Oct. 18, 2022.

Zakhidov.A et al., "Orthogonal processing: A new strategy for organic electronics", Chem. Sci. (Chemical Science), Apr. 7, 2011, vol. 2, No. 6, pp. 1178-1182.

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

(56) References Cited

OTHER PUBLICATIONS

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

* cited by examiner

DISPLAY DEVICE, DISPLAY MODULE, ELECTRONIC DEVICE, AND METHOD FOR MANUFACTURING DISPLAY DEVICE

TECHNICAL FIELD

One embodiment of the present invention relates to a display device, a display module, and an electronic device. One embodiment of the present invention relates to a method for manufacturing a display device.

Note that one embodiment of the present invention is not limited to the above technical field. Examples of the technical field of one embodiment of the present invention include a semiconductor device, a display device, a light-emitting apparatus, a power storage device, a memory device, an electronic device, a lighting device, an input device (e.g., a touch sensor), an input/output device (e.g., a touch panel), a method for driving any of them, and a method for manufacturing any of them.

BACKGROUND ART

Recent display devices have been expected to be applied to a variety of uses. Usage examples of large-sized display devices include a television device for home use (also referred to as TV or television receiver), digital signage, and a PID (Public Information Display). In addition, a smartphone and a tablet terminal each including a touch panel, and the like, are being developed as portable information terminals.

Furthermore, higher-resolution display devices have been required. As devices requiring high-resolution display devices, for example, devices for virtual reality (VR), augmented reality (AR), substitutional reality (SR), or mixed reality (MR) have been actively developed.

Light-emitting apparatuses including light-emitting devices (also referred to as light-emitting elements) have been developed as display devices, for example. Light-emitting devices utilizing an electroluminescence (hereinafter referred to as EL) phenomenon (also referred to as EL devices or EL elements) have features such as ease of reduction in thickness and weight, high-speed response to input signals, and driving with a constant DC voltage power source, and have been used in display devices.

Patent Document 1 discloses a display device using an organic EL device (also referred to as organic EL element) for VR.

REFERENCE

Patent Document

[Patent Document 1] PCT International Publication No. 2018/087625

SUMMARY OF THE INVENTION

Problems to be Solved by the Invention

An object of one embodiment of the present invention is to provide a display device with high display quality. An object of one embodiment of the present invention is to provide a high-resolution display device. An object of one embodiment of the present invention is to provide a high-definition display device. An object of one embodiment of the present invention is to provide a highly reliable display device.

An object of one embodiment of the present invention is to provide a method for manufacturing a high-resolution display device. An object of one embodiment of the present invention is to provide a method for manufacturing a high-definition display device. An object of one embodiment of the present invention is to provide a method for manufacturing a highly reliable display device. An object of one embodiment of the present invention is to provide a method for manufacturing a display device with high yield.

Note that the description of these objects does not preclude the existence of other objects. One embodiment of the present invention does not need to achieve all of these objects. Other objects can be derived from the description of the specification, the drawings, and the claims.

Means for Solving the Problems

One embodiment of the present invention is a display device including a first light-emitting device, a second light-emitting device, a first coloring layer, a second coloring layer, a first insulating layer, and a second insulating layer. The first light-emitting device includes a first pixel electrode, a first layer over the first pixel electrode, and a common electrode over the first layer. The second light-emitting device includes a second pixel electrode, a second layer over the second pixel electrode, and the common electrode over the second layer. The first layer and the second layer each contain a first light-emitting material emitting blue light and a second light-emitting material emitting light having a longer wavelength than blue and are separated from each other. The first coloring layer overlaps with the first light-emitting device. The second coloring layer overlaps with the second light-emitting device. The second coloring layer and the first coloring layer transmit light of different colors. The first insulating layer covers a side surface and part of a top surface of the first layer and a side surface and part of a top surface of the second layer. The second insulating layer overlaps with the side surface and the part of the top surface of the first layer and the side surface and the part of the top surface of the second layer through the first insulating layer. The second insulating layer includes a portion positioned between the side surface of the first layer and the side surface of the second layer. The common electrode covers a top surface of the second insulating layer. In a cross-sectional view, an end portion of the second insulating layer has a tapered shape with a taper angle greater than 0° and less than 90°. The first layer includes a first region and a second region outside the first region. The first region is positioned between the first pixel electrode and the common electrode. The second region overlaps with at least one of the first insulating layer and the second insulating layer. A width of the second region is greater than or equal to 1 nm and is less than or equal to 50% of a width of the first region.

The top surface of the second insulating layer preferably has a convex shape.

In the cross-sectional view, an end portion of the first insulating layer preferably has a tapered shape with a taper angle greater than 0° and less than 90°.

The second insulating layer preferably covers at least part of a side surface of the end portion of the first insulating layer.

The end portion of the second insulating layer is preferably positioned more outwardly than the end portion of the first insulating layer.

A side surface of the second insulating layer preferably has a concave shape.

The display devices having the above structures each preferably include a third insulating layer and a fourth insulating layer. The third insulating layer is preferably positioned between the top surface of the first layer and the first insulating layer. The fourth insulating layer is preferably positioned between the top surface of the second layer and the first insulating layer. An end portion of the third insulating layer and an end portion of the fourth insulating layer are each preferably positioned more outwardly than the end portion of the first insulating layer.

The second insulating layer preferably covers at least part of a side surface of the third insulating layer and at least part of a side surface of the fourth insulating layer.

In the cross-sectional view, the end portion of the third insulating layer and the end portion of the fourth insulating layer each preferably have a tapered shape with a taper angle greater than 0° and less than 90°.

The first layer and the second layer each preferably include a light-emitting layer and a functional layer over the light-emitting layer. The functional layer preferably includes at least one of a hole-injection layer, an electron-injection layer, a hole-transport layer, an electron-transport layer, a hole-blocking layer, and an electron-blocking layer.

The first insulating layer and the second insulating layer each preferably include a portion overlapping with a top surface of the first pixel electrode and a portion overlapping with a top surface of the second pixel electrode.

The first layer preferably covers a side surface of the first pixel electrode and the second layer preferably covers a side surface of the second pixel electrode.

In the cross-sectional view, an end portion of the first pixel electrode and an end portion of the second pixel electrode each preferably have a tapered shape with a taper angle greater than 0° and less than 90°.

The first insulating layer is preferably an inorganic insulating layer and the second insulating layer is preferably an organic insulating layer. The first insulating layer preferably contains aluminum oxide. The second insulating layer preferably contains an acrylic resin.

The first light-emitting device preferably includes a common layer between the first layer and the common electrode, the second light-emitting device preferably includes the common layer between the second layer and the common electrode, and the common layer is preferably positioned between the second insulating layer and the common electrode.

One embodiment of the present invention is a display device including a first light-emitting device, a second light-emitting device, a first coloring layer, a second coloring layer, a first insulating layer, and a second insulating layer. The first light-emitting device includes a first pixel electrode, a first layer over the first pixel electrode, a common layer over the first layer, and a common electrode over the common layer. The second light-emitting device includes a second pixel electrode, a second layer over the second pixel electrode, the common layer over the second layer, and the common electrode over the common layer. The first layer and the second layer each contain a first light-emitting material emitting blue light and a second light-emitting material emitting light having a longer wavelength than blue and are separated from each other. The first layer includes a first functional layer in contact with the common layer. The second layer includes a second functional layer in contact with the common layer. The first coloring layer overlaps with the first light-emitting device. The second coloring layer overlaps with the second light-emitting device. The second coloring layer and the first coloring layer transmit light of different colors. The first insulating layer covers a side surface and part of a top surface of the first layer and a side surface and part of a top surface of the second layer. The second insulating layer overlaps with the side surface and the part of the top surface of the first layer and the side surface and the part of the top surface of the second layer through the first insulating layer. The second insulating layer includes a portion positioned between the side surface of the first layer and the side surface of the second layer. The common layer covers the second insulating layer. The common electrode covers the second insulating layer with the common layer therebetween. In a cross-sectional view, an end portion of the second insulating layer has a tapered shape with a taper angle greater than 0° and less than 90°. The first functional layer, the second functional layer, and the common layer contain the same material.

One embodiment of the present invention is a display device including a first light-emitting device, a second light-emitting device, a first coloring layer, a second coloring layer, a first insulating layer, a second insulating layer, and a third insulating layer. The first light-emitting device includes a first pixel electrode, a first layer over the first pixel electrode, a common layer over the first layer, and a common electrode over the common layer. The second light-emitting device includes a second pixel electrode, a second layer over the second pixel electrode, the common layer over the second layer, and the common electrode over the common layer. The first layer and the second layer each contain a first light-emitting material emitting blue light and a second light-emitting material emitting light having a longer wavelength than blue and are separated from each other. The first layer includes a first functional layer in contact with the common layer. The second layer includes a second functional layer in contact with the common layer. The first coloring layer overlaps with the first light-emitting device. The second coloring layer overlaps with the second light-emitting device. The second coloring layer and the first coloring layer transmit light of different colors. The first insulating layer includes an organic compound. The first insulating layer covers a side surface and part of a top surface of the first layer and a side surface and part of a top surface of the second layer. The second insulating layer overlaps with the side surface and the part of the top surface of the first layer and the side surface and the part of the top surface of the second layer through the first insulating layer. The third insulating layer overlaps with the side surface and the part of the top surface of the first layer and the side surface and the part of the top surface of the second layer through the first insulating layer and the second insulating layer. The third insulating layer includes a portion positioned between the side surface of the first layer and the side surface of the second layer. The common layer covers the third insulating layer. The common electrode covers the third insulating layer with the common layer therebetween. In a cross-sectional view, an end portion of the third insulating layer has a tapered shape with a taper angle greater than 0° and less than 90°. The first functional layer, the second functional layer, and the common layer preferably contain the same material. Alternatively, the first functional layer and the common layer preferably contain the same material.

The first functional layer and the second functional layer each preferably include one or both of a first carrier-transport layer and a carrier-blocking layer.

The common layer preferably includes a second carrier-transport layer and a carrier-injection layer over the second carrier-transport layer.

One embodiment of the present invention is a display module including the display device having any of the above structures and is, for example, a display module provided with a connector such as a flexible printed circuit (hereinafter referred to as an FPC) or a TCP (Tape Carrier Package), or a display module on which an integrated circuit (IC) is mounted by a COG (Chip On Glass) method, a COF (Chip On Film) method, or the like.

One embodiment of the present invention is an electronic device including the above display module and at least one of a housing, a battery, a camera, a speaker, and a microphone.

A method for manufacturing a display device, which includes forming a first pixel electrode and a second pixel electrode; forming a first film over the first pixel electrode and the second pixel electrode; forming, over the first film, a first mask film that is an insulating film; forming, over the first mask film, a second mask film that is a metal film or an alloy film; forming, over the second mask film, a first resist mask overlapping with the first pixel electrode and a second resist mask overlapping with the second pixel electrode; processing the second mask film using the first resist mask and the second resist mask to form a first mask layer overlapping with the first pixel electrode and a second mask layer overlapping with the second pixel electrode; removing the first resist mask and the second resist mask by ashing using plasma; processing the first mask film using the first mask layer and the second mask layer as a hard mask to form a third mask layer overlapping with the first pixel electrode and a fourth mask layer overlapping with the second pixel electrode; processing the first film by a dry etching method using the first mask layer to the fourth mask layer as a hard mask to form a first layer overlapping with the first pixel electrode and a second layer overlapping with the second pixel electrode; removing the first mask layer and the second mask layer by a wet etching method; removing at least part of each of the third mask layer and the fourth mask layer by a wet etching method to expose a top surface of the first layer and a top surface of the second layer; and forming a common electrode to cover the first layer and the second layer. The first layer and the second layer each contain a first light-emitting material emitting blue light and a second light-emitting material emitting light having a longer wavelength than blue.

After removal of the first mask layer and the second mask layer, an inorganic insulating film is preferably formed over the third mask layer and the fourth mask layer. An organic insulating film is preferably formed over the inorganic insulating film using a photosensitive resin composition. Light exposure and development are preferably performed on the organic insulating film to form an organic insulating layer overlapping with a region interposed between the first pixel electrode and the second pixel electrode. The inorganic insulating film is preferably processed by a wet etching method using the organic insulating layer as a hard mask to form an inorganic insulating layer overlapping with the region interposed between the first pixel electrode and the second pixel electrode. The third mask layer and the fourth mask layer are preferably processed by a wet etching method using the organic insulating layer and the inorganic insulating layer as a hard mask to expose the top surface of the first layer and the top surface of the second layer. The common electrode is preferably formed to cover the first layer, the second layer, the inorganic insulating layer, and the organic insulating layer.

Part of the third mask layer and part of the fourth mask layer are preferably thinned down in the step of forming the inorganic insulating layer. Heat treatment is preferably performed between the step of forming the inorganic insulating layer and the step of exposing the top surface of the first layer and the top surface of the second layer.

An aluminum oxide film is preferably formed by an ALD method as each of the first mask film and the inorganic insulating film. A tungsten film is preferably formed by a sputtering method as the second mask film.

The first layer and the second layer each preferably include a light-emitting layer and a functional layer over the light-emitting layer. The functional layer preferably includes at least one of a hole-injection layer, an electron-injection layer, a hole-transport layer, an electron-transport layer, a hole-blocking layer, and an electron-blocking layer.

One embodiment of the present invention is a method for manufacturing a display device, which includes forming a first pixel electrode and a second pixel electrode; forming a first film over the first pixel electrode and the second pixel electrode; forming a mask film over the first film; processing the first film and the mask film to form a first layer and a first mask layer over the first pixel electrode and form a second layer and a second mask layer over the second pixel electrode; forming a first insulating film over the first mask layer and the second mask layer; forming a second insulating film over the first insulating film using a photosensitive resin composition; processing the second insulating film to form a second insulating layer overlapping with a region interposed between the first pixel electrode and the second pixel electrode; performing first etching treatment using the second insulating layer as a mask to remove part of the first insulating film so that a first insulating layer overlapping with the second insulating layer is formed and the first mask layer and the second mask layer are partly thinned down; performing heat treatment and then performing second etching treatment using the second insulating layer as a mask to remove part of the first mask layer and part of the second mask layer so that a top surface of the first layer and a top surface of the second layer are exposed; forming a common electrode to cover the first layer, the second layer, and the second insulating layer; and after the top surface of the first layer and the top surface of the second layer are exposed, performing light irradiation on the second insulating layer. The first layer and the second layer each contain a first light-emitting material emitting blue light and a second light-emitting material emitting light having a longer wavelength than blue.

Light irradiation is preferably performed after the common electrode is formed and a third insulating layer covering the common electrode is preferably formed after the light irradiation is performed. Alternatively, a third insulating layer covering the common electrode is preferably formed after the common electrode is formed and light irradiation is preferably performed after the third insulating layer is formed. Alternatively, light irradiation is preferably performed before the common electrode is formed.

An aluminum oxide film is preferably formed by an ALD method as the first insulating film. An aluminum oxide film is preferably formed by an ALD method as the mask film.

The first etching treatment and the second etching treatment are preferably performed by wet etching.

A method for manufacturing a display device, which includes forming a first pixel electrode and a second pixel electrode; forming, over the first pixel electrode and the second pixel electrode, a first film including a light-emitting film and a functional film over the light-emitting film; forming a mask film over the first film; processing the first film and the mask film to form, over the first pixel electrode, a first layer including a first light-emitting layer and a first functional layer over the first light-emitting layer and a first mask layer over the first layer and form, over the second pixel electrode, a second layer including a second light-emitting layer and a second functional layer over the second light-emitting layer and a second mask layer over the second layer; forming a first insulating film over the first mask layer and the second mask layer; forming a second insulating film over the first insulating film; processing the second insulating film to form a second insulating layer overlapping with a region interposed between the first pixel electrode and the second pixel electrode; performing etching treatment using the second insulating layer as a mask to remove part of the first insulating film so that a first insulating layer overlapping with the second insulating layer is formed and remove part of the first mask layer and part of the second mask layer so that a top surface of the first functional layer and a top surface of the second functional layer are exposed; forming a first common layer to cover the first functional layer, the second functional layer, and the second insulating layer; and forming a common electrode over the first common layer. The first layer and the second layer each contain a first light-emitting material emitting blue light and a second light-emitting material emitting light having a longer wavelength than blue. The first functional layer, the second functional layer, and the first common layer contain the same material.

Part of the first functional layer and part of the second functional layer are preferably removed by the etching treatment.

A method for manufacturing a display device, which includes forming a first pixel electrode and a second pixel electrode; forming, over the first pixel electrode and the second pixel electrode, a first film including a light-emitting film and a functional film over the light-emitting film; forming an organic film over the first film; forming a mask film over the organic film; processing the first film, the organic film, and the mask film to form, over the first pixel electrode, a first layer including a first light-emitting layer and a first functional layer over the first light-emitting layer, a first organic layer over the first layer, and a first mask layer over the first organic layer and form, over the second pixel electrode, a second layer including a second light-emitting layer and a second functional layer over the second light-emitting layer, a second organic layer over the second layer, and a second mask layer over the second organic layer; forming a first insulating film over the first mask layer and the second mask layer; forming a second insulating film over the first insulating film; processing the second insulating film to form a second insulating layer overlapping with a region interposed between the first pixel electrode and the second pixel electrode; performing etching treatment using the second insulating layer as a mask to remove part of the first insulating film so that a first insulating layer overlapping with the second insulating layer is formed and remove part of the first mask layer, part of the second mask layer, part of the first organic layer, and part of the second organic layer so that a top surface of the first functional layer and a top surface of the second functional layer are exposed; forming a first common layer to cover the first functional layer, the second functional layer, and the second insulating layer; and forming a common electrode over the first common layer. The first layer and the second layer each contain a first light-emitting material emitting blue light and a second light-emitting material emitting light having a longer wavelength than blue.

The first functional layer, the second functional layer, and the first common layer are preferably formed using the same material.

A second common layer is preferably formed over the first common layer. The common electrode is preferably formed over the second common layer.

An aluminum oxide film is preferably formed by an ALD method as the first insulating film. An aluminum oxide film is preferably formed by an ALD method as the mask film.

Effect of the Invention

One embodiment of the present invention can provide a display device with high display quality. One embodiment of the present invention can provide a high-resolution display device.

One embodiment of the present invention can provide a high-definition display device. One embodiment of the present invention can provide a highly reliable display device.

One embodiment of the present invention can provide a method for manufacturing a high-resolution display device. One embodiment of the present invention can provide a method for manufacturing a high-definition display device. One embodiment of the present invention can provide a method for manufacturing a highly reliable display device. One embodiment of the present invention can provide a method for manufacturing a display device with high yield.

Note that the description of these effects does not preclude the existence of other effects. One embodiment of the present invention does not necessarily have all of these effects. Other effects can be derived from the description of the specification, the drawings, and the claims.

MODE FOR CARRYING OUT THE INVENTION

Figure 1A:
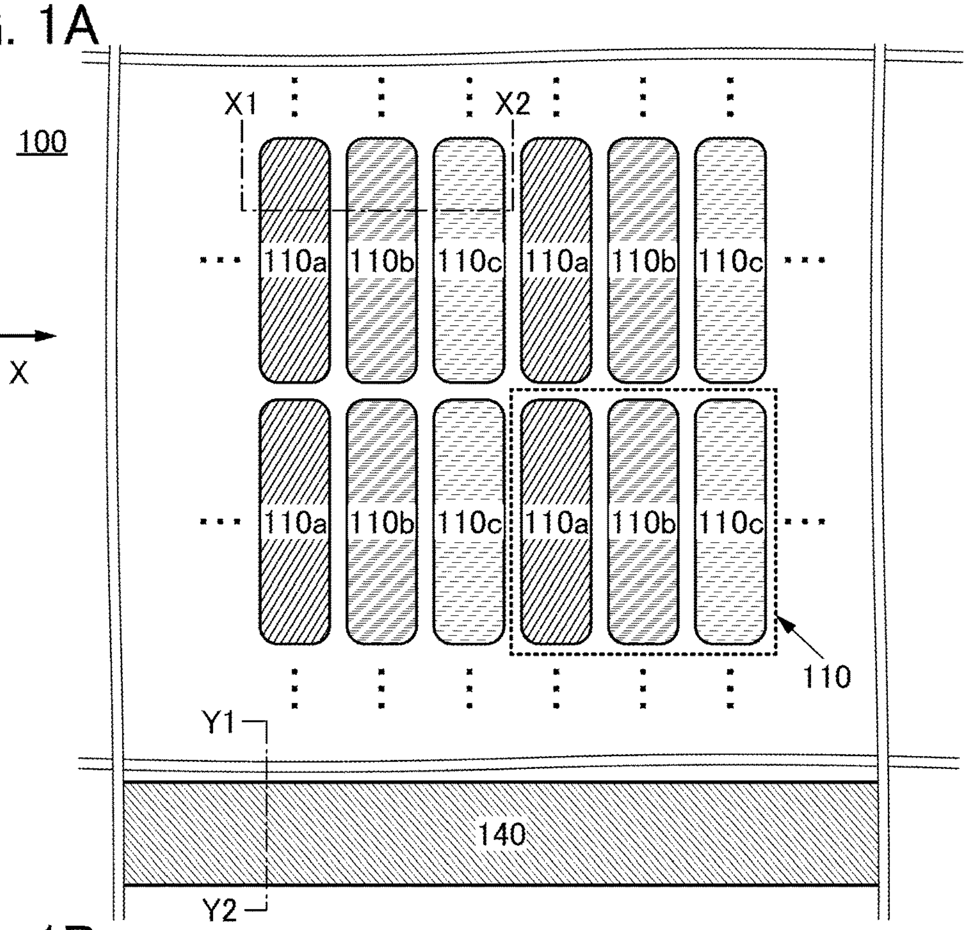
FIG. 1A is a top view illustrating an example of a display device.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

Note that in structures of the invention described below, the same portions or portions having similar functions are denoted by the same reference numerals in different drawings, and the description thereof is not repeated. The same hatching pattern is used for portions having similar functions, and the portions are not especially denoted by reference numerals in some cases.

The position, size, range, or the like of each component illustrated in drawings does not represent the actual position, size, range, or the like in some cases for easy understanding. Therefore, the disclosed invention is not necessarily limited to the position, size, range, or the like disclosed in the drawings.

Note that the term “film” and the term “layer” can be used interchangeably depending on the case or the circumstances. For example, the term “conductive layer” can be replaced with the term “conductive film”. As another example, the term “insulating film” can be replaced with the term “insulating layer”.

In this specification and the like, a device formed using a metal mask or an FMM (fine metal mask, high-resolution metal mask) may be referred to as a device having an MM (metal mask) structure. In this specification and the like, a device formed without using a metal mask or an FMM may be referred to as a device having an MML (metal maskless) structure.

In this specification and the like, a structure in which light-emitting layers of light-emitting devices having different emission wavelengths are separately formed is sometimes referred to as an SBS (Side By Side) structure. The SBS structure can optimize materials and structures of light-emitting devices and thus can extend freedom of choice of materials and structures, whereby the luminance and the reliability can be easily improved.

In this specification and the like, a hole or an electron is sometimes referred to as a “carrier”. Specifically, a hole-injection layer or an electron-injection layer may be referred to as a “carrier-injection layer”, a hole-transport layer or an electron-transport layer may be referred to as a “carrier-transport layer”, and a hole-blocking layer or an electron-blocking layer may be referred to as a “carrier-blocking layer”. Note that the above-described carrier-injection layer, carrier-transport layer, and carrier-blocking layer cannot be clearly distinguished from each other on the basis of the cross-sectional shape, properties, or the like in some cases. One layer may have two or three functions of the carrier-injection layer, the carrier-transport layer, and the carrier-blocking layer in some cases.

In this specification and the like, a light-emitting device (also referred to as a light-emitting element) includes an EL layer between a pair of electrodes. The EL layer includes at least a light-emitting layer. Examples of layers (also referred to as functional layers) included in the EL layer include a light-emitting layer, carrier-injection layers (a hole-injection layer and an electron-injection layer), carrier-transport layers (a hole-transport layer and an electron-transport layer), and carrier-blocking layers (a hole-blocking layer and an electron-blocking layer). In this specification and the like, a light-receiving device (also referred to as a light-receiving element) includes at least an active layer functioning as a photoelectric conversion layer between a pair of electrodes. In this specification and the like, one of the pair of electrodes may be referred to as a pixel electrode and the other may be referred to as a common electrode.

Note that in this specification and the like, a tapered shape refers to a shape such that at least part of the side surface of a component is inclined with respect to a substrate surface or a formation surface. For example, a tapered shape preferably includes a region where the angle between the inclined side surface and the substrate surface or the formation surface (such an angle is also referred to as a taper angle) is greater than 0° and less than 90°. Note that the side surface, the substrate surface, and the formation surface of the component are not necessarily completely flat, and may have a substantially planar shape with a small curvature or a substantially planar shape with slight unevenness.

Embodiment 1

In this embodiment, a display device of one embodiment of the present invention is described with reference to FIG. 1 to FIG. 9.

In the display device of one embodiment of the present invention, subpixels include light-emitting devices including EL layers having the same structure, and coloring layers overlapping with the light-emitting devices. Coloring layers that transmit visible light of different colors are provided for the subpixels, whereby full-color display can be performed.

In the case of using light-emitting devices including EL layers having the same structure, a layer other than a pixel electrode included in the light-emitting device (e.g., a light-emitting layer) can be common between a plurality of subpixels. Therefore, the plurality of subpixels can share one continuous film. However, layers included in the light-emitting device include a layer having relatively high conductivity. When a plurality of subpixels share a layer having high conductivity as one continuous film, leakage current might be generated between the subpixels. Particularly when the increase in resolution or aperture ratio of a display device reduces the distance between subpixels, the leakage current might become too large to ignore and cause a decrease in display quality of the display device, for example.

In view of this, in the display device of one embodiment of the present invention, at least one layer included in the EL layer is formed in an island shape in each light-emitting device. When at least parts of the layers included in the EL layers are separately formed from each other in the light-emitting devices, crosstalk between adjacent subpixels can be inhibited from occurring. This enables the display device to achieve both high resolution and high display quality.

Note that in this specification and the like, the term "island shape" refers to a state where two or more layers formed using the same material in the same step are physically separated from each other. For example, the term "island-shaped light-emitting layer" refers to a state where the light-emitting layer and its adjacent light-emitting layer are physically separated from each other.

For example, an island-shaped light-emitting layer can be formed by a vacuum evaporation method using a metal mask. However, this method causes a deviation from the designed shape and position of an island-shaped light-emitting layer due to various influences such as the accuracy of the metal mask, the positional deviation between the metal mask and a substrate, a warp of the metal mask, and the vapor-scattering-induced expansion of the outline of the formed film; accordingly, it is difficult to achieve high resolution and high aperture ratio of the display device. In addition, the outline of the layer may blur during vapor deposition, whereby the thickness of an end portion may be small. That is, the thickness of the island-shaped light-emitting layer may vary from area to area. In the case of manufacturing a display device with a large size, high definition, or high resolution, the manufacturing yield might be reduced because of low dimensional accuracy of the metal mask and deformation due to heat or the like.

In view of this, in manufacture of the display device of one embodiment of the present invention, fine patterning of a light-emitting layer is performed by a photolithography method without a shadow mask such as a metal mask. Specifically, pixel electrodes are formed independently for respective subpixels, and then a light-emitting layer is formed across the plurality of pixel electrodes. After that, the light-emitting layer is processed by a photolithography method, so that one island-shaped light-emitting layer is formed per pixel electrode. Thus, the light-emitting layer is divided for each subpixel, so that island-shaped light-emitting layers can be formed for the respective subpixels.

In the case of processing the light-emitting layer into an island shape, a structure is possible in which processing is performed by a photolithography method directly on the light-emitting layer. In the case of the above structure, damage to the light-emitting layer (e.g., processing damage) might significantly degrade the reliability. In view of this, in manufacture of the display device of one embodiment of the present invention, a method is preferably employed in which a mask layer (also referred to as a sacrificial layer, a protective layer, or the like) is formed over a functional layer (e.g., a carrier-blocking layer, a carrier-transport layer, or a carrier-injection layer, specifically, a hole-blocking layer, an electron-transport layer, an electron-injection layer, or the like), followed by the processing of the light-emitting layer and the functional layer into an island shape. By employing such a method, a highly reliable display device can be provided. A functional layer between the light-emitting layer and the mask layer can inhibit the light-emitting layer from being exposed on the outermost surface during the manufacturing process of the display device and can reduce damage to the light-emitting layer.

Note that in this specification and the like, each of a mask film and a mask layer is positioned above at least a light-emitting layer (specifically, a layer processed into an island shape among layers included in an EL layer) and has a function of protecting the light-emitting layer in the manufacturing process.

A metal film or an alloy film is preferably used as the mask layer, in which case plasma damage to the EL layer can be inhibited.

The EL layer preferably includes a first region that is a light-emitting region (also referred to as an emission area) and a second region on the outer side of the first region. The second region can also be referred to as a dummy region or a dummy area. The first region is positioned between the pixel electrode and the common electrode. The first region is covered with the mask layer during the manufacturing process of the display device, which greatly reduces damage to the first region. Accordingly, a light-emitting device with high emission efficiency and a long lifetime can be achieved. Meanwhile, the second region includes an end portion of the EL layer and the vicinity thereof, which might be damaged due to exposure to plasma, for example, in the manufacturing process of the display device. By not using the second region as the light-emitting region, variation in characteristics of the light-emitting devices can be reduced.

In the case where the light-emitting layer is processed into an island shape, a layer positioned below the light-emitting layer (e.g., a carrier-injection layer, a carrier-transport layer, or a carrier-blocking layer, specifically a hole-injection layer, a hole-transport layer, an electron-blocking layer, or the like) is preferably processed into the same island shape as the light-emitting layer. Processing a layer positioned below the light-emitting layer into the same island shape as the light-emitting layer can reduce a leakage current (sometimes referred to as a horizontal-direction leakage current, a horizontal leakage current, or a lateral leakage current) that might be generated between adjacent subpixels. For example, in the case where the hole-injection layer is shared by adjacent subpixels, a horizontal leakage current might be generated due to the hole-injection layer. Meanwhile, in the display device of one embodiment of the present invention, the light-emitting layer and the hole-injection layer can each be processed into an island shape; thus, a horizontal leakage current between adjacent subpixels is not substantially generated or a horizontal leakage current can be extremely small.

In the case of performing processing by a photolithography method, for example, the EL layer might suffer from various kinds of damage due to heating at the time of formation of a photomask (also referred to as a resist mask) and exposure to a chemical solution or an etching gas at the time of photomask processing or removal. In the case where a mask layer is provided over the EL layer, the EL layer might be affected by heating, a chemical solution, an etching gas, or the like in forming, processing, and removing the mask layer.

In addition, when steps performed after formation of the EL layer are performed at temperature higher than the upper temperature limit of the EL layer, deterioration of the EL layer proceeds, which might result in a decrease in the emission efficiency and reliability of the light-emitting device.

Thus, in one embodiment of the present invention, the upper temperature limit of a compound contained in the light-emitting device is preferably higher than or equal to 100° C. and lower than or equal to 180° C., further preferably higher than or equal to 120° C. and lower than or equal to 180° C., still further preferably higher than or equal to 140° C. and lower than or equal to 180° C.

Examples of indicators of the upper temperature limit include the glass transition point (Tg), the softening point, the melting point, the thermal decomposition temperature, and the 5% weight loss temperature. For example, as an indicator of the upper temperature limit of a layer included in the EL layer, a glass transition point of a material contained in the layer can be used. In the case where the layer is a mixed layer formed of a plurality of materials, a glass transition point of a material contained in the highest proportion can be used, for example. Alternatively, the lowest temperature among the glass transition points of the materials may be used.

In particular, the upper temperature limits of the functional layers provided over the light-emitting layer are preferably high. It is further preferable that the upper temperature limit of the functional layer provided over and in contact with the light-emitting layer be high. When the functional layer has high heat resistance, the light-emitting layer can be effectively protected and damage to the light-emitting layer can be reduced.

In addition, it is particularly preferable that the upper temperature limit of the light-emitting layer be high. In this case, the light-emitting layer can be inhibited from being damaged by heating and being decreased in emission efficiency and lifetime.

Increasing the upper temperature limit of the light-emitting device can improve the reliability of the light-emitting device. Furthermore, the allowable temperature range in the manufacturing process of the display device can be widened, thereby improving the manufacturing yield and the reliability.

Note that it is not necessary to form all layers included in the EL layers separately between light-emitting devices, and some layers can be formed in the same step. In the method for manufacturing the display device of one embodiment of the present invention, some layers included in the EL layer are formed into an island shape separately for each color, and then at least part of the mask layer is removed. After that, other layers (sometimes referred to as common layers) included in the EL layers and a common electrode (also referred to as an upper electrode) are formed so as to be shared by the light-emitting devices of respective colors (formed as one film). For example, the carrier-injection layer and the common electrode can be formed so as to be shared by the light-emitting devices of respective colors.

Meanwhile, the carrier-injection layer is often a layer having relatively high conductivity in the EL layer. Therefore, when the carrier-injection layer is in contact with the side surface of any layer included in the EL layer formed in an island shape or the side surface of the pixel electrode, the light-emitting device might be short-circuited. Note that also in the case where the carrier-injection layer is formed in an island shape and the common electrode is formed to be shared by the light-emitting devices of respective colors, the light-emitting device might be short-circuited when the common electrode is in contact with the side surface of the EL layer or the side surface of the pixel electrode.

In view of this, the display device of one embodiment of the present invention includes an insulating layer covering at least the side surface of the island-shaped light-emitting layer. The insulating layer preferably covers part of the top surface of the island-shaped light-emitting layer. Thus, at least some layers in the EL layer formed in an island shape and the pixel electrode can be inhibited from being in contact with the carrier-injection layer or the common electrode. Hence, a short circuit in the light-emitting device is inhibited, and the reliability of the light-emitting device can be improved.

In a cross-sectional view, an end portion of the insulating layer preferably has a tapered shape with a taper angle greater than 0° and less than 90°. In this case, step disconnection of the common layer and the common electrode provided over the insulating layer can be prevented. Thus, connection defects caused by step disconnection can be inhibited. In addition, an increase in electric resistance, which is caused by local thinning of the common electrode due to a step, can be inhibited.

Note that in this specification and the like, step disconnection refers to a phenomenon in which a layer, a film, or an electrode is split because of the shape of the formation surface (e.g., a step).

Thus, in the method for manufacturing a display device of one embodiment of the present invention, an island-shaped light-emitting layer is formed by processing a light-emitting layer formed on the entire surface, not by using a fine metal mask. Accordingly, a high-resolution display device or a display device with a high aperture ratio, which has been difficult to be formed so far, can be achieved. Moreover, providing the mask layer over the light-emitting layer can reduce damage to the light-emitting layer in the manufacturing process of the display device, resulting in an improvement in reliability of the light-emitting device.

The small number of times of processing of the light-emitting layer by a photolithography method is preferable because a reduction in manufacturing cost and an improvement of manufacturing yield become possible. In the method for manufacturing the display device of one embodiment of the present invention, the number of times of processing of the light-emitting layer by a photolithography method can be one; thus, the display device can be manufactured with high yield.

It is difficult to reduce the distance between adjacent light-emitting devices to less than 10 μm with a formation method using a fine metal mask, for example; however, the method employing a photolithography method of one embodiment of the present invention can shorten the distance between adjacent light-emitting devices, the distance between adjacent EL layers, or the distance between adjacent pixel electrodes to less than 10 μm, less than or equal to 5 μm, less than or equal to 3 μm, less than or equal to 2 μm, less than or equal to 1.5 μm, less than or equal to 1 μm, or even less than or equal to 0.5 μm, for example, in a process over a glass substrate. Using a light exposure apparatus for LSI can further shorten the distance between adjacent light-emitting devices, the distance between adjacent EL layers, or the distance between adjacent pixel electrodes to less than or equal to 500 nm, less than or equal to 200 nm, less than or equal to 100 nm, or even less than or equal to 50 nm, for example, in a process over a Si wafer. Accordingly, the area of a non-light-emitting region that may exist between two light-emitting devices can be significantly reduced, and the aperture ratio can be close to 100%. For example, the display device of one embodiment of the present invention can have an aperture ratio higher than or equal to 40%, higher than or equal to 50%, higher than or equal to 60%, higher than or equal to 70%, higher than or equal to 80%, or higher than or equal to 90%, and lower than 100%.

Increasing the aperture ratio of the display device can improve the reliability of the display device. Specifically, with reference to the lifetime of a display device including an organic EL device and having an aperture ratio of 10%, a display device having an aperture ratio of 20% (that is, having an aperture ratio two times higher than the reference) has a lifetime 3.25 times longer than the reference, and a display device having an aperture ratio of 40% (that is, having an aperture ratio four times higher than the reference) has a lifetime 10.6 times longer than the reference. Thus, the density of a current flowing through the organic EL device can be reduced with an increasing aperture ratio, and accordingly the lifetime of the display device can be increased. The display device of one embodiment of the present invention can have a higher aperture ratio and thus the display device can have higher display quality. Furthermore, the display device has excellent effect that the reliability (especially the lifetime) can be significantly improved with an increasing aperture ratio.

Furthermore, a pattern of the light-emitting layer itself (also referred to as processing size) can be made much smaller than that in the case of using a fine metal mask. For example, in the case of using a metal mask for forming light-emitting layers separately, a variation in the thickness occurs between the center and the edge of the light-emitting layer, which causes a reduction in an effective area that can be used as a light-emitting region with respect to the area of the light-emitting layer. In contrast, in the above manufacturing method, the film formed to have a uniform thickness is processed, so that island-shaped light-emitting layers can be formed to have a uniform thickness. Accordingly, even with a fine pattern, almost the whole area can be used as a light-emitting region. Thus, a display device having both a high resolution and a high aperture ratio can be manufactured. Furthermore, the display device can be reduced in size and weight.

Specifically, for example, the display device of one embodiment of the present invention can have a resolution higher than or equal to 2000 ppi, preferably higher than or equal to 3000 ppi, further preferably higher than or equal to 5000 ppi, still further preferably higher than or equal to 6000 ppi, and lower than or equal to 20000 ppi or lower than or equal to 30000 ppi.

In this embodiment, cross-sectional structures of the display device of one embodiment of the present invention are mainly described, and a method for manufacturing the display device of one embodiment of the present invention will be described in detail in Embodiment 2.

FIG. 1A illustrates a top view of a display device 100. The display device 100 includes a display portion where a plurality of pixels 110 are arranged, and a connection portion 140 outside the display portion. A plurality of subpixels are arranged in a matrix in the display portion. FIG. 1A illustrates subpixels in two rows and six columns, which form pixels in two rows and two columns. The connection portion 140 can also be referred to as a cathode contact portion.

The top surface shape of the subpixel illustrated in FIG. 1A corresponds to the top surface shape of a light-emitting region. In this specification and the like, a top surface shape refers to a shape in a plan view, i.e., a shape seen from above.

Examples of a top surface shape of the subpixel include polygons such as a triangle, a tetragon (including a rectangle, a rhombus, and a square), and a pentagon; polygons with rounded corners; an ellipse; and a circle.

The range of the circuit layout for forming the subpixels is not limited to the range of the subpixels illustrated in FIG. 1A, and the components may be placed outside the range of the subpixels. For example, transistors included in a subpixel 110*a* may be positioned within the range of a subpixel 110*b* illustrated in FIG. 1A, or some or all of the transistors may be positioned outside the range of the subpixel 110*a*.

Although FIG. 1A illustrates the subpixel 110*a*, the subpixel 110*b*, and a subpixel 110*c* that have the same or substantially the same aperture ratio (also referred to as size or size of a light-emitting region), one embodiment of the present invention is not limited thereto. The aperture ratio of each of the subpixels 110*a*, 110*b*, and 110*c* can be determined as appropriate. The subpixels 110*a*, 110*b*, and 110*c* may have different aperture ratios, or two or more of them may have the same or substantially the same aperture ratio.

The pixel 110 illustrated in FIG. 1A employs stripe arrangement. The pixel 110 illustrated in FIG. 1A is composed of three subpixels: the subpixels 110*a*, 110*b*, and 110*c*. The subpixels 110*a*, 110*b*, and 110*c* exhibit light of different colors. The subpixels 110*a*, 110*b*, and 110*c* are subpixels of three colors of red (R), green (G), and blue (B) or subpixels of three colors of yellow (Y), cyan (C), and magenta (M), for example. The number of types of subpixels is not limited to three and may be four or more. The four subpixels are subpixels of four colors of R, G, B, and white (W), subpixels of four colors of R, G, B, and Y, or subpixels of four types of R, G, B, and infrared light (IR), for example.

In this specification and the like, the row direction is referred to as X direction and the column direction is referred to as Y direction, in some cases. The X direction and the Y direction intersect with each other and are, for example, orthogonal to each other (see FIG. 1A). FIG. 1A illustrates an example in which subpixels of different colors are arranged in the X direction and subpixels of the same color are arranged in the Y direction.

Although the top view in FIG. 1A illustrates an example in which the connection portion 140 is positioned in the lower side of the display portion, the position of the connection portion 140 is not particularly limited. The connection portion 140 is provided in at least one of the upper side, the right side, the left side, and the lower side of the display portion in the top view, and may be provided so as to surround the four sides of the display portion. The top surface shape of the connection portion 140 can be a belt-like shape, an L shape, a U shape, a frame-like shape, or the like. The number of the connection portions 140 can be one or more.

Figure 1B:
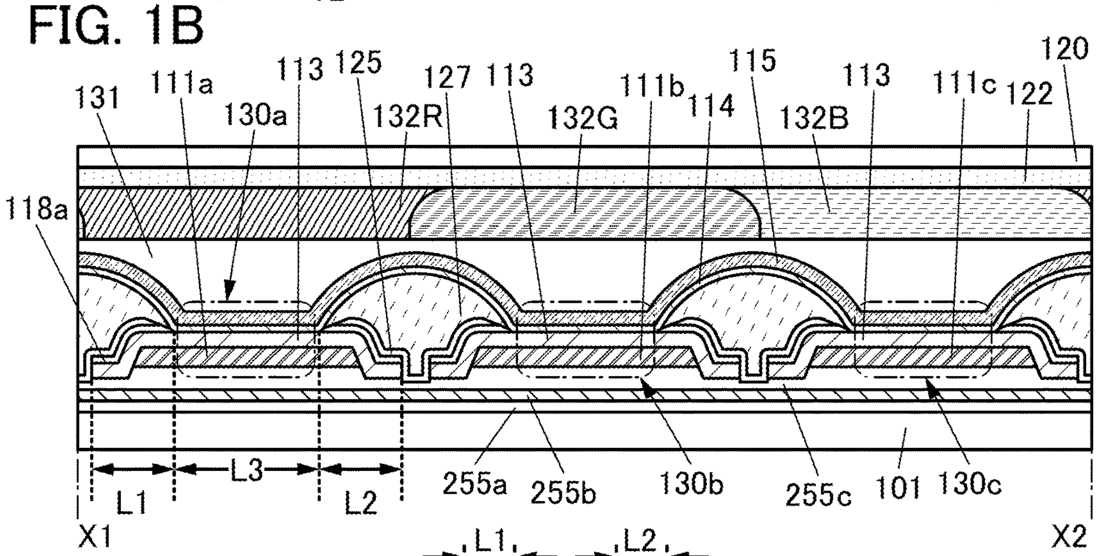
FIG. 1B is a cross-sectional view illustrating the example of the display device.
Figure 1C:
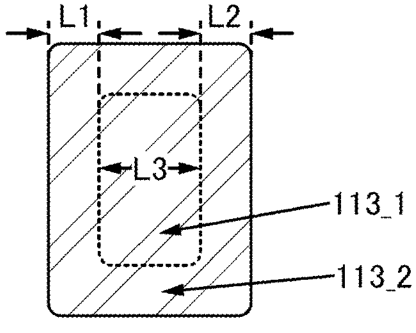
FIG. 1C is a top view illustrating an example of a first layer.
Figure 2A:
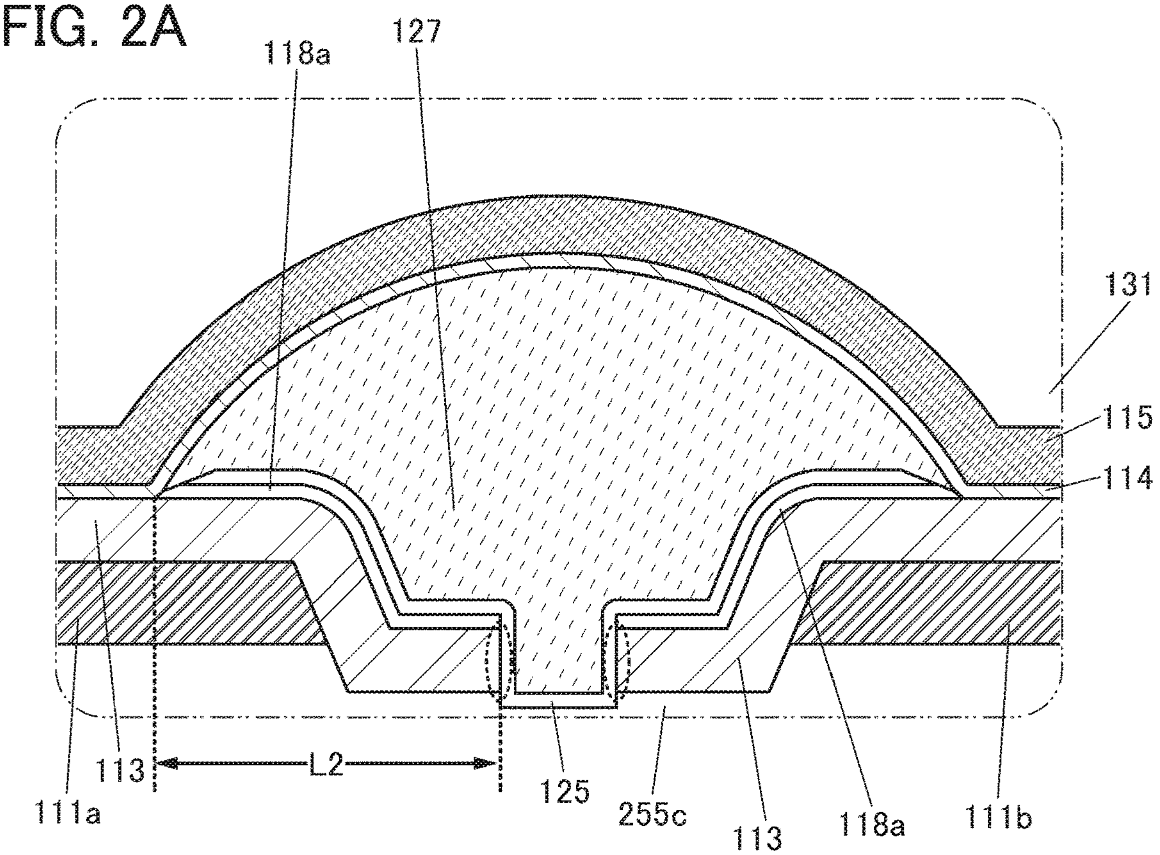
FIG. 2A and FIG. 2B are cross-sectional views illustrating an example of a display device.
Figure 2B:
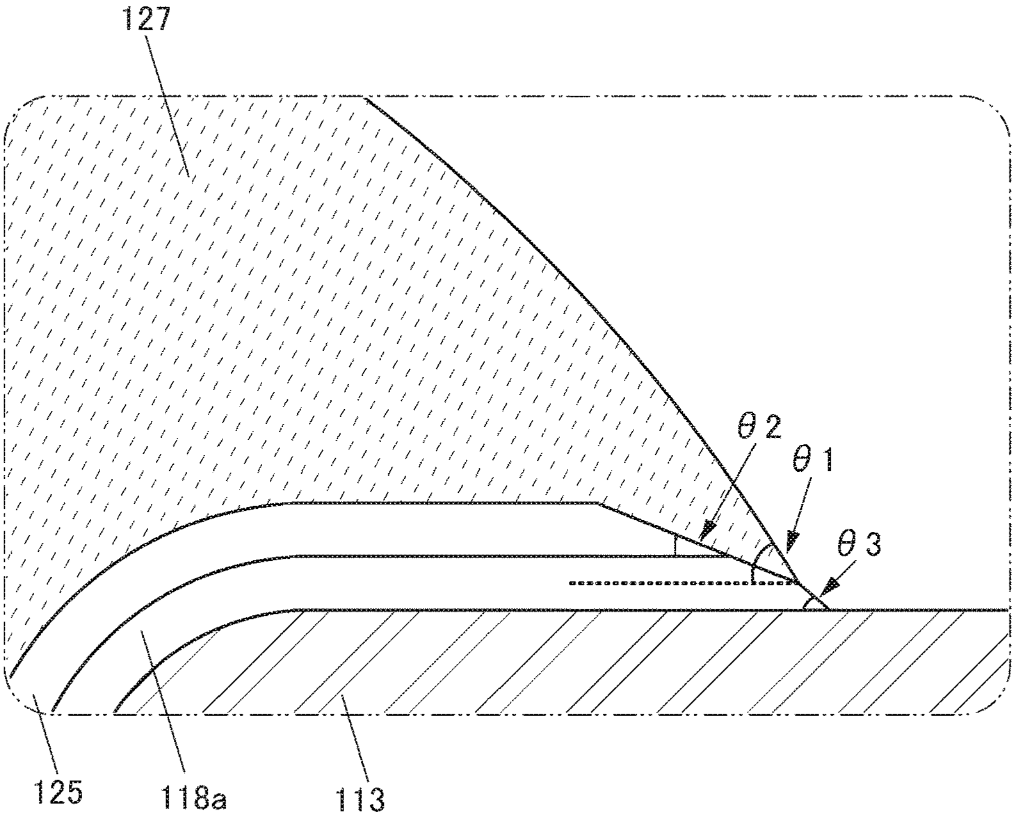

FIG. 1B illustrates a cross-sectional view along the dashed-dotted line X1-X2 in FIG. 1A. FIG. 1C illustrates a top view of a first layer 113. FIG. 2A and FIG. 2B illustrate enlarged views of part of the cross-sectional view illustrated in FIG. 1B. FIG. 3 to FIG. 6 and FIG. 8C illustrate variation examples of FIG. 2. FIG. 7A to FIG. 7C and FIG. 8D illustrate variation examples of FIG. 1B. FIG. 8A and FIG. 8B illustrate cross-sectional views along the dashed-dotted line Y1-Y2 in FIG. 1A.

The subpixel 110*a* includes a light-emitting device 130*a* and a coloring layer 132R that transmits red light. Thus, light emitted by the light-emitting device 130*a* is extracted as red light to the outside of the display device through the coloring layer 132R.

Similarly, the subpixel 110*b* includes a light-emitting device 130*b* and a coloring layer 132G that transmits green light. Thus, light emitted by the light-emitting device 130*b* is extracted as green light to the outside of the display device through the coloring layer 132G.

In addition, the subpixel 110*c* includes a light-emitting device 130*c* and a coloring layer 132B that transmits blue light. Thus, light emitted by the light-emitting device 130*c* is extracted as blue light to the outside of the display device through the coloring layer 132B.

As illustrated in FIG. 1B, in the display device 100, an insulating layer is provided over a layer 101 including transistors, light-emitting devices 130*a*, 130*b*, and 130*c* are provided over the insulating layer, and a protective layer 131 is provided to cover these light-emitting devices. The coloring layers 132R, 132G, and 132B are provided over the protective layer 131, and a substrate 120 is bonded onto the coloring layers 132R, 132G, and 132B with a resin layer 122. In a region between adjacent light-emitting devices, an insulating layer 125 and an insulating layer 127 over the insulating layer 125 are provided.

Although FIG. 1B illustrates a plurality of cross sections of the insulating layer 125 and the insulating layer 127, the insulating layer 125 and the insulating layer 127 are each one continuous layer when the display device 100 is seen from above. In other words, the display device 100 can have a structure including one insulating layer 125 and one insulating layer 127, for example. Note that the display device 100 may include a plurality of insulating layers 125 that are separated from each other, and may include a plurality of insulating layers 127 that are separated from each other.

The display device of one embodiment of the present invention can have any of a top-emission structure in which light is emitted in a direction opposite to the substrate where the light-emitting device is formed, a bottom-emission structure in which light is emitted toward the substrate where the light-emitting device is formed, and a dual-emission structure in which light is emitted toward both surfaces.

The layer 101 including transistors can employ a stacked-layer structure in which a plurality of transistors are provided over a substrate and an insulating layer is provided to cover these transistors, for example. The insulating layer over the transistors may have a single-layer structure or a stacked-layer structure. In FIG. 1B, an insulating layer 255*a*, an insulating layer 255*b* over the insulating layer 255*a*, and an insulating layer 255*c* over the insulating layer 255*b* are illustrated as the insulating layer over the transistors. These insulating layers may have a depressed portion between adjacent light-emitting devices. In the example illustrated in FIG. 1B and the like, the insulating layer 255*c* is provided with a depressed portion. Note that the insulating layer 255*c* does not necessarily include a depressed portion between adjacent light-emitting devices. FIG. 1B and the like exemplify a structure in which an angle formed by the insulating layer 255*b* and the sidewall of the depressed portion in the insulating layer 255*c* is a taper angle almost equal to that of the tapered shape of the pixel electrode 111*a*, the pixel electrode 111*b*, and the pixel electrode 111*c*; however, one embodiment of the present invention is not limited thereto. For example, the tapered shape of the pixel electrode 111*a*, the pixel electrode 111*b*, and the pixel electrode 111*c* may be different from the tapered shape of the sidewall of the depressed portion in the insulating layer 255*c*. Note that the insulating layers (the insulating layer 255*a* to the insulating layer 255*c*) over the transistors may be regarded as part of the layer 101 including transistors.

As each of the insulating layer 255*a*, the insulating layer 255*b*, and the insulating layer 255*c*, any of a variety of inorganic insulating films such as an oxide insulating film, a nitride insulating film, an oxynitride insulating film, and a nitride oxide insulating film can be suitably used. As each of the insulating layer 255*a* and the insulating layer 255*c*, an oxide insulating film or an oxynitride insulating film, such as a silicon oxide film, a silicon oxynitride film, or an aluminum oxide film, is preferably used. As the insulating layer 255*b*, a nitride insulating film or a nitride oxide insulating film, such as a silicon nitride film or a silicon nitride oxide film, is preferably used. Specifically, it is preferable that a silicon oxide film be used as each of the insulating layer 255*a* and the insulating layer 255*c* and that a silicon nitride film be used as the insulating layer 255*b*. The insulating layer 255*b* preferably has a function of an etching protective film.

Note that in this specification and the like, oxynitride refers to a material that contains more oxygen than nitrogen in its composition, and nitride oxide refers to a material that contains more nitrogen than oxygen in its composition. For example, silicon oxynitride refers to a material that contains more oxygen than nitrogen in its composition, and silicon nitride oxide refers to a material that contains more nitrogen than oxygen in its composition.

Structure examples of the layer 101 including transistors will be described later in Embodiment 5.

As the light-emitting device, an OLED (Organic Light-Emitting Diode) or a QLED (Quantum-dot Light-Emitting Diode) is preferably used, for example. Examples of a light-emitting substance (also referred to as a light-emitting material) contained in the light-emitting device include a substance exhibiting fluorescence (a fluorescent material), a substance exhibiting phosphorescence (a phosphorescent material), an inorganic compound (e.g., a quantum dot material), and a substance exhibiting thermally activated delayed fluorescence (a thermally activated delayed fluorescent (TADF) material). An LED (Light Emitting Diode) such as a micro-LED can also be used as the light-emitting device.

The emission color of the light-emitting device can be infrared, red, green, blue, cyan, magenta, yellow, white, or the like. When the light-emitting device has a microcavity structure, the color purity can be increased.

Embodiment 6 can be referred to for the structure and the materials of the light-emitting device.

One of the pair of electrodes included in the light-emitting device functions as an anode, and the other electrode functions as a cathode. The case where the pixel electrode functions as an anode and the common electrode functions as a cathode is described below as an example in some cases.

The light-emitting device 130*a* includes the pixel electrode 111*a* over the insulating layer 255*c*, the island-shaped first layer 113 over the pixel electrode 111*a*, a common layer 114 over the first layer 113, and a common electrode 115 over the common layer 114. The light-emitting device 130*b* includes the pixel electrode 111*b* over the insulating layer 255*c*, the island-shaped first layer 113 over the pixel electrode 111*b*, the common layer 114 over the first layer 113, and the common electrode 115 over the common layer 114. The light-emitting device 130*c* includes the pixel electrode 111*c* over the insulating layer 255*c*, the first layer 113 over the pixel electrode 111*c*, the common layer 114 over the first layer 113, and the common electrode 115 over the common layer 114. In each of the light-emitting devices 130*a*, 130*b*, and 130*c*, the first layer 113 and the common layer 114 can be collectively referred to as an EL layer.

In this specification and the like, in the EL layers included in the light-emitting devices, the island-shaped layer provided in each light-emitting device is referred to as the first layer 113, and the layer shared by the plurality of light-emitting devices is referred to as the common layer 114. Note that in this specification and the like, the first layer 113 is sometimes referred to as an island-shaped EL layer, an EL layer formed in an island shape, or the like, in which case the common layer 114 is not included.

The light-emitting devices 130*a*, 130*b*, and 130*c* each include the first layer 113, and the first layers 113 are apart from each other. When the EL layer is provided in an island shape for each light-emitting device, a leakage current between adjacent light-emitting devices can be inhibited. This can prevent crosstalk due to unintended light emission, so that a display device with extremely high contrast can be obtained. Specifically, a display device having high current efficiency at low luminance can be obtained.

When the structure of the EL layer is the same in the light-emitting devices 130*a*, 130*b*, and 130*c*, the number of manufacturing steps of the display device can be reduced and a reduction in manufacturing cost and an improvement of manufacturing yield become possible.

End portions of the pixel electrode 111*a*, the pixel electrode 111*b*, and the pixel electrode 111*c* each preferably have a tapered shape. Specifically, the end portions of the pixel electrode 111*a*, the pixel electrode 111*b*, and the pixel electrode 111*c* each preferably have a tapered shape with a taper angle greater than 0° and less than 90°. In the case where the end portions of the pixel electrodes each have a tapered shape, each of the first layers 113 provided along the side surfaces of the pixel electrodes also has a tapered shape (corresponding to an inclined portion described later). When the side surface of the pixel electrode has a tapered shape, coverage with the EL layer provided along the side surface of the pixel electrode can be improved.

In FIG. 1B, an insulating layer covering an end portion of the top surface of the pixel electrode is not provided between the pixel electrode and the first layer 113. Thus, the distance between adjacent light-emitting devices can be extremely shortened. Accordingly, the display device can have a high resolution or a high definition. In addition, a mask for forming the insulating layer is not needed, which leads to a reduction in manufacturing cost of the display device.

Furthermore, light emitted from the EL layer can be extracted efficiently with a structure in which an insulating layer covering the end portion of the pixel electrode is not provided between the pixel electrode and the EL layer, i.e., a structure in which an insulating layer is not provided between the pixel electrode and the EL layer. Therefore, the display device of one embodiment of the present invention can significantly reduce the viewing angle dependence. A reduction in the viewing angle dependence leads to an increase in visibility of an image on the display device. For example, in the display device of one embodiment of the present invention, the viewing angle (the maximum angle with a certain contrast ratio maintained when the screen is seen from an oblique direction) can be greater than or equal to 100° and less than 180°, preferably greater than or equal to 150° and less than or equal to 170°. Note that the viewing angle refers to that in both the vertical direction and the horizontal direction.

The light-emitting device of this embodiment may have either a single structure (a structure including only one light-emitting unit) or a tandem structure (a structure including a plurality of light-emitting units). The light-emitting unit includes at least one light-emitting layer. The first layer 113 includes at least a light-emitting layer. The first layer 113 may include one or more of a hole-injection layer, a hole-transport layer, a hole-blocking layer, a charge-generation layer, an electron-blocking layer, an electron-transport layer, and an electron-injection layer.

For example, the first layer 113 can contain a light-emitting material emitting blue light and a light-emitting material emitting visible light having a longer wavelength than blue. For example, a structure containing a light-emitting material emitting blue light and a light-emitting material emitting yellow light, or a structure containing a light-emitting material emitting blue light, a light-emitting material emitting green light, and a light-emitting material emitting red light can be employed for the first layer 113.

As each of the light-emitting devices 130*a*, 130*b*, and 130*c*, for example, a single-structure light-emitting device including two light-emitting layers, which are a light-emitting layer emitting yellow (Y) light and a light-emitting layer emitting blue (B) light, or a single-structure light-emitting device including three light-emitting layers, which are a light-emitting layer emitting red (R) light, a light-emitting layer emitting green (G) light, and a light-emitting layer emitting blue light, can be used. As examples of the number of stacked light-emitting layers and the order of colors thereof, a three-layer structure of R, G, and B and a three-layer structure of R, B, and G from the anode side can be given. Another layer (also referred to as a buffer layer) may be provided between two light-emitting layers.

In the case where a light-emitting device having a tandem structure is used, examples of applicable structures are as follows: a two-unit tandem structure including a light-emitting unit that emits yellow light and a light-emitting unit that emits blue light; a two-unit tandem structure including a light-emitting unit that emits red light and green light and a light-emitting unit that emits blue light; and a three-unit tandem structure in which a light-emitting unit that emits blue light, a light-emitting unit that emits yellow, yellow-green, or green light and red light, and a light-emitting unit that emits blue light are stacked in this order. Examples of the number of stacked units and the order of colors from an anode side include a two-unit structure of B and Y; a two-unit structure of B and X; a three-unit structure of B, Y, and B; and a three-unit structure of B, X, and B. Examples of the number of light-emitting layers stacked in the light-emitting unit X and the order of colors from the anode side include a two-layer structure of R and Y; a two-layer structure of R and G; a two-layer structure of G and R; a three-layer structure of G, R, and G; and a three-layer structure of R, G, and R. Another layer may be provided between two light-emitting layers.

In the case of using a light-emitting device having a tandem structure, the first layer 113 includes a plurality of light-emitting units. A charge-generation layer is preferably provided between the light-emitting units.

The light-emitting unit includes at least one light-emitting layer. For example, when emission colors of the plurality of light-emitting units are complementary to each other, the light-emitting device can emit white light. The light-emitting unit may include one or more of a hole-injection layer, a hole-transport layer, a hole-blocking layer, an electron-blocking layer, an electron-transport layer, and an electron-injection layer.

Note that in the case where the light-emitting device configured to emit white light has a microcavity structure, light of a specific wavelength such as red, green, blue, or infrared light is sometimes intensified to be emitted.

For example, the first layer 113 may include a hole-injection layer, a hole-transport layer, a light-emitting layer, and an electron-transport layer in this order. In addition, an electron-blocking layer may be provided between the hole-transport layer and the light-emitting layer. In addition, a hole-blocking layer may be provided between the electron-transport layer and the light-emitting layer. Furthermore, an electron-injection layer may be provided over the electron-transport layer.

Alternatively, the first layer 113 may include an electron-injection layer, an electron-transport layer, a light-emitting layer, and a hole-transport layer in this order, for example. In addition, a hole-blocking layer may be provided between the electron-transport layer and the light-emitting layer. In addition, an electron-blocking layer may be provided between the hole-transport layer and the light-emitting layer. Furthermore, a hole-injection layer may be provided over the hole-transport layer.

Thus, the first layer 113 preferably includes a light-emitting layer and a carrier-transport layer (an electron-transport layer or a hole-transport layer) over the light-emitting layer. Alternatively, the first layer 113 preferably includes a light-emitting layer and a carrier-blocking layer (a hole-blocking layer or an electron-blocking layer) over the light-emitting layer. Alternatively, the first layer 113 preferably includes a light-emitting layer, a carrier-blocking layer over the light-emitting layer, and a carrier-transport layer over the carrier-blocking layer. Since the surface of the first layer 113 is exposed in the manufacturing process of the display device, providing one or both of the carrier-transport layer and the carrier-blocking layer over the light-emitting layer inhibits the light-emitting layer from being exposed on the outermost surface, so that damage to the light-emitting layer can be reduced. Accordingly, the reliability of the light-emitting device can be improved.

The upper temperature limits of the compounds contained in the first layers 113 are each preferably higher than or equal to 100° C. and lower than or equal to 180° C. or higher than or equal to 120° C. and lower than or equal to 180° C., further preferably higher than or equal to 140° C. and lower than or equal to 180° C. For example, the glass transition point (Tg) of these compounds is preferably higher than or equal to 100° C. and lower than or equal to 180° C. or higher than or equal to 120° C. and lower than or equal to 180° C., further preferably higher than or equal to 140° C. and lower than or equal to 180° C.

In particular, the upper temperature limits of the functional layers provided over the light-emitting layer are preferably high. It is further preferable that the upper temperature limit of the functional layer provided over and in contact with the light-emitting layer be high. When the functional layer has high heat resistance, the light-emitting layer can be effectively protected and damage to the light-emitting layer can be reduced.

In addition, the upper temperature limit of the light-emitting layer is preferably high. In this case, the light-emitting layer can be inhibited from being damaged by heating and being decreased in emission efficiency and lifetime.

The light-emitting layer contains a light-emitting substance (also referred to as a light-emitting organic compound, a guest material, or the like) and an organic compound (also referred to as a host material or the like). Since the light-emitting layer is configured to contain more organic compound than light-emitting substance, Tg of the organic compound can be used as an indicator of the upper temperature limit of the light-emitting layer.

The first layer 113 includes a first light-emitting unit, a charge generation layer, and a second light-emitting unit that are stacked in this order, for example.

The second light-emitting unit preferably includes a light-emitting layer and a carrier-transport layer (an electron-transport layer or a hole-transport layer) over the light-emitting layer. Alternatively, the second light-emitting unit preferably includes a light-emitting layer and a carrier-blocking layer (a hole-blocking layer or an electron-blocking layer) over the light-emitting layer. Alternatively, the second light-emitting unit preferably includes a light-emitting layer, a carrier-blocking layer over the light-emitting layer, and a carrier-transport layer over the carrier-blocking layer. Since the surface of the second light-emitting unit is exposed in the manufacturing process of the display device, providing one or both of the carrier-transport layer and the carrier-blocking layer over the light-emitting layer inhibits the light-emitting layer from being exposed on the outermost surface, so that damage to the light-emitting layer can be reduced. Accordingly, the reliability of the light-emitting device can be improved. Note that in the case where three or more light-emitting units are provided, the uppermost light-emitting unit preferably includes a light-emitting layer and one or both of a carrier-transport layer and a carrier-blocking layer over the light-emitting layer.

The common layer 114 includes, for example, an electron-injection layer or a hole-injection layer. Alternatively, the common layer 114 may include a stack of an electron-transport layer and an electron-injection layer, or may include a stack of a hole-transport layer and a hole-injection layer. The common layer 114 is shared by the light-emitting devices 130*a*, 130*b*, and 130*c*.

FIG. 1B illustrates an example in which an end portion of the first layer 113 is positioned more outwardly than the end portion of the pixel electrode. In FIG. 1B, the first layer 113 is formed to cover the end portion of the pixel electrode. Such a structure enables the entire top surface of the pixel electrode to be a light-emitting region, and the aperture ratio can be easily increased as compared with the structure in which the end portion of the island-shaped EL layer is positioned more inwardly than the end portion of the pixel electrode.

Covering the side surface of the pixel electrode with the EL layer inhibits contact between the pixel electrode and the common electrode 115, thereby inhibiting a short circuit of the light-emitting device. Furthermore, the distance between the light-emitting region (i.e., the region overlapping with the pixel electrode) in the EL layer and the end portion of the EL layer can be increased. Since the end portion of the EL layer might be damaged by processing, the use of a region away from the end portion of the EL layer as a light-emitting region can improve the reliability of the light-emitting device in some cases.

The first layer 113 preferably includes the first region that is a light-emitting region and the second region (dummy region) on the outer side of the first region. The first region is positioned between the pixel electrode and the common electrode. The first region is covered with the mask layer during the manufacturing process of the display device, which greatly reduces damage to the first region. Accordingly, a light-emitting device with high emission efficiency and a long lifetime can be achieved. Meanwhile, the second region includes an end portion of the EL layer and the vicinity thereof, which might be damaged due to exposure to plasma, for example, in the manufacturing process of the display device. By not using the second region as the light-emitting region, variation in characteristics of the light-emitting devices can be reduced.

A width L3 illustrated in FIG. 1B and FIG. 1C corresponds to the width of a first region 113_1 (light-emitting region) in the first layer 113. A width L1 and a width L2 illustrated in FIG. 1B and FIG. 1C each correspond to the width of a second region 113_2 (dummy region) in the first layer 113. As illustrated in FIG. 1C, the second region 113_2 is provided to surround the first region 113_1; thus, the width of the second region 113_2 can be observed on the left and right sides in the cross-sectional views in FIG. 1B and the like. As the width of the second region 113_2, the width L1 or the width L2 can be used; for example, the shorter one of the width L1 and the width L2 can be used.

Figure 6A:
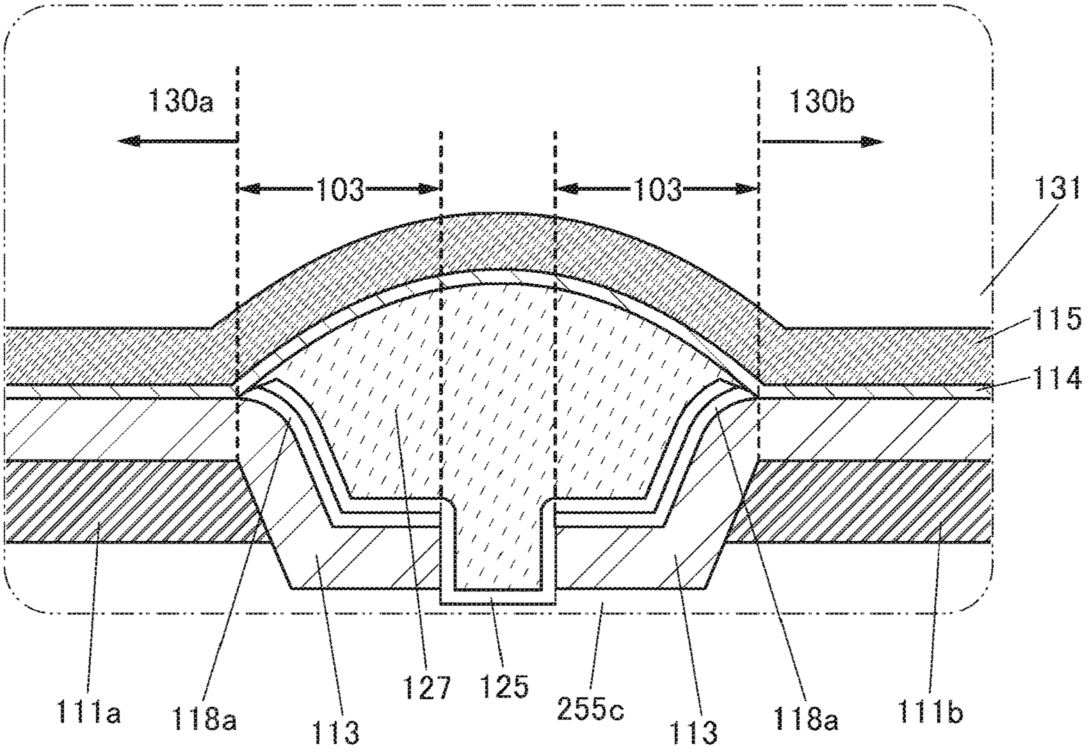
FIG. 6A and FIG. 6B are cross-sectional views illustrating examples of a display device.
Figure 6B:
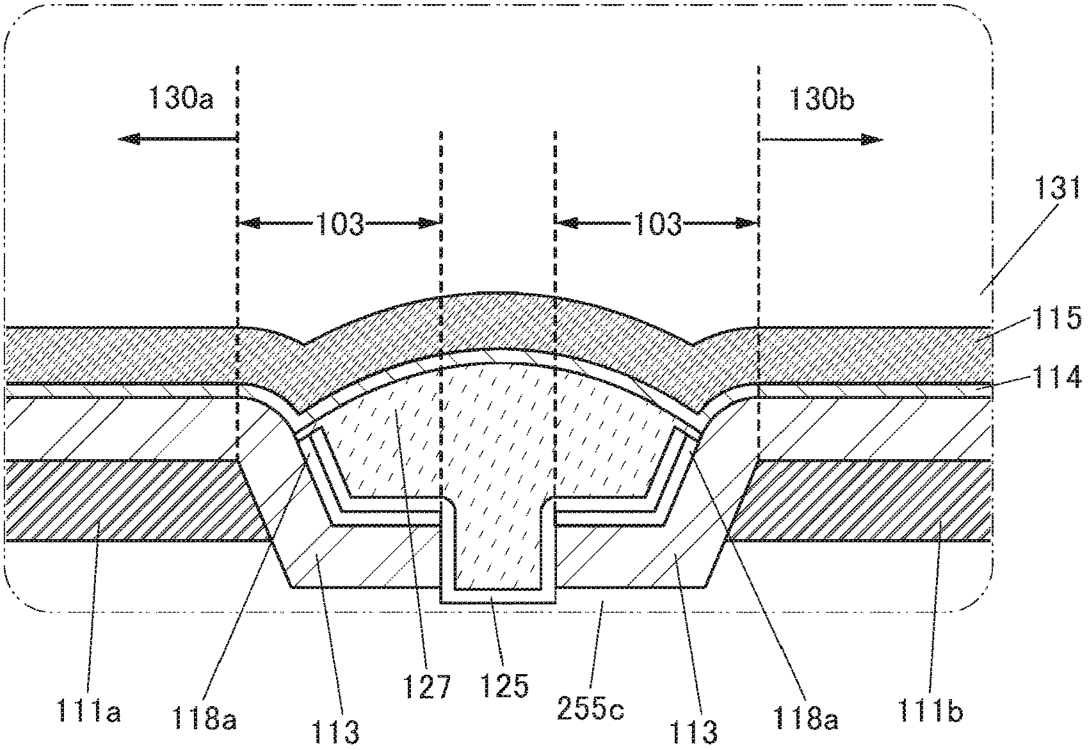

The enlarged view illustrated in FIG. 2A illustrates the width L2 of the second region 113_2. The second region 113_2 is a portion where the first layer 113 overlaps with at least one of a mask layer 118*a*, the insulating layer 125, and the insulating layer 127. In the first layer 113 or the like, a portion positioned on the outer side of the top surface of the pixel electrode, like a region 103 illustrated in FIG. 6B, is a dummy region.

The width of the second region 113_2 is greater than or equal to 1 nm, preferably greater than or equal to 5 nm, greater than or equal to 50 nm, or greater than or equal to 100 nm. The width of the dummy region is preferably wider, in which case the quality of the light-emitting region can be more uniform and the light-emitting devices can have less variation in characteristics. In contrast, a narrower width of the dummy region can widen the light-emitting region and increase the aperture ratio of the pixel. Thus, the width of the second region 113_2 is preferably less than or equal to 50%, further preferably less than or equal to 40%, less than or equal to 30%, less than or equal to 20%, or less than or equal to 10% of the width L3 of the first region 113_1. Furthermore, for example, the width of the second region 113_2 in a small and high-resolution display device, such as a display device for a wearable device, is preferably less than or equal to 500 nm, further preferably less than or equal to 300 nm, less than or equal to 200 nm, or less than or equal to 150 nm.

Note that in the island-shaped EL layer, the first region (light-emitting region) is a region from which EL (Electroluminescence) emission is obtained. Furthermore, in the island-shaped EL layer, the first region (light-emitting region) and the second region (dummy region) are each a region from which PL (Photoluminescence) emission is obtained. Thus, the first region and the second region can be distinguished from each other by observing EL emission and PL emission.

The common electrode 115 is shared by the light-emitting devices 130*a*, 130*b*, and 130*c*. The common electrode 115 shared by the plurality of light-emitting devices is electrically connected to a conductive layer 123 provided in the connection portion 140 (see FIG. 8A and FIG. 8B). The conductive layer 123 is preferably formed using a conductive layer formed using the same material and in the same step as the pixel electrodes 111*a*, 111*b*, and 111*c*.

Note that FIG. 8A illustrates an example in which the common layer 114 is provided over the conductive layer 123, and the conductive layer 123 and the common electrode 115 are electrically connected to each other through the common layer 114. The common layer 114 is not necessarily provided in the connection portion 140. In FIG. 8B, the conductive layer 123 and the common electrode 115 are directly connected to each other. For example, by using a mask for specifying a film formation area (also referred to as an area mask, a rough metal mask, or the like to be distinguished from a fine metal mask), the common layer 114 can be formed in a region different from a region where the common electrode 115 is formed.

In FIG. 1B, the mask layer 118*a* is positioned over the first layer 113 included in the light-emitting device. The mask layer 118*a* is a remaining part of a mask layer provided in contact with the top surface of the first layer 113 at the time of processing the first layer 113. Thus, in the display device of one embodiment of the present invention, the mask layer used to protect the EL layer in manufacture of the display device may partly remain.

In FIG. 1B, one end portion of the mask layer 118*a* is aligned or substantially aligned with the end portion of the first layer 113, and the other end portion of the mask layer 118*a* is positioned over the first layer 113. Here, the other end portion of the mask layer 118*a* preferably overlaps with the first layer 113 and the pixel electrode. In this case, the other end portion of the mask layer 118*a* is easily formed over a flat or substantially flat surface of the first layer 113. The mask layer 118*a* remains between the top surface of the EL layer processed into an island shape (the first layer 113) and the insulating layer 125. The mask layer will be described in detail in Embodiment 2.

In the case where end portions are aligned or substantially aligned with each other and the case where top surface shapes are the same or substantially the same, it can be said that outlines of stacked layers at least partly overlap with each other in a top view. For example, the case of processing the upper layer and the lower layer with the use of the same mask pattern or mask patterns that are partly the same is included. Note that, in some cases, the outlines do not completely overlap with each other and the upper layer is positioned inward from the lower layer or the upper layer is positioned outward from the lower layer; such cases are also represented by the expression "end portions are substantially aligned with each other" or the expression "top surface shapes are substantially the same".

The side surface of the first layer 113 is covered with the insulating layer 125. The insulating layer 127 overlaps with (i.e., covers) the side surface of the first layer 113 with the insulating layer 125 therebetween.

The top surface of the first layer 113 is partly covered with the mask layer 118*a*. The insulating layer 125 and the insulating layer 127 overlap with part of the top surface of the first layer 113 with the mask layer 118*a* therebetween. Note that the top surface of the first layer 113 is not limited to the top surface of a flat portion overlapping with the top surface of the pixel electrode, and can include the top surfaces of the inclined portion and the flat portion (see the region 103 in FIG. 6A) which are positioned on the outer side of the top surface of the pixel electrode.

The side surface and part of the top surface of the first layer 113 are covered with at least one of the insulating layer 125, the insulating layer 127, and the mask layer 118*a*, so that the common layer 114 (or the common electrode 115) can be inhibited from being in contact with the side surfaces of the pixel electrodes 111*a*, 111*b*, and 111*c* and the first layer 113, leading to inhibition of a short circuit of the light-emitting devices. Accordingly, the reliability of the light-emitting devices can be improved.

The insulating layer 125 is preferably in contact with the side surface of the first layer 113 (see portions surrounded by dashed lines in the end portions of the first layers 113 and the vicinities thereof illustrated in FIG. 2A). The insulating layer 125 is configured to be in contact with the first layer 113, whereby film separation of the first layer 113 can be prevented. When the insulating layer 125 is in close contact with the first layer 113, adjacent first layers 113 can be fixed or bonded to each other by the insulating layer 125. In addition, contact between the insulating layer 125 and the insulating layer 255*c* also contributes to prevention of film separation of the first layer 113. Accordingly, the reliability of the light-emitting devices can be improved. The manufacturing yield of the light-emitting devices can also be improved.

As illustrated in FIG. 1B, the insulating layer 125 and the insulating layer 127 cover the side surface and part of the top surface of the first layer 113, whereby film separation of the EL layers can further be prevented and the reliability of the light-emitting devices can be improved. The manufacturing yield of the light-emitting devices can also be improved.

FIG. 1B illustrates an example in which a stacked-layer structure of the first layer 113, the mask layer 118*a*, the insulating layer 125, and the insulating layer 127 is positioned over each of the end portion of the pixel electrode 111*a*, the end portion of the pixel electrode 111*b*, and the end portion of the pixel electrode 111*c*.

In FIG. 1B, the end portions of the pixel electrodes 111*a*, 111*b*, and 111*c* are each covered with the first layer 113 and the insulating layer 125 is in contact with the side surface of the first layer 113.

The insulating layer 127 is provided over the insulating layer 125 to fill a depressed portion in the insulating layer 125. The insulating layer 127 can be configured to overlap with the side surface and part of the top surface of the first layer 113 with the insulating layer 125 therebetween. The insulating layer 127 preferably covers at least part of the side surface of the insulating layer 125.

The insulating layer 125 and the insulating layer 127 can fill a space between adjacent island-shaped EL layers, whereby the formation surface of the layers (e.g., the carrier-injection layer and the common electrode) provided over the island-shaped EL layers can have higher flatness with small unevenness. Consequently, coverage with the carrier-injection layer, the common electrode, and the like can be improved.

The common layer 114 and the common electrode 115 are provided over the first layer 113, the mask layer 118*a*, the insulating layer 125, and the insulating layer 127. Before the insulating layer 125 and the insulating layer 127 are provided, a step is generated due to a difference between a region where the pixel electrode and the island-shaped EL layer are provided and a region where neither the pixel electrode nor the island-shaped EL layer is provided (region between the light-emitting devices). In the display device of one embodiment of the present invention, the step can be reduced with the insulating layer 125 and the insulating layer 127, and the coverage with the common layer 114 and the common electrode 115 can be improved. Thus, connection defects caused by step disconnection can be inhibited. In addition, an increase in electric resistance, which is caused by local thinning of the common electrode 115 due to the level difference, can be inhibited.

The top surface of the insulating layer 127 preferably has a shape with higher flatness, but may include a projection portion, a convex surface, a concave surface, or a depressed portion. For example, the top surface of the insulating layer 127 preferably has a smooth convex shape with high flatness.

Next, an example of materials for the insulating layer 125 and the insulating layer 127 are described.

The insulating layer 125 can be an insulating layer containing an inorganic material. As the insulating layer 125, an inorganic insulating film such as an oxide insulating film, a nitride insulating film, an oxynitride insulating film, or a nitride oxide insulating film can be used, for example. The insulating layer 125 may have a single-layer structure or a stacked-layer structure. Examples of the oxide insulating film include a silicon oxide film, an aluminum oxide film, a magnesium oxide film, an indium-gallium-zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. In particular, aluminum oxide is preferable because it has high selectivity with respect to the EL layer in etching and has a function of protecting the EL layer in forming the insulating layer 127 which is to be described later. In particular, when an inorganic insulating film such as an aluminum oxide film, a hafnium oxide film, or a silicon oxide film formed by an atomic layer deposition (ALD) method is used as the insulating layer 125, the insulating layer 125 having few pin holes and an excellent function of protecting the EL layer can be formed. The insulating layer 125 may have a stacked-layer structure of a film formed by an ALD method and a film formed by a sputtering method. The insulating layer 125 may have a stacked-layer structure of an aluminum oxide film formed by an ALD method and a silicon nitride film formed by a sputtering method, for example.

The insulating layer 125 preferably has a function of a barrier insulating layer against at least one of water and oxygen. Alternatively, the insulating layer 125 preferably has a function of inhibiting diffusion of at least one of water and oxygen. Alternatively, the insulating layer 125 preferably has a function of capturing or fixing (also referred to as gettering) at least one of water and oxygen.

Note that in this specification and the like, a barrier insulating layer refers to an insulating layer having a barrier property. A barrier property in this specification and the like means a function of inhibiting diffusion of a particular substance (also referred to as having low permeability). Alternatively, a barrier property refers to a function of capturing or fixing (also referred to as gettering) a particular substance.

When the insulating layer 125 has a function of a barrier insulating layer or a gettering function, entry of impurities (typically, at least one of water and oxygen) that would diffuse into the light-emitting devices from the outside can be inhibited. With this structure, a highly reliable light-emitting device and a highly reliable display device can be provided.

The insulating layer 125 preferably has a low impurity concentration. Accordingly, degradation of the EL layer, which is caused by entry of impurities into the EL layer from the insulating layer 125, can be inhibited. In addition, when the impurity concentration is reduced in the insulating layer 125, a barrier property against at least one of water and oxygen can be increased. For example, it is desirable that one or both of the hydrogen concentration and the carbon concentration in the insulating layer 125 be sufficiently low.

Note that for the insulating layer 125 and the mask layer 118*a*, the same material can be used. In this case, the boundary between the insulating layer 125 and the mask layer 118*a* is unclear and thus the layers cannot be distinguished from each other in some cases. Thus, the insulating layer 125 and the mask layer 118*a* are sometimes observed as one layer. In other words, in some cases, one layer is observed as being provided in contact with the side surface and part of the top surface of the first layer 113 and the insulating layer 127 is observed as covering at least part of the side surface of the one layer.

The insulating layer 127 provided over the insulating layer 125 has a function of filling large unevenness of the insulating layer 125, which is formed between the adjacent light-emitting devices. In other words, the insulating layer 127 has an effect of improving the flatness of the formation surface of the common electrode 115.

As the insulating layer 127, an insulating layer containing an organic material can be favorably used. As the organic material, a photosensitive organic resin is preferably used, and for example, a photosensitive resin composite containing an acrylic resin is preferably used. Note that in this specification and the like, an acrylic resin refers to not only a polymethacrylic acid ester or a methacrylic resin, but also all the acrylic polymer in a broad sense in some cases.

Alternatively, for the insulating layer 127, it is possible to use an acrylic resin, a polyimide resin, an epoxy resin, an imide resin, a polyamide resin, a polyimide-amide resin, a silicone resin, a siloxane resin, a benzocyclobutene-based resin, a phenol resin, precursors of these resins, or the like. Alternatively, for the insulating layer 127, it is possible to use an organic material such as polyvinyl alcohol (PVA), polyvinyl butyral, polyvinylpyrrolidone, polyethylene glycol, polyglycerin, pullulan, water-soluble cellulose, or an alcohol-soluble polyamide resin. A photoresist may be used for the photosensitive resin. As the photosensitive organic resin, either a positive material or a negative material may be used.

For the insulating layer 127, a material absorbing visible light may be used. When the insulating layer 127 absorbs light from the light-emitting device, leakage of light (stray light) from the light-emitting device to the adjacent light-emitting device through the insulating layer 127 can be inhibited. Thus, the display quality of the display device can be improved. Since no polarizing plate is required to improve the display quality, the weight and thickness of the display device can be reduced.

Examples of the material absorbing visible light include materials containing pigment of black or the like, materials containing dye, light-absorbing resin materials (e.g., polyimide), and resin materials that can be used for color filters (color filter materials). Using a resin material composed of stacked color filter materials of two colors or three or more colors is particularly preferred, in which case the effect of blocking visible light can be enhanced. In particular, mixing color filter materials of three or more colors enables the formation of a black or nearly black resin layer.

Next, a structure of the insulating layer 127 and the vicinity thereof will be described with reference to FIG. 2A and FIG. 2B. FIG. 2A is an enlarged cross-sectional view of a region including the insulating layer 127 between the light-emitting device 130*a* and the light-emitting device 130*b*, and the vicinity of the insulating layer 127. Although the insulating layer 127 between the light-emitting device 130*a* and the light-emitting device 130*b* is described below as an example, the same applies to the insulating layer 127 between the light-emitting device 130*b* and the light-emitting device 130*c*, the insulating layer 127 between the light-emitting device 130*c* and the light-emitting device 130*a*, and the like. FIG. 2B is an enlarged view of an end portion of the insulating layer 127 over the first layer 113 included in the light-emitting device 130*b* and the vicinity thereof illustrated in FIG. 2A.

As illustrated in FIG. 2A, the first layer 113 is provided to cover the pixel electrode 111*a* and another first layer 113 is provided to cover the pixel electrode 111*b*. The mask layer 118*a* is provided in contact with part of the top surface of the first layer 113, and the insulating layer 125 is provided in contact with the top surfaces and the side surfaces of the two mask layers 118*a*, the side surfaces of the two first layers 113, and the top surface of the insulating layer 255*c*. The top surfaces of the two first layers 113 are partly covered with the insulating layer 125. The insulating layer 127 is provided in contact with the top surface of the insulating layer 125. The insulating layer 127 overlaps with the side surface and part of the top surface of each of the two first layers 113 through the insulating layer 125, and is in contact with at least part of the side surface of the insulating layer 125. The common layer 114 is provided to cover the first layer 113, the mask layer 118*a*, the insulating layer 125, and the insulating layer 127, and the common electrode 115 is provided over the common layer 114.

The insulating layer 127 is formed in a region between two island-shaped EL layers (e.g., a region between the two first layers 113 in FIG. 2A). At this time, at least part of the insulating layer 127 is placed at a position interposed between an end portion of the side surface of one of the EL layers (the first layer 113) and an end portion of the side surface of the other of the EL layers (the first layer 113). Providing the insulating layer 127 in such a manner can prevent formation of a disconnected portion and a locally thinned portion in the common layer 114 and the common electrode 115 that are formed over the island-shaped EL layers and the insulating layer 127.

As illustrated in FIG. 2B, the end portion of the insulating layer 127 preferably has a tapered shape with a taper angle θ1 in the cross-sectional view of the display device. The taper angle θ1 is an angle formed by the side surface of the insulating layer 127 and the substrate surface. Note that the taper angle θ1 is not limited to the angle with the substrate surface, and may be an angle formed by the side surface of the insulating layer 127 and the top surface of the flat portion of the first layer 113 or the top surface of the flat portion of the pixel electrode 111*b*.

The taper angle θ1 of the insulating layer 127 is greater than 0° and less than 90°, preferably greater than or equal to 10°, preferably less than or equal to 60°, further preferably less than or equal to 45°, still further preferably less than or equal to 20°. When the end portion of the insulating layer 127 has such a forward tapered shape, the common layer 114 and the common electrode 115 that are provided over the insulating layer 127 can be formed with favorable coverage, thereby inhibiting step disconnection, local thinning, or the like. Accordingly, the in-place uniformity of the common layer 114 and the common electrode 115 can be improved, leading to higher display quality of the display device.

As illustrated in FIG. 2A, in a cross-sectional view of the display device, the top surface of the insulating layer 127 preferably has a convex shape. The convex shape of the top surface of the insulating layer 127 is preferably a shape gently bulged toward the center. It is also preferable that the convex portion in the center portion of the top surface of the insulating layer 127 have a shape gently connected to a tapered portion in the end portion. When the insulating layer 127 has such a shape, the common layer 114 and the common electrode 115 can be formed with good coverage over the whole insulating layer 127.

Figure 8A:
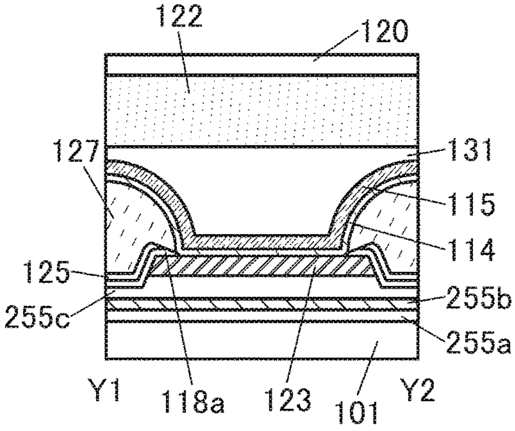
FIG. 8A to FIG. 8D are cross-sectional views illustrating examples of a display device.
Figure 8B:
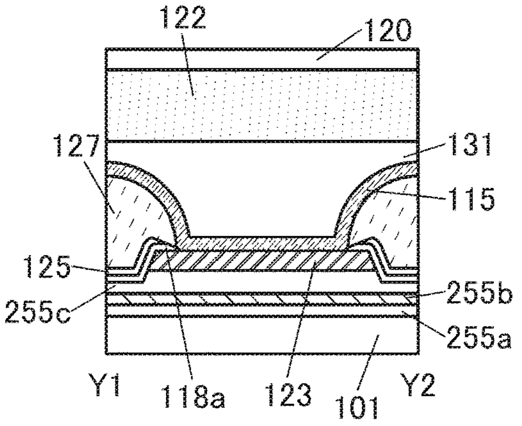
Figure 8C:
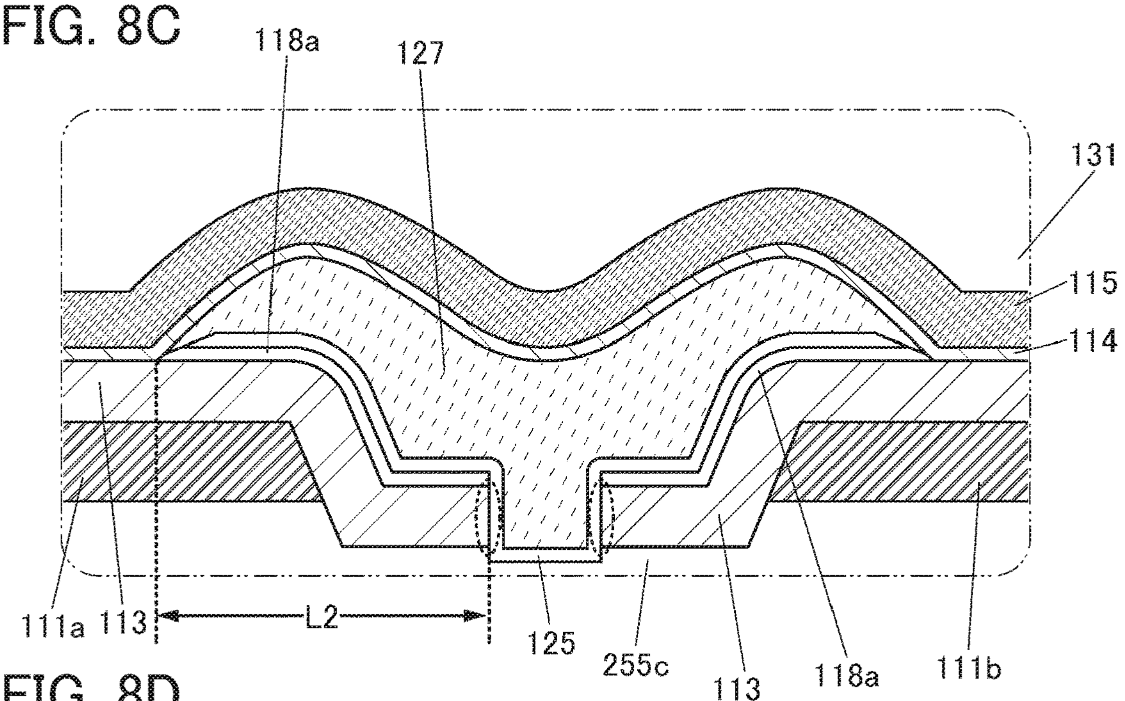

As illustrated in FIG. 8C, the top surface of the insulating layer 127 may have a concave shape in a cross-sectional view of the display device. In FIG. 8C, the top surface of the insulating layer 127 has a shape that is gently bulged toward the center, i.e., includes a convex surface, and has a shape that is recessed in the center and its vicinity, i.e., includes a concave surface. In FIG. 8C, the convex portion of the top surface of the insulating layer 127 has a shape gently connected to the tapered portion in the end portion. Even when the insulating layer 127 has such a shape, the common layer 114 and the common electrode 115 can be formed with good coverage over the whole insulating layer 127.

A structure in which the insulating layer 127 includes a concave surface in its center portion as illustrated in FIG. 8C can relieve stress generated in the insulating layer 127 in some cases. Specifically, the structure in which the insulating layer 127 includes a concave surface in its center portion can relieve local stress generated at the end portion of the insulating layer 127 and inhibit film separation in one or more of a space between the first layer 113 and the mask layer 118*a*, a space between the mask layer 118*a* and the insulating layer 125, and a space between the insulating layer 125 and the insulating layer 127.

To form a structure in which the insulating layer 127 includes a concave surface in its center portion as illustrated in FIG. 8C, a light exposure method using a multi-tone mask (typically, a half-tone mask or a gray-tone mask) can be employed. A multi-tone mask is a mask capable of light exposure of three light-exposure levels to provide an exposed portion, a half-exposed portion, and an unexposed portion, and is a light-exposure mask through which light is transmitted to have a plurality of intensities. The insulating layer 127 including regions with a plurality of (typically two kinds of) thicknesses can be formed with one photomask (one light exposure and development process).

In order to form the structure in which the insulating layer 127 includes a concave surface in its center portion, it is also possible to employ a method in which the line width of a mask at a positon where the concave surface is formed is made smaller than the line width of an exposed portion. Accordingly, the insulating layer 127 including a plurality of regions with different thicknesses can be formed.

Note that a method for forming a concave surface in the center portion of the insulating layer 127 is not limited to the above method. For example, an exposed portion and a half-exposed portion may be formed separately with the use of two photomasks. Alternatively, the viscosity of the resin material used for the insulating layer 127 may be adjusted; specifically, the viscosity of the material used for the insulating layer 127 may be less than or equal to 10 cP, preferably greater than or equal to 1 cP and less than or equal to 5 cP.

Although not illustrated, the concave surface in the center portion of the insulating layer 127 is not necessarily continuous, and may be disconnected between adjacent light-emitting devices. In this case, part of the insulating layer 127 in the center portion of the insulating layer 127 illustrated in FIG. 8C is eliminated, so that the surface of the insulating layer 125 is exposed. In the case of such a structure, the common layer 114 and the common electrode 115 are formed to have shapes covering the insulating layer 125.

As illustrated in FIG. 2B, the end portion of the insulating layer 127 is preferably positioned more outwardly than the end portion of the insulating layer 125. In this case, unevenness of the formation surface of the common layer 114 and the common electrode 115 can be reduced and coverage with the common layer 114 and the common electrode 115 can be improved.

As illustrated in FIG. 2B, the end portion of the insulating layer 125 preferably has a tapered shape with a taper angle θ2 in the cross-sectional view of the display device. The taper angle θ2 is an angle formed by the side surface of the insulating layer 125 and the substrate surface. Note that the taper angle 2 is not limited to the angle with the substrate surface, and may be an angle formed by the side surface of the insulating layer 125 and the top surface of the flat portion of the first layer 113 or the top surface of the flat portion of the pixel electrode 111*b*.

The taper angle θ2 of the insulating layer 125 is greater than 0° and less than 90°, preferably greater than or equal to 10°, preferably less than or equal to 60°, further preferably less than or equal to 45°, still further preferably less than or equal to 20°.

As illustrated in FIG. 2B, the end portion of the mask layer 118*a* preferably has a tapered shape with a taper angle θ3 in the cross-sectional view of the display device. The taper angle θ3 is an angle formed by the side surface of the mask layer 118*a* and the substrate surface. Note that the taper angle θ3 is not limited to the angle with the substrate surface, and may be an angle formed by the side surface of the insulating layer 127 and the top surface of the flat portion of the first layer 113 or the top surface of the flat portion of the pixel electrode 111*b*.

The taper angle θ3 of the mask layer 118*a* is greater than 0° and less than 90°, preferably greater than or equal to 10°, preferably less than or equal to 60°, further preferably less than or equal to 45°, still further preferably less than or equal to 20°. When the mask layer 118*a* has such a forward tapered shape, the common layer 114 and the common electrode 115 that are provided over the mask layer 118*a* can be formed with favorable coverage.

The end portion of the mask layer 118*a* is preferably positioned more outwardly than the end portion of the insulating layer 125. In this case, unevenness of the formation surface of the common layer 114 and the common electrode 115 can be reduced and coverage with the common layer 114 and the common electrode 115 can be improved.

Although the details will be described in Embodiment 2, when the insulating layer 125 and the mask layer 118*a* are collectively etched, the insulating layer 125 and the mask layer below the end portion of the insulating layer 127 are eliminated by side etching and accordingly a cavity (also referred to as a hole) is formed in some cases. The cavity causes unevenness in the formation surface of the common layer 114 and the common electrode 115, so that step disconnection is likely to occur in the common layer 114 and the common electrode 115. Thus, the etching treatment is performed in two separate steps with heat treatment performed between the two etching steps, whereby even when a cavity is formed by the first etching treatment, the cavity can be filled with the insulating layer 127 deformed by the heat treatment. In addition, since the second etching treatment etches a thin film, the amount of side etching is small and thus a cavity is not easily formed, and even if a cavity is formed, it can be extremely small. Thus, generation of unevenness in the formation surface of the common layer 114 and the common electrode 115 can be inhibited and accordingly step disconnection of the common layer 114 and the common electrode 115 can be inhibited. Since the etching treatment is performed twice as described above, the taper angle θ2 and the taper angle θ3 might be different angles. The taper angle θ2 and the taper angle 83 may be the same angle. Each of the taper angle θ2 and the taper angle θ3 might be an angle less than the taper angle θ1.

The insulating layer 127 covers at least part of the side surface of the mask layer 118*a* in some cases. For example, FIG. 2B illustrates an example in which the insulating layer 127 covers to be in contact with an inclined surface (an upper inclined surface) positioned at an end portion of the mask layer 118*a* which is formed by the first etching treatment, and an inclined surface (a lower inclined surface) positioned at an end portion of the mask layer 118*a* which is formed by the second etching treatment is exposed. In some cases, these two inclined surfaces can be distinguished from each other depending on their different taper angles. There might be almost no difference between the taper angles formed at the side surfaces by the two etching steps; in this case, the inclined surfaces cannot be distinguished from each other.

Figure 3A:
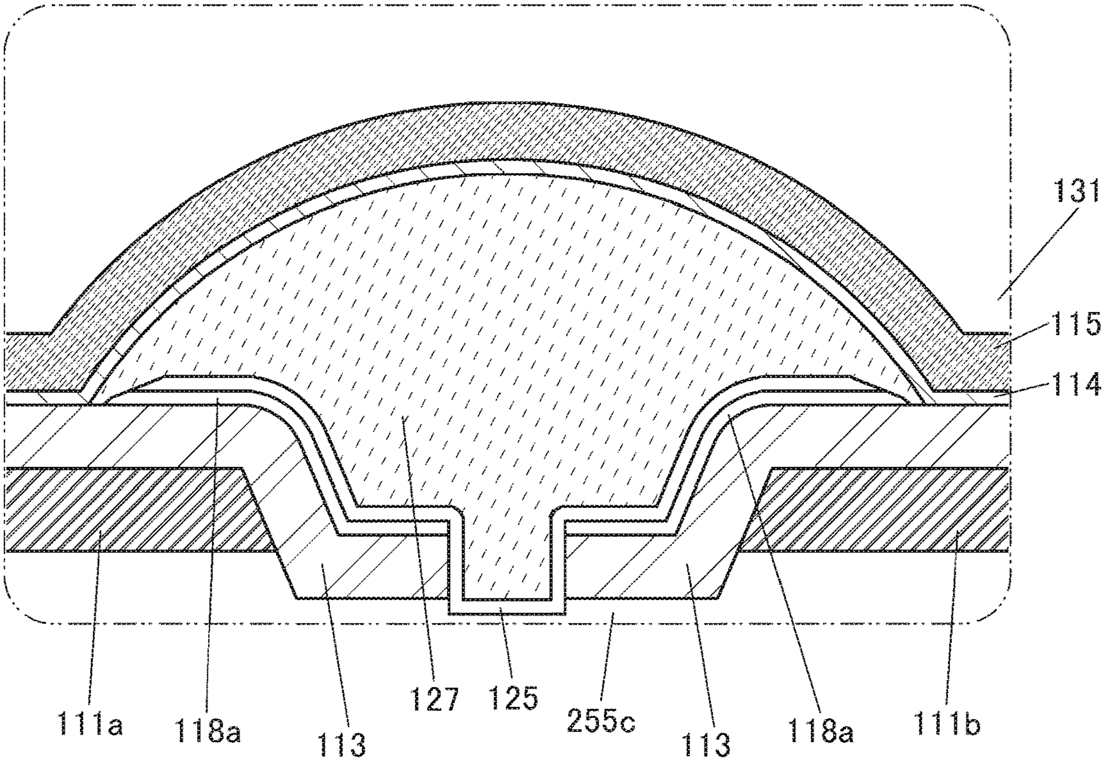
FIG. 3A and FIG. 3B are cross-sectional views illustrating an example of a display device.
Figure 3B:
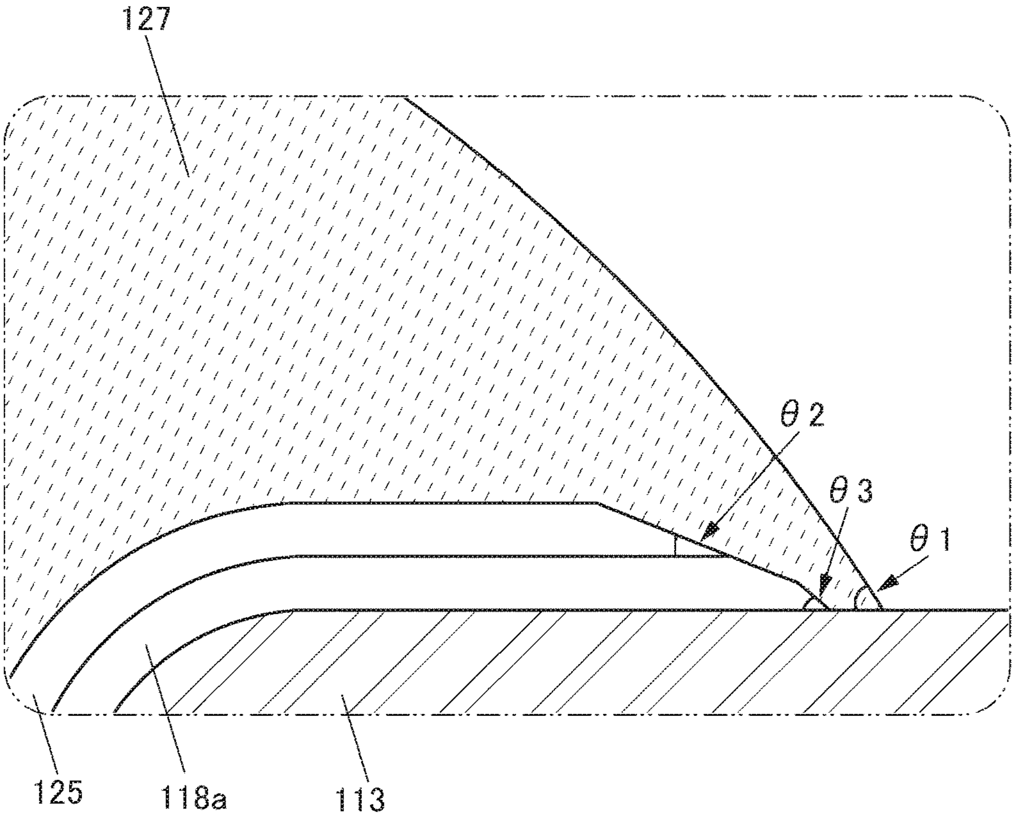

FIG. 3A and FIG. 3B illustrate an example in which the insulating layer 127 covers the entire side surface of the mask layer 118*a*. Specifically, in FIG. 3B, the insulating layer 127 covers to be in contact with both of the two inclined surfaces. This is preferable because unevenness of the formation surface of the common layer 114 and the common electrode 115 can be further reduced. FIG. 3B illustrates an example in which the end portion of the insulating layer 127 is positioned more outwardly than the end portion of the mask layer 118*a*. As illustrated in FIG. 2B, the end portion of the insulating layer 127 may be positioned more inwardly than the end portion of the mask layer 118*a*, or may be aligned or substantially aligned with the end portion of the mask layer 118*a*. As illustrated in FIG. 3B, the insulating layer 127 is in contact with the first layer 113 in some cases.

FIG. 4A, FIG. 4B, FIG. 5A, and FIG. 5B illustrate examples in which the side surface of the insulating layer 127 has a concave shape (also referred to as a narrowed portion, a depressed portion, a dent, a hollow, or the like). Depending on the materials and the formation conditions (e.g., heating temperature, heating time, and heating atmosphere) of the insulating layer 127, the side surface of the insulating layer 127 has a concave shape in some cases.

Figure 4A:
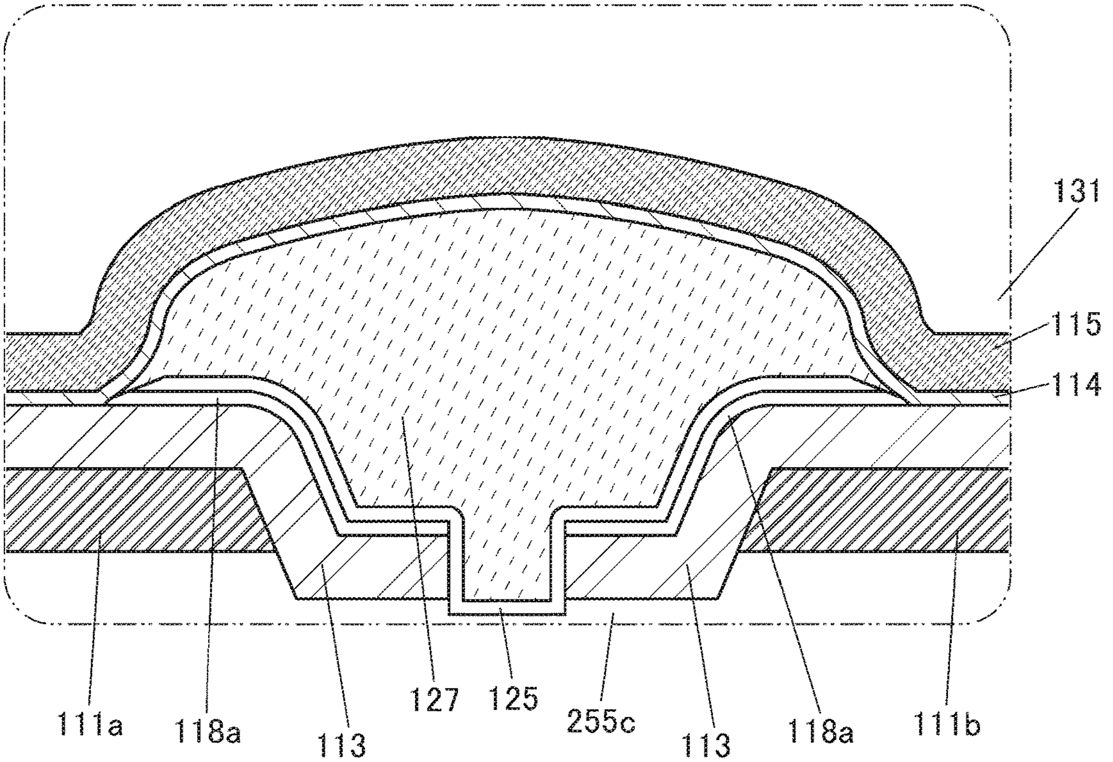
FIG. 4A and FIG. 4B are cross-sectional views illustrating an example of a display device.
Figure 4B:
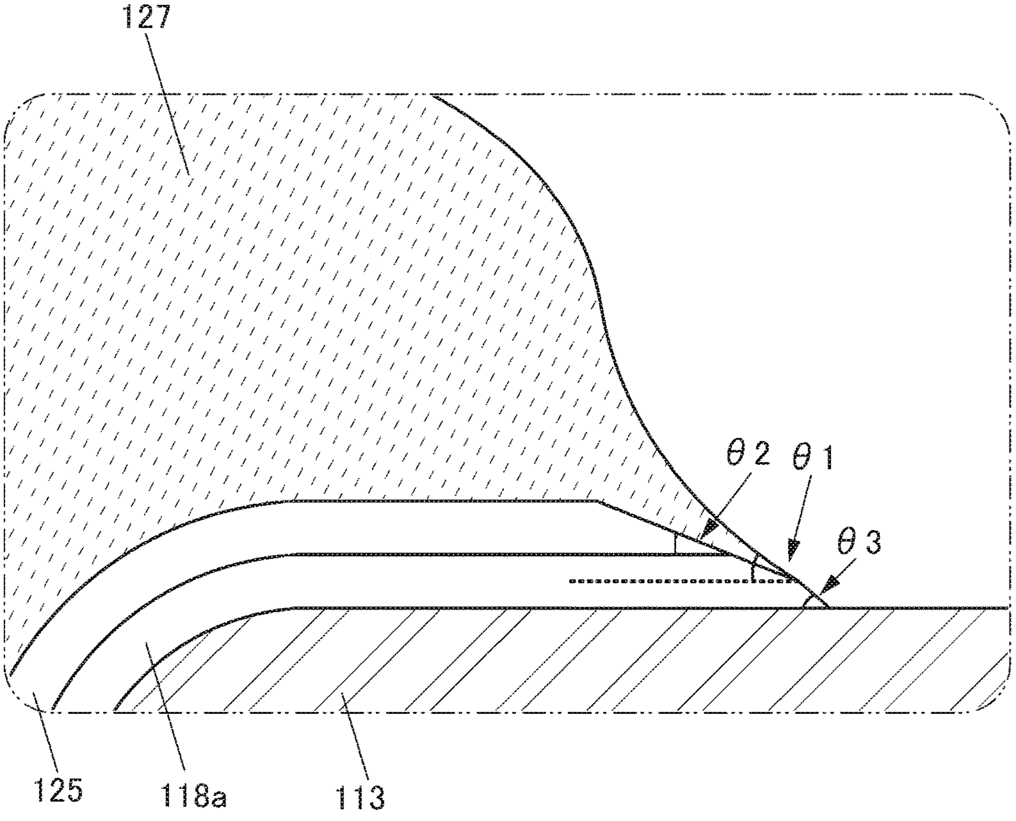
Figure 5A:
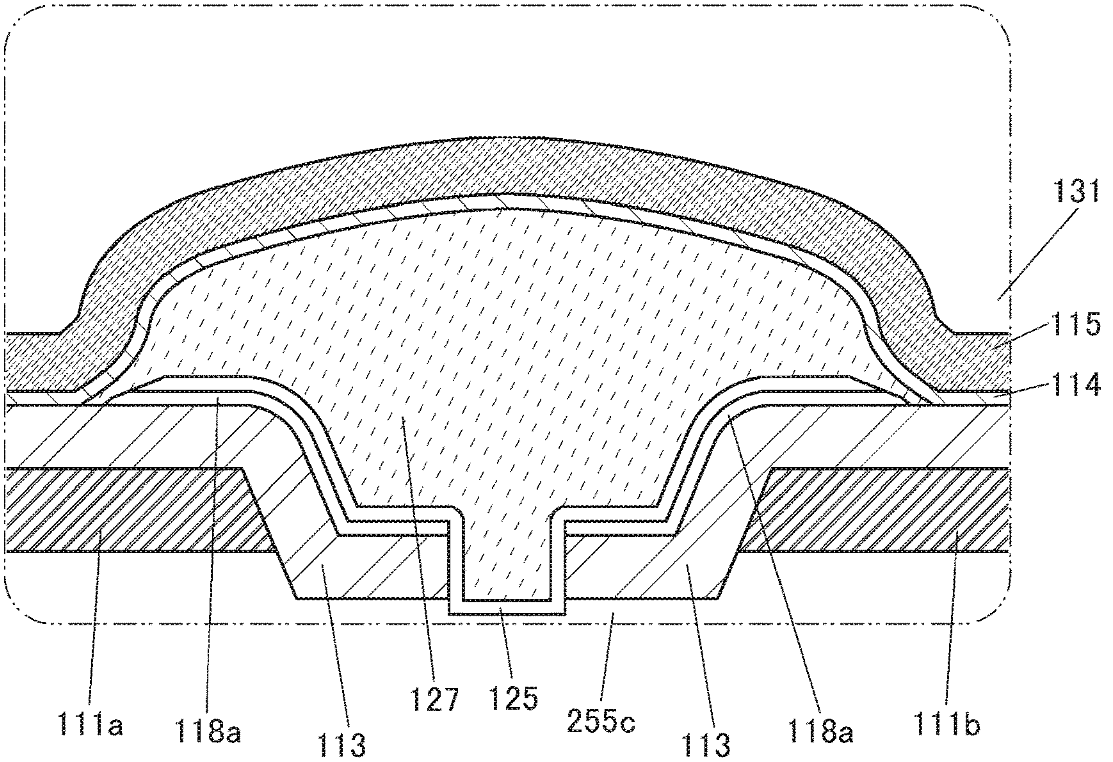
FIG. 5A and FIG. 5B are cross-sectional views illustrating an example of a display device.
Figure 5B:
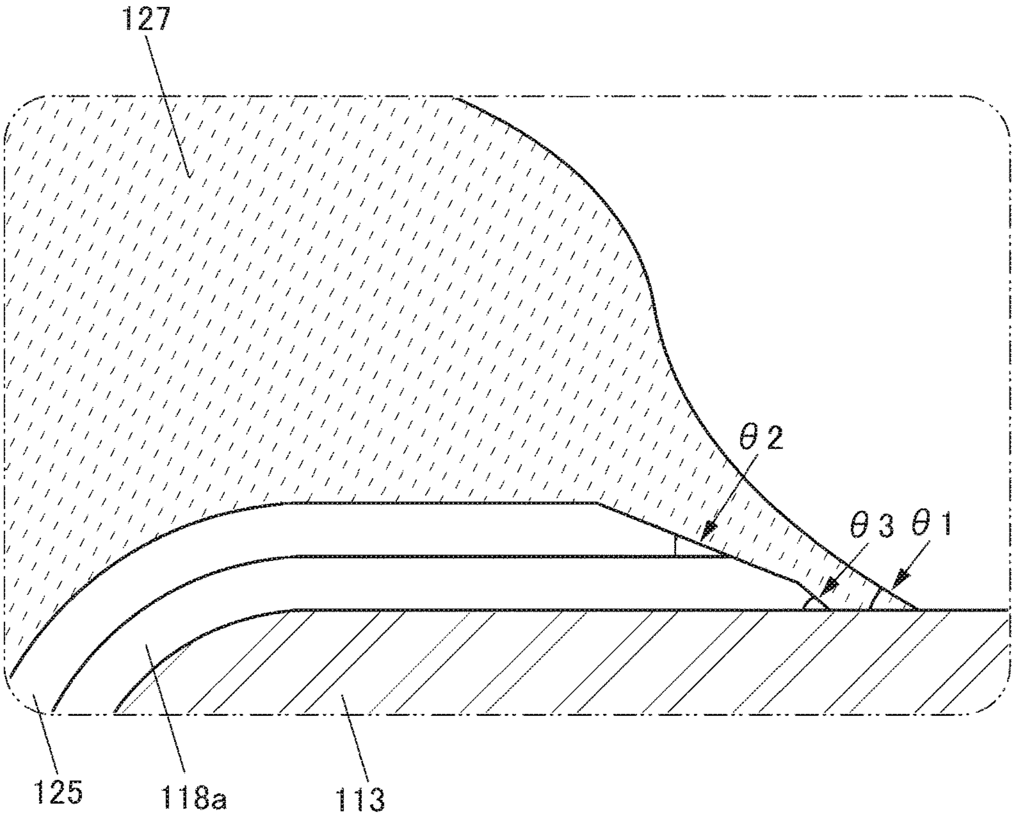

FIG. 4A and FIG. 4B illustrate an example in which the insulating layer 127 covers part of the side surface of the mask layer 118*a* and the other part of the side surface of the mask layer 118*a* is exposed. FIG. 5A and FIG. 5B illustrate an example in which the insulating layer 127 covers to be in contact with the entire side surface of the mask layer 118*a*.

Also in FIG. 3 to FIG. 5, the taper angle θ1 to the taper angle θ3 are preferably within the above range.

As illustrated in FIG. 2 to FIG. 5, one end portion of the insulating layer 127 preferably overlaps with the top surface of the pixel electrode 111*a* and the other end portion of the insulating layer 127 preferably overlaps with the top surface of the pixel electrode 111*b*. Such a structure enables the end portion of the insulating layer 127 to be formed over a flat or substantially flat region of the first layer 113. This makes it relatively easy to form a tapered shape in each of the insulating layer 127, the insulating layer 125, and the mask layer 118*a*. In addition, film separation of the pixel electrodes 111*a* and 111*b* and the first layer 113 can be inhibited. Meanwhile, a portion where the top surface of the pixel electrode and the insulating layer 127 overlap with each other is preferably smaller because the light-emitting region of the light-emitting device can be wider and the aperture ratio can be higher.

Note that the insulating layer 127 does not necessarily overlap with the top surface of the pixel electrode. As illustrated in FIG. 6A, the insulating layer 127 does not necessarily overlap with the top surface of the pixel electrode, and one end portion of the insulating layer 127 may overlap with the side surface of the pixel electrode 111*a* and the other end portion of the insulating layer 127 may overlap with the side surface of the pixel electrode 111*b*. As illustrated in FIG. 6B, the insulating layer 127 does not necessarily overlap with the pixel electrode, and may be provided in a region interposed between the pixel electrode 111*a* and the pixel electrode 111*b*. In FIG. 6A and FIG. 6B, part or the whole of the top surface of the first layer 113 in the inclined portion and the flat portion (the region 103) positioned on the outer side of the top surface of the pixel electrode is covered with the mask layer 118*a*, the insulating layer 125, and the insulating layer 127. Even such a structure can reduce unevenness of the formation surface of the common layer 114 and the common electrode 115 and improve the coverage with the common layer 114 and the common electrode 115, as compared with the structure in which the mask layer 118*a*, the insulating layer 125, and the insulating layer 127 are not provided. Note that the region 103 can be referred to as a dummy region.

As described above, in the structures illustrated in FIG. 2 to FIG. 6 and FIG. 8C, providing the insulating layer 127, the insulating layer 125, and the mask layer 118*a* enables the common layer 114 and the common electrode 115 to be formed with favorable coverage from the flat or substantially flat region of the first layer 113 included in a light-emitting device to the flat or substantially flat region of the first layer 113 included in an adjacent light-emitting device. It is also possible to prevent formation of a disconnected portion and a locally thinned portion in the common layer 114 and the common electrode 115. This can inhibit the common layer 114 and the common electrode 115 between light-emitting devices from having connection defects due to the disconnected portion and an increased electric resistance due to the locally thinned portion. Thus, the display quality of the display device of one embodiment of the present invention can be improved.

The protective layer 131 is preferably provided over the light-emitting devices 130*a*, 130*b*, and 130*c*. Providing the protective layer 131 can improve the reliability of the light-emitting devices. The protective layer 131 may have a single-layer structure or a stacked-layer structure, and may have a stacked-layer structure including two or more layers.

There is no limitation on the conductivity of the protective layer 131. As the protective layer 131, at least one type of insulating films, semiconductor films, and conductive films can be used.

The protective layer 131 including an inorganic film can inhibit deterioration of the light-emitting devices by preventing oxidation of the common electrode 115 and inhibiting entry of impurities (e.g., moisture and oxygen) into the light-emitting devices, for example; thus, the reliability of the display device can be improved.

As the protective layer 131, an inorganic insulating film such as an oxide insulating film, a nitride insulating film, an oxynitride insulating film, or a nitride oxide insulating film can be used, for example. Specific examples of these inorganic films are as listed in the description of the insulating layer 125. In particular, the protective layer 131 preferably includes a nitride insulating film or a nitride oxide insulating film, and further preferably includes a nitride insulating film.

As the protective layer 131, an inorganic film containing In—Sn oxide (also referred to as ITO), In—Zn oxide, Ga—Zn oxide, Al—Zn oxide, indium gallium zinc oxide (In—Ga—Zn oxide, also referred to as IGZO), or the like can also be used. The inorganic film preferably has high resistance, specifically, higher resistance than the common electrode 115. The inorganic film may further contain nitrogen.

When light emitted from the light-emitting device is extracted through the protective layer 131, the protective layer 131 preferably has a high visible-light-transmitting property. For example, ITO, IGZO, and aluminum oxide are preferable because they are inorganic materials having a high visible-light-transmitting property.

The protective layer 131 can employ, for example, a stacked-layer structure of an aluminum oxide film and a silicon nitride film over the aluminum oxide film, or a stacked-layer structure of an aluminum oxide film and an IGZO film over the aluminum oxide film. Such a stacked-layer structure can inhibit entry of impurities (e.g., water and oxygen) into the EL layer.

Furthermore, the protective layer 131 may include an organic film. For example, the protective layer 131 may include both an organic film and an inorganic film. Examples of an organic material that can be used for the protective layer 131 include organic insulating materials that can be used for the insulating layer 127.

The protective layer 131 may have a stacked structure of two layers which are formed by different film formation methods. Specifically, the first layer of the protective layer 131 may be formed by an ALD method, and the second layer of the protective layer 131 may be formed by a sputtering method.

The coloring layer is a colored layer that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used. For each coloring layer, one or more of a metal material, a resin material, a pigment, and a dye can be used. Each coloring layer is formed in a desired position by a printing method, an ink-jet method, an etching method using a photolithography method, or the like.

A light-blocking layer may be provided on the surface of the substrate 120 on the resin layer 122 side. Moreover, a variety of optical members can be provided on the outer surface of the substrate 120. Examples of optical members include a polarizing plate, a retardation plate, a light diffusion layer (e.g., a diffusion film), an anti-reflective layer, and a light-condensing film. Furthermore, a surface protective layer such as an antistatic film inhibiting the attachment of dust, a water repellent film inhibiting the attachment of stain, a hard coat film inhibiting generation of a scratch caused by the use, or an impact-absorbing layer may be provided on the outer surface of the substrate 120. For example, it is preferable to provide, as the surface protective layer, a glass layer or a silica layer ($SiO_x$ layer) because the surface contamination and generation of damage can be inhibited. For the surface protective layer, DLC (diamond like carbon), aluminum oxide ($AlO_x$), a polyester-based material, a polycarbonate-based material, or the like may be used. For the surface protective layer, a material having a high visible-light-transmitting property is preferably used. For the surface protective layer, a material with high hardness is preferably used.

For the substrate 120, glass, quartz, ceramic, sapphire, a resin, a metal, an alloy, a semiconductor, or the like can be used. For the substrate through which light from the light-emitting device is extracted, a material that transmits the light is used. When a flexible material is used for the substrate 120, the flexibility of the display device can be increased and a flexible display can be provided. Furthermore, a polarizing plate may be used as the substrate 120.

For the substrate 120, it is possible to use polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, cellulose nanofiber, and the like. Glass that is thin enough to have flexibility may be used as the substrate 120.

In the case where a circularly polarizing plate overlaps with the display device, a highly optically isotropic substrate is preferably used as the substrate included in the display device. A highly optically isotropic substrate has a low birefringence (i.e., a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of a highly optically isotropic film include a triacetyl cellulose (TAC, also referred to as cellulose triacetate) film, a cycloolefin polymer (COP) film, a cycloolefin copolymer (COC) film, and an acrylic film.

In the case where a film is used as the substrate and the film absorbs water, the shape of the display device might be changed, e.g., creases might be caused. Thus, as the substrate, a film with a low water absorption rate is preferably used. For example, a film with a water absorption rate lower than or equal to 1% is preferably used, a film with a water absorption rate lower than or equal to 0.1% is further preferably used, and a film with a water absorption rate lower than or equal to 0.01% is still further preferably used.

For the resin layer 122, a variety of curable adhesives such as a photocurable adhesive like an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferable. A two-liquid-mixture-type resin may be used. An adhesive sheet or the like may be used.

As materials that can be used for a gate, a source, and a drain of a transistor and conductive layers such as wirings and electrodes included in the display device, any of metals such as aluminum, titanium, chromium, nickel, copper, yttrium, zirconium, molybdenum, silver, tantalum, and tungsten, or an alloy containing any of these metals as its main component can be given, for example. A film containing any of these materials can be used in a single layer or as a stacked-layer structure.

As a conductive material having a light-transmitting property, a conductive oxide such as indium oxide, indium tin oxide, indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, or titanium or an alloy material containing any of these metal materials. Further alternatively, a nitride of the metal material (e.g., titanium nitride) or the like may be used. Note that in the case of using the metal material or the alloy material (or the nitride thereof), the thickness is preferably set small enough to be able to transmit light. Furthermore, a stacked-layer film of the above materials can be used as a conductive layer. For example, a stacked film of indium tin oxide and an alloy of silver and magnesium, or the like is preferably used for increased conductivity. They can also be used for conductive layers such as wirings and electrodes included in the display device, and conductive layers (e.g., a conductive layer functioning as a pixel electrode or a counter electrode) included in a light-emitting device.

As an insulating material that can be used for each insulating layer, for example, a resin such as an acrylic resin or an epoxy resin, and an inorganic insulating material such as silicon oxide, silicon oxynitride, silicon nitride oxide, silicon nitride, or aluminum oxide can be given.

FIG. 1B illustrates an example in which the coloring layers 132R, 132G, and 132B are directly provided over the light-emitting devices 130*a*, 130*b*, and 130*c* with the protective layer 131 therebetween. With such a structure, the alignment accuracy of the light-emitting devices and the coloring layers can be improved. Furthermore, the distance between the light-emitting devices and the coloring layers is reduced, so that color mixture can be inhibited and the viewing angle characteristics can be improved, which is preferable.

FIG. 7A to FIG. 7C and FIG. 8D illustrate cross-sectional views along the dashed-dotted line X1-X2 in FIG. 1A.

Figure 7A:
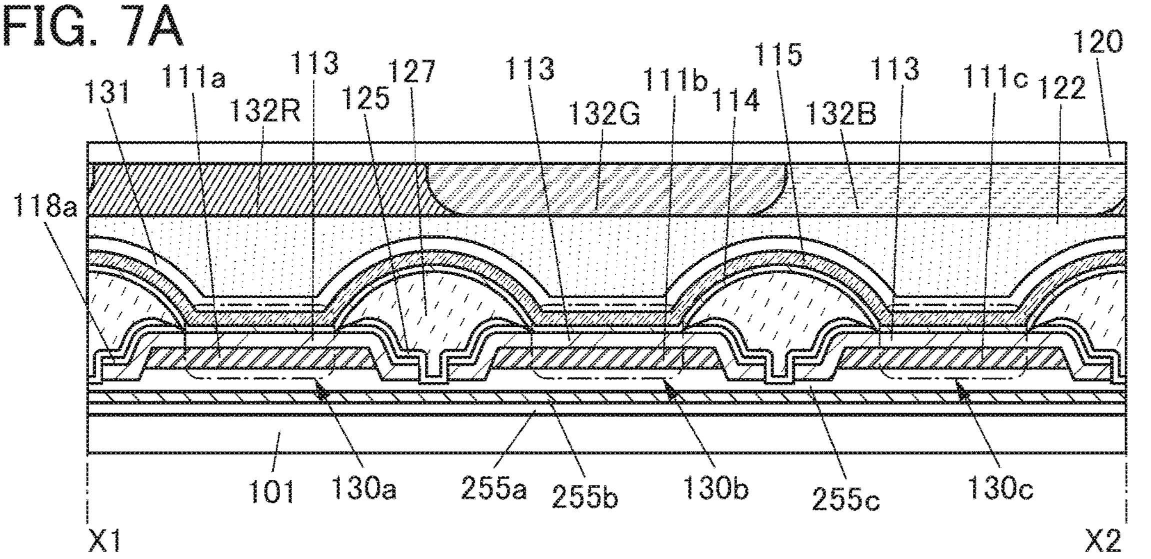
FIG. 7A to FIG. 7C are cross-sectional views illustrating examples of a display device.

As illustrated in FIG. 7A, the substrate 120 provided with the coloring layer may be bonded onto the protective layer 131 with the resin layer 122. By providing the coloring layer for the substrate 120, the heat treatment temperature in the formation step of the coloring layer can be increased.

Figure 7B:
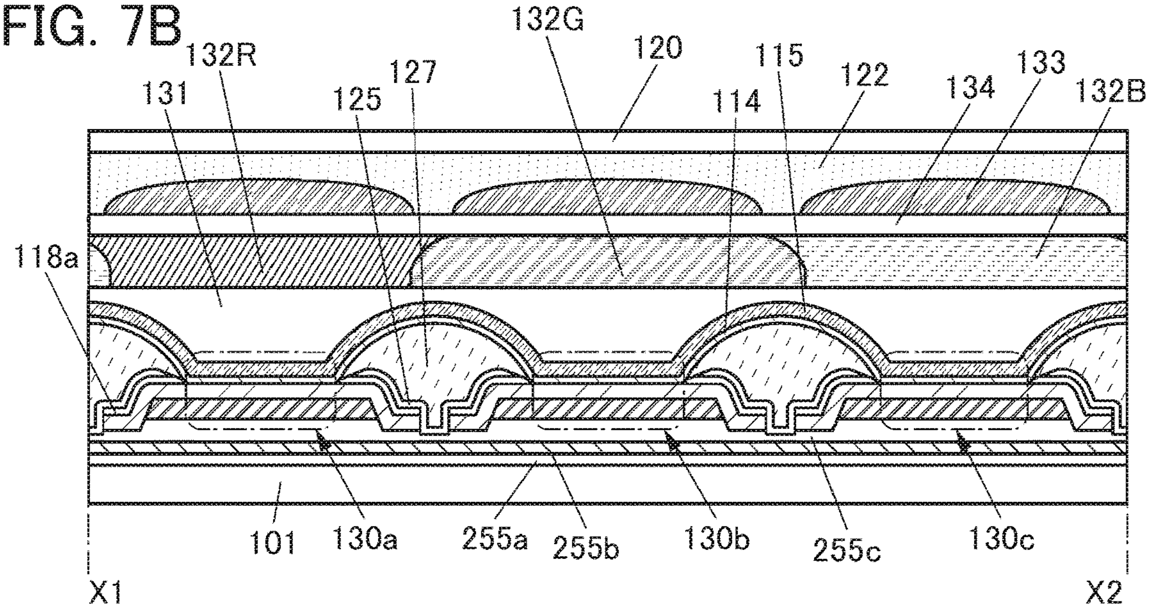
Figure 7C:
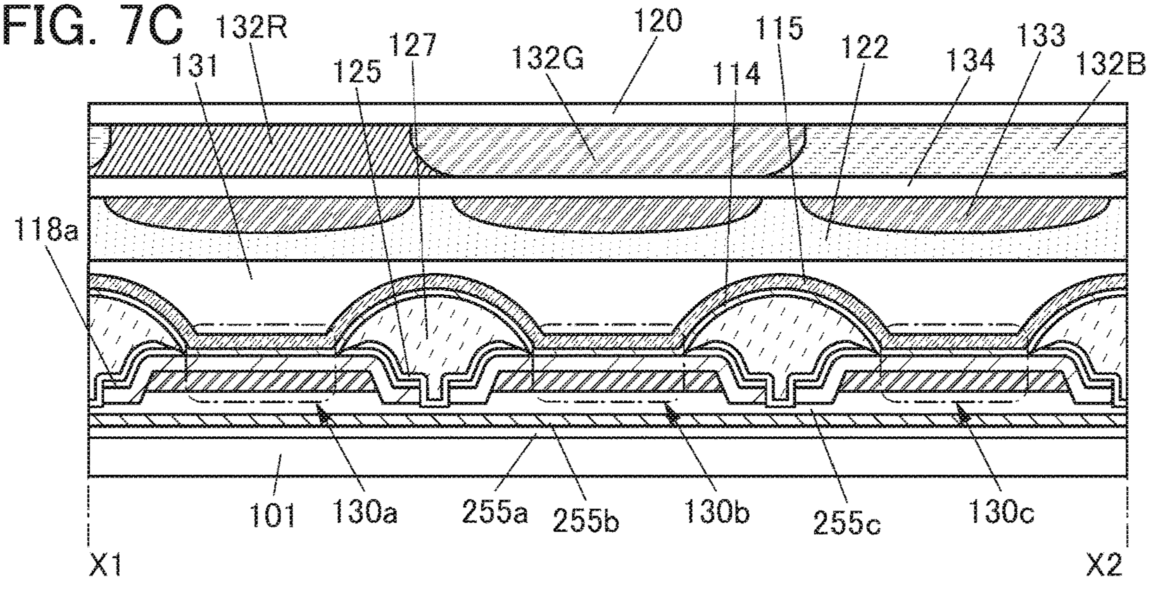

As illustrated in FIG. 7B and FIG. 7C, a lens array 133 may be provided in the display device. The lens array 133 can be provided to overlap with a light-emitting device.

FIG. 7B illustrates an example in which the coloring layers 132R, 132G, and 132B are provided over the light-emitting devices 130*a*, 130*b*, and 130*c* with the protective layer 131 therebetween, an insulating layer 134 is provided over the coloring layers 132R, 132G, and 132B, and the lens array 133 is provided over the insulating layer 134. The coloring layer 132R, the coloring layer 132G, the coloring layer 132B, and the lens array 133 are directly formed over the substrate provided with the light-emitting devices, whereby the accuracy of positional alignment of the light-emitting devices and the coloring layers or the lens array can be improved.

For the insulating layer 134, one or both of an inorganic insulating film and an organic insulating film can be used. The insulating layer 134 may have either a single-layer structure or a stacked-layer structure. For the insulating layer 134, a material that can be used for the protective layer 131 can be used, for example. Light emitted by the light-emitting device is extracted through the insulating layer 134, so that the insulating layer 134 preferably has a high visible-light-transmitting property.

In FIG. 7B, light emitted by the light-emitting device passes through the coloring layer and then passes through the lens array 133, resulting in being extracted to the outside of the display device. The distance between the light-emitting device and the coloring layers is reduced, so that color mixture can be inhibited and the viewing angle characteristics can be improved, which is preferable. Note that the lens array 133 may be provided over the light-emitting device and the coloring layer may be provided over the lens array 133.

FIG. 7C illustrates an example in which the substrate 120 provided with the coloring layer 132R, the coloring layer 132G, the coloring layer 132B, and the lens array 133 is bonded onto the protective layer 131 with the resin layer 122. The substrate 120 is provided with the coloring layer 132R, the coloring layer 132G, the coloring layer 132B, and the lens array 133, whereby the heat treatment temperature in the forming process of them can be increased.

In the example illustrated in FIG. 7C, the coloring layers 132R, 132G, and 132B are provided in contact with the substrate 120, the insulating layer 134 is provided in contact with the coloring layers 132R, 132G, and 132B, and the lens array 133 is provided in contact with the insulating layer 134.

In FIG. 7C, light emitted by the light-emitting device passes through the lens array 133 and then passes through the coloring layer, resulting in being extracted to the outside of the display device. Note that the lens array 133 may be provided in contact with the substrate 120, the insulating layer 134 may be provided in contact with the lens array 133, and the coloring layer may be provided in contact with the insulating layer 134. In this case, light emitted by the light-emitting device passes through the coloring layer and then passes through the lens array 133, resulting in being extracted to the outside of the display device. Note that it is preferable that a region where the coloring layer 132R and the coloring layer 132G overlap with each other be provided between adjacent lens arrays 133, as illustrated in FIG. 7B and FIG. 7C. Providing a region where coloring layers of different colors overlap with each other can inhibit color mixture of light emitted from the light-emitting devices.

Figure 8D:
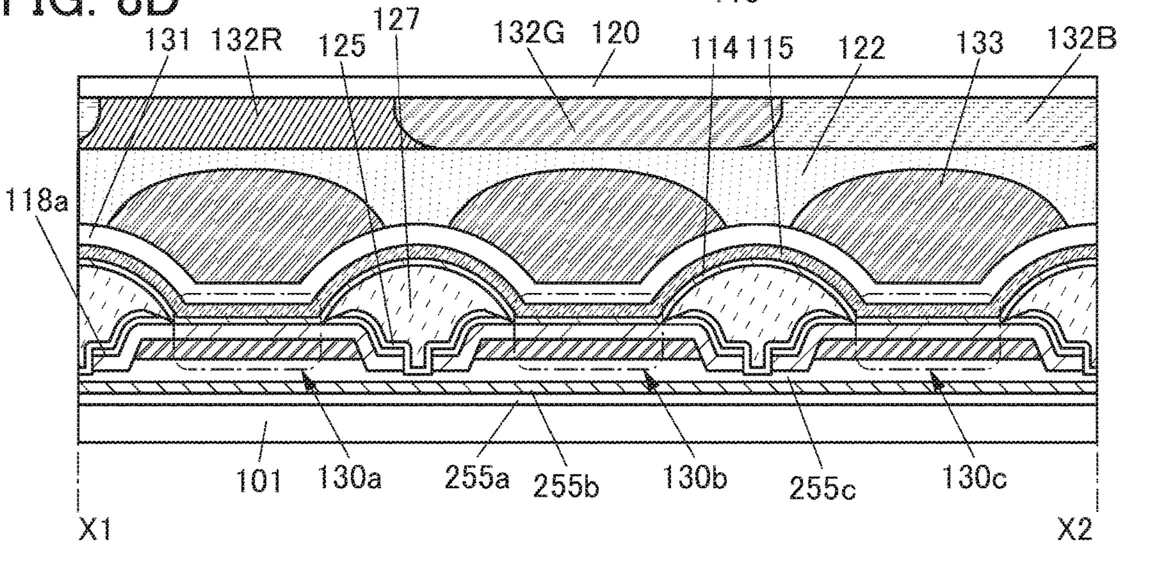

FIG. 8D illustrates an example in which the lens array 133 is provided over the light-emitting devices 130*a*, 130*b*, and 130*c* with the protective layer 131 therebetween, and the substrate 120 provided with the coloring layer 132R, the coloring layer 132G, and the coloring layer 132B is bonded onto the lens array 133 and the protective layer 131 with the resin layer 122.

Unlike in FIG. 8D, the lens array 133 may be provided over the substrate 120 and the coloring layer may be formed directly over the protective layer 131. In this manner, one of the lens array and the coloring layer may be provided over the protective layer 131 and the other may be provided over the substrate 120.

Although FIG. 7A to FIG. 7C illustrate an example in which a layer having a planarization function is used as the protective layer 131, the protective layer 131 does not necessarily have a planarization function as illustrated in FIG. 8D. For example, when an organic film is used as the protective layer 131, the top surface of the protective layer 131 can be flat. Alternatively, the protective layer 131 illustrated in FIG. 8D can be formed using an inorganic film, for example.

The lens array 133 may include a convex surface facing the substrate 120 side or a convex surface facing the light-emitting device side.

The lens array 133 can be formed using at least one of an inorganic material and an organic material. For example, a material containing a resin can be used for the lens. Moreover, a material containing at least one of an oxide and a sulfide can be used for the lens. As the lens array 133, a microlens array can be used, for example. The lens array 133 may be directly formed over the substrate or the light-emitting device. Alternatively, a lens array separately formed may be bonded thereto.

Figure 9A:
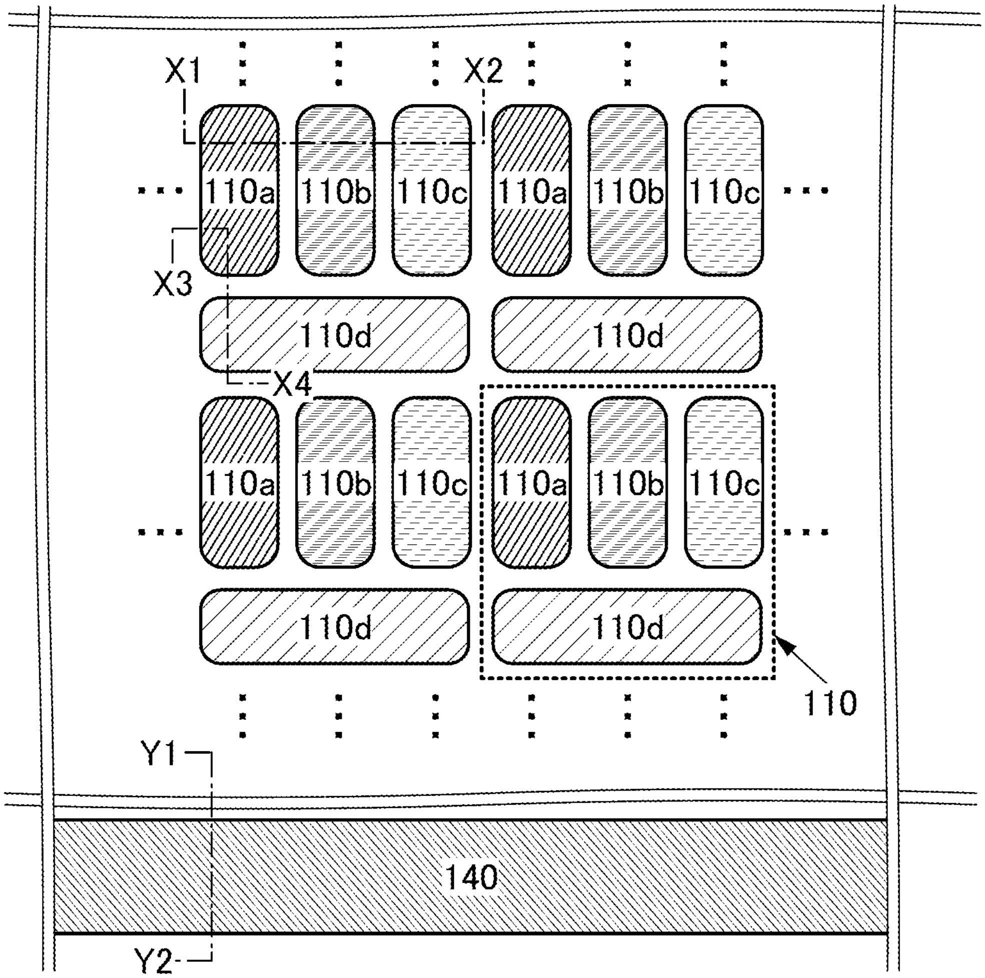
FIG. 9A is a top view illustrating an example of a display device.

FIG. 9A illustrates a top view of the display device 100 different from that in FIG. 1A. The pixel 110 illustrated in FIG. 9A is composed of four subpixels: the subpixel 110*a*, the subpixel 110*b*, the subpixel 110*c*, and a subpixel 110*d*.

The subpixels 110*a*, 110*b*, 110*c*, and 110*d* can be configured to include light-emitting devices emitting light of different colors. The subpixels 110*a*, 110*b*, 110*c*, and 110*d* are subpixels of four colors of R, G, B, and W, subpixels of four colors of R, G, B, and Y, or subpixels of four types of R, G, B, and IR, for example.

The display device of one embodiment of the present invention may include a light-receiving device in the pixel.

Three of the four subpixels included in the pixel 110 illustrated in FIG. 9A may each be configured to include a light-emitting device and the other one may be configured to include a light-receiving device.

For example, a pn or pin photodiode can be used as the light-receiving device. The light-receiving device functions as a photoelectric conversion device (also referred to as a photoelectric conversion element) that detects light entering the light-receiving device and generates electric charge. The amount of electric charge generated from the light-receiving device depends on the amount of light entering the light-receiving device.

The light-receiving device can detect one or both of visible light and infrared light. In the case of detecting visible light, for example, one or more of blue light, violet light, bluish violet light, green light, yellowish green light, yellow light, orange light, red light, and the like can be detected. The infrared light is preferably detected because an object can be detected even in a dark environment.

It is particularly preferable to use an organic photodiode including a layer containing an organic compound as the light-receiving device. An organic photodiode, which is easily made thin, lightweight, and large in area and has a high degree of freedom for shape and design, can be used for a variety of display devices.

In one embodiment of the present invention, an organic EL device is used as the light-emitting device, and an organic photodiode is used as the light-receiving device. The organic EL device and the organic photodiode can be formed over the same substrate. Thus, the organic photodiode can be incorporated in the display device including the organic EL device.

The light-receiving device is driven by application of reverse bias between the pixel electrode and the common electrode, whereby light entering the light-receiving device can be detected and electric charge can be generated and extracted as a current.

A manufacturing method similar to that for the light-emitting device can be employed for the light-receiving device. An island-shaped active layer (also referred to as a photoelectric conversion layer) included in the light-receiving device is formed by processing a film to be the active layer formed on the entire surface, not by using a fine metal mask; thus, the island-shaped active layer can be formed to have a uniform thickness. Moreover, providing the mask layer over the active layer can reduce damage to the active layer in the manufacturing process of the display device, resulting in an improvement in reliability of the light-receiving device.

Embodiment 7 can be referred to for the structure and the materials of the light-receiving device.

Figure 9B:
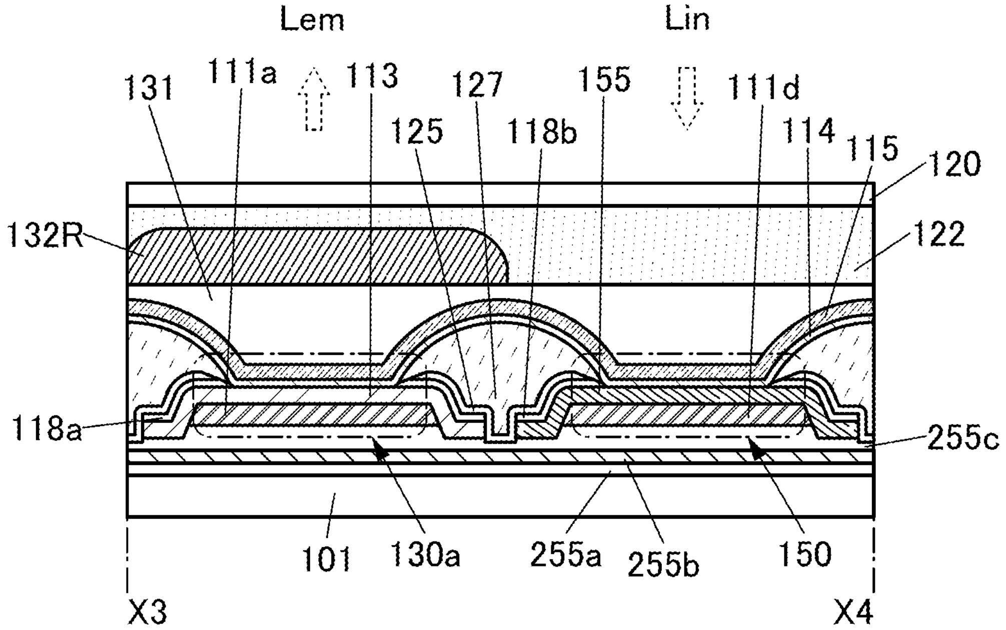
FIG. 9B is a cross-sectional view illustrating the example of the display device.

FIG. 9B illustrates a cross-sectional view along the dashed-dotted line X3-X4 in FIG. 9A. FIG. 1B can be referred to for a cross-sectional view along the dashed-dotted line X1-X2 in FIG. 9A, and FIG. 8A or FIG. 8B can be referred to for a cross-sectional view along the dashed-dotted line Y1-Y2.

As illustrated in FIG. 9B, in the display device 100, an insulating layer is provided over the layer 101 including transistors, the light-emitting device 130*a* and a light-receiving device 150 are provided over the insulating layer, the protective layer 131 is provided to cover the light-emitting device and the light-receiving device, the coloring layers 132R, 132G, and 132B are provided over the protective layer 131, and the substrate 120 is bonded onto the coloring layers 132R, 132G, and 132B with the resin layer 122. In a region between the light-emitting device and the light-receiving device adjacent to each other, the insulating layer 125 and the insulating layer 127 over the insulating layer 125 are provided.

FIG. 9B illustrates an example in which light is emitted from the light-emitting device 130*a* to the substrate 120 side and light enters the light-receiving device 150 from the substrate 120 side (see light Lem and light Lin).

The structure of the light-emitting device 130*a* is as described above.

The light-receiving device 150 includes a pixel electrode 111*d* over the insulating layer 255*c*, a second layer 155 over the pixel electrode 111*d*, the common layer 114 over the second layer 155, and the common electrode 115 over the common layer 114. The second layer 155 includes at least an active layer.

Here, the second layer 155 includes at least an active layer, preferably includes a plurality of functional layers. Examples of the functional layer include carrier-transport layers (a hole-transport layer and an electron-transport layer) and carrier-blocking layers (a hole-blocking layer and an electron-blocking layer). In addition, one or more layers are preferably provided over the active layer. A layer between the active layer and the mask layer can inhibit the active layer from being exposed on the outermost surface during the manufacturing process of the display device and can reduce damage to the active layer. Accordingly, the reliability of the light-receiving device 150 can be improved. Thus, the second layer 155 preferably includes an active layer and a carrier-blocking layer (a hole-blocking layer or an electron-blocking layer) or a carrier-transport layer (an electron-transport layer or a hole-transport layer) over the active layer.

The second layer 155 is a layer provided in the light-receiving device 150, not in the light-emitting devices. Note that the functional layer other than the active layer included in the second layer 155 may include the same material as the functional layer other than the light-emitting layer included in the first layer 113. Meanwhile, the common layer 114 is a continuous layer shared by the light-emitting device and the light-receiving device.

Here, a layer used in common to the light-receiving device and the light-emitting device may have different functions in the light-emitting device and the light-receiving device. In this specification, the name of a component is based on its function in the light-emitting device in some cases. For example, a hole-injection layer functions as a hole-injection layer in the light-emitting device and functions as a hole-transport layer in the light-receiving device. Similarly, an electron-injection layer functions as an electron-injection layer in the light-emitting device and functions as an electron-transport layer in the light-receiving device. A layer used in common to the light-receiving device and the light-emitting device may have the same function in both the light-emitting device and the light-receiving device. The hole-transport layer functions as a hole-transport layer in both the light-emitting device and the light-receiving device, and the electron-transport layer functions as an electron-transport layer in both the light-emitting device and the light-receiving device.

The mask layer 118*a* is positioned between the first layer 113 and the insulating layer 125, and a mask layer 118*b* is positioned between the second layer 155 and the insulating layer 125. The mask layer 118*a* is a remaining part of a mask layer provided over the first layer 113 at the time of processing the first layer 113. The mask layer 118*b* is a remaining part of a mask layer provided in contact with the top surface of the second layer 155 at the time of processing the second layer 155, which is a layer including the active layer. The mask layer 118*a* and the mask layer 118*b* may contain the same material or different materials.

Although FIG. 9A illustrates an example in which an aperture ratio (also referred to as size or size of the light-emitting region or the light-receiving region) of the subpixel 110*d* is higher than those of the subpixels 110*a*, 110*b*, and 110*c*, one embodiment of the present invention is not limited thereto. The aperture ratio of each of the subpixels 110*a*, 110*b*, 110*c*, and 110*d* can be determined as appropriate. The subpixels 110*a*, 110*b*, 110*c*, and 110*d* may have different aperture ratios, or two or more of them may have the same or substantially the same aperture ratio.

The subpixel 110*d* may have a higher aperture ratio than at least one of the subpixels 110*a*, 110*b*, and 110*c*. The wide light-receiving area of the subpixel 110*d* can make it easy to detect an object in some cases. For example, in some cases, the aperture ratio of the subpixel 110*d* is higher than the aperture ratio of each of the other subpixels depending on the resolution of the display device and the circuit structure or the like of the subpixel.

The subpixel 110*d* may have a lower aperture ratio than at least one of the subpixels 110*a*, 110*b*, and 110*c*. A small light-receiving area of the subpixel 110*d* leads to a narrow image-capturing range, inhibits a blur in a capturing result, and improves the definition. Accordingly, high-resolution or high-definition image capturing can be performed, which is preferable.

As described above, the subpixel 110*d* can have a detection wavelength, a resolution, and an aperture ratio that are suitable for the intended use.

In the display device of one embodiment of the present invention, an island-shaped EL layer is provided in each light-emitting device, which can inhibit generation of a leakage current between the subpixels. This can prevent crosstalk due to unintended light emission, so that a display device with extremely high contrast can be obtained. An end portion of the island-shaped EL layer and the vicinity thereof, which might be damaged in the manufacturing process of the display device, are set as a dummy region not to be used as the light-emitting region, whereby variations in the characteristics of the light-emitting devices can be inhibited. Provision of the insulating layer having a tapered shape on its end portion between adjacent island-shaped EL layers can inhibit formation of step disconnection and prevent formation of a locally thinned portion in the common electrode at the time of forming the common electrode. This can inhibit the common layer and the common electrode from having connection defects due to the disconnected portion and an increased electric resistance due to the locally thinned portion. Thus, the display device of one embodiment of the present invention can have both a higher resolution and higher display quality.

This embodiment can be combined with the other embodiments as appropriate. In this specification, in the case where a plurality of structure examples are shown in one embodiment, the structure examples can be combined as appropriate.

Embodiment 2

In this embodiment, a method for manufacturing a display device of one embodiment of the present invention will be described with reference to FIG. 10 to FIG. 20. Note that as for a material and a formation method of each component, portions similar to the portions described in Embodiment 1 are not described in some cases. The structure of the light-emitting device will be described in detail in Embodiment 5.

FIG. 10 to FIG. 14 and FIG. 16 to FIG. 20 each illustrate a cross-sectional view along the dashed-dotted line X1-X2 and a cross-sectional view along the dashed-dotted line Y1-Y2 in FIG. 1A side by side. FIG. 15 illustrates enlarged views of the end portion of the insulating layer 127 and the vicinity thereof.

Thin films included in the display device (e.g., insulating films, semiconductor films, and conductive films) can be formed by any of a sputtering method, a chemical vapor deposition (CVD) method, a vacuum evaporation method, a pulsed laser deposition (PLD) method, an ALD method, and the like. Examples of a CVD method include a plasma-enhanced CVD (PECVD) method and a thermal CVD method. An example of a thermal CVD method is a metal organic chemical vapor deposition (MOCVD) method.

Alternatively, thin films included in the display device (e.g., insulating films, semiconductor films, and conductive films) can be formed by a wet film formation method such as spin coating, dipping, spray coating, ink-jetting, dispensing, screen printing, offset printing, a doctor knife method, slit coating, roll coating, curtain coating, or knife coating.

Specifically, for manufacture of the light-emitting device, a vacuum process such as an evaporation method and a solution process such as a spin coating method or an inkjet method can be used. Examples of an evaporation method include physical vapor deposition methods (PVD methods) such as a sputtering method, an ion plating method, an ion beam evaporation method, a molecular beam evaporation method, and a vacuum evaporation method, and a chemical vapor deposition method (CVD method). Specifically, functional layers (e.g., a hole-injection layer, a hole-transport layer, a hole-blocking layer, a light-emitting layer, an electron-blocking layer, an electron-transport layer, an electron-injection layer, and a charge-generation layer) included in the EL layer can be formed by a method such as an evaporation method (e.g., a vacuum evaporation method), a coating method (e.g., a dip coating method, a die coating method, a bar coating method, a spin coating method, or a spray coating method), or a printing method (e.g., an inkjet method, a screen printing (stencil) method, an offset printing (planography) method, a flexography (relief printing) method, a gravure printing method, or a micro-contact printing method).

Thin films included in the display device can be processed by a photolithography method or the like. Alternatively, the thin films may be processed by a nanoimprinting method, a sandblasting method, a lift-off method, or the like. Alternatively, island-shaped thin films may be directly formed by a film formation method using a shielding mask such as a metal mask.

There are the following two typical examples of photolithography methods. In one of the methods, a resist mask is formed over a thin film to be processed, the thin film is processed by etching or the like, and then the resist mask is removed. In the other method, after a photosensitive thin film is formed, light exposure and development are performed, so that the thin film is processed into a desired shape.

As light used for light exposure in a photolithography method, it is possible to use light with the i-line (wavelength: 365 nm), light with the g-line (wavelength: 436 nm), light with the h-line (wavelength: 405 nm), or combined light of any of them. Alternatively, ultraviolet rays (also referred to as ultraviolet light), KrF laser light, ArF laser light, or the like can be used. Light exposure may be performed by liquid immersion light exposure technique. As the light used for light exposure, extreme ultraviolet (EUV) light or X-rays may also be used. Furthermore, instead of the light used for light exposure, an electron beam can be used. It is preferable to use extreme ultraviolet light, X-rays, or an electron beam because extremely minute processing can be performed. Note that a photomask is not needed when light exposure is performed by scanning with a beam such as an electron beam.

For etching of thin films, a dry etching method, a wet etching method, a sandblast method, or the like can be used.

Manufacturing Method Example 1

Figure 10A:
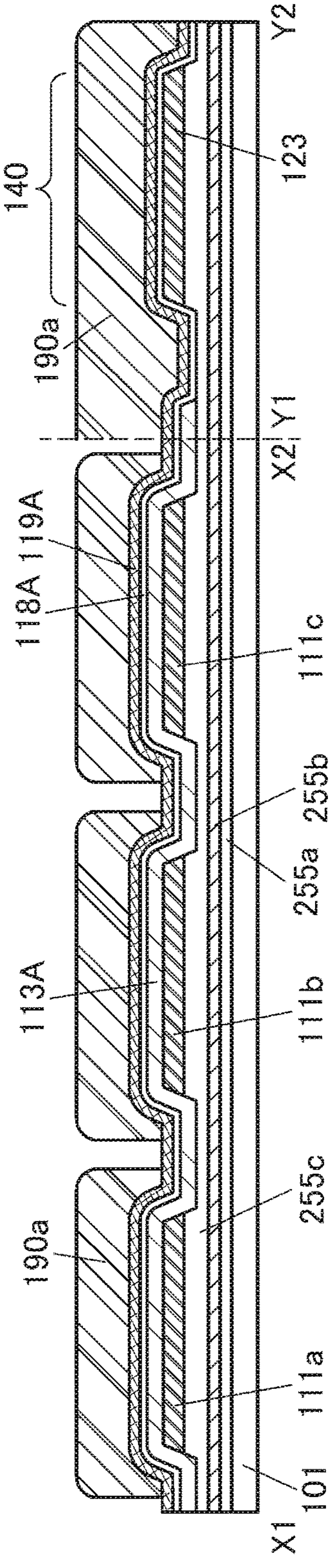
FIG. 10A to FIG. 10C are cross-sectional views illustrating an example of a method for manufacturing a display device.

First, the insulating layer 255*a*, the insulating layer 255*b*, and the insulating layer 255*c* are formed in this order over the layer 101 including transistors. Next, the pixel electrodes 111*a*, 111*b*, and 111*c* and the conductive layer 123 are formed over the insulating layer 255*c* (FIG. 10A). The pixel electrodes can be formed by a sputtering method or a vacuum evaporation method, for example.

Then, the pixel electrode is preferably subjected to hydrophobic treatment. The hydrophobic treatment can change the property of the surface of a processing target from hydrophilic to hydrophobic, or can improve the hydrophobic property of the surface of the processing target. The hydrophobic treatment for the pixel electrode can improve adhesion between the pixel electrode and a film to be formed in a later step (here, a film 113A), thereby inhibiting film separation. Note that the hydrophobic treatment is not necessarily performed.

The hydrophobic treatment can be performed by fluorine modification of the pixel electrode, for example. The fluorine modification can be performed by treatment using a gas containing fluorine, heat treatment, plasma treatment in a gas atmosphere containing fluorine, or the like. A fluorine gas can be used as the gas containing fluorine, and for example, a fluorocarbon gas can be used. As the fluorocarbon gas, a low-molecular-weight carbon fluoride gas such as a carbon tetrafluoride ($CF_4$) gas, a $C_4F_6$ gas, a $C_2F_6$ gas, a $C_4F_8$ gas, or $C_5F_8$ can be used, for example. Alternatively, as the gas containing fluorine, an $SF_6$ gas, an $NF_3$ gas, a $CHF_3$ gas, or the like can be used, for example. Moreover, a helium gas, an argon gas, a hydrogen gas, or the like can be added to any of the above gases as appropriate.

After plasma treatment is performed in a gas atmosphere containing a Group 18 element such as argon, treatment using a silylating agent is performed on the surface of the pixel electrode, so that the surface of the pixel electrode can have a hydrophobic property. As the silylating agent, hexamethyldisilazane (HMDS), trimethylsilylimidazole (TMSI), or the like can be used. Alternatively, after plasma treatment is performed in a gas atmosphere containing a Group 18 element such as argon, treatment using a silane coupling agent is performed on the surface of the pixel electrode, so that the surface of the pixel electrode can have a hydrophobic property.

Plasma treatment on the surface of the pixel electrode in a gas atmosphere containing a Group 18 element such as argon can apply damage to the surface of the pixel electrode. Accordingly, a methyl group included in the silylating agent such as HMDS is likely to bond to the surface of the pixel electrode. In addition, silane coupling by the silane coupling agent is likely to occur. As described above, treatment using a silylating agent or a silane coupling agent performed on the surface of the pixel electrode after plasma treatment in a gas atmosphere containing a Group 18 element such as argon enables the surface of the pixel electrode to have a hydrophobic property.

The treatment using a silylating agent, a silane coupling agent, or the like can be performed by application of the silylating agent, the silane coupling agent, or the like by a spin coating method, a dipping method, or the like. Alternatively, the treatment using a silylating agent, a silane coupling agent, or the like can be performed by forming a film containing the silylating agent, a film containing the silane coupling agent, or the like over the pixel electrode or the like by a gas phase method, for example. In a gas phase method, first, a material containing a silylating agent, a material containing a silane coupling agent, or the like is evaporated so that the silylating agent, the silane coupling agent, or the like is contained in an atmosphere. Next, a substrate where the pixel electrode and the like are formed is put in the atmosphere. Accordingly, a film containing the silylating agent, the silane coupling agent, or the like can be formed over the pixel electrode, so that the surface of the pixel electrode can have a hydrophobic property.

Then, the film 113A to be the first layer 113 later is formed over the pixel electrodes (FIG. 10A).

As illustrated in FIG. 10A, the film 113A is not formed over the conductive layer 123 in the cross-sectional view along the dashed-dotted line Y1-Y2. For example, by using a mask for specifying a film formation area (also referred to as an area mask, a rough metal mask, or the like to be distinguished from a fine metal mask), the film 113A can be formed only in a desired region. A light-emitting device can be manufactured through a relatively simple process, by employing a film formation step using an area mask and a processing step using a resist mask.

As described in Embodiment 1, a material with high heat resistance is used for the light-emitting device of the display device of one embodiment of the present invention. Specifically, the upper temperature limit of a compound contained in the film 113A is preferably higher than or equal to 100° C. and lower than or equal to 180° C., further preferably higher than or equal to 120° C. and lower than or equal to 180° C., still further preferably higher than or equal to 140° C. and lower than or equal to 180° C. In this case, the reliability of the light-emitting device can be improved. In addition, the upper limit of the temperature that can be applied in the manufacturing process of the display device can be increased. Therefore, the range of choices of the materials and the formation method of the display device can be widened, thereby improving the manufacturing yield and the reliability.

The film 113A can be formed by an evaporation method, specifically a vacuum evaporation method, for example. The film 113A may be formed by a method such as a transfer method, a printing method, an inkjet method, or a coating method.

Next, a mask film 118A to be the mask layer 118*a* later and a mask film 119A to be the mask layer 119*a* later are formed in this order over the film 113A and the conductive layer 123 (FIG. 10A).

Although this embodiment describes an example in which the mask film is formed with a two-layer structure of the mask film 118A and the mask film 119A, the mask film may have a single-layer structure or a stacked-layer structure of three or more layers.

Providing the mask layer over the film 113A can reduce damage to the film 113A in the manufacturing process of the display device, resulting in an improvement in reliability of the light-emitting device.

As the mask film 118A, a film highly resistant to the processing conditions of the film 113A, specifically, a film having high etching selectivity to the film 113A is used. As the mask film 119A, a film having high etching selectivity to the mask film 118A is used.

The mask film 118A and the mask film 119A are formed at a temperature lower than the upper temperature limit of the film 113A. The typical substrate temperatures in formation of the mask film 118A and the mask film 119A are lower than or equal to 200° C., preferably lower than or equal to 150° C., further preferably lower than or equal to 120° C., still further preferably lower than or equal to 100° C., yet still further preferably lower than or equal to 80° C.

Examples of indicators of the upper temperature limit include the glass transition point, the softening point, the melting point, the thermal decomposition temperature, and the 5% weight loss temperature. The upper temperature limit of the film 113A (i.e., the first layer 113) can be any of the above temperatures, preferably the lowest one among the temperatures.

As described above, a material with high heat resistance is used for the light-emitting device of the display device of one embodiment of the present invention. Thus, the substrate temperature in formation of the mask film can be higher than or equal to 100° C., higher than or equal to 120° C., or higher than or equal to 140° C. For example, an inorganic insulating film formed at a higher temperature can be a film that is denser and has a higher barrier property. Therefore, forming the mask film at such a temperature can further reduce damage to the film 113A and improve the reliability of the light-emitting device.

As each of the mask film 118A and the mask film 119A, a film that can be removed by a wet etching method is preferably used. The use of a wet etching method can reduce damage to the film 113A in processing of the mask film 118A and the mask film 119A as compared with the case of using a dry etching method.

The mask film 118A and the mask film 119A can be formed by a sputtering method, an ALD method (including a thermal ALD method and a PEALD method), a CVD method, or a vacuum evaporation method, for example. Alternatively, the aforementioned wet film formation method may be used for the formation.

The mask film 118A, which is formed over and in contact with the film 113A, is preferably formed by a formation method that causes less damage to the film 113A than a formation method of the mask film 119A. For example, the mask film 118A is preferably formed by an ALD method or a vacuum evaporation method rather than a sputtering method.

As each of the mask film 118A and the mask film 119A, it is possible to use one or more of a metal film, an alloy film, a metal oxide film, a semiconductor film, an organic insulating film, and an inorganic insulating film, for example.

For each of the mask film 118A and the mask film 119A, it is possible to use a metal material such as gold, silver, platinum, magnesium, nickel, tungsten, chromium, molybdenum, iron, cobalt, copper, palladium, titanium, aluminum, yttrium, zirconium, or tantalum or an alloy material containing any of the metal materials, for example. It is particularly preferable to use a low-melting-point material such as aluminum or silver. The use of a metal material capable of blocking ultraviolet rays for one or both of the mask film 118A and the mask film 119A is preferable, in which case the film 113A can be inhibited from being irradiated with ultraviolet rays and deterioration of the film 113A can be inhibited.

The use of a metal film or an alloy film as one or both of the mask film 118A and the mask film 119A is preferable, in which case the film 113A can be inhibited from being damaged by plasma and deterioration of the film 113A can be inhibited. Specifically, the film 113A can be inhibited from being damaged by plasma in a step using a dry etching method, a step performing ashing, or the like. It is particularly preferable to use a metal film such as a tungsten film or an alloy film as the mask film 119A.

For each of the mask film 118A and the mask film 119A, it is possible to use a metal oxide such as In—Ga—Zn oxide, indium oxide, In—Zn oxide, In—Sn oxide, indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or indium tin oxide containing silicon.

In addition, in place of gallium described above, an element M (M is one or more selected from of aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like) may be used.

As the mask film, a film containing a material having a light-blocking property with respect to light, particularly ultraviolet rays, can be used. For example, a film having a reflecting property with respect to ultraviolet rays or a film absorbing ultraviolet rays can be used. Although a variety of materials, such as a metal having a light-blocking property with respect to ultraviolet rays, an insulator, a semiconductor, and a metalloid, can be used as the material having a light-blocking property, a film capable of being processed by etching is preferable, and a film having good processability is particularly preferable because part or the whole of the mask film is removed in a later step.

For example, a semiconductor material such as silicon or germanium can be used as a material with a high affinity for the semiconductor manufacturing process. Alternatively, an oxide or a nitride of the semiconductor material can be used. Alternatively, a non-metallic (metalloid) material such as carbon or a compound thereof can be used. Alternatively, a metal, such as titanium, tantalum, tungsten, chromium, or aluminum, or an alloy containing one or more of them can be given. Alternatively, an oxide containing the above-described metal, such as titanium oxide or chromium oxide, or a nitride such as titanium nitride, chromium nitride, or tantalum nitride can be used.

The use of a film containing a material having a light-blocking property with respect to ultraviolet rays can inhibit the EL layer from being irradiated with ultraviolet rays in a light exposure step or the like. The EL layer is inhibited from being damaged by ultraviolet rays, so that the reliability of the light-emitting device can be improved.

Note that the film containing a material having a light-blocking property with respect to ultraviolet rays can have the same effect even when used as a material of an insulating film 125A to be described later.

As each of the mask film 118A and the mask film 119A, any of a variety of inorganic insulating films that can be used as the protective layer 131 can be used. In particular, an oxide insulating film is preferable because its adhesion to the film 113A is higher than that of a nitride insulating film. For example, an inorganic insulating material such as aluminum oxide, hafnium oxide, or silicon oxide can be used for each of the mask film 118A and the mask film 119A. As each of the mask film 118A and the mask film 119A, an aluminum oxide film can be formed by an ALD method, for example. The use of an ALD method is preferable, in which case damage to a base (in particular, the EL layer) can be reduced.

For example, an inorganic insulating film (e.g., an aluminum oxide film) formed by an ALD method can be used as the mask film 118A, and an inorganic film (e.g., an In—Ga—Zn oxide film, an aluminum film, or a tungsten film) formed by a sputtering method can be used as the mask film 119A.

Note that the same inorganic insulating film can be used for both the mask film 118A and the insulating layer 125 that is to be formed later. For example, an aluminum oxide film formed by an ALD method can be used for both the mask film 118A and the insulating layer 125. Here, for the mask film 118A and the insulating layer 125, the same film formation condition may be used or different film formation conditions may be used. For example, when the mask film 118A is formed under conditions similar to those for the insulating layer 125, the mask film 118A can be an insulating layer having a high barrier property against at least one of water and oxygen. Meanwhile, the mask film 118A is a layer most or all of which is to be removed in a later step, and thus is preferably easily processed. Therefore, the mask film 118A is preferably formed at a substrate temperature lower than that in formation of the insulating layer 125.

An organic material may be used for one or both of the mask film 118A and the mask film 119A. For example, as the organic material, a material that can be dissolved in a solvent chemically stable with respect to at least the uppermost film of the film 113A. Specifically, a material that is dissolved in water or alcohol can be suitably used. In forming a film of such a material, it is preferable to apply the material dissolved in a solvent such as water or alcohol by a wet film formation method and then perform heat treatment for evaporating the solvent. At this time, the heat treatment is preferably performed under a reduced-pressure atmosphere, in which case the solvent can be removed at a low temperature in a short time and thermal damage to the film 113A can be accordingly reduced.

For each of the mask film 118A and the mask film 119A, an organic resin such as polyvinyl alcohol (PVA), polyvinyl butyral, polyvinylpyrrolidone, polyethylene glycol, polyglycerin, pullulan, water-soluble cellulose, an alcohol-soluble polyamide resin, or a fluororesin such as perfluoropolymer may be used.

For example, an organic film (e.g., a PVA film) formed by an evaporation method or the above wet film formation method can be used as the mask film 118A, and an inorganic film (e.g., a silicon nitride film) formed by a sputtering method can be used as the mask film 119A.

Note that as described in Embodiment 1, part of the mask film sometimes remains as a mask layer in the display device of one embodiment of the present invention.

Next, a resist mask 190*a* is formed over the mask film 119A (FIG. 10A). The resist mask 190*a* can be formed by application of a photosensitive resin (photoresist), light exposure, and development.

The resist mask 190*a* may be formed using either a positive resist material or a negative resist material.

The resist mask 190*a* is provided at positions overlapping with the pixel electrodes 111*a*, 111*b*, and 111*c*. The resist mask 190*a* is preferably provided also at a position overlapping with the conductive layer 123. This can inhibit the conductive layer 123 from being damaged during the manufacturing process of the display device. Note that the resist mask 190*a* is not necessarily provided over the conductive layer 123.

As illustrated in the cross-sectional view along Y1-Y2 in FIG. 10A, the resist mask 190*a* is preferably provided to cover a region from the end portion of the first layer 113 to an end portion of the conductive layer 123 (an end portion on the first layer 113 side). In this case, end portions of the mask layers 118*a* and 119*a* overlap with the end portion of the first layer 113 even after the mask film 118A and the mask film 119A are processed. Since the mask layers 118*a* and 119*a* are provided to cover the region from the end portion of the first layer 113 to the end portion of the conductive layer 123 (the end portion on the first layer 113 side), the insulating layer 255*c* can be inhibited from being exposed (see the cross-sectional view along Y1-Y2 in FIG. 11B). This can prevent removal of the insulating layers 255*a* to 255*c* and part of the insulating layer included in the layer 101 including transistors, and exposure of the conductive layer included in the layer 101 including transistors. Thus, unintentional electrical connection between the conductive layer and another conductive layer can be inhibited. For example, a short circuit between the conductive layer and the common electrode 115 can be inhibited.

Figure 10B:
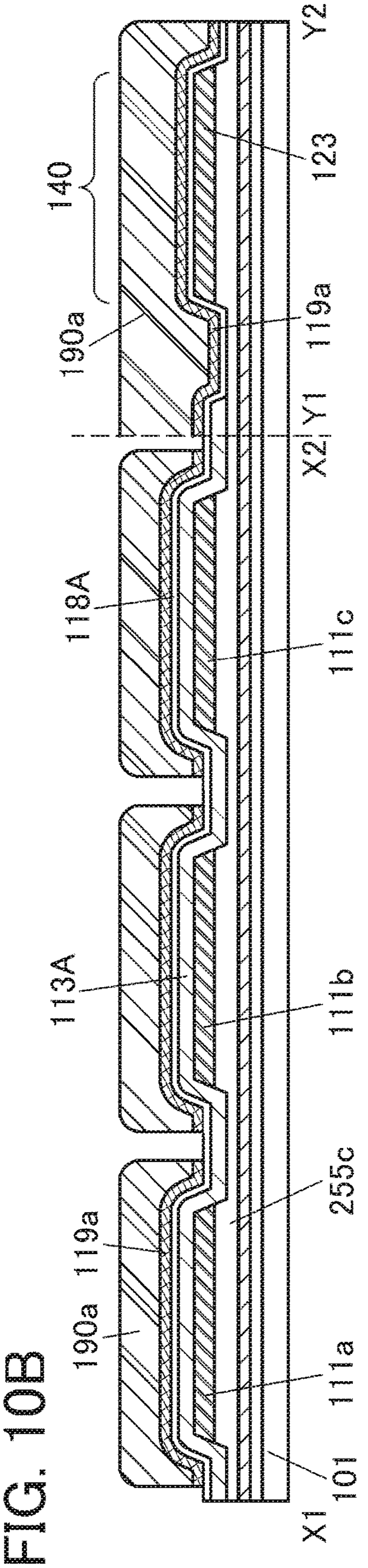
Figure 10C:
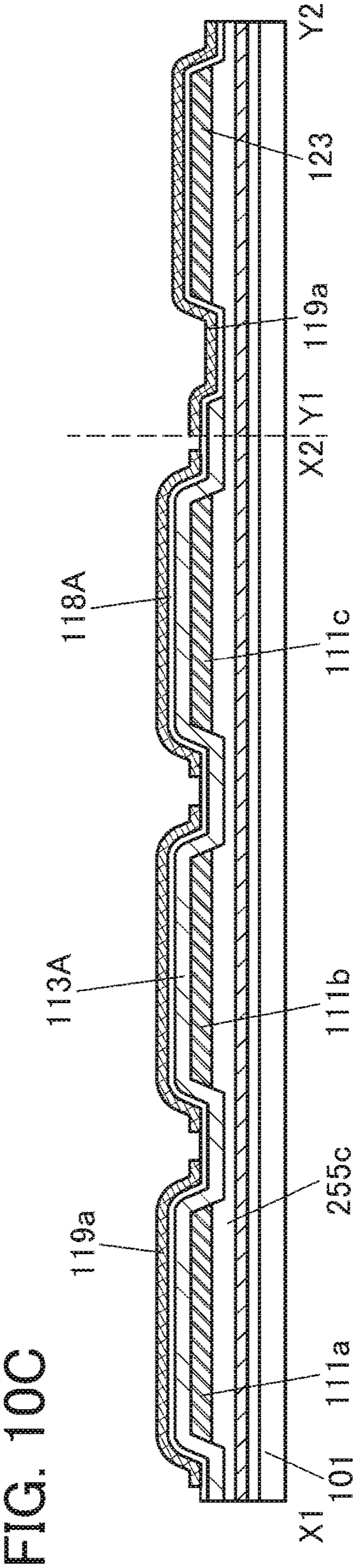
Figure 11A:
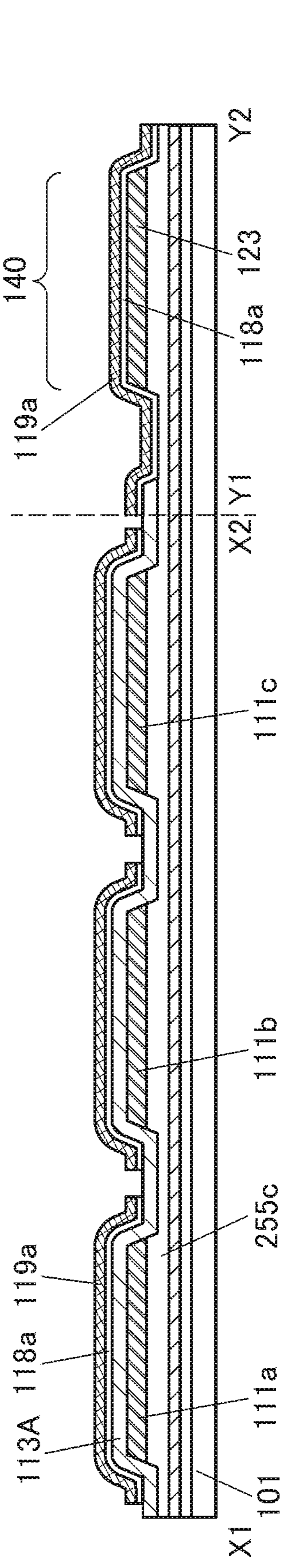
FIG. 11A and FIG. 11B are cross-sectional views illustrating an example of a method for manufacturing a display device.

Next, part of the mask film 119A is removed with the use of the resist mask 190*a*, so that the mask layer 119*a* is formed (FIG. 10B). The mask layer 119*a* remains over the pixel electrodes 111*a*, 111*b*, and 111*c* and the conductive layer 123. After that, the resist mask 190*a* is removed (FIG. 10C). Next, part of the mask film 118A is removed using the mask layer 119*a* as a mask (also referred to as a hard mask), so that the mask layer 118*a* is formed (FIG. 11A).

The mask film 118A and the mask film 119A can be processed by a wet etching method or a dry etching method. The mask film 118A and the mask film 119A are preferably processed by anisotropic etching.

The use of a wet etching method can reduce damage to the film 113A in processing of the mask film 118A and the mask film 119A as compared with the case of using a dry etching method. In the case of using a wet etching method, it is preferable to use a developer, an aqueous solution of tetramethylammonium hydroxide (TMAH), dilute hydrofluoric acid, oxalic acid, phosphoric acid, acetic acid, nitric acid, or a chemical solution containing a mixed solution of any of these acids, for example.

Since the film 113A is not exposed in processing of the mask film 119A, the range of choices of the processing method is wider than that for processing of the mask film 118A. Specifically, deterioration of the film 113A can be further inhibited even when a gas containing oxygen is used as an etching gas for processing the mask film 119A.

In the case of using a dry etching method for processing the mask film 118A, deterioration of the film 113A can be inhibited by not using a gas containing oxygen as the etching gas. In the case of using a dry etching method, it is preferable to use a gas containing $CF_4$, $C_4F_8$, $SF_6$, $CHF_3$, $Cl_2$, $H_2O$, or $BCl_3$ or a noble gas (also referred to as a rare gas) such as He as the etching gas, for example.

For example, when an aluminum oxide film formed by an ALD method is used as the mask film 118A, the mask film 118A can be processed by a dry etching method using $CHF_3$ and He or $CHF_3$, He, and $CH_4$. In the case where an In—Ga—Zn oxide film formed by a sputtering method is used as the mask film 119A, the mask film 119A can be processed by a wet etching method using a diluted phosphoric acid. Alternatively, the mask film 119A may be processed by a dry etching method using $CH_4$ and Ar. Alternatively, the mask film 119A can be processed by a wet etching method using a diluted phosphoric acid. When a tungsten film formed by a sputtering method is used as the mask film 119A, the mask film 119A can be processed by a dry etching method using $SF_6$, $CF_4$, and $O_2$ or $CF_4$, $Cl_2$, and $O_2$.

The resist mask 190*a* can be removed by ashing using oxygen plasma, for example. Alternatively, an oxygen gas and any of $CF_4$, $C_4F_8$, $SF_6$, $CHF_3$, $Cl_2$, $H_2O$, $BCl_3$, and a noble gas such as He may be used. Alternatively, the resist mask 190*a* may be removed by wet etching. At this time, the mask film 118A is positioned on the outermost surface, and the film 113A is not exposed; thus, the film 113A can be inhibited from being damaged in the step of removing the resist mask 190*a*. In addition, the range of choices of the method for removing the resist mask 190*a* can be widened.

Next, the film 113A is processed to form the first layer 113. For example, part of the film 113A is removed using the mask layer 119*a* and the mask layer 118*a* as a hard mask, so that the first layer 113 is formed (FIG. 11B).

Figure 11B:
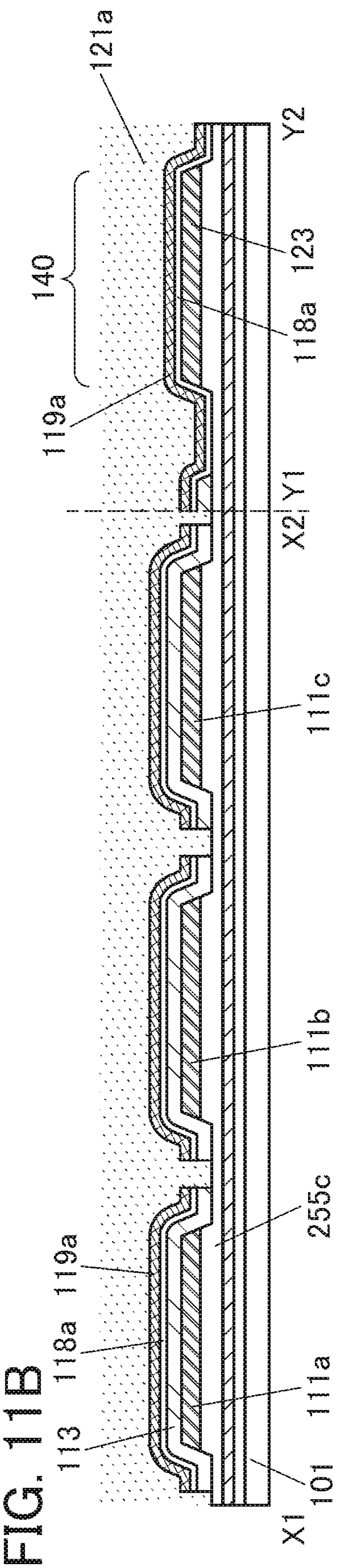

Accordingly, as illustrated in FIG. 11B, the stacked-layer structure of the first layer 113, the mask layer 118*a*, and the mask layer 119*a* remains over the pixel electrode 111*a*, the pixel electrode 111*b*, and the pixel electrode 111*c*.

The film 113A is preferably processed by anisotropic etching. In particular, anisotropic dry etching is preferable. Alternatively, wet etching may be employed.

FIG. 11B illustrates an example in which the film 113A is processed by a dry etching method. In a dry etching apparatus, an etching gas is brought into a plasma state. Thus, the surface of the display device under manufacturing is exposed to plasma (plasma 121*a*). Here, a metal film or an alloy film is preferably used for one or both of the mask layer 118*a* and the mask layer 119*a*, in which case a remaining portion of the film 113A (a portion to be the first layer 113) can be inhibited from being damaged by the plasma and deterioration of the first layer 113 can be inhibited. In particular, a metal film such as a tungsten film or an alloy film is preferably used for the mask layer 119*a*.

In the case of using a dry etching method, deterioration of the film 113A can be inhibited by not using a gas containing oxygen as the etching gas.

A gas containing oxygen may be used as the etching gas. When the etching gas contains oxygen, the etching rate can be increased. Therefore, the etching can be performed under a low-power condition while an adequately high etching rate is maintained. Thus, damage to the film 113A can be suppressed. Furthermore, a defect such as attachment of a reaction product generated at the etching can be inhibited.

In the case of using a dry etching method, it is preferable to use, as the etching gas, a gas containing one or more of $H_2$, $CF_4$, $C_4F_8$, $SF_6$, $CHF_3$, $Cl_2$, $H_2O$, $BCl_3$, and a noble gas (also referred to as a rare gas) such as He and Ar, for example. Alternatively, a gas containing oxygen and one or more of the above is preferably used as the etching gas. Alternatively, an oxygen gas may be used as the etching gas. Specifically, for example, a gas containing $H_2$ and Ar or a gas containing $CF_4$ and He can be used as the etching gas. As another example, a gas containing $CF_4$, He, and oxygen can be used as the etching gas. As another example, a gas containing $H_2$ and Ar and a gas containing oxygen can be used as the etching gas.

A dry etching apparatus including a high-density plasma source can be used as the dry etching apparatus. As the dry etching apparatus including a high-density plasma source, an inductively coupled plasma (ICP) etching apparatus can be used, for example. Alternatively, a capacitively coupled plasma (CCP) etching apparatus including parallel plate electrodes can be used. The capacitively coupled plasma etching apparatus including parallel plate electrodes may have a structure in which a high-frequency voltage is applied to one of the parallel plate electrodes. Alternatively, a structure may be employed in which different high-frequency voltages are applied to one of the parallel plate electrodes. Alternatively, a structure may be employed in which high-frequency voltages with the same frequency are applied to the parallel plate electrodes. Alternatively, a structure may be employed in which high-frequency voltages with different frequencies are applied to the parallel plate electrodes.

The film 113A is processed as illustrated in FIG. 11B, whereby a plurality of first layers 113 can be formed. That is, the film 113A can be divided into a plurality of first layers 113. Thus, the island-shaped first layer 113 is provided for each subpixel. The island-shaped first layers 113 of adjacent subpixels can be inhibited from being in contact with each other. As a result, generation of a leakage current between the subpixels can be inhibited. Accordingly, degradation of the display quality of the display device can be inhibited. In addition, both the higher resolution and higher display quality of the display device can be achieved.

As described above, the distance between adjacent two layers among the plurality of first layers 113 formed by a photolithography method can be shortened to less than or equal to 8 μm, less than or equal to 5 μm, less than or equal to 3 μm, less than or equal to 2 μm, or less than or equal to 1 μm. Here, the distance can be determined by, for example, the distance between facing end portions of adjacent two layers among the plurality of first layers 113. When the distance between the island-shaped EL layers is shortened in this manner, a display device with a high resolution and a high aperture ratio can be provided.

Note that side surfaces of the first layers 113 are preferably perpendicular or substantially perpendicular to their formation surfaces. For example, the angle between the formation surfaces and these side surfaces is preferably greater than or equal to 60° and less than or equal to 90°.

FIG. 11B illustrates an example in which the end portion of the first layer 113 is positioned more outwardly than the end portion of the pixel electrode. A pixel with such a structure can have a high aperture ratio. Although not illustrated in FIG. 11B, a depressed portion is sometimes formed by the etching treatment in a region of the insulating layer 255*c* not overlapping with the first layer 113.

When the first layer 113 covers the top surface and the side surface of the pixel electrode, the following steps can be performed without exposing the pixel electrode. When the end portion of the pixel electrode is exposed, corrosion might occur in the etching step or the like. A product generated by corrosion of the pixel electrode might be unstable; for example, the product might be dissolved in a solution in wet etching and might be diffused in an atmosphere in dry etching. The product dissolved in a solution or diffused in an atmosphere might be attached to a surface to be processed, the side surface of the first layer 113, and the like, which may adversely affect the characteristics of the light-emitting device or may form a leakage path between the plurality of light-emitting devices. In a region where the end portion of the pixel electrode is exposed, adhesion between contacting layers is reduced, which might facilitate film separation of the first layer 113 or the pixel electrode.

Thus, when the first layers 113 cover the top surfaces and the side surfaces of the pixel electrodes 111*a*, 111*b*, and 111*c*, the yield and characteristics of the light-emitting device can be improved, for example.

In addition, as described in Embodiment 1, the first layer 113 covers the top surface and the side surface of the pixel electrode, and thus the first layer 113 is provided with a dummy region outside the light-emitting region (a region positioned between the pixel electrode and the common electrode 115). Here, the end portion of the first layer 113 is sometimes damaged at the time of processing the film 113A. The end portion of the first layer 113 and the vicinity thereof are dummy regions and not used for light emission; thus, such regions are less likely to adversely affect the characteristics of the light-emitting device even when being damaged. Meanwhile, the light-emitting region of the first layer 113 is covered with the mask layer, and thus is not exposed to plasma and plasma damage is sufficiently reduced. The mask layer is preferably provided to cover not only the top surface of a flat portion of the first layer 113 overlapping with the top surface of the pixel electrode, but also the top surfaces of an inclined portion and a flat portion of the first layer 113 that are positioned on the outer side of the top surface of the pixel electrode. A portion of the first layer 113 with reduced damage in the manufacturing process is used as the light-emitting region in this manner; thus, a light-emitting device having high emission efficiency and a long lifetime can be achieved.

In a region corresponding to the connection portion 140, a stacked-layer structure of the mask layer 118*a* and the mask layer 119*a* remains over the conductive layer 123.

As described above, in the cross-sectional view along Y1-Y2 in FIG. 11B, the mask layers 118*a* and 119*a* are provided to cover the end portion of the first layer 113 and the end portion of the conductive layer 123, and the insulating layer 255*c* is not exposed. This can prevent removal of the insulating layers 255*a* to 255*c* and part of the insulating layer included in the layer 101 including transistors, and exposure of the conductive layer included in the layer 101 including transistors. Thus, unintentional electrical connection between the conductive layer and another conductive layer can be inhibited.

As described above, in one embodiment of the present invention, the resist mask 190*a* is formed over the mask film 119A and part of the mask film 119A is removed using the resist mask 190*a*, so that the mask layer 119*a* is formed. After that, part of the film 113A is removed using the mask layer 119*a* as a hard mask, so that the first layer 113 is formed. Thus, it can be said that the first layer 113 is formed by processing the film 113A by a photolithography method. Note that part of the film 113A may be removed using the resist mask 190*a*. Then, the resist mask 190*a* may be removed.

In the case of manufacturing a display device including both the light-emitting device and the light-receiving device as illustrated in FIG. 9A and FIG. 9B, the second layer 155 included in the light-receiving device is formed in a manner similar to that for the first layer 113. There is no particular limitation on the formation order of the first layer 113 and the second layer 155. For example, when a layer with high adhesion to the pixel electrode is formed earlier, film separation in the process can be inhibited. For example, in the case where the first layer 113 has higher adhesion to the pixel electrode than the second layer 155, the first layer 113 is preferably formed earlier. The thickness of the layer formed earlier sometimes has an influence on the distance between the substrate and a mask for specifying a film formation area in the subsequent step of forming a layer. Forming a thinner layer earlier can inhibit shadowing (formation of a layer in a shadow portion). For example, in the case where a light-emitting device having a tandem structure is formed, the first layer 113 often becomes thicker than the second layer 155; thus, it is preferable to form the second layer 155 earlier. In the case where a film is formed by a wet method using a high molecular material, it is preferable to form the film earlier. For example, when a high molecular material is used for an active layer, the second layer 155 is preferably formed earlier. As described above, the formation order is determined depending on the materials and film formation methods, whereby the manufacturing yield of the display device can be increased.

Figures 12A, 12B, 12C:
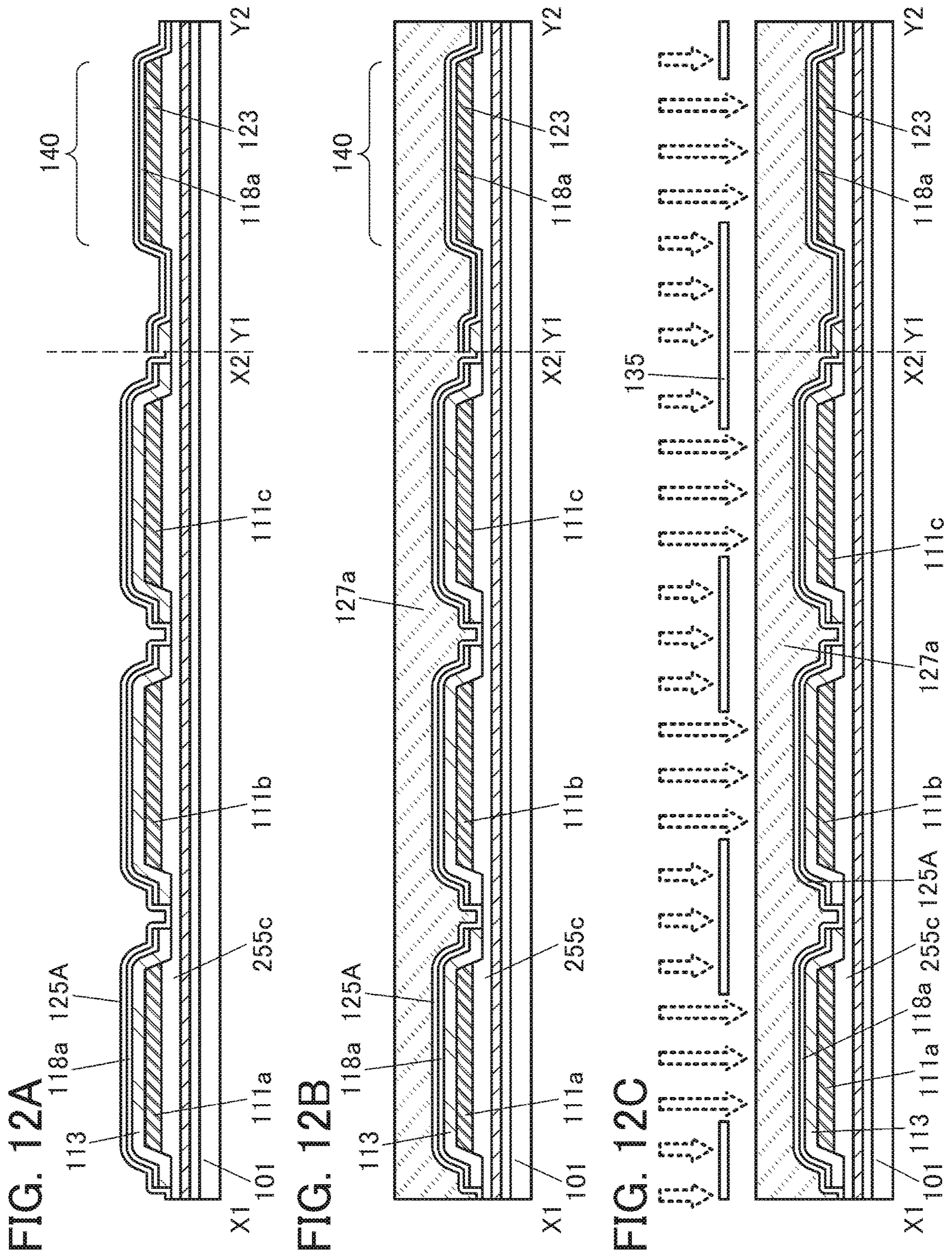
FIG. 12A to FIG. 12C are cross-sectional views illustrating an example of a method for manufacturing a display device.

Next, the mask layer 119*a* is preferably removed (FIG. 12A). The mask layers 118*a* and 119*a* remain in the display device in some cases, depending on the later steps. Removing the mask layer 119*a* at this stage can inhibit the mask layer 119*a* from remaining in the display device. For example, in the case where a conductive material is used for the mask layer 119*a*, removing the mask layer 119*a* in advance can inhibit generation of a leakage current due to the remaining mask layer 119*a*, formation of a capacitor, and the like.

Although this embodiment describes an example in which the mask layer 119*a* is removed, the mask layer 119*a* is not necessarily removed. For example, in the case where the mask layer 119*a* contains the aforementioned material having a light-blocking property with respect to ultraviolet rays, the process preferably proceeds to the next step without removing the mask layer, in which case the EL layer can be protected from ultraviolet rays.

The step of removing the mask layer can be performed by a method similar to that for the step of processing the mask layer. In particular, the use of a wet etching method can reduce damage to the first layer 113 at the time of removing the mask layer compared with the case of using a dry etching method.

In the case where a metal film or an alloy film is used for the mask layer 119*a*, the mask layer 119*a* can inhibit plasma damage to the EL layer. Thus, film processing can be performed by a dry etching method in the steps before the removal of the mask layer 119*a*. In contrast, in the step of removing the mask layer 119*a* and in the steps after the removal, the film inhibiting plasma damage to the EL layer does not exist; thus, film processing is preferably performed by a method that does not use plasma, such as a wet etching method.

The mask layer may be removed by being dissolved in a solvent such as water or alcohol. Examples of alcohol include ethyl alcohol, methyl alcohol, isopropyl alcohol (IPA), and glycerin.

After the mask layer is removed, drying treatment may be performed to remove water contained in the first layer 113 and water adsorbed onto the surface of the first layer 113. For example, heat treatment in an inert gas atmosphere or a reduced-pressure atmosphere can be performed. The heat treatment can be performed at a substrate temperature higher than or equal to 50° C. and lower than or equal to 200° C., preferably higher than or equal to 60° C. and lower than or equal to 150° C., further preferably higher than or equal to 70° C. and lower than or equal to 120° C. A reduced-pressure atmosphere is preferable because drying at a lower temperature is possible. The drying treatment can increase the density of the first layer 113 in some cases. When heat is added to the first layer 113 due to the heat treatment or the like in forming the insulating layer 127 and volume shrinkage occurs, adhesion between the first layer 113 and the insulating layer 125 might be reduced and a defect such as generation of film separation or formation of a gap might occur. Therefore, before the insulating film 125A is formed, the first layer 113 is preferably heated to have high density.

Next, the insulating film 125A to be the insulating layer 125 later is formed to cover the pixel electrode, the first layer 113, and the mask layer 118*a* (FIG. 12A).

As described later, an insulating film 127*a* is formed in contact with the top surface of the insulating film 125A. Thus, the top surface of the insulating film 125A preferably has high affinity for a resin composite (e.g., a photosensitive resin composite containing an acrylic resin) that is used for the insulating film 127*a*. To improve the affinity, the top surface of the insulating film 125A is preferably made hydrophobic (or more hydrophobic) by surface treatment. For example, the treatment is preferably performed using a silylating agent such as hexamethyldisilazane (HMDS). By making the top surface of the insulating film 125A hydrophobic in this manner, the insulating film 127*a* can be formed with high adhesion. Note that the above-described hydrophobic treatment may be performed as the surface treatment.

Then, the insulating film 127*a* is formed over the insulating film 125A (FIG. 12B).

The insulating film 125A and the insulating film 127*a* are preferably formed by a formation method that causes less damage to the first layer 113. In particular, the insulating film 125A, which is formed in contact with the side surface of the first layer 113, is preferably formed by a formation method that causes less damage to the first layer 113 than the method for forming the insulating film 127*a*.

The insulating film 125A and the insulating film 127*a* are formed at a temperature lower than the upper temperature limit of the first layer 113. When the insulating film 125A is formed at a high substrate temperature, the formed film, even with a small thickness, can have a low impurity concentration and a high barrier property against at least one of water and oxygen.

The insulating film 125A and the insulating film 127*a* are preferably formed at a substrate temperature higher than or equal to 60° C., higher than or equal to 80° C., higher than or equal to 100° C., or higher than or equal to 120° C. and lower than or equal to 200° C., lower than or equal to 180° C., lower than or equal to 160° C., lower than or equal to 150° C., or lower than or equal to 140° C.

As described above, a material with high heat resistance is used for the light-emitting device of the display device of one embodiment of the present invention. Thus, the substrate temperature in formation of the insulating film 125A and the insulating film 127*a* can be higher than or equal to 100° C., higher than or equal to 120° C., or higher than or equal to 140° C. For example, an inorganic insulating film formed at a higher temperature can be a film that is denser and has a higher barrier property. Therefore, forming the insulating film 125A at such a temperature can further reduce damage to the first layer 113 and improve the reliability of the light-emitting device.

As the insulating film 125A, an insulating film is preferably formed within the above substrate temperature range to have a thickness greater than or equal to 3 nm, greater than or equal to 5 nm, or greater than or equal to 10 nm and less than or equal to 200 nm, less than or equal to 150 nm, less than or equal to 100 nm, or less than or equal to 50 nm.

The insulating film 125A is preferably formed by an ALD method, for example. The use of an ALD method is preferable, in which case damage due to film formation can be reduced and a film with good coverage can be formed. As the insulating film 125A, an aluminum oxide film is preferably formed by an ALD method, for example.

Alternatively, the insulating film 125A may be formed by a sputtering method, a CVD method, or a PECVD method that provides a higher film formation speed than an ALD method. In this case, a highly reliable display device can be manufactured with high productivity.

The insulating film 127*a* is preferably formed by the aforementioned wet film formation method. For example, the insulating film 127*a* is preferably formed by spin coating using a photosensitive resin, specifically, a photosensitive resin composite containing an acrylic resin.

Heat treatment (also referred to as pre-baking) is preferably performed after formation of the insulating film 127*a*. The heat treatment is performed at a temperature lower than the upper temperature limit of the first layer 113. The substrate temperature in the heat treatment is preferably higher than or equal to 50° C. and lower than or equal to 200° C., further preferably higher than or equal to 60° C. and lower than or equal to 150° C., still further preferably higher than or equal to 70° C. and lower than or equal to 120° C. Accordingly, a solvent contained in the insulating film 127*a* can be removed.

Then, as illustrated in FIG. 12C, light exposure is performed so that part of the insulating film 127*a* is exposed to visible light or ultraviolet rays. Here, in the case where a positive photosensitive resin composite containing an acrylic resin is used for the insulating film 127*a*, a region where the insulating layer 127 is not formed in a later step is irradiated with visible light or ultraviolet rays using a mask 135. The insulating layer 127 is formed in regions interposed between adjacent two pixel electrodes among the pixel electrodes 111*a*, 111*b*, and 111*c*, and around the conductive layer 123. Thus, as illustrated in FIG. 12C, irradiation with visible light or ultraviolet rays is performed on the pixel electrode 111*a*, the pixel electrode 111*b*, the pixel electrode 111*c*, and the conductive layer 123 using the mask 135.

Note that the width of the insulating layer 127 to be formed later can be controlled by the region exposed to light here. In this embodiment, the insulating layer 127 is processed so as to include a portion overlapping with the top surface of the pixel electrode (FIG. 2A and FIG. 2B). As illustrated in FIG. 6A or FIG. 6B, the insulating layer 127 does not necessarily include a portion overlapping with the top surface of the pixel electrode.

Light used for light exposure preferably includes the i-line (wavelength: 365 nm). The light used for light exposure may include at least one of the g-line (wavelength: 436 nm) and the h-line (wavelength: 405 nm).

Here, when a barrier insulating layer against oxygen is provided as one or both of the mask layer 118*a* and the insulating film 125A, diffusion of oxygen into the first layer 113 can be suppressed. When the EL layer is irradiated with light (visible light or ultraviolet rays), the organic compound contained in the EL layer is brought into an excited state and a reaction between the organic compound and oxygen contained in the atmosphere is promoted in some cases. Specifically, when the EL layer is irradiated with light (visible light or ultraviolet rays) in an atmosphere containing oxygen, oxygen might be bonded to the organic compound contained in the EL layer. By providing the mask layer 118*a* and the insulating film 125A over the island-shaped EL layer, bonding of oxygen in the atmosphere to the organic compound contained in the EL layer can be suppressed.

Although FIG. 12C illustrates an example in which a positive photosensitive resin is used for the insulating film 127*a* and a region where the insulating layer 127 is not formed is irradiated with visible light or ultraviolet rays, the present invention is not limited thereto. For example, a structure may be employed in which a negative photosensitive resin is used for the insulating film 127*a*. In this case, a region where the insulating layer 127 is formed is irradiated with visible light or ultraviolet rays.

Figure 13A:
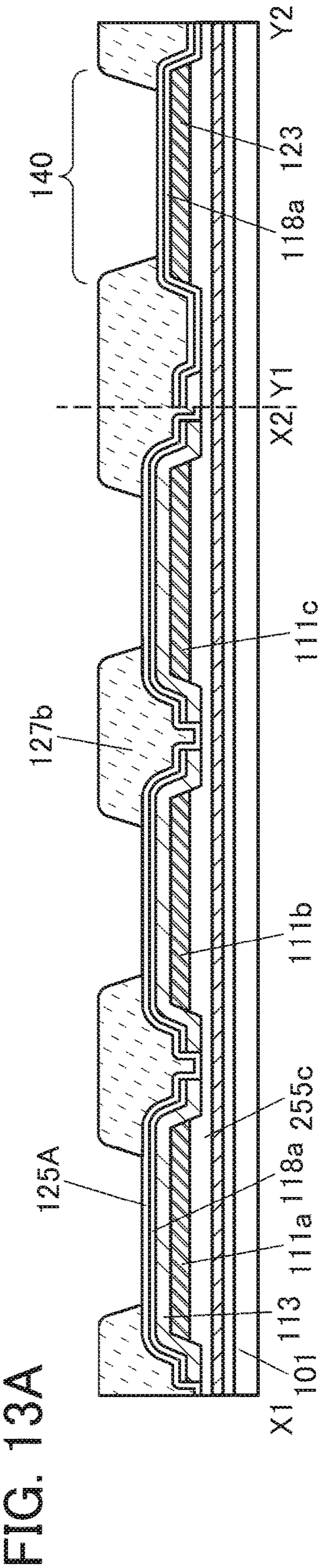
FIG. 13A to FIG. 13C are cross-sectional views illustrating an example of a method for manufacturing a display device.
Figure 15A:
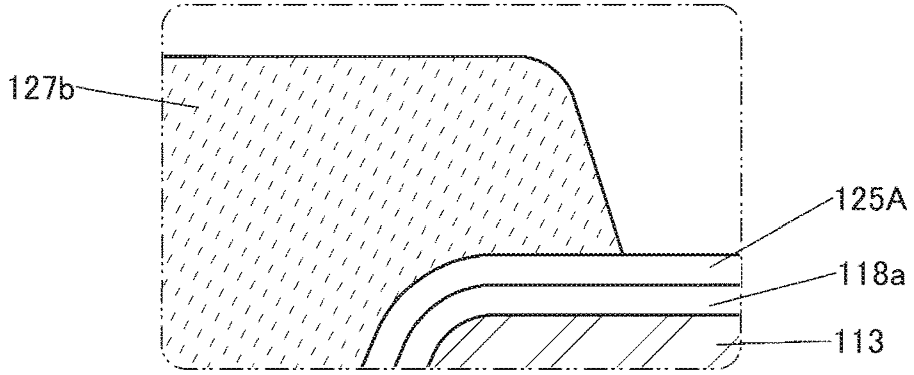
FIG. 15A to FIG. 15D are cross-sectional views illustrating examples of a method for manufacturing a display device.

Next, as illustrated in FIG. 13A and FIG. 15A, the region of the insulating film 127*a* exposed to light is removed by development, so that an insulating layer 127*b* is formed. Note that FIG. 15A is an enlarged view of the end portions of the first layer 113 and the insulating layer 127*b* illustrated in FIG. 13A and the vicinities thereof. The insulating layer 127*b* is formed in regions interposed between adjacent two pixel electrodes among the pixel electrodes 111*a*, 111*b*, and 111*c*, and a region surrounding the conductive layer 123. Here, in the case where an acrylic resin is used for the insulating film 127*a*, an alkaline solution is preferably used as a developer, and for example, an aqueous solution of tetramethyl ammonium hydroxide (TMAH) can be used.

Then, a residue (what is called scum) due to the development may be removed. For example, the residue can be removed by ashing using oxygen plasma.

Etching may be performed to adjust the surface level of the insulating layer 127*b*. The insulating layer 127*b* may be processed by ashing using oxygen plasma, for example. Also in the case where a non-photosensitive material is used for the insulating film 127*a*, the surface level of the insulating film 127*a* can be adjusted by the ashing or the like.

Figure 13B:
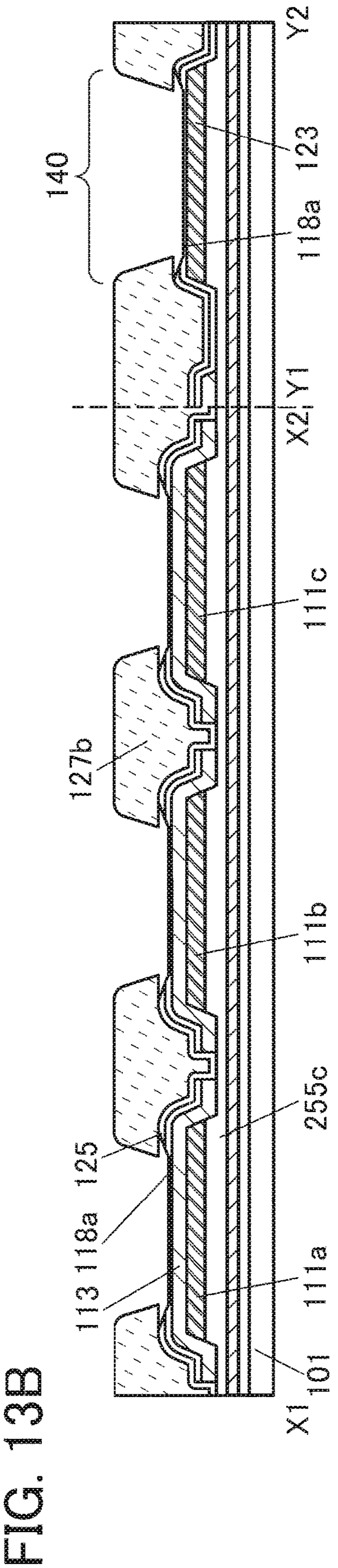
Figure 15B:
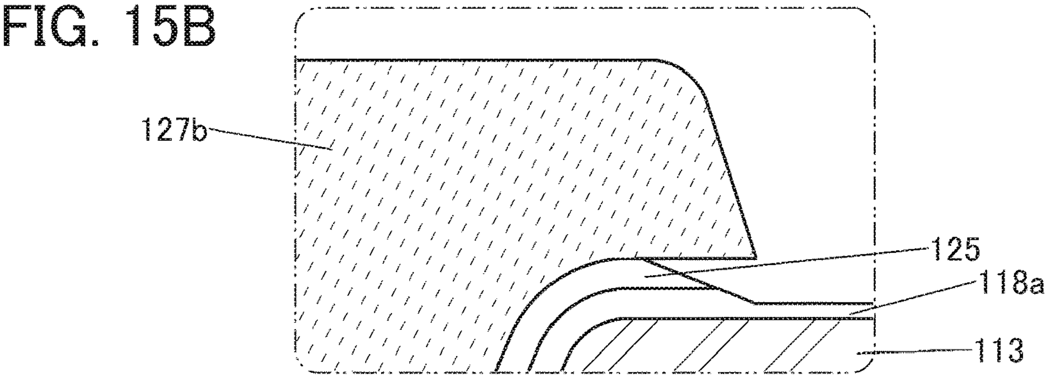

Next, as illustrated in FIG. 13B and FIG. 15B, etching treatment is performed using the insulating layer 127*b* as a mask to remove part of the insulating film 125A, so that the mask layer 118*a* is partly thinned down. Accordingly, the insulating layer 125 is formed below the insulating layer 127*b*. In addition, the surface of the thinned portion of the mask layer 118*a* is exposed. FIG. 15B is an enlarged view of the end portions of the first layer 113 and the insulating layer 127*b* illustrated in FIG. 13B and the vicinities thereof. Note that the etching treatment using the insulating layer 127*b* as a mask is referred to as first etching treatment below in some cases.

The first etching treatment can be performed by dry etching or wet etching. Note that the insulating film 125A is preferably formed using a material similar to that for the mask layer 118*a*, in which case the first etching treatment can be performed collectively.

As illustrated in FIG. 15B, etching is performed using the insulating layer 127*b* having a tapered shape on its side surface as a mask, so that the side surface of the insulating layer 125 and the upper end portion of the side surface of the mask layer 118*a* can easily have tapered shapes.

In the case of performing dry etching, a chlorine-based gas is preferably used. As the chlorine-based gas, any of $Cl_2$, $BCl_3$, $SiCl_4$, $CCl_4$, and the like can be used alone or two or more of the gases can be mixed and used. Furthermore, one or more of an oxygen gas, a hydrogen gas, a helium gas, an argon gas, and the like can be mixed as appropriate with the chlorine-based gas. By employing dry etching, the thin region of the mask layer 118*a* can be formed with a favorable in-plane uniformity.

Furthermore, the first etching treatment is preferably performed by wet etching. The use of a wet etching method can reduce damage to the first layer 113 compared with the case of using a dry etching method. The wet etching can be performed using an alkaline solution or the like. For example, for wet etching of an aluminum oxide film, it is preferable to use an aqueous solution of tetramethyl ammonium hydroxide (TMAH) that is an alkaline solution. In this case, the wet etching can be performed by a puddle method. Note that the insulating film 125A is preferably formed using a material similar to that for the mask layer 118*a*, in which case the etching treatment can be performed collectively.

As illustrated in FIG. 13B and FIG. 15B, in the first etching treatment, the etching treatment is stopped when the mask layer 118*a* is thinned down, before the mask layer is completely removed. In this manner, the mask layer 118*a* is made to remain over the first layer 113, so that the first layer 113 can be prevented from being damaged by treatment in a later step.

Although the mask layer 118*a* is thinned down in FIG. 13B and FIG. 15B, the present invention is not limited thereto. For example, depending on the thickness of the insulating film 125A and the thickness of the mask layer 118*a*, the first etching treatment might be stopped before the insulating film 125A is processed into the insulating layer 125. Specifically, the first etching treatment might be stopped after only part of the insulating film 125A is thinned down. In the case where the insulating film 125A is formed using a material similar to that for the mask layer 118*a* and a boundary between the insulating film 125A and the mask layer 118*a* is unclear, whether the insulating layer 125 is formed or whether the mask layer 118*a* is thinned down cannot be determined in some cases.

Although FIG. 13B and FIG. 15B illustrate an example in which the shape of the insulating layer 127*b* is not changed from that in FIG. 13A and FIG. 15A, the present invention is not limited thereto. For example, the end portion of the insulating layer 127*b* sags and covers the end portion of the insulating layer 125 in some cases. In another case, the end portion of the insulating layer 127*b* is in contact with the top surface of the mask layer 118*a*, for example. As described above, in the case where light exposure is not performed on the insulating layer 127*b* after development, the shape of the insulating layer 127*b* is sometimes easily changed.

Figure 13C:
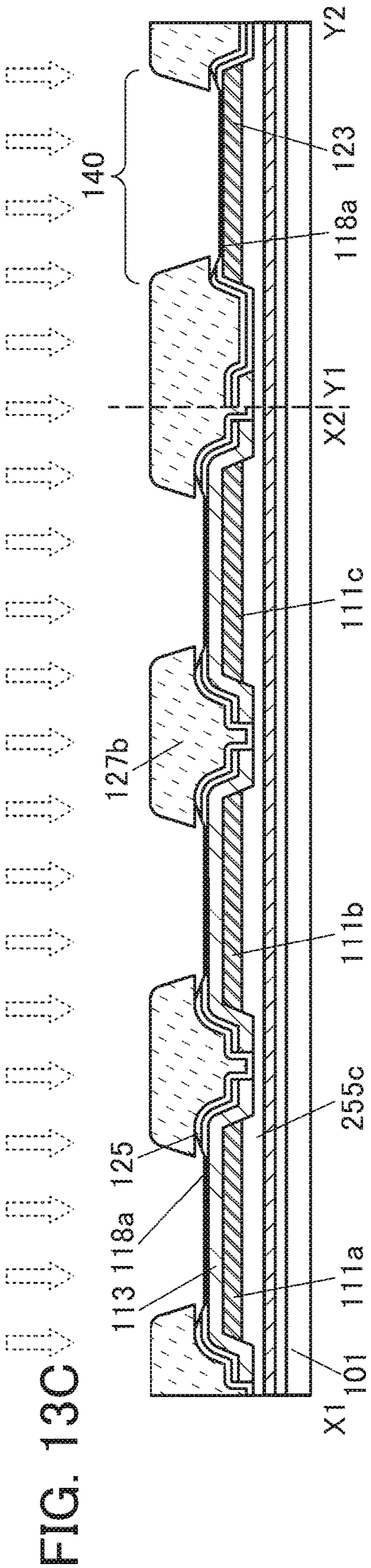

Next, light exposure is preferably performed on the entire substrate so that the insulating layer 127*b* is irradiated with visible light or ultraviolet rays (FIG. 13C). The energy density for the light exposure is preferably greater than 0 $mJ/cm^2$ and less than or equal to 800 $mJ/cm^2$, further preferably greater than 0 $mJ/cm^2$ and less than or equal to 500 $mJ/cm^2$. Performing such light exposure after development can improve the transparency of the insulating layer 127*b* in some cases. In addition, it is sometimes possible to lower the substrate temperature required for heat treatment in a later step for changing the shape of the insulating layer 127*b* into a tapered shape.

Here, when a barrier insulating layer against oxygen is provided as the mask layer 118*a*, diffusion of oxygen into the first layer 113 can be suppressed. When the EL layer is irradiated with light (visible light or ultraviolet rays), the organic compound contained in the EL layer is brought into an excited state and a reaction between the organic compound and oxygen contained in the atmosphere is promoted in some cases. Specifically, when the EL layer is irradiated with light (visible light or ultraviolet rays) in an atmosphere containing oxygen, oxygen might be bonded to the organic compound contained in the EL layer. By providing the mask layer 118*a* over the island-shaped EL layer, bonding of oxygen in the atmosphere to the organic compound contained in the EL layer can be suppressed.

In contrast, as described later, when light exposure is not performed on the insulating layer 127*b*, the shape of the insulating layer 127*b* can be easily changed or the insulating layer 127 can be easily changed into a tapered shape in a later step in some cases. Thus, sometimes it is preferable not to perform light exposure on the insulating layer 127*b* or 127 after development.

For example, in the case where a photocurable resin is used as a material of the insulating layer 127*b*, performing light exposure on the insulating layer 127*b* can start polymerization and cure the insulating layer 127*b*. Note that without performing light exposure on the insulating layer 127*b* at this stage, at least one of post-baking and second etching treatment that are described later may be performed while the insulating layer 127*b* remains in a state where its shape is relatively easily changed. Thus, generation of unevenness in the formation surface of the common layer 114 and the common electrode 115 can be inhibited and step disconnection of the common layer 114 and the common electrode 115 can be inhibited. Note that after the post-baking or the second etching treatment that is described later, light exposure may be performed on the insulating layer 127*b* (or the insulating layer 127). Note that light exposure may be performed after development and before the first etching treatment. On the other hand, depending on the material (e.g., a positive material) of the insulating layer 127*b* and the first etching treatment conditions, the insulating layer 127*b* might be dissolved in a chemical solution during the first etching treatment due to light exposure. For this reason, light exposure is preferably performed after the first etching treatment and before the post-baking. Hence, the insulating layer 127 having an intended shape can be stably formed with high reproducibility.

Here, irradiation with visible light or ultraviolet rays illustrated in FIG. 13C is preferably performed in an atmosphere containing no oxygen or an atmosphere containing a small amount of oxygen. For example, the irradiation with visible light or ultraviolet rays is preferably performed in an inert gas atmosphere such as a nitrogen atmosphere, a reduced-pressure atmosphere having a lower oxygen content than an air atmosphere, or a pressurized atmosphere having a lower oxygen content than an air atmosphere. If the irradiation with visible light or ultraviolet rays is performed in an atmosphere containing a large amount of oxygen, the compound contained in the EL layer might be oxidized and the properties might be changed. In contrast, by performing the irradiation with visible light or ultraviolet rays in an atmosphere containing no oxygen or an atmosphere containing a small amount of oxygen, a change of the properties of the EL layer can be prevented; hence, a display device with higher reliability can be provided. Note that the same applies to the light-exposure step illustrated in FIG. 12C.

Figure 14A:
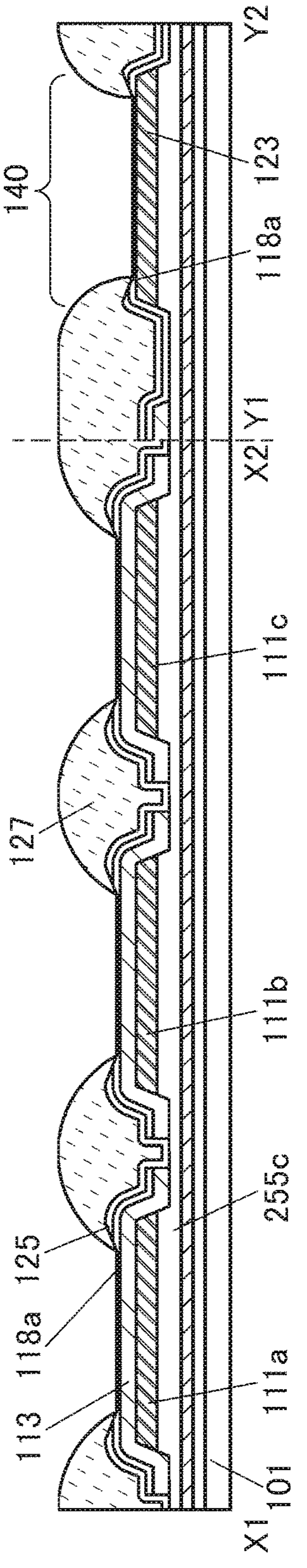
FIG. 14A to FIG. 14C are cross-sectional views illustrating an example of a method for manufacturing a display device.
Figure 15C:
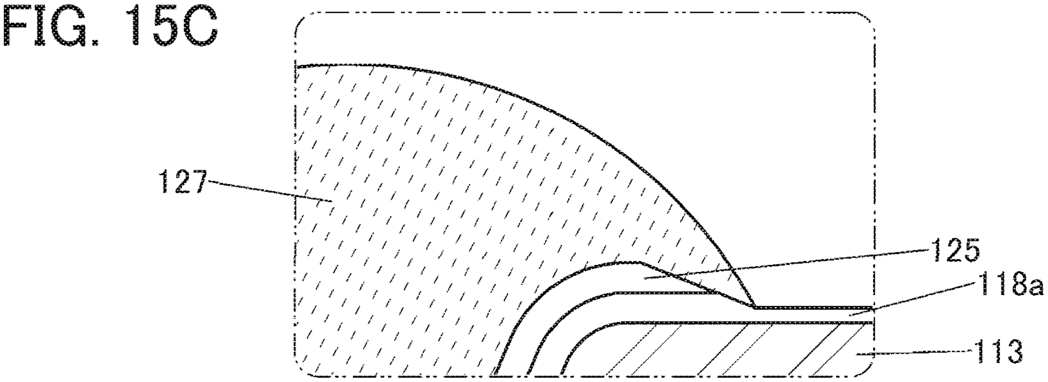

After that, heat treatment (also referred to as post-baking) is performed. As illustrated in FIG. 14A and FIG. 15C, by performing the heat treatment, the insulating layer 127*b* can be transformed into the insulating layer 127 having a tapered shape on its side surface. As described above, in some cases, the insulating layer 127*b* is already changed in shape and has a tapered shape on its side surface at the time when the first etching treatment is finished. The heat treatment is performed at a temperature lower than the upper temperature limit of the EL layer. The heat treatment can be performed at a substrate temperature higher than or equal to 50° C. and lower than or equal to 200° C., preferably higher than or equal to 60° C. and lower than or equal to 150° C., further preferably higher than or equal to 70° C. and lower than or equal to 130° C. The heating atmosphere may be either an air atmosphere or an inert gas atmosphere. Alternatively, the heating atmosphere may be either an atmospheric pressure atmosphere or a reduced pressure atmosphere. A reduced-pressure atmosphere is preferable because drying at a lower temperature is possible. The heat treatment in this step is preferably performed at a higher substrate temperature than the heat treatment (pre-baking) after formation of the insulating film 127*a*. In this case, adhesion between the insulating layer 127 and the insulating layer 125 and the corrosion resistance of the insulating layer 127 can be improved. Note that FIG. 15C is an enlarged view of the end portions of the first layer 113 and the insulating layer 127 illustrated in FIG. 14A and the vicinities thereof.

As described above, a material with high heat resistance is used for the light-emitting device of the display device of one embodiment of the present invention. Therefore, the temperature of the pre-baking and the temperature of the post-baking can each be higher than or equal to 100° C., higher than or equal to 120° C., or higher than or equal to 140° C. Thus, adhesion between the insulating layer 127 and the insulating layer 125 can be further improved, and the corrosion resistance of the insulating layer 127 can be further increased. Moreover, the range of choice for materials that can be used for the insulating layer 127 can be widened. By adequately removing the solvent and the like included in the insulating layer 127, entry of impurities such as water and oxygen into the EL layer can be suppressed.

The first etching treatment does not remove the mask layer 118*a* completely to make the thinned mask layer 118*a* remain, thereby preventing the first layer 113 from being damaged by the heat treatment and deteriorating. Thus, the reliability of the light-emitting device can be improved.

As illustrated in FIG. 4A and FIG. 4B, the side surface of the insulating layer 127 might have a concave shape depending on the materials for the insulating layer 127, or the temperature, time, and atmosphere of the post-baking. For example, the insulating layer 127 is more likely to be changed in shape to have a concave shape as the temperature is higher or the time is longer in the post-baking conditions. In addition, as described above, in the case where light exposure is not performed on the insulating layer 127*b* after development, the shape of the insulating layer 127 is sometimes easily changed at the time of the post-baking.

Figure 14B:
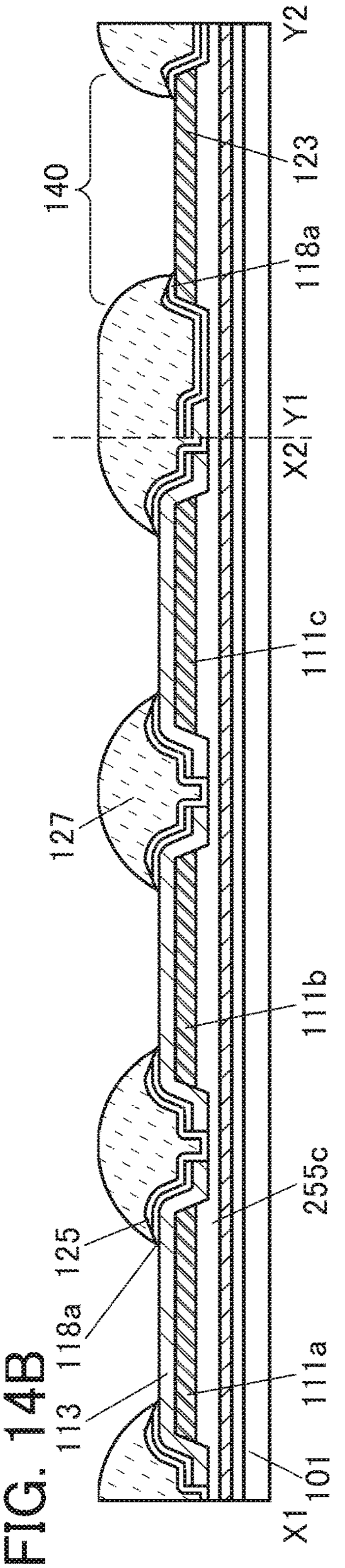
Figure 15D:
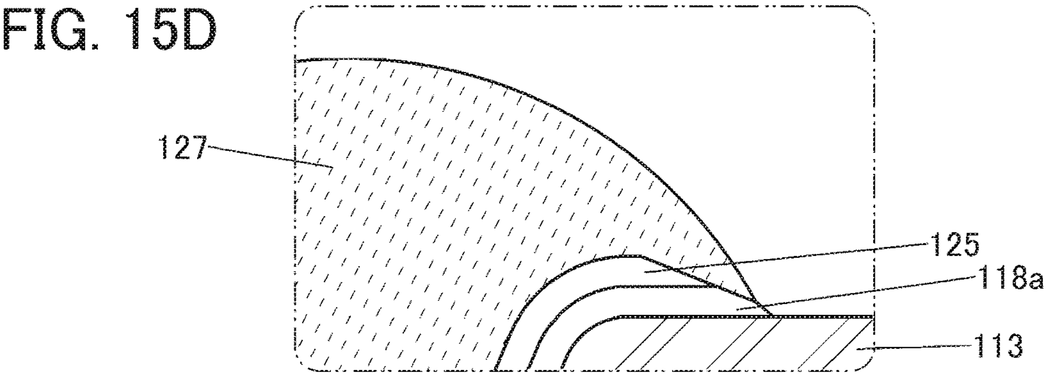

Next, as illustrated in FIG. 14B and FIG. 15D, etching treatment is performed using the insulating layer 127 as a mask to remove part of the mask layer 118*a*. Note that part of the insulating layer 125 is also removed in some cases. Consequently, an opening is formed in the mask layer 118*a*, and the top surfaces of the first layer 113 and the conductive layer 123 are exposed. Note that FIG. 15D is an enlarged view of the end portions of the first layer 113 and the insulating layer 127 illustrated in FIG. 14B and the vicinities thereof. Note that the etching treatment using the insulating layer 127 as a mask is referred to as second etching treatment below in some cases.

The end portion of the insulating layer 125 is covered with the insulating layer 127. FIG. 14B and FIG. 15D illustrate an example in which part of the end portion of the mask layer 118*a* (specifically, the portion having a tapered shape formed by the first etching treatment) is covered with the insulating layer 127 and the portion having a tapered shape formed by the second etching treatment is exposed. That is, the structure corresponds to that illustrated in FIG. 2A and FIG. 2B.

When the first etching treatment is not performed and the insulating layer 125 and the mask layer are collectively etched after the post-baking, the insulating layer 125 and the mask layer below the end portion of the insulating layer 127 are eliminated by side etching and accordingly a cavity is formed in some cases. The cavity causes unevenness in the formation surface of the common layer 114 and the common electrode 115, so that step disconnection is likely to occur in the common layer 114 and the common electrode 115. Even when a cavity is formed owing to side etching of the insulating layer 125 and the mask layer by the first etching treatment, the post-baking performed subsequently can make the insulating layer 127 fill the cavity. After that, since the second etching treatment etches the thinned mask layer, the amount of side etching is small and thus a cavity is not easily formed, and even if a cavity is formed, it can be extremely small. Therefore, the flatness of the formation surface of the common layer 114 and the common electrode 115 can be improved.

Note that as illustrated in FIG. 3A, FIG. 3B, FIG. 5A, and FIG. 5B, the insulating layer 127 may cover the entire end portion of the mask layer 118*a*. For example, the end portion of the insulating layer 127 sags and covers the end portion of the mask layer 118*a* in some cases. Alternatively, for example, the end portion of the insulating layer 127 is in contact with the top surface of the first layer 113 in some cases. As described above, in the case where light exposure is not performed on the insulating layer 127*b* after development, the shape of the insulating layer 127 is easily changed in some cases.

The second etching treatment is preferably performed by wet etching. The use of a wet etching method can reduce damage to the first layer 113 compared with the case of using a dry etching method. The wet etching can be performed using an alkaline solution or the like.

As described above, providing the insulating layer 127, the insulating layer 125, and the mask layer 118*a* can inhibit the common layer 114 and the common electrode 115 between the light-emitting devices from having connection defects due to a disconnected portion and an increase in electric resistance due to a locally thinned portion. Thus, the display quality of the display device of one embodiment of the present invention can be improved.

After part of the first layer 113 is exposed, additional heat treatment may be performed. The heat treatment can remove water contained in the EL layer, water adsorbed onto the surface of the EL layer, and the like. In addition, the heat treatment changes the shape of the insulating layer 127 in some cases. Specifically, the insulating layer 127 may be extended to cover at least one of the end portion of the insulating layer 125, the end portion of the mask layer 118*a*, and the top surface of the first layer 113. For example, the insulating layer 127 may have a shape illustrated in FIG. 3A and FIG. 3B. For example, heat treatment in an inert gas atmosphere or a reduced pressure atmosphere can be performed. The heat treatment can be performed at a substrate temperature higher than or equal to 50° C. and lower than or equal to 200° C., preferably higher than or equal to 60° C. and lower than or equal to 150° C., further preferably higher than or equal to 70° C. and lower than or equal to 120° C. A reduced-pressure atmosphere is preferable because dehydration at a lower temperature is possible. Note that the temperature range of the heat treatment is preferably set as appropriate in consideration of the upper temperature limit of the EL layer. In consideration of the upper temperature limit of the EL layer, temperatures from 70° C. to 120° C. are particularly preferable in the above temperature range.

Figure 14C:
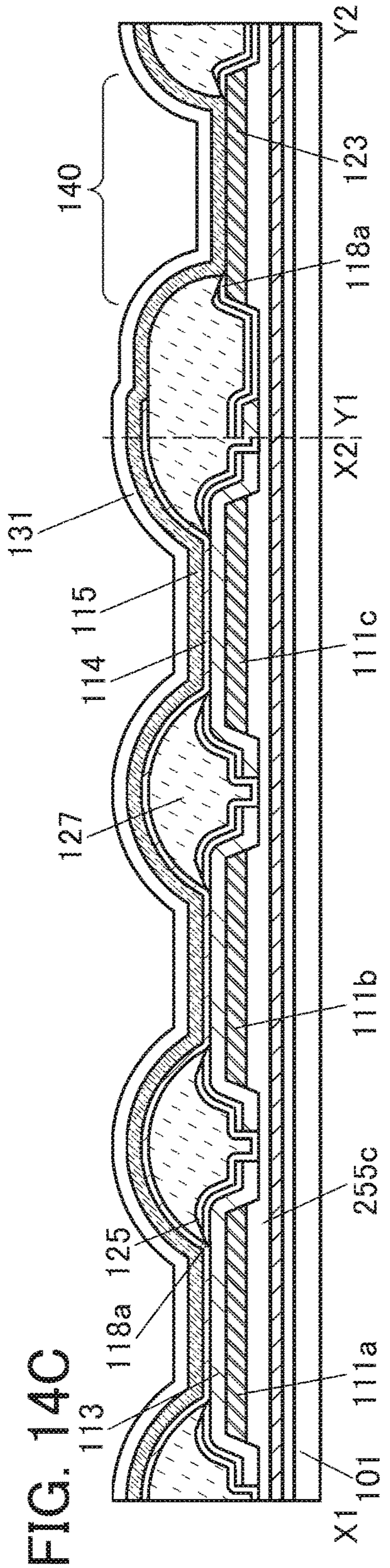

Next, the common layer 114, the common electrode 115, and the protective layer 131 are formed in this order over the insulating layer 127 and the first layer 113 (FIG. 14(C)). Then, the coloring layers 132R, 132G, and 132B are formed over the protective layer 131. Furthermore, the substrate 120 is bonded onto the protective layer 131 and the coloring layers 132R, 132G, and 132B with the resin layer 122, whereby the display device can be manufactured (FIG. 1B).

The common layer 114 can be formed by a method such as an evaporation method (including a vacuum evaporation method), a transfer method, a printing method, an inkjet method, or a coating method.

The common electrode 115 can be formed by a sputtering method or a vacuum evaporation method, for example. Alternatively, a film formed by an evaporation method and a film formed by a sputtering method may be stacked.

Examples of methods for forming the protective layer 131 include a vacuum evaporation method, a sputtering method, a CVD method, and an ALD method.

Manufacturing Method Example 2

In Manufacturing method example 1, the example is described in which before post-baking is performed (FIG. 14A), light exposure is performed on the entire substrate and the insulating layer 127*b* is irradiated with visible light or ultraviolet rays (FIG. 13C). In Manufacturing method example 2, three kinds of examples are described in each of which the light exposure is performed at a timing different from that in Manufacturing method example 1.

Note that there is no particular limitation on the timing and the number of light irradiation on the insulating layer 127*b* or the insulating layer 127 after development, and the steps described in Manufacturing method examples 1 and 2 may be combined to be performed.

<<2-1: Before Formation of Common Electrode 115>>

First, the steps in FIG. 10A to FIG. 12C are performed in a manner similar to that in Manufacturing method example 1.

Figure 16A:
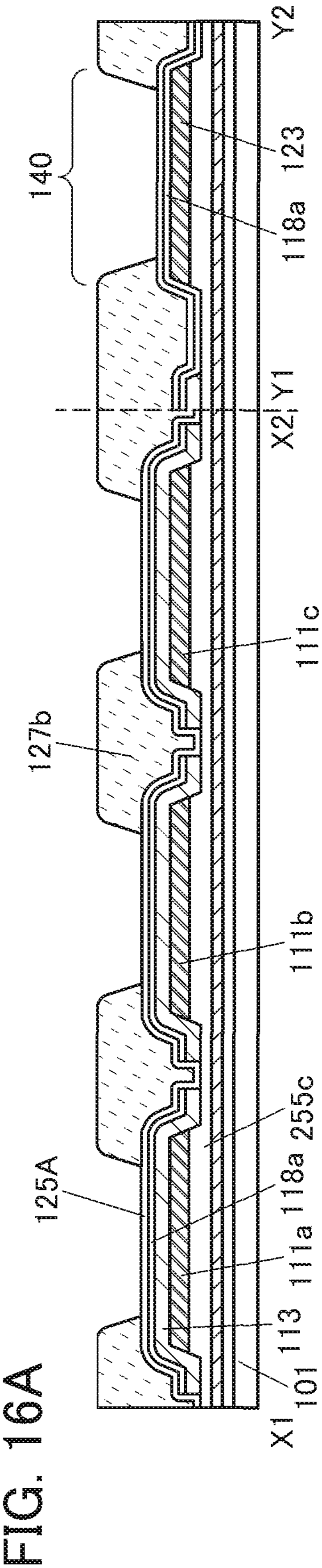
FIG. 16A and FIG. 16B are cross-sectional views illustrating an example of a method for manufacturing a display device.

Next, as illustrated in FIG. 16A, development is performed to form the insulating layer 127*b*. The step illustrated in FIG. 16A is similar to the step in FIG. 13A of Manufacturing method example 1.

Figure 16B:
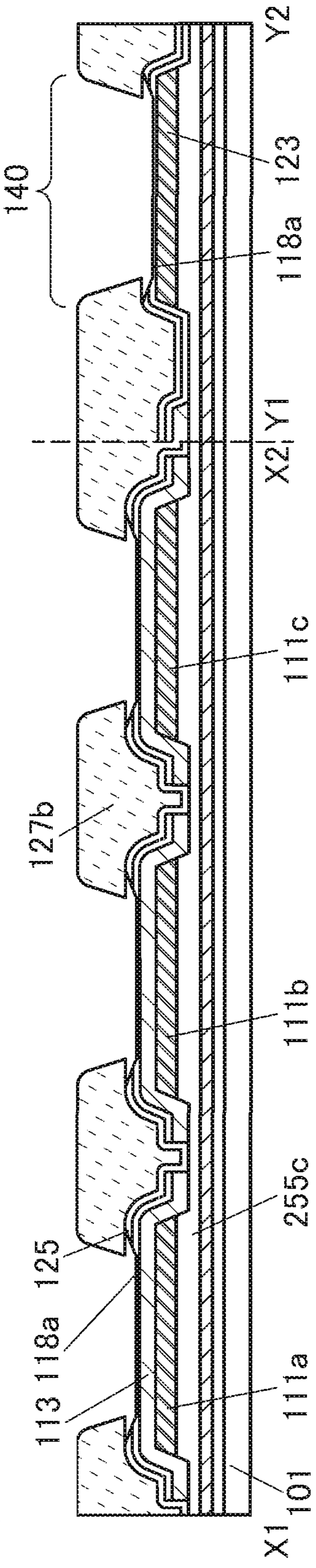

Next, as illustrated in FIG. 16B, etching treatment is performed using the insulating layer 127*b* as a mask to remove part of the insulating film 125A, so that the mask layer 118*a* is partly thinned down. The step illustrated in FIG. 16B is similar to the step (the first etching treatment) in FIG. 13B of Manufacturing method example 1.

Figure 17A:
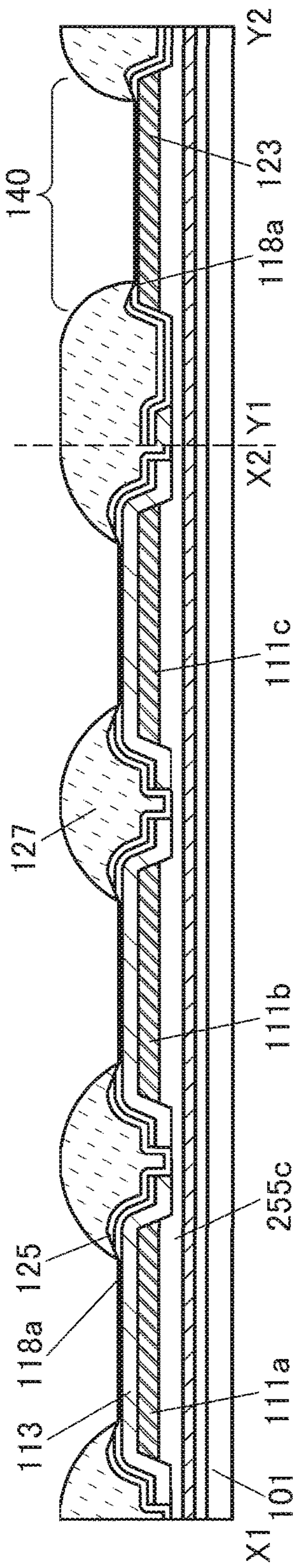
FIG. 17A to FIG. 17C are cross-sectional views illustrating an example of a method for manufacturing a display device.

Then, heat treatment is performed without performing light exposure. The step illustrated in FIG. 17A is similar to the step (the post-baking) in FIG. 14A of Manufacturing method example 1. Since light exposure is not performed, the shape of the insulating layer 127 may be easily changed. For example, the end portion of the insulating layer 127 may have a smaller taper angle. The end portion of the insulating layer 127 may cover the entire side surface of the mask layer, and furthermore, may be positioned more outwardly than the end portion of the mask layer.

Figure 17B:
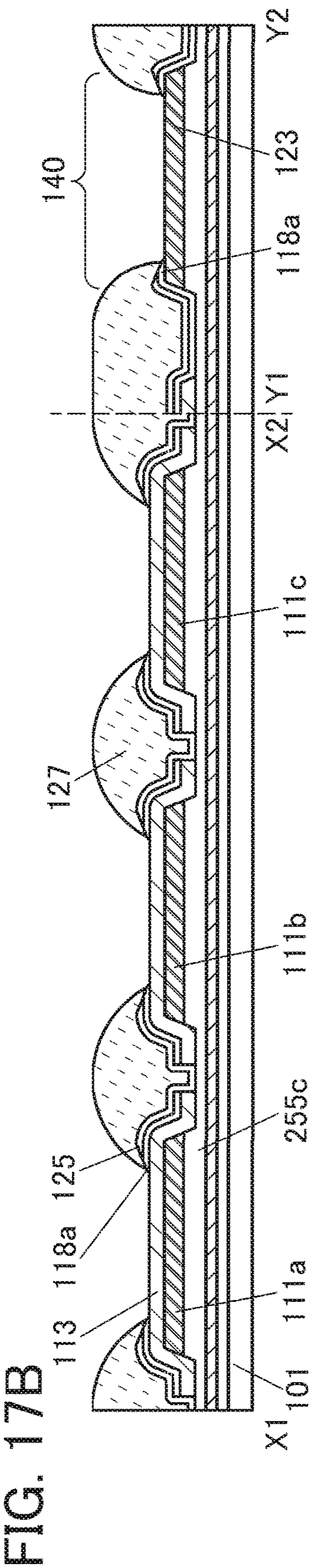

Next, as illustrated in FIG. 17B, etching treatment is performed using the insulating layer 127 as a mask to remove part of the mask layer 118*a*. The step illustrated in FIG. 17B is similar to the step (the second etching treatment) in FIG. 14B of Manufacturing method example 1.

Figure 17C:
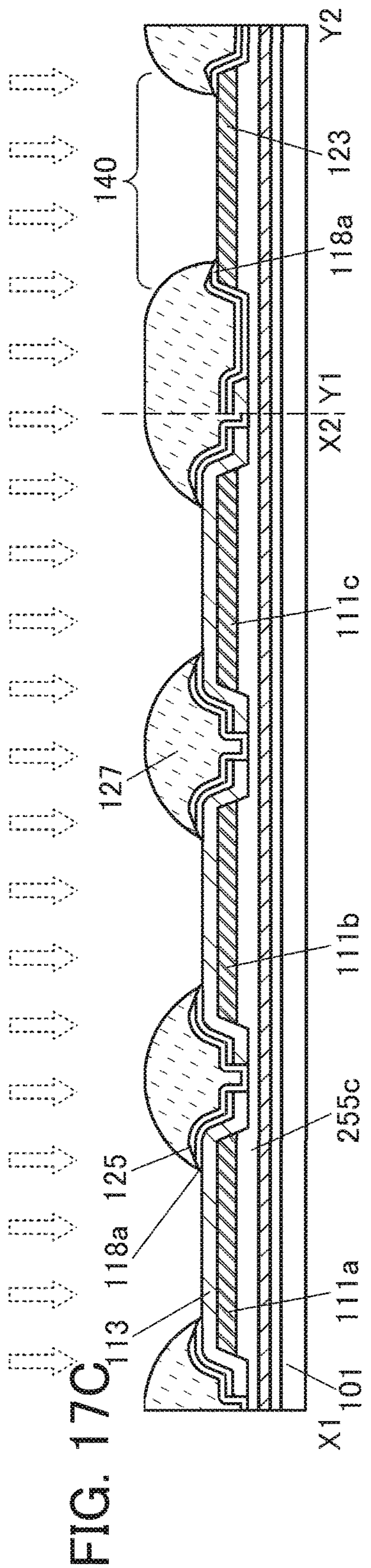

Next, as illustrated in FIG. 17C, light exposure is performed on the entire substrate and the insulating layer 127 is irradiated with visible light or ultraviolet rays. The step illustrated in FIG. 17C is similar to the step in FIG. 13C of Manufacturing method example 1. In the case where a resin that is cured or promoted to be cured by light irradiation is used as a material of the insulating layer 127, the insulating layer 127 can be sufficiently cured by performing light irradiation at least once after development and the shape stability can be improved.

Then, the step in FIG. 14C is performed in a manner similar to that in Manufacturing method example 1. Specifically, the common layer 114, the common electrode 115, and the protective layer 131 are formed in this order over the insulating layer 127 and the first layer 113. Furthermore, the substrate 120 is bonded onto the protective layer 131 with the resin layer 122, whereby the display device can be manufactured (FIG. 1B).

<<2-2: After Formation of Common Electrode 115>>

First, the steps up to FIG. 16B are performed in a manner similar to that in Manufacturing method example 2-1.

Figure 18A:
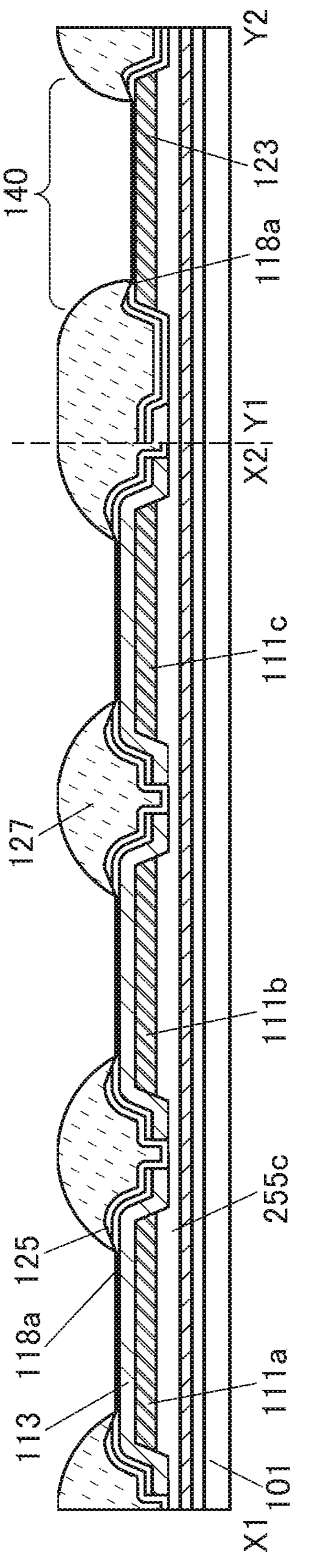
FIG. 18A and FIG. 18B are cross-sectional views illustrating an example of a method for manufacturing a display device.

Then, heat treatment is performed without performing light exposure. The step illustrated in FIG. 18A is similar to the step (the post-baking) in FIG. 14A of Manufacturing method example 1. Since light exposure is not performed, the shape of the insulating layer 127 may be easily changed. For example, the end portion of the insulating layer 127 may have a smaller taper angle. The end portion of the insulating layer 127 may cover the entire side surface of the mask layer, and furthermore, may be positioned more outwardly than the end portion of the mask layer.

Figure 18B:
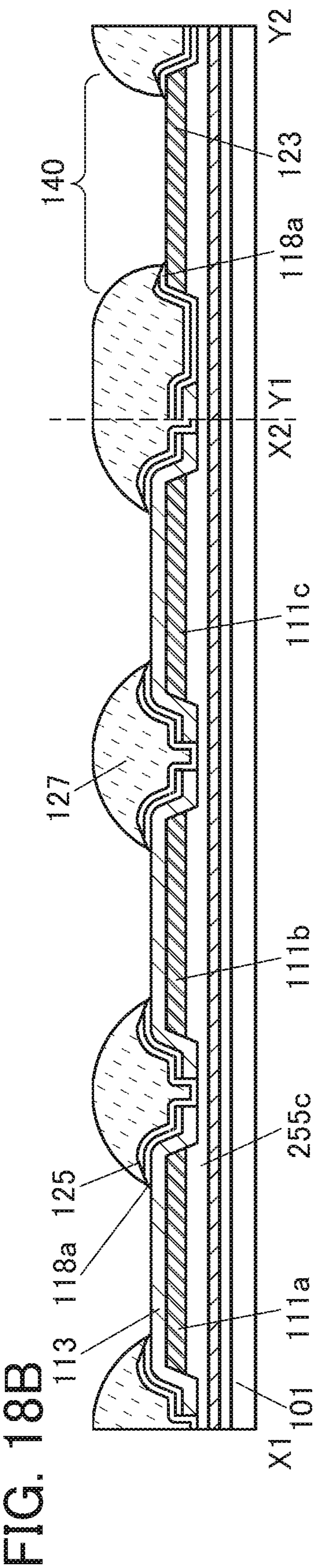

Next, as illustrated in FIG. 18B, etching treatment is performed using the insulating layer 127 as a mask to remove part of the mask layer 118*a*. The step illustrated in FIG. 18B is similar to the step (the second etching treatment) in FIG. 14B of Manufacturing method example 1.

Figures 19A, 19B, 19C:
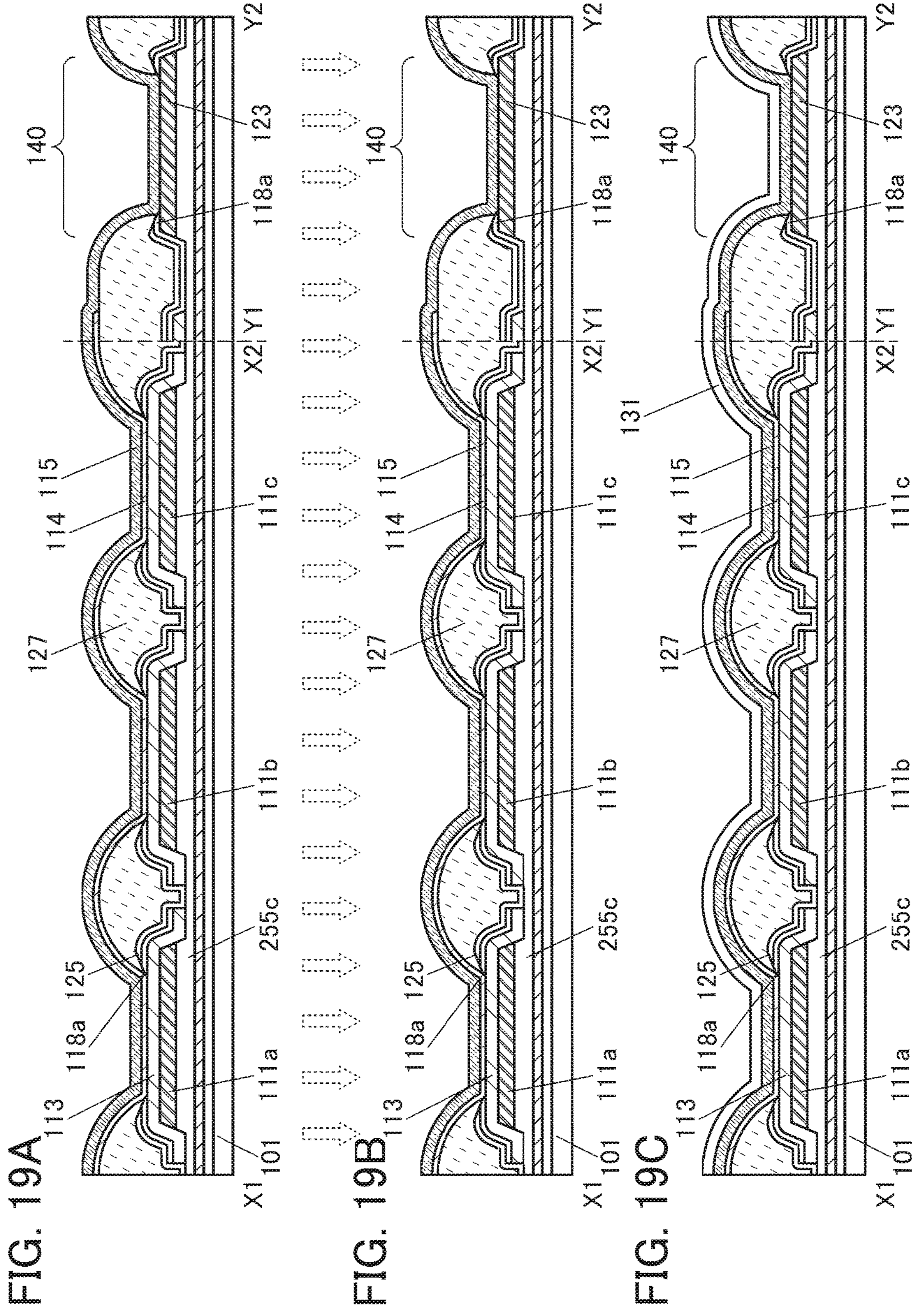
FIG. 19A to FIG. 19C are cross-sectional views illustrating an example of a method for manufacturing a display device.

Next, without performing light exposure, the common layer 114 is formed over the insulating layer 127 and the first layer 113 and the common electrode 115 is formed over the common layer 114 as illustrated in FIG. 19A.

Next, as illustrated in FIG. 19B, light exposure is performed on the entire substrate and the insulating layer 127 is irradiated with visible light or ultraviolet rays. The step illustrated in FIG. 19B is similar to the step in FIG. 13C of Manufacturing method example 1. In the case where a resin that is cured or promoted to be cured by light irradiation is used as a material of the insulating layer 127, the insulating layer 127 can be sufficiently cured by performing light irradiation at least once after development and the shape stability can be improved.

After that, the protective layer 131 is formed over the common electrode 115 (FIG. 19C). Furthermore, the substrate 120 is bonded onto the protective layer 131 with the resin layer 122, whereby the display device can be manufactured (FIG. 1B).

<<2-3: After formation of protective layer 131>>

First, the steps up to FIG. 18B are performed in a manner similar to that in Manufacturing method example 2-2.

Figure 20A:
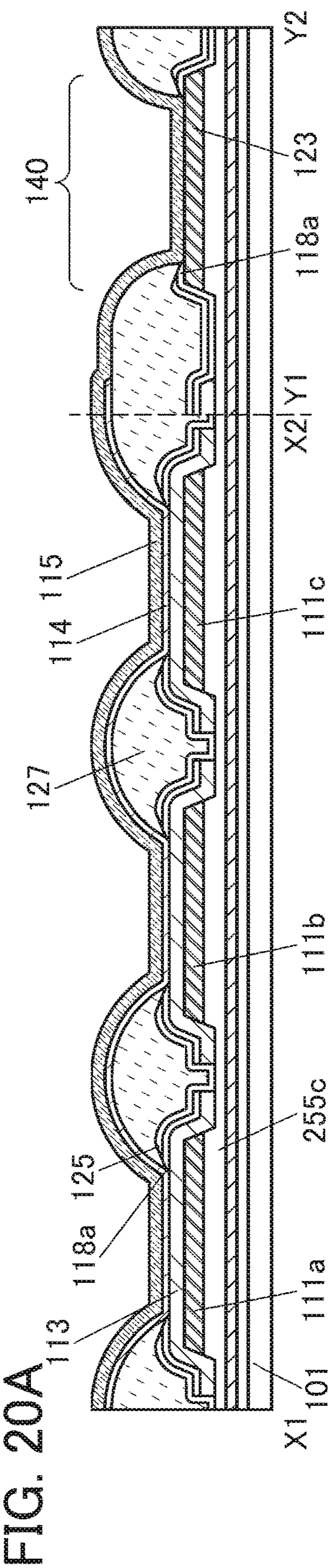
FIG. 20A to FIG. 20C are cross-sectional views illustrating an example of a method for manufacturing a display device.
Figure 20B:
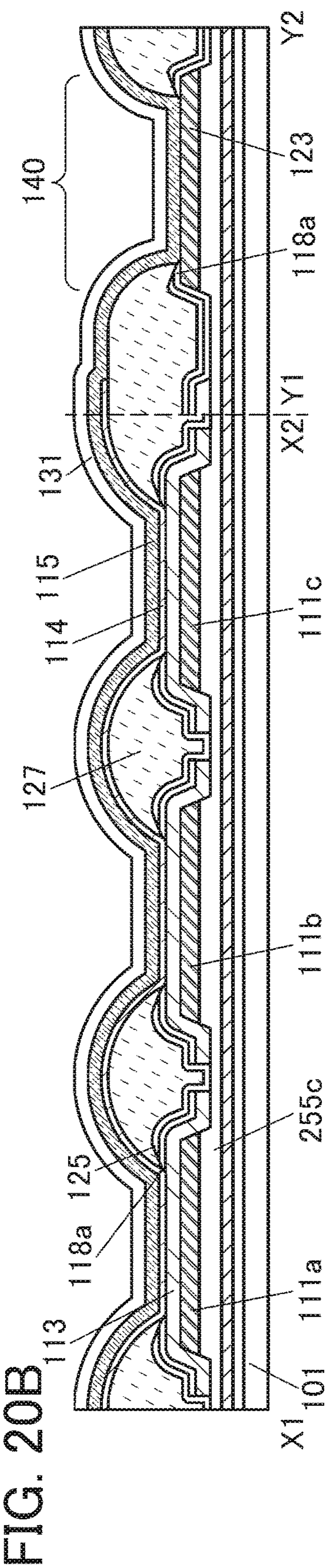

Next, without performing light exposure, the common layer 114 is formed over the insulating layer 127 and the first layer 113 and the common electrode 115 is formed over the common layer 114 as illustrated in FIG. 20A. Moreover, without performing light exposure, the protective layer 131 is formed over the common electrode 115 as illustrated in FIG. 20B.

Figure 20C:
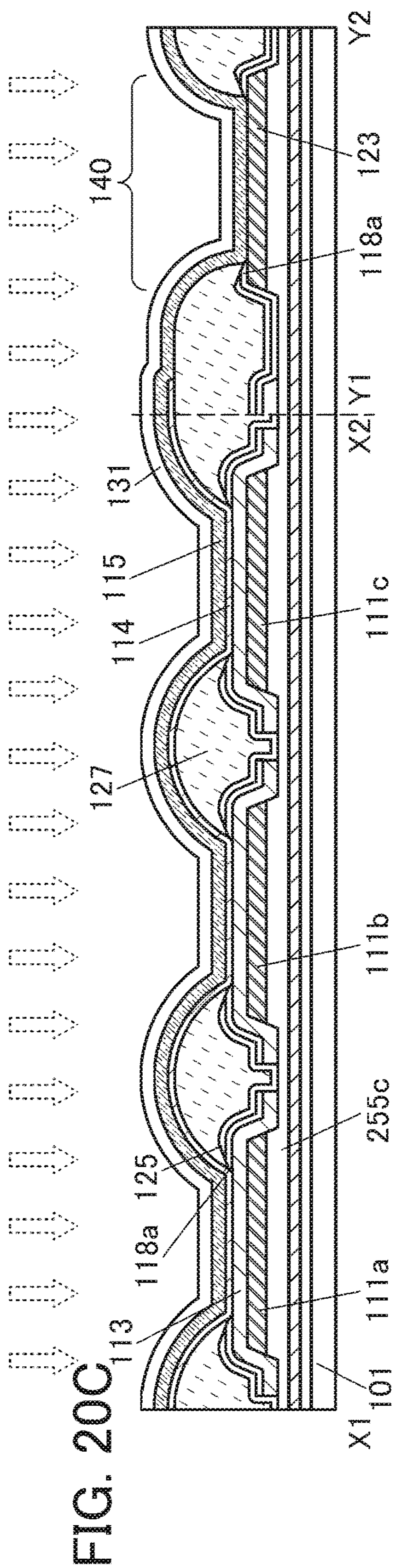

Next, as illustrated in FIG. 20C, light exposure is performed on the entire substrate and the insulating layer 127 is irradiated with visible light or ultraviolet rays. The step illustrated in FIG. 20C is similar to the step in FIG. 13C of Manufacturing method example 1. In the case where a resin that is cured or promoted to be cured by light irradiation is used as a material of the insulating layer 127, the insulating layer 127 can be sufficiently cured by performing light irradiation at least once after development and the shape stability can be improved.

After that, the substrate 120 is bonded onto the protective layer 131 with the resin layer 122, whereby the display device can be manufactured (FIG. 1B).

As described above, in the method for manufacturing a display device of one embodiment of the present invention, the island-shaped EL layer is formed by processing an EL layer formed on the entire surface, not by using a fine metal mask. Thus, the size of the island-shaped EL layer can be made smaller than the size of the EL layer formed with use of a fine metal mask. Accordingly, a high-resolution display device or a display device with a high aperture ratio, which has been difficult to be formed so far, can be achieved. Furthermore, even when the resolution or the aperture ratio is high and the distance between subpixels is extremely short, contact between the island-shaped EL layers can be inhibited in adjacent subpixels. Accordingly, generation of a leakage current between subpixels can be inhibited. Accordingly, degradation of the display quality of the display device can be inhibited. In addition, both the higher resolution and higher display quality of the display device can be achieved.

Provision of the insulating layer 127 having a tapered shape on its end portion between adjacent island-shaped EL layers can inhibit formation of step disconnection and prevent formation of a locally thinned portion in the common electrode 115 at the time of forming the common electrode 115. This can inhibit the common layer 114 and the common electrode 115 from having connection defects due to the disconnected portion and an increased electric resistance due to the locally thinned portion.

This embodiment can be combined with the other embodiments as appropriate.

Embodiment 3

In this embodiment, a display device of one embodiment of the present invention is described with reference to FIG. 21 and FIG. 22.

Figure 21A:
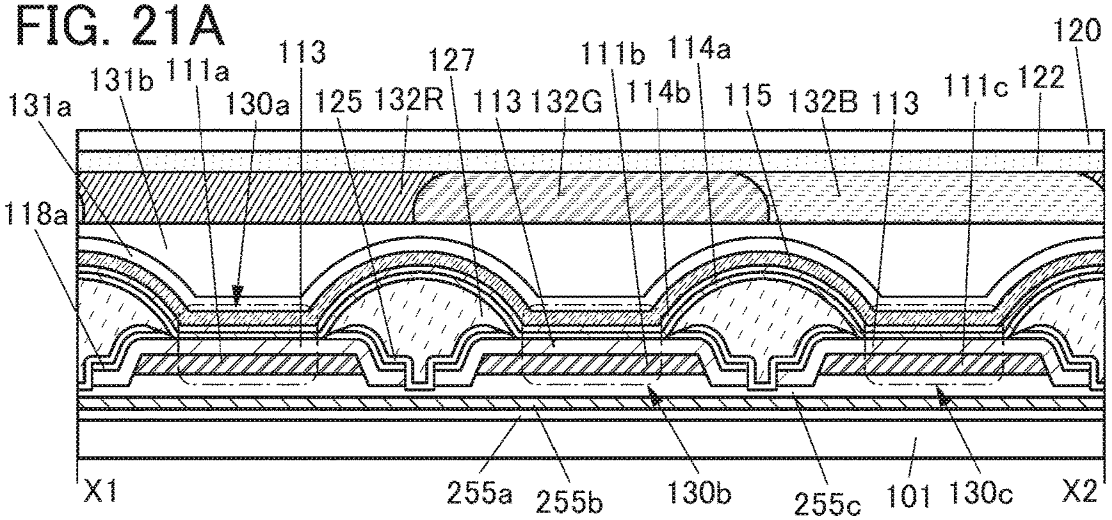
FIG. 21A to FIG. 21C are cross-sectional views illustrating examples of a display device.

FIG. 21A is a cross-sectional view taken along the dashed-dotted line X1-X2 in FIG. 1A and can be referred to as a variation example of the structure illustrated in FIG. 1B.

In a display device illustrated in FIG. 21A, an insulating layer is provided over the layer 101 including transistors, the light-emitting devices 130*a*, 130*b*, and 130*c* are provided over the insulating layer, a protective layer 131*a* is provided to cover these light-emitting devices, and a protective layer 131*b* is provided over the protective layer 131*a*. The coloring layers 132R, 132G, and 132B are provided over the protective layer 131*b*, and the substrate 120 is bonded onto the coloring layers 132R, 132G, and 132B with the resin layer 122. In a region between adjacent light-emitting devices, the insulating layer 125 and the insulating layer 127 over the insulating layer 125 are provided.

In FIG. 21A, the insulating layer 255*a*, the insulating layer 255*b* over the insulating layer 255*a*, and the insulating layer 255*c* over the insulating layer 255*b* are illustrated as the insulating layer over the transistors.

For each of the protective layers 131*a* and 131*b*, a material that can be used for the protective layer 131 can be used. An inorganic insulating film is preferably used as the protective layer 131*a* and an organic insulating film is preferably used as the protective layer 131*b*. The use of an inorganic insulating film as the protective layer 131*a* can inhibit deterioration of the light-emitting device and improve the reliability of the display device. The use of an organic insulating film as the protective layer 131*b* can flatten the top surface of the protective layer 131*b*, which is the formation surface of the coloring layer.

The light-emitting device 130*a* includes the pixel electrode 111*a* over the insulating layer 255*c*, the island-shaped first layer 113 over the pixel electrode 111*a*, a common layer 114*a* over the first layer 113, a common layer 114*b* over the common layer 114*a*, and the common electrode 115 over the common layer 114*b*. The light-emitting device 130*b* includes the pixel electrode 111*b* over the insulating layer 255*c*, the island-shaped first layer 113 over the pixel electrode 111*b*, the common layer 114*a* over the first layer 113, the common layer 114*b* over the common layer 114*a*, and the common electrode 115 over the common layer 114*b*. The light-emitting device 130*c* includes the pixel electrode 111*c* over the insulating layer 255*c*, the first layer 113 over the pixel electrode 111*c*, the common layer 114*a* over the first layer 113, the common layer 114*b* over the common layer 114*a*, and the common electrode 115 over the common layer 114*b*. In each of the light-emitting devices 130*a*, 130*b*, and 130*c*, the first layer 113, the common layer 114*a*, and the common layer 114*b* can be collectively referred to as an EL layer.

The light-emitting devices 130*a*, 130*b*, and 130*c* each include the first layer 113, and the first layers 113 are apart from each other. When the EL layer is provided in an island shape for each light-emitting device, a leakage current between adjacent light-emitting devices can be inhibited. This can prevent crosstalk due to unintended light emission, so that a display device with extremely high contrast can be obtained.

The display device illustrated in FIG. 21A is different from the structure illustrated in FIG. 1B mainly in that the common layer 114 has a stacked-layer structure of the common layer 114*a* and the common layer 114*b* over the common layer 114*a*. The description of Embodiment 1 can be referred to for the components similar to those in the structure illustrated in FIG. 1B.

FIG. 21B, FIG. 21C, FIG. 22A, and FIG. 22B each illustrate an enlarged view of a region including the light-emitting device 130*a*, the mask layer 118*a*, the insulating layer 125, and the insulating layer 127.

Figure 21B:
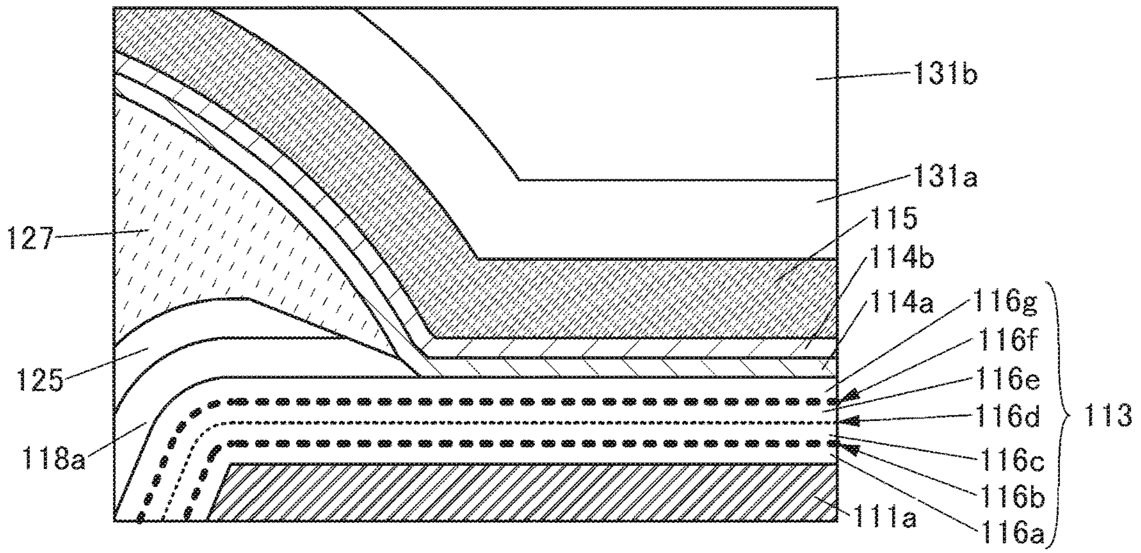

The first layer 113 illustrated in FIG. 21B includes a layer 116*a* over the pixel electrode 111*a*, a layer 116*b* over the layer 116*a*, a layer 116*c* over the layer 116*b*, a layer 116*d* over the layer 116*c*, a layer 116*e* over the layer 116*d*, a layer 116*f* over the layer 116*e*, and a layer 116*g* over the layer 116*f*. The common layer 114*a* is provided in contact with the layer 116*g* and the common layer 114*b* is provided in contact with the common layer 114*a*.

For example, the layer 116*a* includes a hole-injection layer and a hole-transport layer, the layer 116*b* includes a light-emitting layer, the layer 116*c* includes an electron-transport layer, the layer 116*d* includes a charge-generation layer, the layer 116*e* includes a hole-transport layer, the layer 116*f* includes a light-emitting layer, the layer 116*g* includes an electron-transport layer, the common layer 114*a* includes an electron-transport layer, and the common layer 114*b* includes an electron-injection layer. The layer 116*a* may include an electron-blocking layer positioned between the hole-transport layer and the layer 116*b* (the light-emitting layer). The layer 116*c* may include a hole-blocking layer positioned between the layer 116*b* (the light-emitting layer) and the electron-transport layer. The layer 116*e* may include an electron-blocking layer positioned between the hole-transport layer and the layer 116*f* (the light-emitting layer). The layer 116*g* may include a hole-blocking layer positioned between the layer 116*f* (the light-emitting layer) and the electron-transport layer. The layer 116*g* and the common layer 114*a* may contain the same material or different materials.

As the case where two layers contain the same material, a case is given where two layers contain the same compound (organic compound, for example). For example, when a light-emitting device is analyzed and peaks (or fragments) with the same mass-to-charge ratio (m/z) are detected from two layers, it can be confirmed that the two layers contain the same material. As an analysis means of the light-emitting device, a time-of-flight secondary ion mass spectrometer (TOF-SIMS) is given, for example.

For example, the layer 116*a* includes an electron-injection layer and an electron-transport layer, the layer 116*b* includes a light-emitting layer, the layer 116*c* includes a hole-transport layer, the layer 116*d* includes a charge-generation layer, the layer 116*e* includes an electron-transport layer, the layer 116*f* includes a light-emitting layer, the layer 116*g* includes a hole-transport layer, the common layer 114*a* includes a hole-transport layer, and the common layer 114*b* includes a hole-injection layer. The layer 116*a* may include a hole-blocking layer positioned between the electron-transport layer and the layer 116*b* (the light-emitting layer). The layer 116*c* may include an electron-blocking layer positioned between the layer 116*b* (the light-emitting layer) and the hole-transport layer. The layer 116*e* may include a hole-blocking layer positioned between the electron-transport layer and the layer 116*f* (the light-emitting layer). The layer 116*g* may include an electron-blocking layer positioned between the layer 116*f* (the light-emitting layer) and the hole-transport layer. The layer 116*g* and the common layer 114*a* may contain the same material or different materials.

Note that although this embodiment describes a light-emitting device having a tandem structure as an example, a light-emitting device having a single structure can also be used.

Here, during the manufacturing process of the display device, the surface of the first layer 113 might be damaged due to processing or the like. In addition, during the manufacturing process of the display device, impurities such as oxygen and water might attach onto or enter the surface of the first layer 113. Alternatively, some component elements of the mask layer 118*a* might attach onto or enter the surface of the first layer 113. For example, in the case of using an aluminum oxide film as the mask layer 118*a*, one or both of oxygen and aluminum might attach onto or enter the surface of the first layer 113. Such damage and impurities might lower the reliability of the light-emitting device.

In view of the above, in the method for manufacturing a display device of one embodiment of the present invention, the first layer 113 may be partly removed. Specifically, at least part of a layer positioned on the outermost surface of the first layer 113 (the layer 116*g* in FIG. 21B and the like) is removed. Accordingly, a portion damaged due to processing or the like and a portion where impurities are attached or have entered can be removed from the first layer 113, so that the reliability of the light-emitting device can be improved.

Figure 21C:
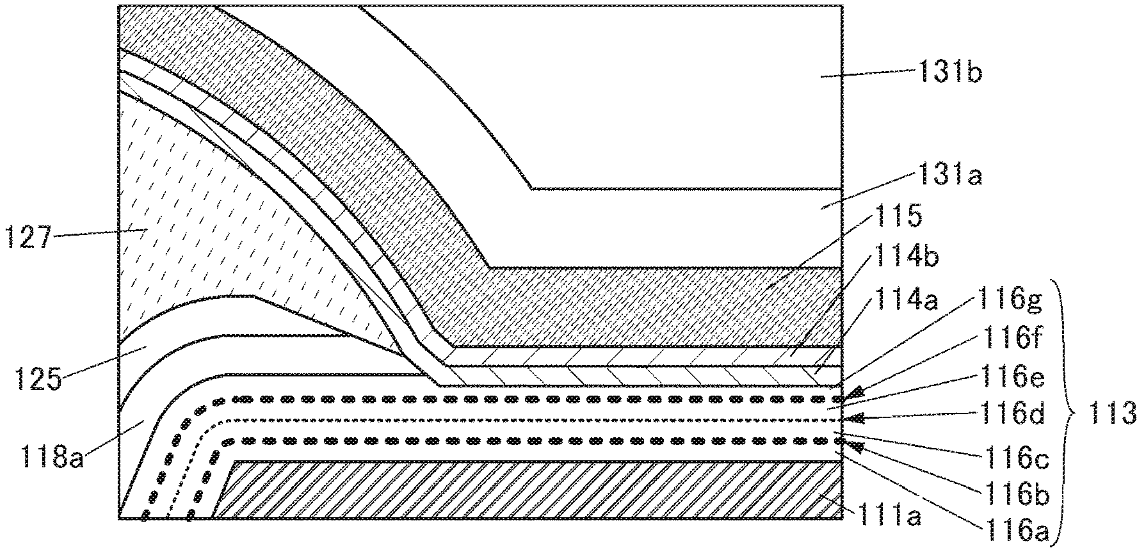

FIG. 21C illustrates an example in which the thickness of a portion in contact with the common layer 114*a* is smaller than the thickness of a portion overlapping with the mask layer 118*a* in the layer 116*g*.

The layer 116*g* is preferably formed to have a thickness larger than a desired thickness (an appropriate thickness in a light-emitting device), for example. Accordingly, after the portion affected by damage and impurities is removed, the layer 116*g* having an appropriate thickness in a light-emitting device can remain. Thus, degradation of the characteristics of the light-emitting device can be suppressed.

Alternatively, since part of the layer 116*g* is removed and thus the thickness of the layer 116*g* is reduced, a film containing the same material as the layer 116*g* may be provided later as the common layer 114*a*. This can make the thickness of a stacked-layer structure of the layer 116*g* and the common layer 114*a* appropriate in a light-emitting device.

For example, the layer 116*g* can be etched in the etching treatment described in Embodiment 2 and illustrated in FIG. 14B and FIG. 15D, or after the etching treatment.

In FIG. 14B and FIG. 15D, part of the mask layer 118*a* is removed to expose the top surfaces of the first layer 113 and the conductive layer 123.

After that, part of the first layer 113 is etched, whereby the first layer 113 having a shape similar to that illustrated in FIG. 21C can be formed.

In the step of removing part of the first layer 113, anisotropic etching is preferably employed. In particular, anisotropic dry etching is preferable. Alternatively, wet etching may be employed. A removal method similar to that for the mask layer is preferably employed, in which case part of the first layer 113 can be removed without increasing the number of steps.

Note that in the steps described in Embodiment 2 and illustrated in FIG. 13A and FIG. 15A, the mask layer 118*a* is provided over the first layer 113. In FIG. 14B and FIG. 15D, an exposed portion of the first layer 113 is a portion having been in contact with the mask layer 118*a* and might contain impurities from the mask layer 118*a* or impurities generated in the manufacturing process. In addition, the portion might be damaged due to processing or the like. As described above, by removing part of the first layer 113, the influence of damage and impurities can be reduced and the reliability of the light-emitting device can be improved.

Figure 22A:
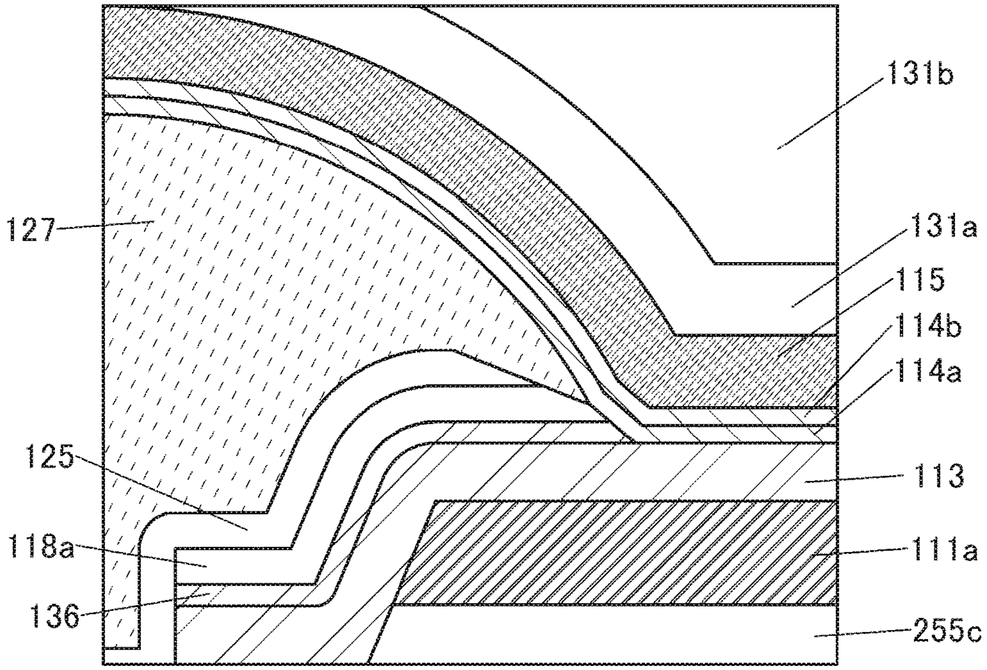
FIG. 22A and FIG. 22B are cross-sectional views illustrating an example of a display device.
Figure 22B:
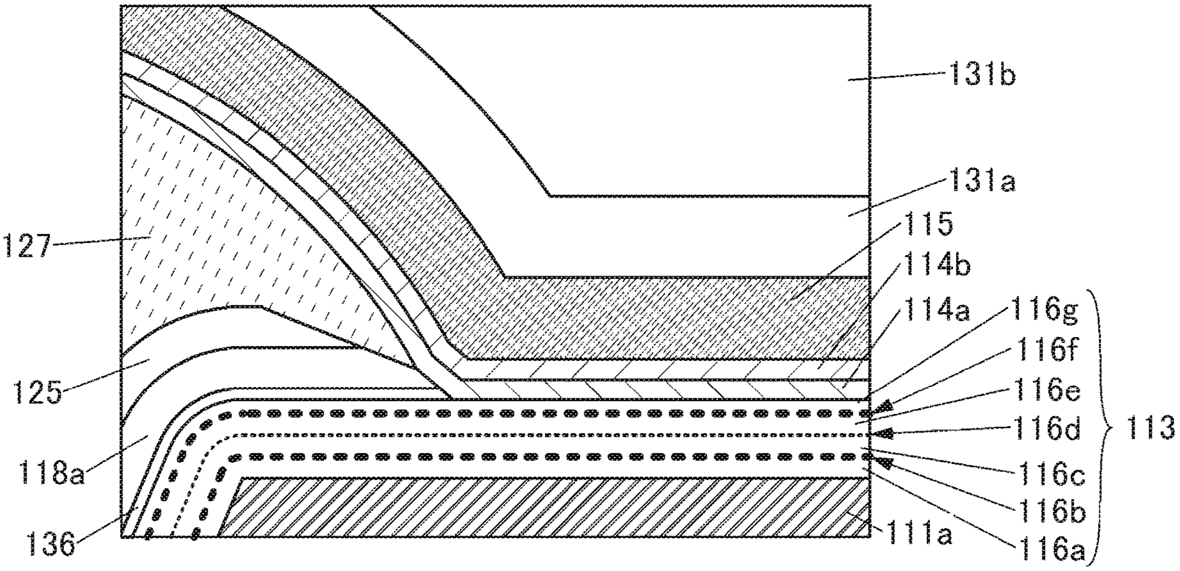

FIG. 22A and FIG. 22B illustrate an example in which a mask layer 136, which is an organic film, is provided between the layer 116*g* (the first layer 113) and the mask layer 118*a*.

For the mask layer 136, an organic film is used, and for example, a variety of organic compounds that can be used for the EL layer can be used.

For example, the mask layer 136 and the layer 116*g* may contain the same material. The mask layer 136 and the common layer 114*a* may contain the same material. In other words, the mask layer 136, the layer 116*g*, and the common layer 114*a* may contain the same material.

Moreover, for the mask layer 136, a material with high etching selectivity with respect to the layer 116*g* may be used.

The mask layer 136 can be regarded as a layer included in the first layer 113 in the steps up to FIG. 14B and FIG. 15D. The mask layer 136 is positioned in a portion where the first layer 113 is exposed in FIG. 14B and FIG. 15D. Then, part of the mask layer 136 is removed to expose the layer 116*g*. Accordingly, the structure illustrated in FIG. 22A and FIG. 22B can be achieved.

The mask layer 136 is a layer positioned on the outermost surface of the first layer 113 in the manufacturing process of the display device. Thus, the mask layer 136 might be damaged due to processing or the like. Moreover, the mask layer 136 is in contact with the mask layer 118*a* and thus might contain impurities from the mask layer 118*a* or impurities generated in the manufacturing process. Thus, by removing a portion of the mask layer 136 overlapping with a light-emitting region of the light-emitting device, the influence of damage and impurities can be reduced and the reliability of the light-emitting device can be improved.

This embodiment can be combined with the other embodiments as appropriate.

Embodiment 4

In this embodiment, a display device of one embodiment of the present invention is described with reference to FIG. 23 and FIG. 24.

[Pixel Layout]

Pixel layouts different from that in FIG. 1A will be mainly described in this embodiment. There is no particular limitation on the arrangement of subpixels, and any of a variety of methods can be employed. Examples of the arrangement of subpixels include stripe arrangement, S-stripe arrangement, matrix arrangement, delta arrangement, Bayer arrangement, and PenTile arrangement.

The top surface shape of the subpixel illustrated in a diagram in this embodiment corresponds to the top surface shape of a light-emitting region (or a light-receiving region).

Examples of a top surface shape of the subpixel include polygons such as a triangle, a tetragon (including a rectangle, a rhombus, and a square), and a pentagon; polygons with rounded corners; an ellipse; and a circle.

The range of the circuit layout for forming the subpixels is not limited to the range of the subpixels illustrated in a diagram and may be placed outside the range of the subpixels. The arrangement of the circuits and the arrangement of the light-emitting devices are not necessarily the same, and different arrangement methods may be employed. For example, the arrangement of the circuits may be stripe arrangement, and the arrangement of the light-emitting devices may be S-stripe arrangement.

Figure 23A:
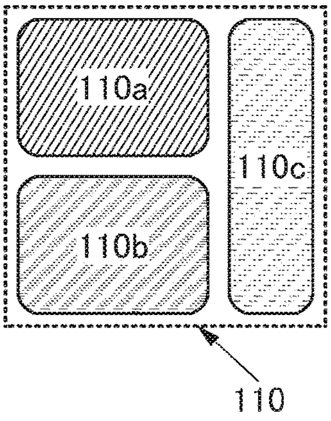
FIG. 23A to FIG. 23F are diagrams illustrating examples of pixels.

The pixel 110 illustrated in FIG. 23A employs S-stripe arrangement. The pixel 110 illustrated in FIG. 23A is composed of three subpixels: the subpixels 110*a*, 110*b*, and 110*c*.

Figure 23B:
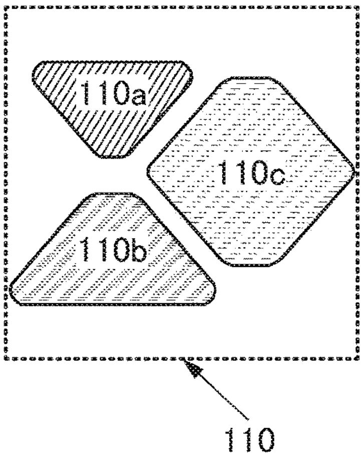

The pixel 110 illustrated in FIG. 23B includes the subpixel 110*a* whose top surface has a rough triangle or rough trapezoidal shape with rounded corners, the subpixel 110*b* whose top surface has a rough triangle or rough trapezoidal shape with rounded corners, and the subpixel 110*c* whose top surface has a rough tetragonal or rough hexagonal shape with rounded corners. The subpixel 110*b* has a larger light-emitting area than the subpixel 110*a*. In this manner, the shapes and sizes of the subpixels can be determined independently. For example, the size of a subpixel including a light-emitting device with higher reliability can be smaller.

Figure 23C:
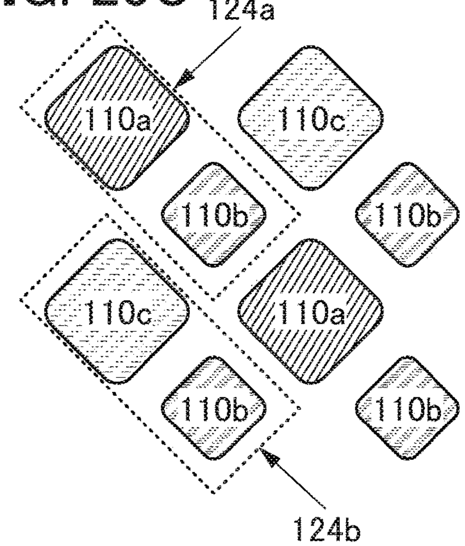

Pixels 124*a* and 124*b* illustrated in FIG. 23C employ PenTile arrangement. FIG. 23C illustrates an example in which the pixels 124*a* including the subpixel 110*a* and the subpixel 110*b* and the pixels 124*b* including the subpixel 110*b* and the subpixel 110*c* are alternately arranged.

Figure 23D:
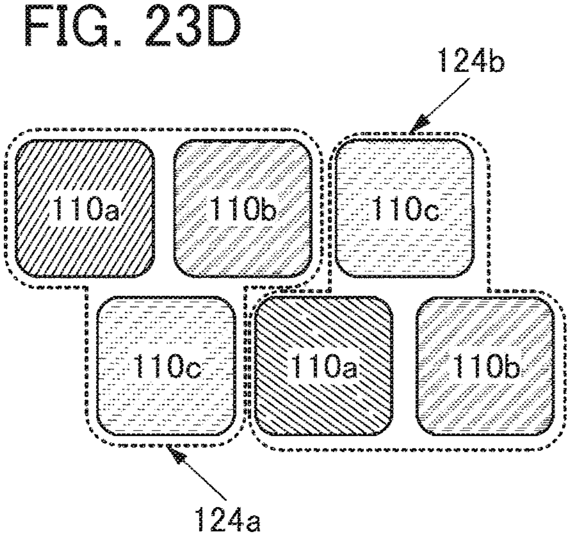
Figure 23E:
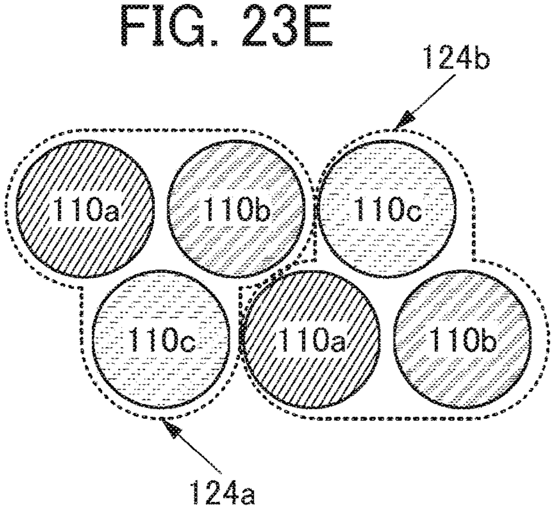

The pixels 124*a* and 124*b* illustrated in FIG. 23D and FIG. 23E employ delta arrangement. The pixel 124*a* includes two subpixels (the subpixels 110*a* and 110*b*) in the upper row (first row) and one subpixel (the subpixel 110*c*) in the lower row (second row). The pixel 124*b* includes one subpixel (the subpixel 110*c*) in the upper row (first row) and two subpixels (the subpixels 110*a* and 110*b*) in the lower row (second row).

FIG. 23D illustrates an example in which the top surface of each subpixel has a rough tetragonal shape with rounded corners, and FIG. 23E illustrates an example in which the top surface of each subpixel has a circular shape.

Figure 23F:
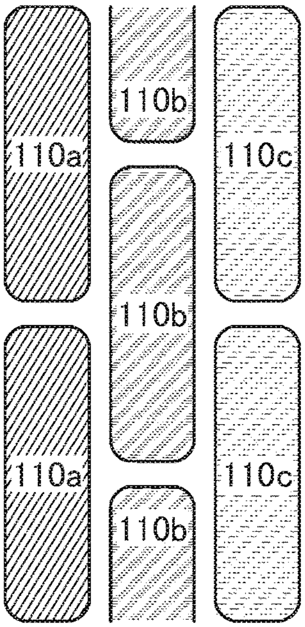

FIG. 23F illustrates an example in which subpixels of different colors are arranged in a zigzag manner. Specifically, the positions of the top sides of two subpixels arranged in the column direction (e.g., the subpixel 110*a* and the subpixel 110*b* or the subpixel 110*b* and the subpixel 110*c*) are not aligned in a top view.

For example, in each pixel illustrated in FIG. 23A to FIG. 23F, it is preferable that the subpixel 110*a* be a subpixel R emitting red light, that the subpixel 110*b* be a subpixel G emitting green light, and that the subpixel 110*c* be a subpixel B emitting blue light. Note that the structure of the subpixels is not limited to this, and the colors and arrangement order of the subpixels can be determined as appropriate. For example, the subpixel 110*b* may be the subpixel R emitting red light and the subpixel 110*a* may be the subpixel G emitting green light.

In a photolithography method, as a pattern to be processed becomes finer, the influence of light diffraction becomes more difficult to ignore; therefore, the fidelity in transferring a photomask pattern by light exposure is degraded, and it becomes difficult to process a resist mask into a desired shape. Thus, a pattern with rounded corners is likely to be formed even with a rectangular photomask pattern. Consequently, the top surface of a subpixel has a polygonal shape with rounded corners, an elliptical shape, a circular shape, or the like, in some cases.

Furthermore, in the method for manufacturing the display device of one embodiment of the present invention, the EL layer is processed into an island shape using a resist mask. A resist film formed over the EL layer needs to be cured at a temperature lower than the upper temperature limit of the EL layer. Therefore, the resist film is insufficiently cured in some cases depending on the upper temperature limit of the material of the EL layer and the curing temperature of the resist material. An insufficiently cured resist film may have a shape different from a desired shape after being processed. As a result, the top surface of the EL layer may have a polygonal shape with rounded corners, an elliptical shape, a circular shape, or the like. For example, when a resist mask whose top surface has a square shape is intended to be formed, a resist mask whose top surface has a circular shape may be formed, and the top surface of the EL layer may have a circular shape.

Note that to obtain a desired top surface shape of the EL layer, a technique of correcting a mask pattern in advance so that a transferred pattern agrees with a design pattern (OPC (Optical Proximity Correction) technique) may be used. Specifically, with the OPC technique, a pattern for correction is added to a corner portion or the like of a figure on a mask pattern.

As illustrated in FIG. 24A to FIG. 24I, the pixel can include four types of subpixels.

Figure 24A:
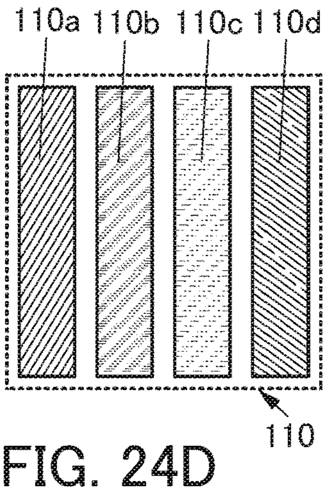
FIG. 24A to FIG. 24K are diagrams illustrating examples of a pixel.
Figure 24B:
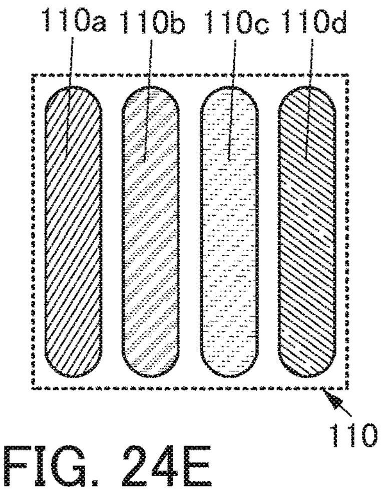
Figure 24C:
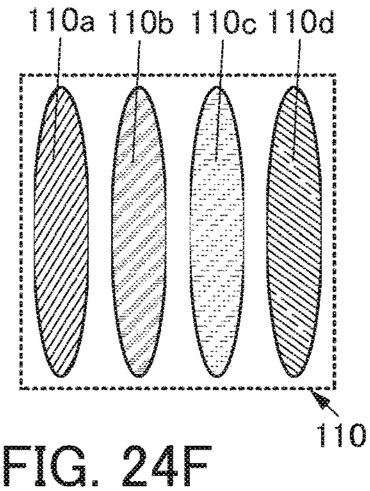

The pixels 110 illustrated in FIG. 24A to FIG. 24C employ stripe arrangement.

FIG. 24A illustrates an example in which each subpixel has a rectangular top surface shape, FIG. 24B illustrates an example in which each subpixel has a top surface shape formed by combining two half circles and a rectangle, and FIG. 24C illustrates an example in which each subpixel has an elliptical top surface shape.

Figure 24D:
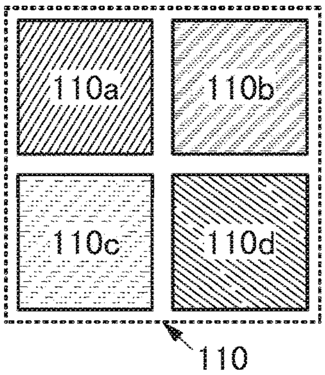
Figure 24E:
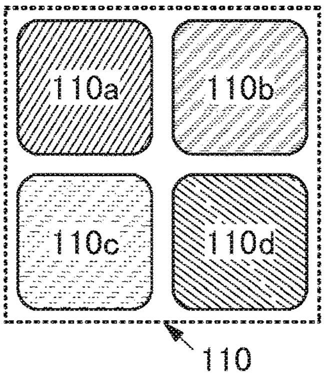
Figure 24F:
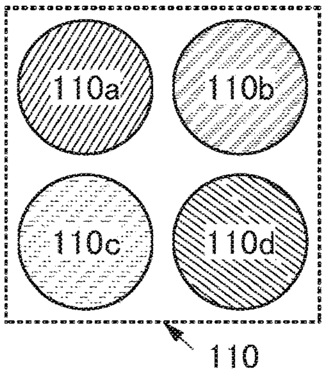

The pixels 110 illustrated in FIG. 24D to FIG. 24F employ matrix arrangement.

FIG. 24D illustrates an example in which each subpixel has a square top surface shape, FIG. 24E illustrates an example in which each subpixel has a rough square top surface shape with rounded corners, and FIG. 24F illustrates an example in which each subpixel has a circular top surface shape.

Figure 24G:
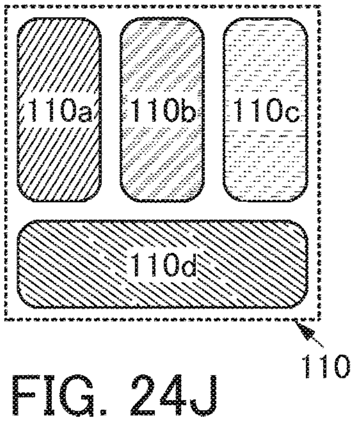
Figure 24H:
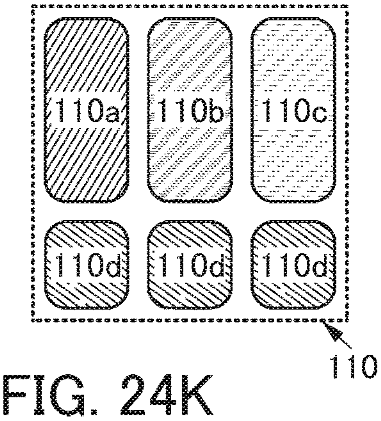

FIG. 24G and FIG. 24H each illustrate an example in which one pixel 110 is composed of two rows and three columns.

The pixel 110 illustrated in FIG. 24G includes three subpixels (the subpixels 110*a*, 110*b*, and 110*c*) in the upper row (first row) and one subpixel (the subpixel 110*d*) in the lower row (second row). In other words, the pixel 110 includes the subpixel 110*a* in the left column (first column), the subpixel 110*b* in the center column (second column), the subpixel 110*c* in the right column (third column), and the subpixel 110*d* across these three columns.

The pixel 110 illustrated in FIG. 24H includes three subpixels (the subpixels 110*a*, 110*b*, and 110*c*) in the upper row (first row) and three subpixels 110*d* in the lower row (second row). In other words, the pixel 110 includes the subpixel 110*a* and the subpixel 110*d* in the left column (first column), the subpixel 110*b* and the subpixel 110*d* in the center column (second column), and the subpixel 110*c* and the subpixel 110*d* in the right column (third column). Matching the positions of the subpixels in the upper row and the lower row as illustrated in FIG. 24H enables efficient removal of dust and the like that would be produced in the manufacturing process. Thus, a display device with high display quality can be provided.

Figure 24I:
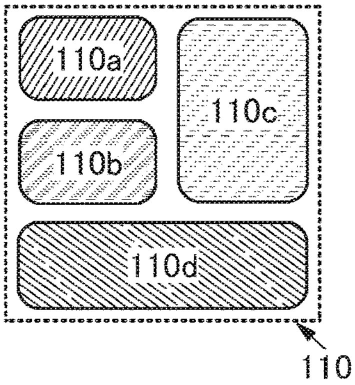

FIG. 24I illustrates an example in which one pixel 110 is composed of three rows and two columns.

The pixel 110 illustrated in FIG. 24I includes the subpixel 110*a* in the upper row (first row), the subpixel 110*b* in the center row (second row), the subpixel 110*c* across the first and second rows, and one subpixel (the subpixel 110*d*) in the lower row (third row). In other words, the pixel 110 includes the subpixels 110*a* and 110*b* in the left column (first column), the subpixel 110*c* in the right column (second column), and the subpixel 110*d* across these two columns.

The pixels 110 illustrated in FIG. 24A to FIG. 24I are each composed of four subpixels: the subpixels 110*a*, 110*b*, 110*c*, and 110*d*.

The subpixels 110*a*, 110*b*, 110*c*, and 110*d* can include light-emitting devices emitting light of different colors. The subpixels 110*a*, 110*b*, 110*c*, and 110*d* are subpixels of four colors of R, G, B, and white (W), subpixels of four colors of R, G, B, and Y, or subpixels of R, G, B, and infrared light (IR), for example.

In the pixels 110 illustrated in FIG. 24A to FIG. 24I, it is preferable that the subpixel 110*a* be the subpixel R emitting red light, that the subpixel 110*b* be the subpixel G emitting green light, that the subpixel 110*c* be the subpixel B emitting blue light, and that the subpixel 110*d* be any of a subpixel W emitting white light, a subpixel Y emitting yellow light, and a subpixel IR emitting near-infrared light, for example. In the case of such a structure, stripe arrangement is employed as the layout of R, G, and B in the pixels 110 illustrated in FIG. 24G and FIG. 24H, leading to higher display quality. In addition, what is called S-stripe arrangement is employed as the layout of R, G, and B in the pixel 110 illustrated in FIG. 24I, leading to higher display quality.

The pixel 110 may include a subpixel including a light-receiving device.

In the pixels 110 illustrated in FIG. 24A to FIG. 24I, any one of the subpixel 110*a* to the subpixel 110*d* may be a subpixel including a light-receiving device.

In the pixels 110 illustrated in FIG. 24A to FIG. 24I, for example, it is preferable that the subpixel 110*a* be the subpixel R emitting red light, that the subpixel 110*b* be the subpixel G emitting green light, that the subpixel 110*c* be the subpixel B emitting blue light, and that the subpixel 110*d* be a subpixel S including a light-receiving device. In the case of such a structure, stripe arrangement is employed as the layout of R, G, and B in the pixels 110 illustrated in FIG. 24G and FIG. 24H, leading to higher display quality. In addition, what is called S-stripe arrangement is employed as the layout of R, G, and B in the pixel 110 illustrated in FIG. 24I, leading to higher display quality.

There is no particular limitation on the wavelength of light detected by the subpixel S including a light-receiving device. The subpixel S can have a structure in which one or both of visible light and infrared light are detected.

Figure 24J:
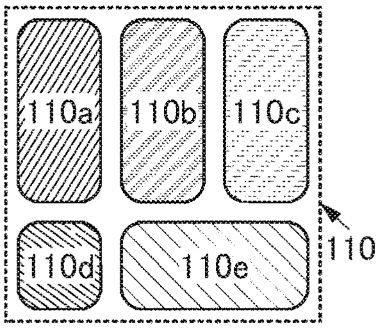
Figure 24K:
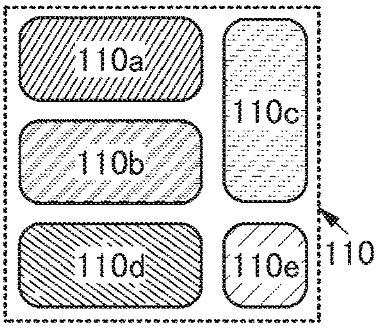

As illustrated in FIG. 24J and FIG. 24K, the pixel can include five types of subpixels.

FIG. 24J illustrates an example in which one pixel 110 is composed of two rows and three columns.

The pixel 110 illustrated in FIG. 24J includes three subpixels (the subpixels 110*a*, 110*b*, and 110*c*) in the upper row (first row) and two subpixels (the subpixel 110*d* and a subpixel 110*e*) in the lower row (second row). In other words, the pixel 110 includes the subpixels 110*a* and 110*d* in the left column (first column), the subpixel 110*b* in the center column (second column), the subpixel 110*c* in the right column (third column), and the subpixel 110*e* across the second and third columns.

FIG. 24K illustrates an example in which one pixel 110 is composed of three rows and two columns.

The pixel 110 illustrated in FIG. 24K includes the subpixel 110*a* in the upper row (first row), the subpixel 110*b* in the center row (second row), the subpixel 110*c* across the first and second rows, and two subpixels (the subpixels 110*d* and 110*e*) in the lower row (third row). In other words, the pixel 110 includes the subpixels 110*a*, 110*b*, and 110*d* in the left column (first column), and the subpixels 110*c* and 110*e* in the right column (second column).

In the pixels 110 illustrated in FIG. 24J and FIG. 24K, for example, it is preferable that the subpixel 110*a* be the subpixel R emitting red light, that the subpixel 110*b* be the subpixel G emitting green light, and that the subpixel 110*c* be the subpixel B emitting blue light. In the case of such a structure, stripe arrangement is employed as the layout of R, G, and B in the pixel 110 illustrated in FIG. 24J, leading to higher display quality. In addition, what is called S-stripe arrangement is employed as the layout of R, G, and B in the pixel 110 illustrated in FIG. 24K, leading to higher display quality.

In the pixels 110 illustrated in FIG. 24J and FIG. 24K, for example, it is preferable to use the subpixel S including a light-receiving device as at least one of the subpixel 110*d* and the subpixel 110*e*. In the case where light-receiving devices are used in both the subpixel 110*d* and the subpixel 110*e*, the light-receiving devices may have different structures. For example, the wavelength ranges of detected light may be different at least partly. Specifically, one of the subpixel 110*d* and the subpixel 110*e* may include a light-receiving device mainly detecting visible light and the other may include a light-receiving device mainly detecting infrared light.

In a preferred mode of the pixels 110 illustrated in FIG. 24J and FIG. 24K, for example, the subpixel S including a light-receiving device is used as one of the subpixel 110*d* and the subpixel 110*e* and a subpixel including a light-receiving device that can be used as a light source is used as the other. For example, it is preferable that one of the subpixel 110*d* and the subpixel 110*e* be the subpixel IR emitting infrared light and that the other be the subpixel S including a light-receiving device detecting infrared light.

In a pixel including the subpixels R, G, B, IR, and S, while an image is displayed using the subpixels R, G, and B, reflected light of infrared light emitted by the subpixel IR that is used as a light source can be detected by the subpixel S.

As described above, the pixel composed of the subpixels each including the light-emitting device can employ any of a variety of layouts in the display device of one embodiment of the present invention. The display device of one embodiment of the present invention can have a structure in which the pixel includes both a light-emitting device and a light-receiving device. Also in this case, any of a variety of layouts can be employed.

This embodiment can be combined with the other embodiments as appropriate.

Embodiment 5

In this embodiment, display devices of embodiments of the present invention will be described with reference to FIG. 25 to FIG. 35.

The display device of this embodiment can be a high-resolution display device. Accordingly, the display device of this embodiment can be used for display portions of information terminals (wearable devices) such as watch-type and bracelet-type information terminals and display portions of wearable devices capable of being worn on the head, such as a VR device like a head-mounted display (HMD) and a glasses-type AR device.

The display device of this embodiment can be a high-definition display device or a large-sized display device. Accordingly, the display device of this embodiment can be used for display portions of electronic devices such as a digital camera, a digital video camera, a digital photo frame, a mobile phone, a portable game console, a portable information terminal, and an audio reproducing device, in addition to display portions of electronic devices with a relatively large screen, such as a television device, a desktop or notebook personal computer, a monitor of a computer or the like, digital signage, and a large game machine such as a pachinko machine.

[Display Module]

Figure 25A:
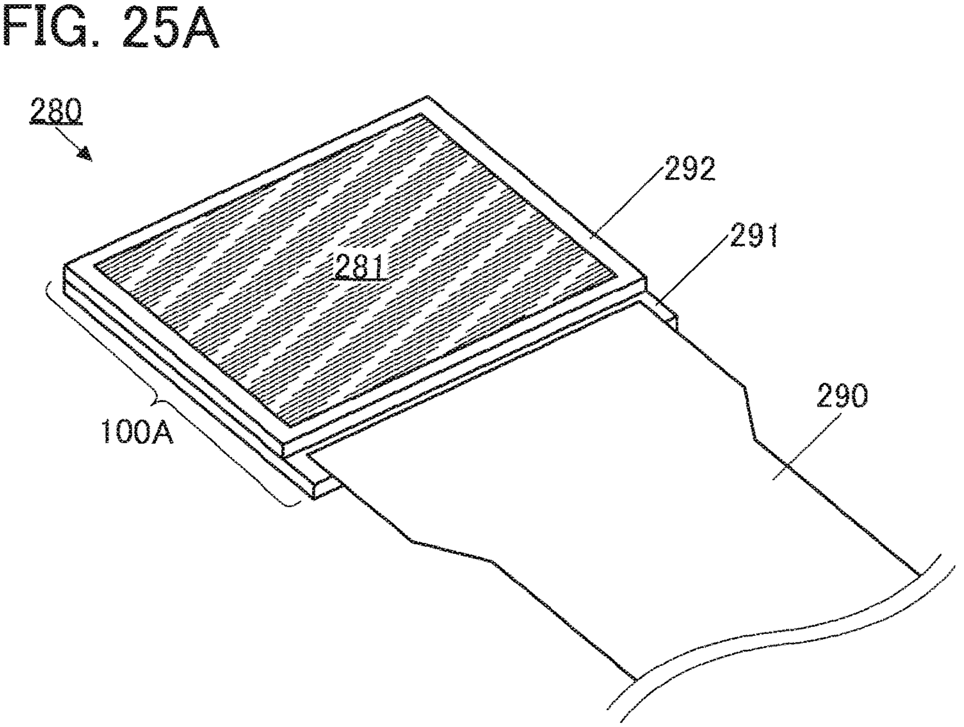
FIG. 25A and FIG. 25B are perspective views illustrating an example of a display device.

FIG. 25A shows a perspective view of a display module 280. The display module 280 includes a display device 100A and an FPC 290. Note that the display device included in the display module 280 is not limited to the display device 100A and may be any of a display device 100B to a display device 100F described later.

The display module 280 includes a substrate 291 and a substrate 292. The display module 280 includes a display portion 281. The display portion 281 is a region of the display module 280 where an image is displayed, and is a region where light emitted from pixels provided in a pixel portion 284 described later can be seen.

Figure 25B:
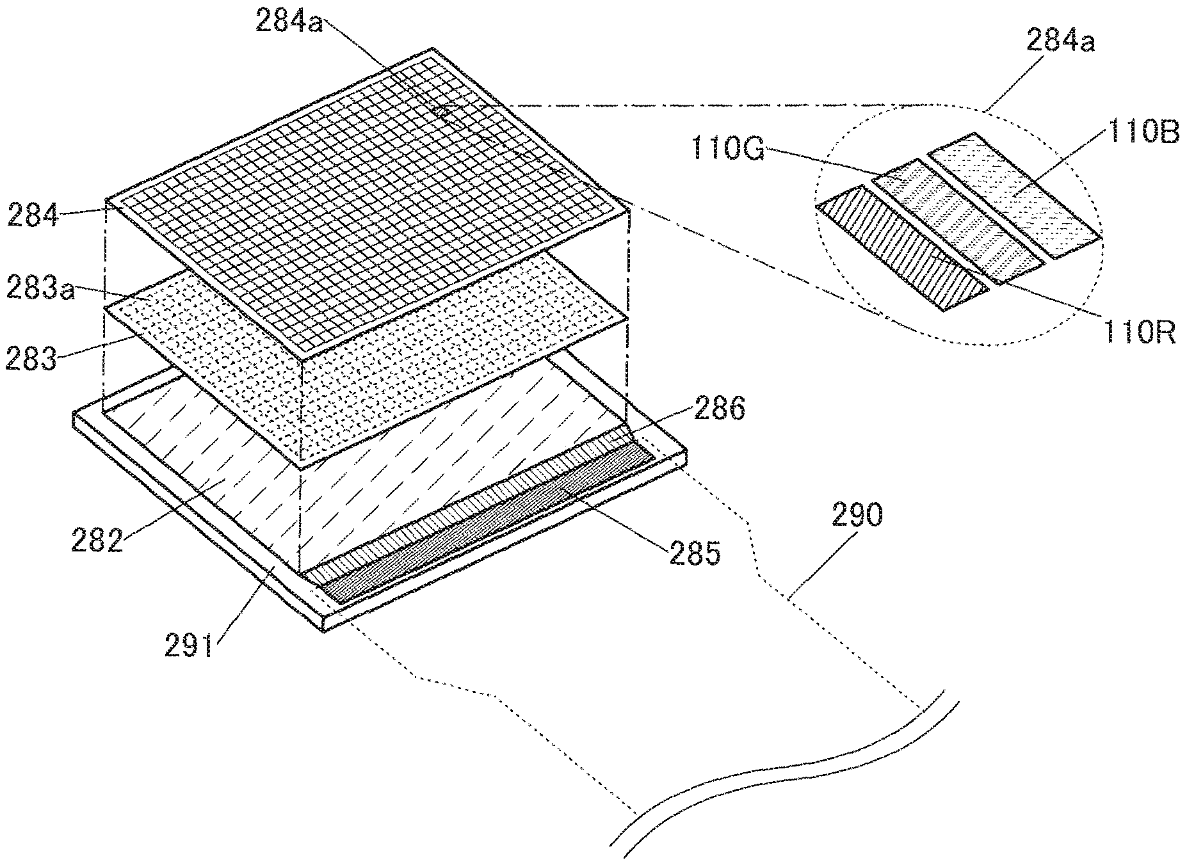

FIG. 25B shows a perspective view schematically illustrating a structure on the substrate 291 side. Over the substrate 291, a circuit portion 282, a pixel circuit portion 283 over the circuit portion 282, and the pixel portion 284 over the pixel circuit portion 283 are stacked. A terminal portion 285 to be connected to the FPC 290 is provided in a portion over the substrate 291 that does not overlap with the pixel portion 284. The terminal portion 285 and the circuit portion 282 are electrically connected to each other through a wiring portion 286 formed of a plurality of wirings.

The pixel portion 284 includes a plurality of pixels 284*a* arranged periodically. An enlarged view of one pixel 284*a* is illustrated on the right side of FIG. 25B. The pixel 284*a* can employ any of the structures described in the above embodiments. FIG. 25B illustrates an example in which a structure similar to that of the pixel 110 illustrated in FIG. 1A is employed.

The pixel circuit portion 283 includes a plurality of pixel circuits 283*a* arranged periodically.

One pixel circuit 283*a* is a circuit that controls driving of a plurality of elements included in one pixel 284*a*. One pixel circuit 283*a* can be provided with three circuits each controlling light emission of one light-emitting device. For example, the pixel circuit 283*a* can include at least one selection transistor, one current control transistor (driving transistor), and a capacitor for one light-emitting device. In this case, a gate signal is input to a gate of the selection transistor, and a source signal is input to a source of the selection transistor. Thus, an active-matrix display device is achieved.

The circuit portion 282 includes a circuit for driving the pixel circuits 283*a* in the pixel circuit portion 283. For example, the circuit portion 282 preferably includes one or both of a gate line driver circuit and a source line driver circuit. The circuit portion 282 may also include at least one of an arithmetic circuit, a memory circuit, a power supply circuit, and the like.

The FPC 290 functions as a wiring for supplying a video signal, a power supply potential, or the like to the circuit portion 282 from the outside. An IC may be mounted on the FPC 290.

The display module 280 can have a structure in which one or both of the pixel circuit portion 283 and the circuit portion 282 are stacked below the pixel portion 284; hence, the aperture ratio (the effective display area ratio) of the display portion 281 can be significantly high. For example, the aperture ratio of the display portion 281 can be greater than or equal to 40% and less than 100%, preferably greater than or equal to 50% and less than or equal to 95%, further preferably greater than or equal to 60% and less than or equal to 95%. Furthermore, the pixels 284*a* can be arranged extremely densely and thus the display portion 281 can have extremely high resolution. For example, the pixels 284*a* are preferably arranged in the display portion 281 with a resolution higher than or equal to 2000 ppi, preferably higher than or equal to 3000 ppi, further preferably higher than or equal to 5000 ppi, still further preferably higher than or equal to 6000 ppi, and lower than or equal to 20000 ppi or lower than or equal to 30000 ppi.

Such a display module 280 has extremely high resolution, and thus can be suitably used for a VR device such as an HMD or a glasses-type AR device. For example, even with a structure in which the display portion of the display module 280 is seen through a lens, pixels of the extremely-high-resolution display portion 281 included in the display module 280 are prevented from being perceived when the display portion is enlarged by the lens, so that display providing a high sense of immersion can be performed. Without being limited thereto, the display module 280 can be suitably used for electronic devices including a relatively small display portion. For example, the display module 280 can be suitably used for a display portion of a wearable electronic device, such as a wrist watch.

[Display Device 100A]

Figure 26A:
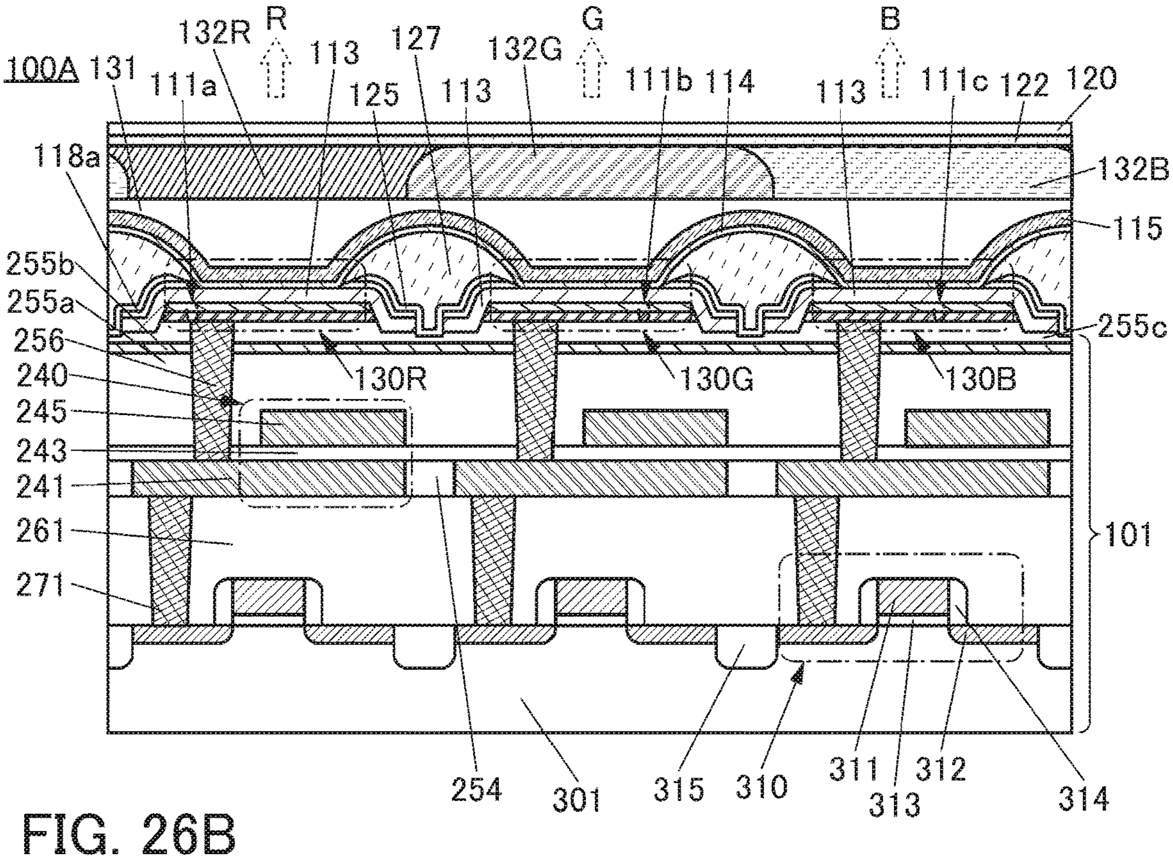
FIG. 26A and FIG. 26B are cross-sectional views illustrating examples of a display device.

The display device 100A illustrated in FIG. 26A includes a substrate 301, a light-emitting device 130R, a light-emitting device 130G, a light-emitting device 130B, the coloring layer 132R, the coloring layer 132G, the coloring layer 132B, a capacitor 240, and a transistor 310.

A subpixel 110R illustrated in FIG. 25B includes the light-emitting device 130R and the coloring layer 132R, a subpixel 110G includes the light-emitting device 130G and the coloring layer 132G, and a subpixel 110B includes the light-emitting device 130B and the coloring layer 132B. In the subpixel 110R, light emitted by the light-emitting device 130R is extracted as red light to the outside of the display device 100A through the coloring layer 132R. Similarly, in the subpixel 110G, light emitted by the light-emitting device 130G is extracted as green light to the outside of the display device 100A through the coloring layer 132G. In the subpixel 110B, light emitted by the light-emitting device 130B is extracted as blue light to the outside of the display device 100A through the coloring layer 132B.

The substrate 301 corresponds to the substrate 291 in FIG. 25A and FIG. 25B. A stacked-layer structure from the substrate 301 to the insulating layer 255*c* corresponds to the layer 101 including transistors in Embodiment 1.

The transistor 310 is a transistor including a channel formation region in the substrate 301. As the substrate 301, a semiconductor substrate such as a single crystal silicon substrate can be used, for example. The transistor 310 includes part of the substrate 301, a conductive layer 311, low-resistance regions 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance region 312 is a region where the substrate 301 is doped with an impurity, and functions as one of a source and a drain. The insulating layer 314 is provided to cover the side surface of the conductive layer 311.

An element isolation layer 315 is provided between two adjacent transistors 310 to be embedded in the substrate 301.

An insulating layer 261 is provided to cover the transistor 310, and the capacitor 240 is provided over the insulating layer 261.

The capacitor 240 includes a conductive layer 241, a conductive layer 245, and an insulating layer 243 positioned between these conductive layers. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of the source and the drain of the transistor 310 through a plug 271 embedded in the insulating layer 261. The insulating layer 243 is provided to cover the conductive layer 241. The conductive layer 245 is provided in a region overlapping with the conductive layer 241 with the insulating layer 243 therebetween.

Note that a conductive layer surrounding the outer surface of the display portion 281 (or the pixel portion 284) is preferably provided in at least one layer of the conductive layers included in the layer 101 including transistors. The conductive layer can be referred to as a guard ring. By providing the conductive layer, elements such as a transistor and a light-emitting device can be inhibited from being broken by high voltage application due to ESD (electronic discharge) or charging caused by a step using plasma.

The insulating layer 255*a* is provided to cover the capacitor 240, the insulating layer 255*b* is provided over the insulating layer 255*a*, and the insulating layer 255*c* is provided over the insulating layer 255*b*. The light-emitting device 130R, the light-emitting device 130G, and the light-emitting device 130B are provided over the insulating layer 255*c*. FIG. 26A illustrates an example in which the light-emitting device 130R, the light-emitting device 130G, and the light-emitting device 130B each have a structure similar to the stacked-layer structure illustrated in FIG. 1B. An insulator is provided in a region between adjacent light-emitting devices. In FIG. 26A and the like, the insulating layer 125 and the insulating layer 127 over the insulating layer 125 are provided in this region.

The mask layer 118*a* is positioned over the first layer 113 included in each of the light-emitting device 130R, the light-emitting device 130G, and the light-emitting device 130B.

The pixel electrode 111*a*, the pixel electrode 111*b*, and the pixel electrode 111*c* are each electrically connected to one of the source and the drain of the transistor 310 through a plug 256 embedded in the insulating layer 243, the insulating layer 255*a*, the insulating layer 255*b*, and the insulating layer 255*c*, the conductive layer 241 embedded in the insulating layer 254, and the plug 271 embedded in the insulating layer 261. The top surface of the insulating layer 255*c* and the top surface of the plug 256 are level or substantially level with each other. A variety of conductive materials can be used for the plugs. FIG. 26A and the like illustrate an example in which the pixel electrodes 111*a*, 111*b*, and 111*c* each have a two-layer structure of a reflective electrode and a transparent electrode over the reflective electrode.

The protective layer 131 is provided over the light-emitting device 130R, the light-emitting device 130G, and the light-emitting device 130B. The substrate 120 is bonded onto the protective layer 131 with the resin layer 122. Embodiment 1 can be referred to for the details of the light-emitting devices and the components thereover up to the substrate 120. The substrate 120 corresponds to the substrate 292 in FIG. 25A.

Figure 26B:
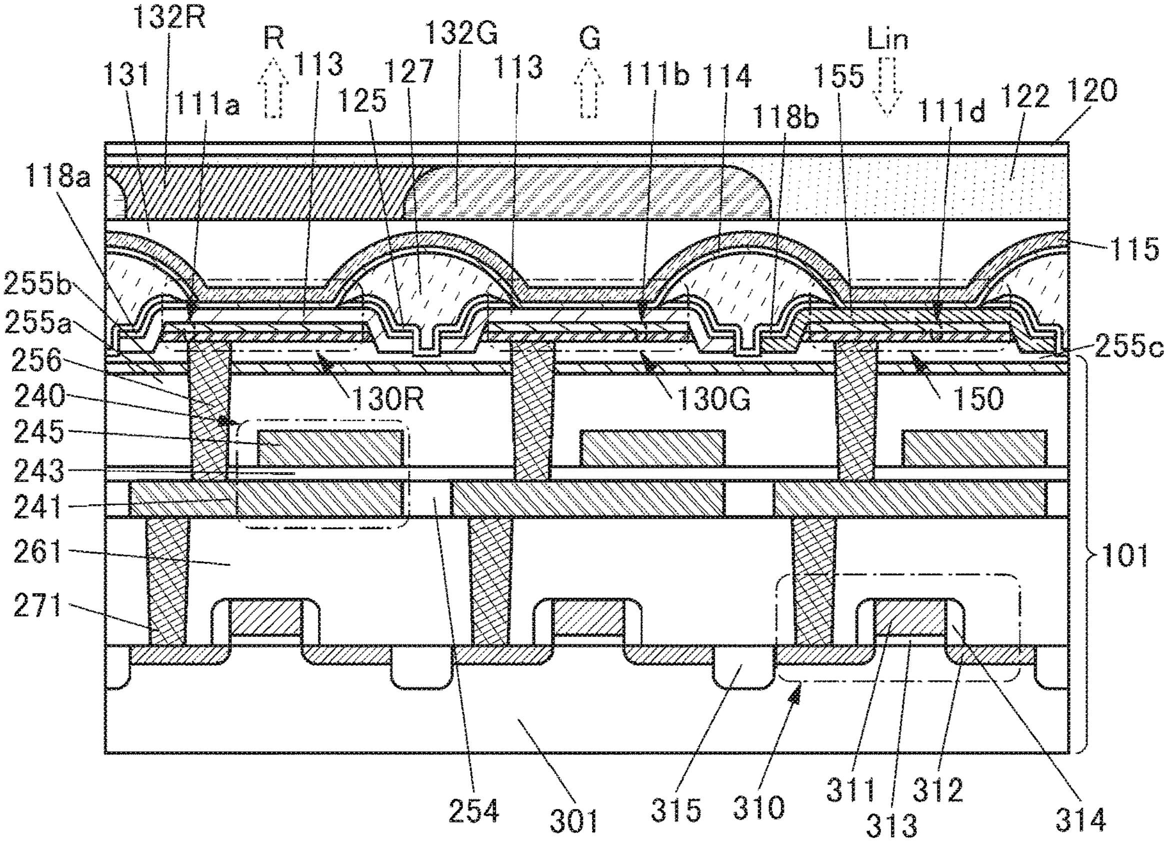

The display device illustrated in FIG. 26B is an example including the light-emitting devices 130R and 130G and the light-receiving device 150. The light-receiving device 150 includes the pixel electrode 111*d*, the second layer 155, the common layer 114, and the common electrode 115 which are stacked. Embodiment 1 and Embodiment 7 can be referred to for the details of the display device including the light-receiving device.

[Display Device 100B]

Figure 27:
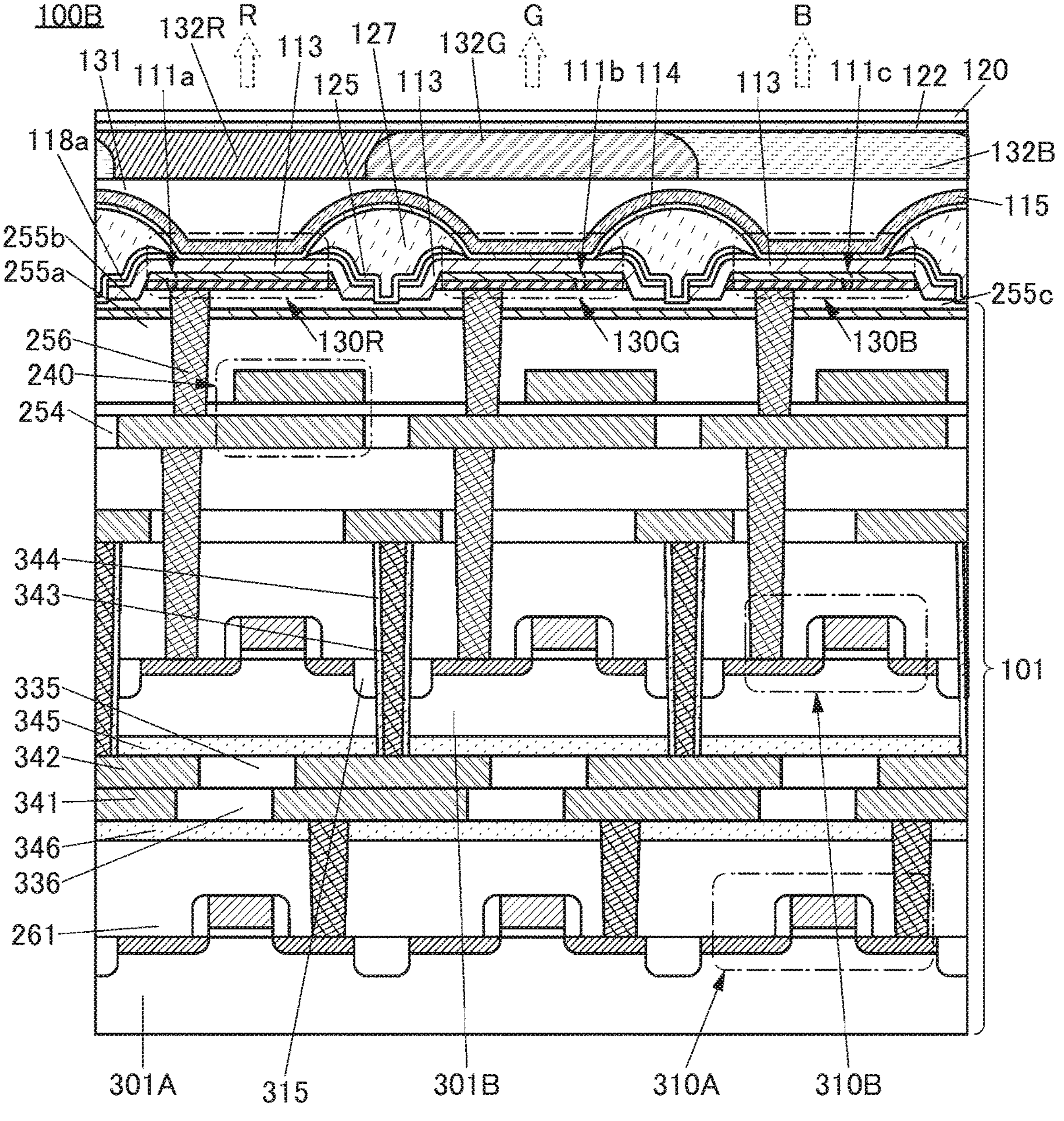
FIG. 27 is a cross-sectional view illustrating an example of a display device.

The display device 100B illustrated in FIG. 27 has a structure in which a transistor 310A and a transistor 310B whose channels are formed in a semiconductor substrate are stacked. Note that in the description of the display device below, portions similar to those of the above-described display device are not described in some cases.

In the display device 100B, a substrate 301B provided with the transistor 310B, the capacitor 240, and the light-emitting devices is bonded to a substrate 301A provided with the transistor 310A.

Here, an insulating layer 345 is preferably provided on the bottom surface of the substrate 301B. An insulating layer 346 is preferably provided over the insulating layer 261 provided over the substrate 301A. The insulating layers 345 and 346 are insulating layers functioning as protective layers and can inhibit diffusion of impurities into the substrate 301B and the substrate 301A. For the insulating layers 345 and 346, an inorganic insulating film that can be used as the protective layer 131 or an insulating layer 332 can be used.

The substrate 301B is provided with a plug 343 that penetrates the substrate 301B and the insulating layer 345. An insulating layer 344 is preferably provided to cover the side surface of the plug 343. The insulating layer 344 is an insulating layer functioning as a protective layer and can inhibit diffusion of impurities into the substrate 301B. As the insulating layer 344, an inorganic insulating film that can be used as the protective layer 131 can be used.

A conductive layer 342 is provided under the insulating layer 345 on the rear surface of the substrate 301B (the surface opposite to the substrate 120). The conductive layer 342 is preferably provided to be embedded in an insulating layer 335. The bottom surfaces of the conductive layer 342 and the insulating layer 335 are preferably planarized. Here, the conductive layer 342 is electrically connected to the plug 343.

Meanwhile, a conductive layer 341 is provided over the insulating layer 346 over the substrate 301A. The conductive layer 341 is preferably provided to be embedded in the insulating layer 336. The top surfaces of the conductive layer 341 and the insulating layer 336 are preferably planarized.

The conductive layer 341 and the conductive layer 342 are bonded to each other, whereby the substrate 301A and the substrate 301B are electrically connected to each other.

Here, improving the flatness of a plane formed by the conductive layer 342 and the insulating layer 335 and a plane formed by the conductive layer 341 and the insulating layer 336 allows the conductive layer 341 and the conductive layer 342 to be bonded to each other favorably.

The conductive layer 341 and the conductive layer 342 are preferably formed using the same conductive material. For example, it is possible to use a metal film containing an element selected from Al, Cr, Cu, Ta, Ti, Mo, and W, or a metal nitride film containing any of the above elements as a component (a titanium nitride film, a molybdenum nitride film, or a tungsten nitride film). Copper is particularly preferably used for the conductive layer 341 and the conductive layer 342. In that case, it is possible to employ Cu—Cu (copper-to-copper) direct bonding (a technique for achieving electrical continuity by connecting Cu (copper) pads).

[Display Device 100C]

Figure 28:
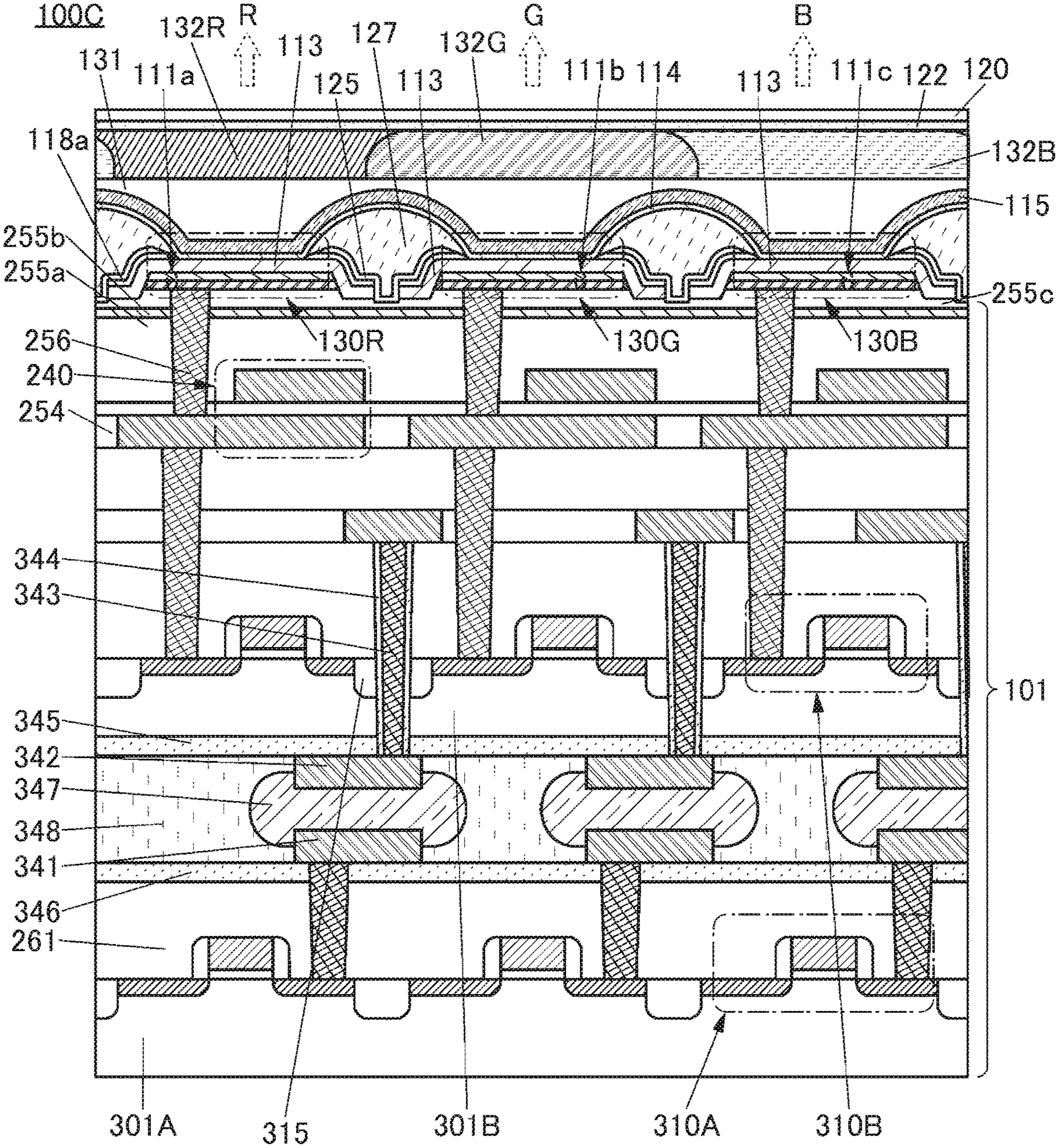
FIG. 28 is a cross-sectional view illustrating an example of a display device.

The display device 100C illustrated in FIG. 28 has a structure in which the conductive layer 341 and the conductive layer 342 are bonded to each other through a bump 347.

As illustrated in FIG. 28, providing the bump 347 between the conductive layer 341 and the conductive layer 342 enables the conductive layer 341 and the conductive layer 342 to be electrically connected to each other. The bump 347 can be formed using a conductive material containing gold (Au), nickel (Ni), indium (In), tin (Sn), or the like, for example. For another example, solder may be used for the bump 347. An adhesive layer 348 may be provided between the insulating layer 345 and the insulating layer 346. In the case where the bump 347 is provided, the insulating layer 335 and the insulating layer 336 may be omitted.

[Display Device 100D]

Figure 29:
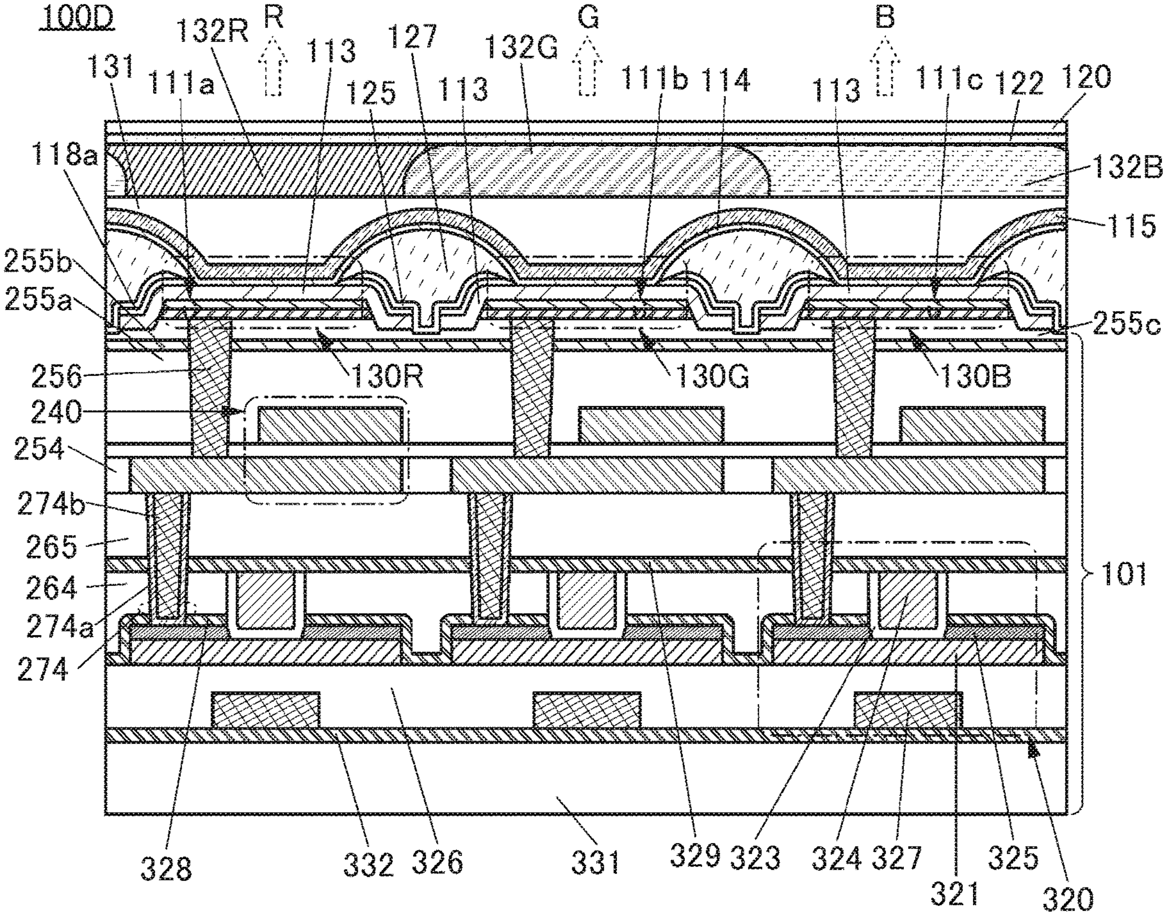
FIG. 29 is a cross-sectional view illustrating an example of a display device.

The display device 100D illustrated in FIG. 29 differs from the display device 100A mainly in a structure of a transistor.

A transistor 320 is a transistor (OS transistor) that includes a metal oxide (also referred to as an oxide semiconductor) in its semiconductor layer where a channel is formed. The transistor 320 includes a semiconductor layer 321, an insulating layer 323, a conductive layer 324, a pair of conductive layers 325, an insulating layer 326, and a conductive layer 327.

A substrate 331 corresponds to the substrate 291 in FIG. 25A and FIG. 25B. A stacked-layer structure from the substrate 331 to the insulating layer 255*c* corresponds to the layer 101 including transistors in Embodiment 1. As the substrate 331, an insulating substrate or a semiconductor substrate can be used.

The insulating layer 332 is provided over the substrate 331. The insulating layer 332 functions as a barrier layer that prevents diffusion of impurities such as water and hydrogen from the substrate 331 into the transistor 320 and release of oxygen from the semiconductor layer 321 to the insulating layer 332 side. As the insulating layer 332, for example, a film in which hydrogen or oxygen is less likely to diffuse than in a silicon oxide film, such as an aluminum oxide film, a hafnium oxide film, or a silicon nitride film, can be used.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used as at least part of the insulating layer 326 that is in contact with the semiconductor layer 321. The top surface of the insulating layer 326 is preferably planarized.

The semiconductor layer 321 is provided over the insulating layer 326. The semiconductor layer 321 preferably includes a metal oxide film having semiconductor characteristics (also referred to as an oxide semiconductor). The pair of conductive layers 325 is provided over and in contact with the semiconductor layer 321 and functions as a source electrode and a drain electrode.

An insulating layer 328 is provided to cover the top surfaces and the side surfaces of the pair of conductive layers 325, the side surface of the semiconductor layer 321, and the like, and an insulating layer 264 is provided over the insulating layer 328. The insulating layer 328 functions as a barrier layer that prevents diffusion of impurities such as water and hydrogen from the insulating layer 264 and the like into the semiconductor layer 321 and release of oxygen from the semiconductor layer 321. As the insulating layer 328, an insulating film similar to the insulating layer 332 can be used.

An opening reaching the semiconductor layer 321 is provided in the insulating layer 328 and the insulating layer 264. The insulating layer 323 that is in contact with the side surfaces of the insulating layer 264, the insulating layer 328, and the conductive layer 325 and the top surface of the semiconductor layer 321, and the conductive layer 324 are embedded in the opening. The conductive layer 324 functions as a second gate electrode, and the insulating layer 323 functions as a second gate insulating layer.

The top surface of the conductive layer 324, the top surface of the insulating layer 323, and the top surface of the insulating layer 264 are planarized so as to be level or substantially level with each other, and an insulating layer 329 and an insulating layer 265 are provided to cover these layers.

The insulating layer 264 and the insulating layer 265 function as interlayer insulating layers. The insulating layer 329 functions as a barrier layer that prevents diffusion of impurities such as water and hydrogen from the insulating layer 265 or the like into the transistor 320. For the insulating layer 329, an insulating film similar to the insulating layer 328 and the insulating layer 332 can be used.

A plug 274 electrically connected to one of the pair of conductive layers 325 is provided to be embedded in the insulating layer 265, the insulating layer 329, and the insulating layer 264. Here, the plug 274 preferably includes a conductive layer 274*a* covering the side surface of an opening formed in the insulating layer 265, the insulating layer 329, the insulating layer 264, and the insulating layer 328 and part of the top surface of the conductive layer 325, and a conductive layer 274*b* in contact with the top surface of the conductive layer 274*a*. For the conductive layer 274*a*, a conductive material that does not easily allow diffusion of hydrogen and oxygen is preferably used.

[Display Device 100E]

Figure 30:
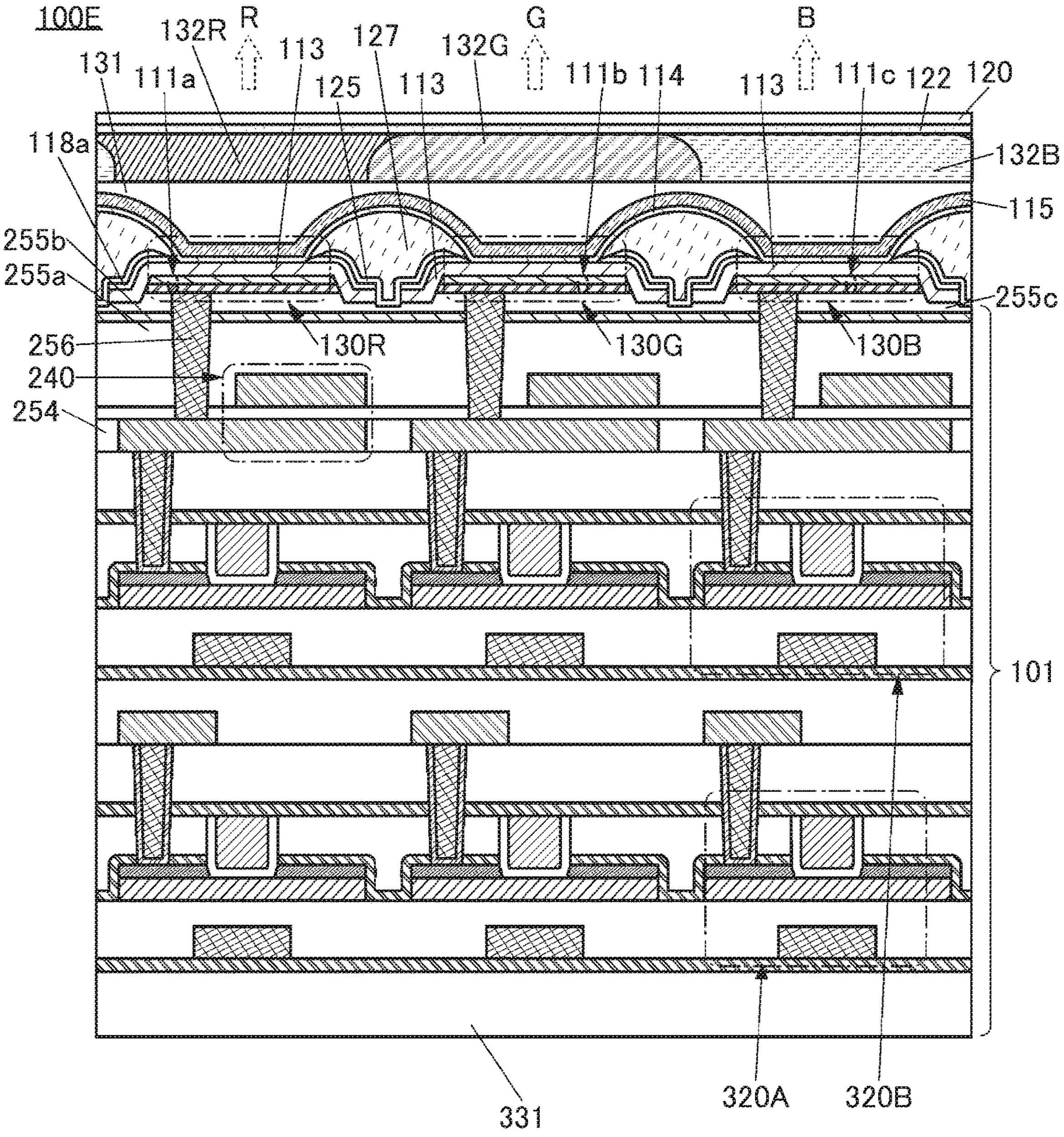
FIG. 30 is a cross-sectional view illustrating an example of a display device.

The display device 100E illustrated in FIG. 30 has a structure in which a transistor 320A and a transistor 320B each including an oxide semiconductor in a semiconductor where a channel is formed are stacked.

The display device 100D can be referred to for the transistor 320A, the transistor 320B, and the components around them.

Although the structure in which two transistors including an oxide semiconductor are stacked is described, the present invention is not limited thereto. For example, three or more transistors may be stacked.

[Display Device 100F]

Figure 31:
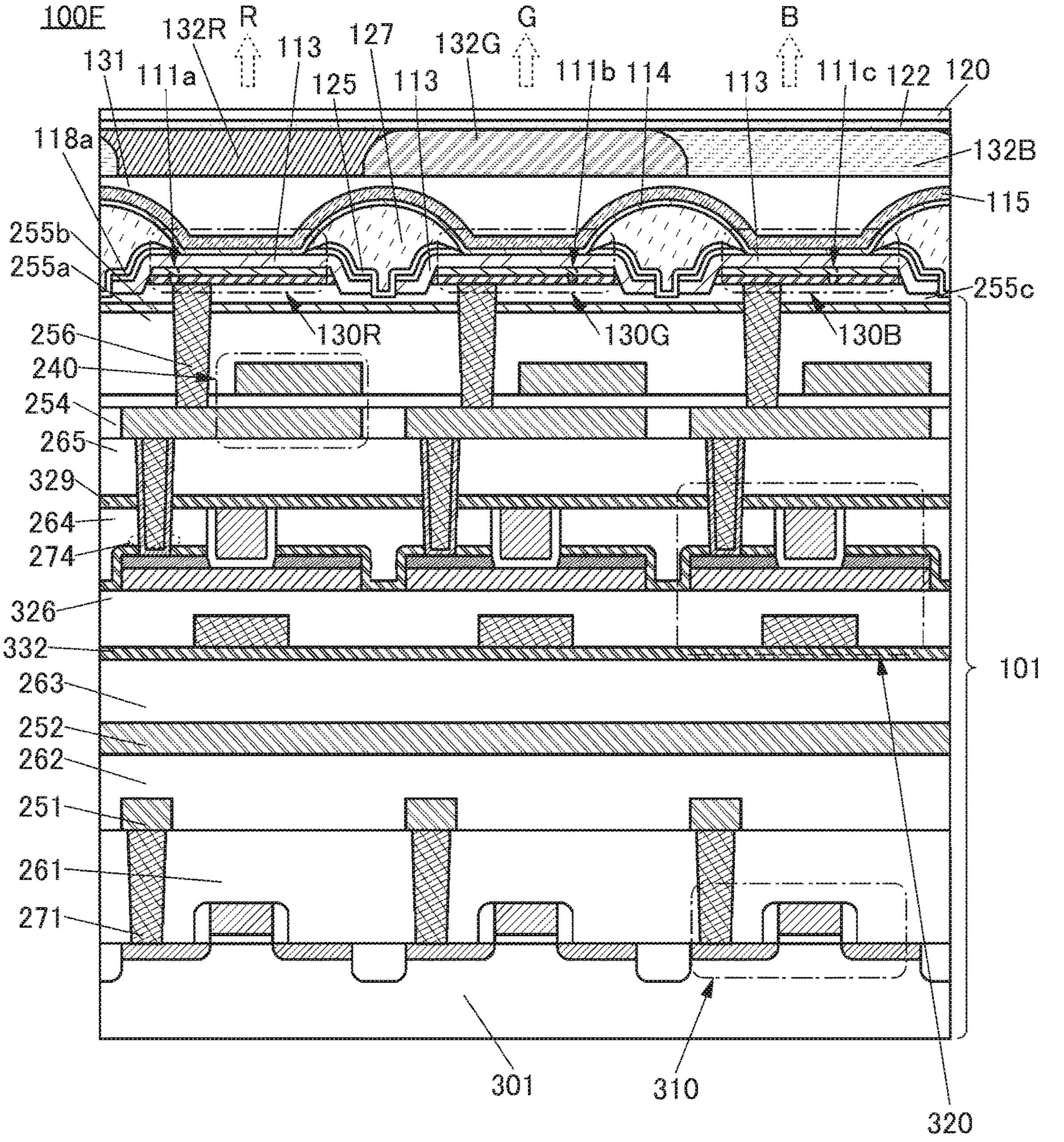
FIG. 31 is a cross-sectional view illustrating an example of a display device.

The display device 100F illustrated in FIG. 31 has a structure in which the transistor 310 having a channel formed in the substrate 301 and the transistor 320 including a metal oxide in a semiconductor layer where a channel is formed are stacked.

The insulating layer 261 is provided to cover the transistor 310, and a conductive layer 251 is provided over the insulating layer 261. An insulating layer 262 is provided to cover the conductive layer 251, and a conductive layer 252 is provided over the insulating layer 262. The conductive layer 251 and the conductive layer 252 each function as a wiring. An insulating layer 263 and the insulating layer 332 are provided to cover the conductive layer 252, and the transistor 320 is provided over the insulating layer 332. The insulating layer 265 is provided to cover the transistor 320, and the capacitor 240 is provided over the insulating layer 265. The capacitor 240 and the transistor 320 are electrically connected to each other through the plug 274.

The transistor 320 can be used as a transistor included in the pixel circuit. The transistor 310 can be used as a transistor included in the pixel circuit or a transistor included in a driver circuit for driving the pixel circuit (a gate line driver circuit or a source line driver circuit). The transistor 310 and the transistor 320 can also be used as transistors included in a variety of circuits such as an arithmetic circuit and a memory circuit.

With such a structure, not only the pixel circuit but also the driver circuit or the like can be formed directly under the light-emitting device; thus, the display device can be downsized as compared to the case where the driver circuit is provided around a display region.

[Display Device 100G]

Figure 32:
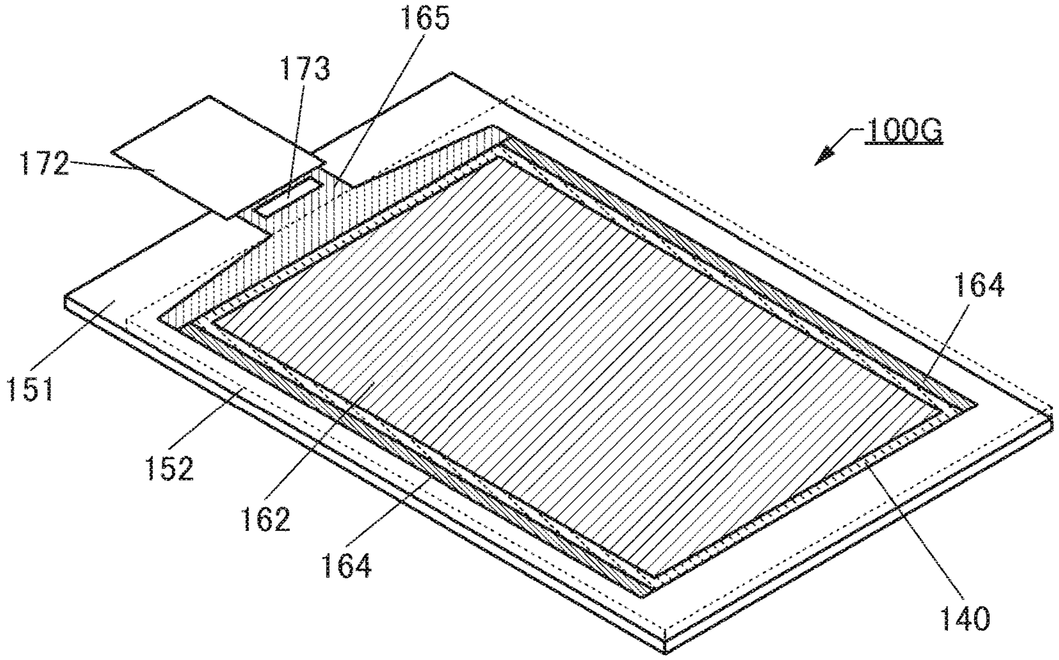
FIG. 32 is a perspective view illustrating an example of a display device.
Figure 33A:
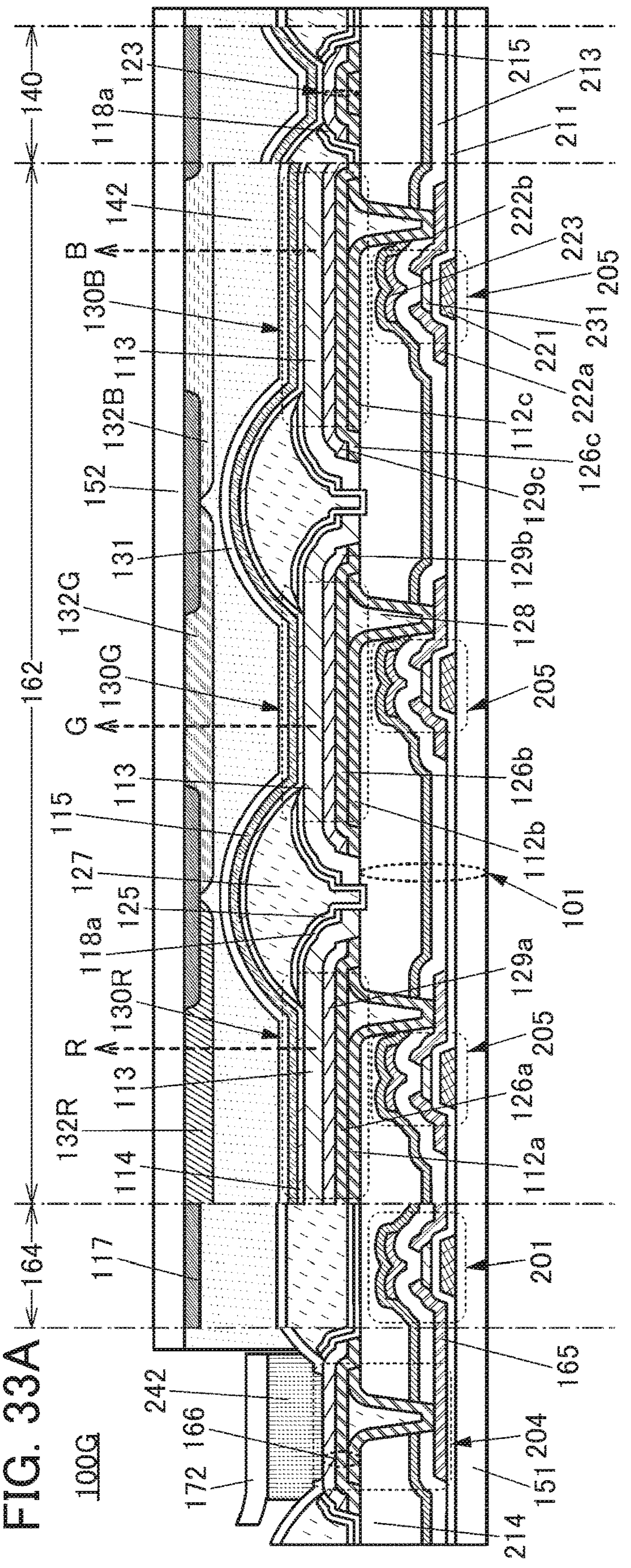
FIG. 33A is a cross-sectional view illustrating an example of a display device.

FIG. 32 is a perspective view of a display device 100G, and FIG. 33A is a cross-sectional view of the display device 100G.

In the display device 100G, a substrate 152 and a substrate 151 are bonded to each other. In FIG. 32, the substrate 152 is denoted by a dashed line.

The display device 100G includes a display portion 162, the connection portion 140, a circuit 164, a wiring 165, and the like. FIG. 32 illustrates an example in which an IC 173 and an FPC 172 are mounted on the display device 100G. Thus, the structure illustrated in FIG. 32 can also be regarded as a display module including the display device 100G, the IC (integrated circuit), and the FPC.

The connection portion 140 is provided outside the display portion 162. The connection portion 140 can be provided along one or more sides of the display portion 162. The number of the connection portions 140 can be one or more. FIG. 32 illustrates an example in which the connection portion 140 is provided to surround the four sides of the display portion. A common electrode of a light-emitting device is electrically connected to a conductive layer in the connection portion 140, so that a potential can be supplied to the common electrode.

As the circuit 164, a scan line driver circuit can be used, for example.

The wiring 165 has a function of supplying a signal and power to the display portion 162 and the circuit 164. The signal and power are input to the wiring 165 from the outside through the FPC 172 or input to the wiring 165 from the IC 173.

FIG. 32 illustrates an example in which the IC 173 is provided over the substrate 151 by a COG (Chip On Glass) method, a COF (Chip On Film) method, or the like. An IC including a scan line driver circuit, a signal line driver circuit, or the like can be used as the IC 173, for example.

Note that the display device 100G and the display module are not necessarily provided with an IC. The IC may be mounted on the FPC by a COF method or the like.

FIG. 33A illustrates an example of cross sections of part of a region including the FPC 172, part of the circuit 164, part of the display portion 162, part of the connection portion 140, and part of a region including an end portion of the display device 100G.

The display device 100G illustrated in FIG. 33A includes a transistor 201, a transistor 205, the light-emitting device 130R, the light-emitting device 130G, the light-emitting device 130B, the coloring layer 132R transmitting red light, the coloring layer 132G transmitting green light, the coloring layer 132B transmitting blue light, and the like between the substrate 151 and the substrate 152.

The light-emitting devices 130R, 130G, and 130B each have a structure similar to the stacked-layer structure illustrated in FIG. 1B except the structure of the pixel electrode. Embodiment 1 can be referred to for the details of the light-emitting devices.

The light-emitting device 130R includes a conductive layer 112*a*, a conductive layer 126*a* over the conductive layer 112*a*, and a conductive layer 129*a* over the conductive layer 126*a*. All of the conductive layers 112*a*, 126*a*, and 129*a* can be referred to as pixel electrodes, or one or two of them can be referred to as pixel electrodes.

The light-emitting device 130G includes a conductive layer 112*b*, a conductive layer 126*b* over the conductive layer 112*b*, and a conductive layer 129*b* over the conductive layer 126*b*.

The light-emitting device 130B includes a conductive layer 112*c*, a conductive layer 126*c* over the conductive layer 112*c*, and a conductive layer 129*c* over the conductive layer 126*c*.

The conductive layer 112*a* is connected to a conductive layer 222*b* included in the transistor 205 through an opening provided in the insulating layer 214. An end portion of the conductive layer 126*a* is positioned more outwardly than an end portion of the conductive layer 112*a*. The end portion of the conductive layer 126*a* and an end portion of the conductive layer 129*a* are aligned or substantially aligned with each other. For example, a conductive layer functioning as a reflective electrode can be used as the conductive layer 112*a* and the conductive layer 126*a*, and a conductive layer functioning as a transparent electrode can be used as the conductive layer 129*a*.

Detailed description of the conductive layers 112*b*, 126*b*, and 129*b* of the light-emitting device 130G and the conductive layers 112*c*, 126*c*, and 129*c* of the light-emitting device 130B is omitted because these conductive layers are similar to the conductive layers 112*a*, 126*a*, and 129*a* of the light-emitting device 130R.

The conductive layers 112*a*, 112*b*, and 112*c* are formed to cover the openings provided in the insulating layer 214. A layer 128 is embedded in each of the depressed portions of the conductive layers 112*a*, 112*b*, and 112*c*.

The layer 128 has a planarization function for the depressed portions of the conductive layers 112*a*, 112*b*, and 112*c*. The conductive layers 126*a*, 126*b*, and 126*c* electrically connected to the conductive layers 112*a*, 112*b*, and 112*c*, respectively, are provided over the conductive layers 112*a*, 112*b*, and 112*c* and the layer 128. Thus, regions overlapping with the depressed portions of the conductive layers 112*a*, 112*b*, and 112*c* can also be used as the light-emitting regions, increasing the aperture ratio of the pixels.

The layer 128 may be an insulating layer or a conductive layer. Any of a variety of inorganic insulating materials, organic insulating materials, and conductive materials can be used for the layer 128 as appropriate. Specifically, the layer 128 is preferably formed using an insulating material and is particularly preferably formed using an organic insulating material. For the layer 128, an organic insulating material that can be used for the insulating layer 127 can be used, for example.

The top surfaces and the side surfaces of the conductive layers 126*a*, 126*b*, 126*c*, 129*a*, 129*b*, and 129*c* are covered with the first layer 113. Accordingly, regions provided with the conductive layers 126*a*, 126*b*, and 126*c* can be entirely used as the light-emitting regions of the light-emitting devices 130R, 130G, and 130B, increasing the aperture ratio of the pixels.

The side surface and part of the top surface of the first layer 113 are covered with the insulating layers 125 and 127. The mask layer 118*a* is positioned between the first layer 113 and the insulating layer 125. The common layer 114 is provided over the first layer 113 and the insulating layers 125 and 127, and the common electrode 115 is provided over the common layer 114. The common layer 114 and the common electrode 115 are each a continuous film provided to be shared by a plurality of light-emitting devices.

The protective layer 131 is provided over the light-emitting devices 130R, 130G, and 130B. The protective layer 131 and the substrate 152 are bonded to each other with an adhesive layer 142. The substrate 152 is provided with a light-blocking layer 117 and the coloring layers 132R, 132G, and 132B. A solid sealing structure, a hollow sealing structure, or the like can be employed to seal the light-emitting devices. In FIG. 33A, a solid sealing structure is employed in which a space between the substrate 152 and the substrate 151 is filled with the adhesive layer 142. Alternatively, a hollow sealing structure may be employed, in which the space is filled with an inert gas (e.g., nitrogen or argon). Here, the adhesive layer 142 may be provided not to overlap with the light-emitting device. The space may be filled with a resin different from that of the frame-like adhesive layer 142.

The conductive layer 123 is provided over the insulating layer 214 in the connection portion 140. An example is described in which the conductive layer 123 has a stacked-layer structure of a conductive film obtained by processing the same conductive film as the conductive layers 112*a*, 112*b*, and 112*c*; a conductive film obtained by processing the same conductive film as the conductive layers 126*a*, 126*b*, and 126*c*; and a conductive film obtained by processing the same conductive film as the conductive layers 129*a*, 129*b*, and 129*c*. The end portion of the conductive layer 123 is covered with the mask layer 118*a*, the insulating layer 125, and the insulating layer 127. The common layer 114 is provided over the conductive layer 123, and the common electrode 115 is provided over the common layer 114. The conductive layer 123 and the common electrode 115 are electrically connected to each other through the common layer 114. Note that the common layer 114 is not necessarily formed in the connection portion 140. In this case, the conductive layer 123 and the common electrode 115 are in direct contact with each other to be electrically connected to each other.

The display device 100G has a top-emission structure. Light emitted by the light-emitting device is emitted toward the substrate 152 side. For the substrate 152, a material having a high visible-light-transmitting property is preferably used. The pixel electrode contains a material reflecting visible light, and the counter electrode (the common electrode 115) contains a material transmitting visible light.

A stacked-layer structure including the substrate 151 and the components thereover up to the insulating layer 214 corresponds to the layer 101 including transistors in Embodiment 1.

The transistor 201 and the transistor 205 are formed over the substrate 151. These transistors can be fabricated using the same material in the same step.

An insulating layer 211, an insulating layer 213, an insulating layer 215, and the insulating layer 214 are provided in this order over the substrate 151. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or two or more.

A material that does not easily allow diffusion of impurities such as water and hydrogen is preferably used for at least one of the insulating layers that cover the transistors. This allows the insulating layer to function as a barrier layer. Such a structure can effectively inhibit diffusion of impurities into the transistors from the outside and improve the reliability of the display device.

An inorganic insulating film is preferably used as each of the insulating layer 211, the insulating layer 213, and the insulating layer 215. As the inorganic insulating film, a silicon nitride film, a silicon oxynitride film, a silicon oxide film, a silicon nitride oxide film, an aluminum oxide film, an aluminum nitride film, or the like can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may also be used. A stack including two or more of the above insulating films may also be used.

An organic insulating layer is suitable as the insulating layer 214 functioning as a planarization layer. Examples of materials that can be used for the organic insulating layer include an acrylic resin, a polyimide resin, an epoxy resin, a polyamide resin, a polyimide-amide resin, a siloxane resin, a benzocyclobutene-based resin, a phenol resin, and precursors of these resins. The insulating layer 214 may have a stacked-layer structure of an organic insulating layer and an inorganic insulating layer. The uppermost layer of the insulating layer 214 preferably has a function of an etching protective layer. Accordingly, a depressed portion can be prevented from being formed in the insulating layer 214 in processing the conductive layer 112*a*, the conductive layer 126*a*, the conductive layer 129*a*, or the like. Alternatively, a depressed portion may be provided in the insulating layer 214 in processing the conductive layer 112*a*, the conductive layer 126*a*, the conductive layer 129*a*, or the like.

Each of the transistor 201 and the transistor 205 includes a conductive layer 221 functioning as a gate, the insulating layer 211 functioning as a gate insulating layer, a conductive layer 222*a* and the conductive layer 222*b* functioning as a source and a drain, a semiconductor layer 231, the insulating layer 213 functioning as a gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display device of this embodiment. For example, a planar transistor, a staggered transistor, an inverted staggered transistor, or the like can be used. A top-gate or bottom-gate transistor structure may be employed. Alternatively, gates may be provided above and below the semiconductor layer where a channel is formed.

The structure in which the semiconductor layer where a channel is formed is provided between two gates is used for the transistor 201 and the transistor 205. The two gates may be connected to each other and supplied with the same signal to drive the transistor. Alternatively, a potential for controlling the threshold voltage may be supplied to one of the two gates and a potential for driving may be supplied to the other to control the threshold voltage of the transistor.

There is no particular limitation on the crystallinity of a semiconductor material used for the transistors, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. A single crystal semiconductor or a semiconductor having crystallinity is preferably used, in which case degradation of the transistor characteristics can be inhibited.

The semiconductor layer of the transistor preferably includes a metal oxide (also referred to as an oxide semiconductor). That is, a transistor including a metal oxide in its channel formation region (hereinafter, also referred to as an OS transistor) is preferably used for the display device of this embodiment.

As the oxide semiconductor having crystallinity, a CAAC (c-axis aligned crystalline)-OS, an nc (nanocrystalline)-OS, and the like are given.

Alternatively, a transistor using silicon in a channel formation region (a Si transistor) may be used. Examples of silicon include single crystal silicon, polycrystalline silicon, and amorphous silicon. In particular, a transistor containing low-temperature polysilicon (LTPS) in its semiconductor layer (hereinafter also referred to as an LTPS transistor) can be used. The LTPS transistor has high field-effect mobility and favorable frequency characteristics.

With the use of a Si transistor such as an LTPS transistor, a circuit required to be driven at a high frequency (e.g., a source driver circuit) can be formed on the same substrate as the display portion. This allows simplification of an external circuit mounted on the display device and a reduction in component cost and mounting cost.

An OS transistor has much higher field-effect mobility than a transistor using amorphous silicon. In addition, an OS transistor has an extremely low leakage current between a source and a drain in an off state (also referred to as off-state current), and charge accumulated in a capacitor that is connected in series to the transistor can be retained for a long period. Furthermore, the power consumption of the display device can be reduced with the OS transistor.

To increase the emission luminance of the light-emitting device included in a pixel circuit, it is necessary to increase the amount of current flowing through the light-emitting device. For that purpose, the source-drain voltage of the driving transistor included in the pixel circuit needs to be increased. Since an OS transistor has a higher withstand voltage between the source and the drain than a Si transistor, a high voltage can be applied between the source and the drain of the OS transistor. Thus, with use of an OS transistor as a driving transistor included in the pixel circuit, the amount of current flowing through the light-emitting device can be increased, resulting in an increase in emission luminance of the light-emitting device.

When a transistor operates in a saturation region, a change in source-drain current relative to a change in gate-source voltage can be smaller in an OS transistor than in a Si transistor. Accordingly, when an OS transistor is used as the driving transistor included in the pixel circuit, current flowing between the source and the drain can be set minutely by a change in gate-source voltage; hence, the amount of current flowing through the light-emitting device can be controlled. Accordingly, the number of gray levels in the pixel circuit can be increased.

Regarding saturation characteristics of current flowing when a transistor operates in a saturation region, even in the case where the source-drain voltage of an OS transistor increases gradually, more stable current (saturation current) can be made flow through an OS transistor than through a Si transistor. Thus, with use of an OS transistor as a driving transistor, current can be made flow stably through the light-emitting device, for example, even when a variation in current-voltage characteristics of the EL device occurs. In other words, when the OS transistor operates in the saturation region, the source-drain current hardly changes with an increase in the source-drain voltage; hence, the emission luminance of the light-emitting device can be stable.

As described above, with use of an OS transistor as the driving transistor included in the pixel circuit, it is possible to achieve "inhibition of black floating", "increase in emission luminance", "increase in the number of gray levels", "inhibition of variation in light-emitting devices", and the like.

A metal oxide used for the semiconductor layer preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable that an oxide containing indium (In), gallium (Ga), and zinc (Zn) (also referred to as IGZO) be used for the semiconductor layer. Alternatively, it is preferable to use an oxide containing indium, tin, and zinc. Further alternatively, it is preferable to use an oxide containing indium, gallium, tin, and zinc. Alternatively, it is preferable to use an oxide containing indium (In), aluminum (Al), and zinc (Zn) (also referred to as IAZO). Further alternatively, it is preferable to use an oxide containing indium (In), aluminum (Al), gallium (Ga), and zinc (Zn) (also referred to as IAGZO).

In the case where the semiconductor layer is an In-M-Zn oxide, the atomic proportion of In is preferably greater than or equal to the atomic proportion of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=1:3:2 or a composition in the neighborhood thereof, In:M:Zn=1:3:4 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of +30% of an intended atomic ratio.

For example, in the case where the atomic ratio is described as In:Ga:Zn=4:2:3 or a composition in the neighborhood thereof, the case is included where Ga is greater than or equal to 1 and less than or equal to 3 and Zn is greater than or equal to 2 and less than or equal to 4 with In being 4. In addition, in the case where the atomic ratio is described as In:Ga:Zn=5:1:6 or a composition in the neighborhood thereof, the case is included where Ga is greater than 0.1 and less than or equal to 2 and Zn is greater than or equal to 5 and less than or equal to 7 with In being 5. Furthermore, in the case where the atomic ratio is described as In:Ga:Zn=1:1:1 or a composition in the neighborhood thereof, the case is included where Ga is greater than 0.1 and less than or equal to 2 and Zn is greater than 0.1 and less than or equal to 2 with In being 1.

The transistors included in the circuit 164 and the transistors included in the display portion 162 may have the same structure or different structures. A plurality of transistors included in the circuit 164 may have the same structure or two or more kinds of structures. Similarly, a plurality of transistors included in the display portion 162 may have the same structure or two or more kinds of structures.

All of the transistors included in the display portion 162 may be OS transistors or all of the transistors included in the display portion 162 may be Si transistors; alternatively, some of the transistors included in the display portion 162 may be OS transistors and the others may be Si transistors.

For example, when both an LTPS transistor and an OS transistor are used in the display portion 162, the display device can have low power consumption and high drive capability. A structure in which an LTPS transistor and an OS transistor are used in combination is referred to as LTPO in some cases. As a more suitable example, a structure in which the OS transistor is used as a transistor or the like functioning as a switch for controlling conduction or non-conduction between wirings, and the LTPS transistor is used as a transistor or the like for controlling current, can be given.

For example, one transistor included in the display portion 162 functions as a transistor for controlling current flowing through the light-emitting device and can also be referred to as a driving transistor. One of a source and a drain of the driving transistor is electrically connected to the pixel electrode of the light-emitting device. An LTPS transistor is preferably used as the driving transistor. Thus, current flowing through the light-emitting device in the pixel circuit can be increased.

In contrast, another transistor included in the display portion 162 functions as a switch for controlling selection or non-selection of a pixel and can also be referred to as a selection transistor. A gate of the selection transistor is electrically connected to a gate line, and one of a source and a drain thereof is electrically connected to a source line (signal line). An OS transistor is preferably used as the selection transistor. Accordingly, the gray level of the pixel can be maintained even with an extremely low frame frequency (e.g., lower than or equal to 1 fps); thus, power consumption can be reduced by stopping the driver in displaying a still image.

As described above, the display device of one embodiment of the present invention can have all of a high aperture ratio, high resolution, high display quality, and low power consumption.

Note that the display device of one embodiment of the present invention has a structure including the OS transistor and the light-emitting device having an MML (metal maskless) structure. This structure can significantly reduce the leakage current that might flow through a transistor, and the leakage current that might flow between adjacent light-emitting devices (also referred to as a lateral leakage current, a side leakage current, or the like). With the structure, a viewer can observe any one or more of the image crispness, the image sharpness, a high chroma, and a high contrast ratio in an image displayed on the display device. Note that when the leakage current that might flow through a transistor and the lateral leakage current between light-emitting devices are extremely low, light leakage or the like (what is called black blurring) that might occur in black display can be reduced as much as possible.

Figure 33B:
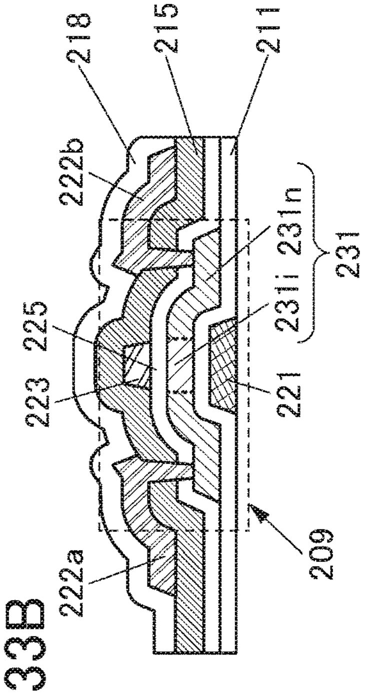
FIG. 33B and FIG. 33C are cross-sectional views illustrating examples of transistors.
Figure 33C:
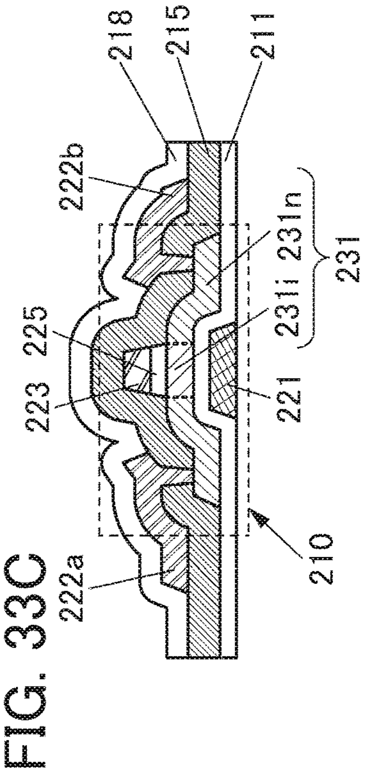

FIG. 33B and FIG. 33C illustrate other structure examples of transistors.

A transistor 209 and a transistor 210 each include the conductive layer 221 functioning as a gate, the insulating layer 211 functioning as a gate insulating layer, the semiconductor layer 231 including a channel formation region 231*i* and a pair of low-resistance regions 231*n*, the conductive layer 222*a* connected to one of the pair of low-resistance regions 231*n*, the conductive layer 222*b* connected to the other of the pair of low-resistance regions 231*n*, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231*i*. The insulating layer 225 is positioned between at least the conductive layer 223 and the channel formation region 231*i*. Furthermore, an insulating layer 218 covering the transistor may be provided.

FIG. 33B illustrates an example of the transistor 209 in which the insulating layer 225 covers the top and side surfaces of the semiconductor layer 231. The conductive layer 222*a* and the conductive layer 222*b* are connected to the low-resistance regions 231*n* through openings provided in the insulating layer 225 and the insulating layer 215. One of the conductive layer 222*a* and the conductive layer 222*b* functions as a source, and the other functions as a drain.

Meanwhile, in the transistor 210 illustrated in FIG. 33C, the insulating layer 225 overlaps with the channel formation region 231*i* of the semiconductor layer 231 and does not overlap with the low-resistance regions 231*n* . . . . The structure illustrated in FIG. 33C can be formed by processing the insulating layer 225 using the conductive layer 223 as a mask, for example. In FIG. 33C, the insulating layer 215 is provided to cover the insulating layer 225 and the conductive layer 223, and the conductive layer 222*a* and the conductive layer 222*b* are connected to the low-resistance regions 231*n* through the openings in the insulating layer 215.

A connection portion 204 is provided in a region of the substrate 151 not overlapping with the substrate 152. In the connection portion 204, the wiring 165 is electrically connected to the FPC 172 through a conductive layer 166 and a connection layer 242. An example is illustrated in which the conductive layer 166 has a stacked-layer structure of a conductive film obtained by processing the same conductive film as the conductive layers 112*a*, 112*b*, and 112*c*, a conductive film obtained by processing the same conductive film as the conductive layers 126a, 126b, and 126c, and a conductive film obtained by processing the same conductive film as the conductive layers 129a, 129b, and 129c. On the top surface of the connection portion 204, the conductive layer 166 is exposed. Thus, the connection portion 204 and the FPC 172 can be electrically connected to each other through the connection layer 242.

The light-blocking layer 117 is preferably provided on the surface of the substrate 152 on the substrate 151 side. The light-blocking layer 117 can be provided between adjacent light-emitting devices, in the connection portion 140, and in the circuit 164, for example. A variety of optical members can be arranged on the outer surface of the substrate 152.

The material that can be used for the substrate 120 can be used for each of the substrate 151 and the substrate 152.

The material that can be used for the resin layer 122 can be used for the adhesive layer 142.

As the connection layer 242, an anisotropic conductive film (ACF), an anisotropic conductive paste (ACP), or the like can be used.

[Display Device 100H]

Figures 34A, 34B, 34C, 34D:
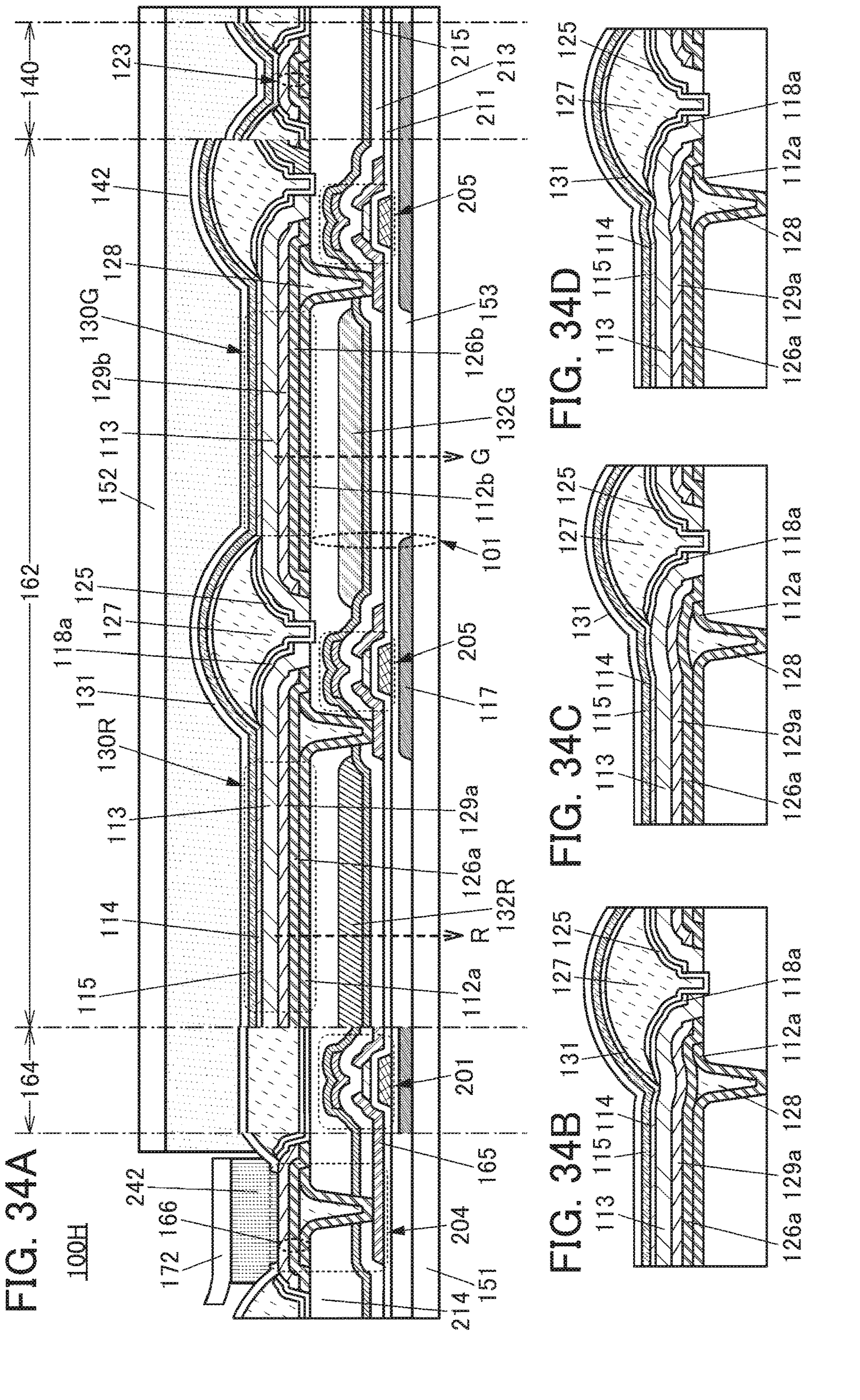
FIG. 34A to FIG. 34D are cross-sectional views illustrating examples of a display device.

A display device 100H illustrated in FIG. 34A is different from the display device 100G mainly in being a bottom-emission display device.

Light emitted by the light-emitting device is emitted toward the substrate 151 side. For the substrate 151, a material having a high visible-light-transmitting property is preferably used. In contrast, there is no limitation on the light-transmitting property of a material used for the substrate 152.

The light-blocking layer 117 is preferably formed between the substrate 151 and the transistor 201 and between the substrate 151 and the transistor 205. FIG. 34A illustrates an example in which the light-blocking layer 117 is provided over the substrate 151, an insulating layer 153 is provided over the light-blocking layer 117, and the transistors 201 and 205 and the like are provided over the insulating layer 153.

The light-emitting device 130R includes the conductive layer 112a, the conductive layer 126a over the conductive layer 112a, and the conductive layer 129a over the conductive layer 126a.

The light-emitting device 130G includes the conductive layer 112b, the conductive layer 126b over the conductive layer 112b, and the conductive layer 129b over the conductive layer 126b.

A material having a high visible-light-transmitting property is used for each of the conductive layers 112a, 112b, 126a, 126b, 129a, and 129b. A material reflecting visible light is preferably used for the common electrode 115.

Although FIG. 33A, FIG. 34A, and the like illustrate an example in which the top surface of the layer 128 includes a flat portion, the shape of the layer 128 is not particularly limited. FIG. 34B to FIG. 34D illustrate variation examples of the layer 128.

As illustrated in FIG. 34B and FIG. 34D, the top surface of the layer 128 can have a shape such that its center and the vicinity thereof are recessed, i.e., a shape including a concave surface, in a cross-sectional view.

As illustrated in FIG. 34C, the top surface of the layer 128 can have a shape such that its center and the vicinity thereof bulge, i.e., a shape including a convex surface, in a cross-sectional view.

The top surface of the layer 128 may include one or both of a convex surface and a concave surface. The number of convex surfaces and the number of concave surfaces included in the top surface of the layer 128 are not limited and can each be one or more.

The level of the top surface of the layer 128 and the level of the top surface of the conductive layer 112a may be equal to or substantially equal to each other, or may be different from each other. For example, the level of the top surface of the layer 128 may be either lower or higher than the level of the top surface of the conductive layer 112a.

FIG. 34B can be regarded as illustrating an example in which the layer 128 fits in the depressed portion of the conductive layer 112a. By contrast, as illustrated in FIG. 34D, the layer 128 may exist also outside the depressed portion of the conductive layer 112a, that is, the layer 128 may be formed to have a top surface wider than the depressed portion.

[Display Device 100J]

Figure 35:
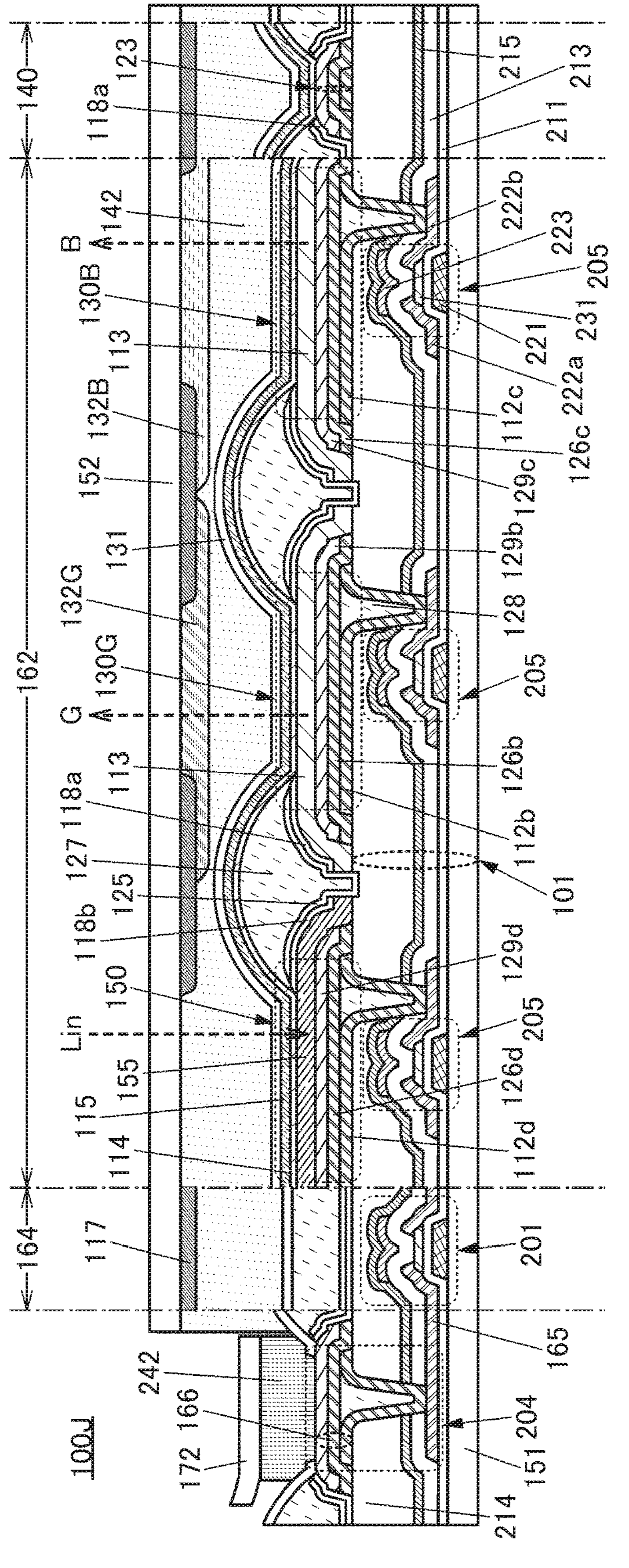
FIG. 35 is a cross-sectional view illustrating an example of a display device.

A display device 100J illustrated in FIG. 35 is different from the display device 100G mainly in including the light-receiving device 150.

The light-receiving device 150 includes a conductive layer 112d, a conductive layer 126d over the conductive layer 112d, and a conductive layer 129d over the conductive layer 126d.

The conductive layer 112d is connected to the conductive layer 222b included in the transistor 205 through an opening provided in the insulating layer 214.

The top surface and the side surface of the conductive layer 126d and the top surface and the side surface of the conductive layer 129d are covered with the second layer 155. The second layer 155 includes at least an active layer.

The side surface and part of the top surface of the second layer 155 are covered with the insulating layers 125 and 127. The mask layer 118b is positioned between the second layer 155 and the insulating layer 125. The common layer 114 is provided over the second layer 155 and the insulating layers 125 and 127, and the common electrode 115 is provided over the common layer 114. The common layer 114 is a continuous film provided to be shared by the light-receiving device and the light-emitting devices.

The display device 100J can employ any of the pixel layouts that are described in Embodiment 4 with reference to FIG. 24A to FIG. 24K, for example. Embodiment 1 and Embodiment 7 can be referred to for the details of the display device including the light-receiving device.

This embodiment can be combined with the other embodiments as appropriate.

Embodiment 6

In this embodiment, a light-emitting device that can be used for a display device of one embodiment of the present invention will be described.

In this specification and the like, a structure in which light-emitting devices of different emission colors (e.g., blue (B), green (G), and red (R)) are separately formed is referred to as an SBS (Side By Side) structure in some cases.

The emission color of the light-emitting device can be red, green, blue, cyan, magenta, yellow, or white, for example. When the light-emitting device has a microcavity structure, the color purity can be increased.

[Light-Emitting Device]

Figure 36A:
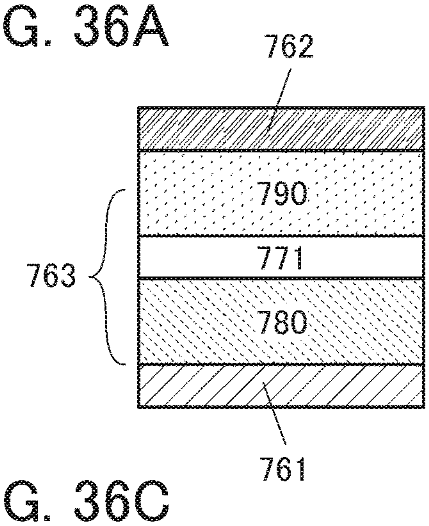
FIG. 36A to FIG. 36F are diagrams illustrating structure examples of a light-emitting device.

As illustrated in FIG. 36A, the light-emitting device includes an EL layer 763 between a pair of electrodes (a lower electrode 761 and an upper electrode 762). The EL layer 763 can be formed of a plurality of layers such as a layer 780, a light-emitting layer 771, and a layer 790. The light-emitting layer 771 contains at least a light-emitting substance (also referred to as a light-emitting material).

In the case where the lower electrode 761 is an anode and the upper electrode 762 is a cathode, the layer 780 includes one or more of a layer containing a substance having a high hole-injection property (a hole-injection layer), a layer containing a substance having a high hole-transport property (a hole-transport layer), and a layer containing a substance having a high electron-blocking property (an electron-blocking layer). Furthermore, the layer 790 includes one or more of a layer containing a substance having a high electron-injection property (an electron-injection layer), a layer containing a substance having a high electron-transport property (an electron-transport layer), and a layer containing a substance having a high hole-blocking property (a hole-blocking layer). In the case where the lower electrode 761 is a cathode and the upper electrode 762 is an anode, the structures of the layer 780 and the layer 790 are replaced with each other.

The structure including the layer 780, the light-emitting layer 771, and the layer 790, which is provided between the pair of electrodes, can function as a single light-emitting unit, and the structure in FIG. 36A is referred to as a single structure in this specification.

Figure 36B:
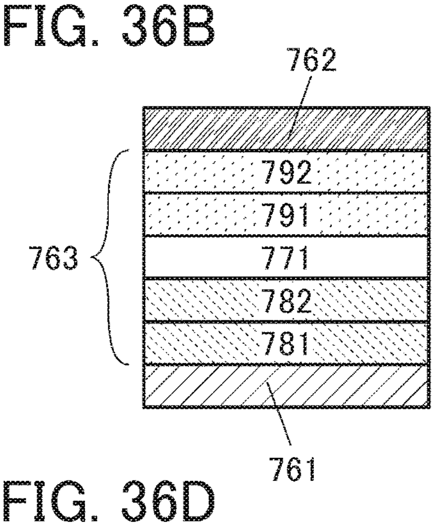

FIG. 36B is a variation example of the EL layer 763 included in the light-emitting device illustrated in FIG. 36A. Specifically, the light-emitting device illustrated in FIG. 36B includes a layer 781 over the lower electrode 761, a layer 782 over the layer 781, the light-emitting layer 771 over the layer 782, a layer 791 over the light-emitting layer 771, a layer 792 over the layer 791, and the upper electrode 762 over the layer 792.

In the case where the lower electrode 761 is an anode and the upper electrode 762 is a cathode, the layer 781 can be a hole-injection layer, the layer 782 can be a hole-transport layer, the layer 791 can be an electron-transport layer, and the layer 792 can be an electron-injection layer, for example. In the case where the lower electrode 761 is a cathode and the upper electrode 762 is an anode, the layer 781 can be an electron-injection layer, the layer 782 can be an electron-transport layer, the layer 791 can be a hole-transport layer, and the layer 792 can be a hole-injection layer. With such a layer structure, carriers can be efficiently injected into the light-emitting layer 771, and the efficiency of the recombination of carriers in the light-emitting layer 771 can be increased.

Figure 36C:
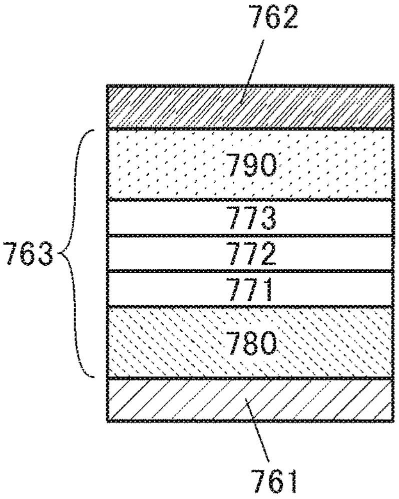
Figure 36D:
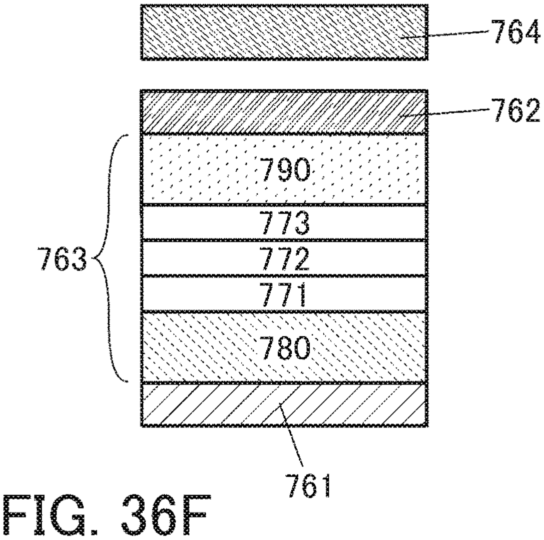

Note that structures in which a plurality of light-emitting layers (the light-emitting layer 771, a light-emitting layer 772, and a light-emitting layer 773) are provided between the layer 780 and the layer 790 as illustrated in FIG. 36C and FIG. 36D are other variations of the single structure.

Figure 36E:
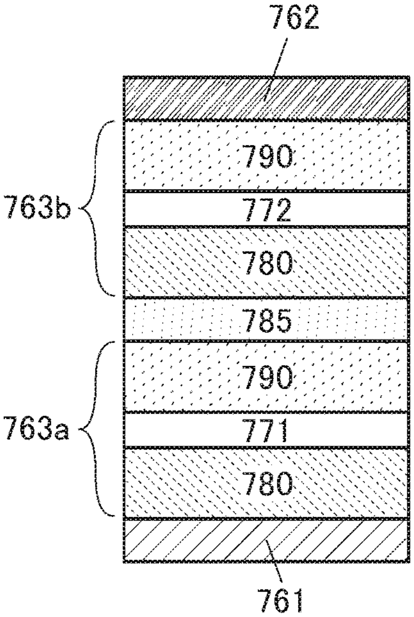
Figure 36F:
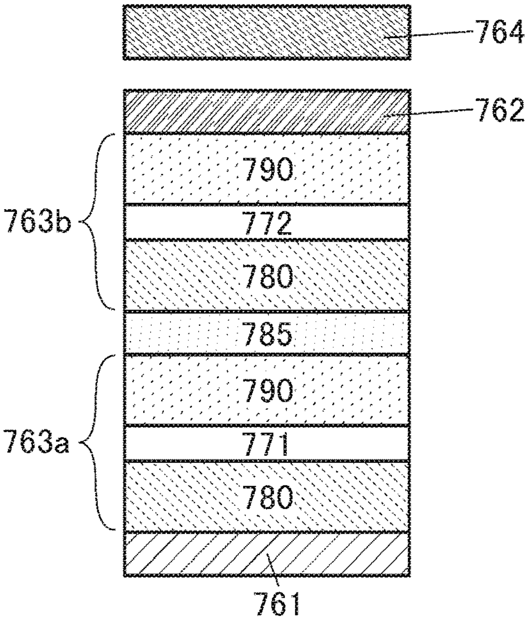

Structures in which a plurality of light-emitting units (an EL layer 763*a* and an EL layer 763*b*) are connected in series with a charge-generation layer 785 therebetween as illustrated in FIG. 36E and FIG. 36F are referred to as a tandem structure in this specification. Note that the tandem structure may be referred to as a stack structure. The tandem structure enables a light-emitting device capable of high-luminance light emission.

In FIG. 36C and FIG. 36D, light-emitting substances that emit light of the same color, or moreover, the same light-emitting substance may be used for the light-emitting layer 771, the light-emitting layer 772, and the light-emitting layer 773. For example, a light-emitting substance that emits blue light may be used for the light-emitting layer 771, the light-emitting layer 772, and the light-emitting layer 773. A color conversion layer may be provided as a layer 764 illustrated in FIG. 36D.

Alternatively, light-emitting substances that emit light of different colors may be used for the light-emitting layer 771, the light-emitting layer 772, and the light-emitting layer 773. White light can be obtained when the light-emitting layer 771, the light-emitting layer 772, and the light-emitting layer 773 emit light of complementary colors. A color filter (also referred to as a coloring layer) may be provided as the layer 764 illustrated in FIG. 36D. When white light passes through the color filter, light of a desired color can be obtained.

The light-emitting device emitting white light preferably contains two or more kinds of light-emitting substances. To obtain white light emission, two or more kinds of light-emitting substances are selected such that they emit light of complementary colors. For example, when an emission color of a first light-emitting layer and an emission color of a second light-emitting layer are complementary colors, the light-emitting device can be configured to emit white light as a whole. The same applies to a light-emitting device including three or more light-emitting layers.

In FIG. 36E and FIG. 36F, light-emitting substances that emit light of the same color, or moreover, the same light-emitting substance may be used for the light-emitting layer 771 and the light-emitting layer 772. Alternatively, light-emitting substances that emit light of different colors may be used for the light-emitting layer 771 and the light-emitting layer 772. White light can be obtained when the light-emitting layer 771 and the light-emitting layer 772 emit light of complementary colors. FIG. 36F illustrates an example in which the layer 764 is further provided. One or both of a color conversion layer and a color filter (a coloring layer) can be used as the layer 764.

Also in FIG. 36C, FIG. 36D, FIG. 36E, and FIG. 36F, the layer 780 and the layer 790 may each independently have a stacked-layer structure of two or more layers as illustrated in FIG. 36B.

In FIG. 36D and FIG. 36F, a conductive film transmitting visible light is used for the upper electrode 762 to extract light from the upper electrode 762 side.

Next, materials that can be used for the light-emitting device will be described.

A conductive film transmitting visible light is used as the electrode through which light is extracted, which is either the lower electrode 761 or the upper electrode 762. A conductive film reflecting visible light is preferably used as the electrode through which light is not extracted. In the case where a display device includes a light-emitting device emitting infrared light, a conductive film transmitting visible light and infrared light is used as the electrode through which light is extracted, and a conductive film reflecting visible light and infrared light is preferably used as the electrode through which light is not extracted.

A conductive film transmitting visible light may be used also for an electrode through which no light is extracted. In that case, this electrode is preferably provided between a reflective layer and the EL layer 763. In other words, light emitted by the EL layer 763 may be reflected by the reflective layer to be extracted from the display device.

As a material that forms the pair of electrodes of the light-emitting device, a metal, an alloy, an electrically conductive compound, a mixture thereof, and the like can be used as appropriate. Specific examples include indium tin oxide (In—Sn oxide, also referred to as ITO), In—Si—Sn oxide (also referred to as ITSO), indium zinc oxide (In—Zn oxide), In—W—Zn oxide, an alloy containing aluminum (an aluminum alloy) such as an alloy of aluminum, nickel, and lanthanum (Al—Ni—La), and an alloy containing silver such as an alloy containing silver and magnesium and an alloy of silver, palladium, and copper (Ag—Pd—Cu, also referred to as APC). In addition, it is possible to use a metal such as aluminum (Al), magnesium (Mg), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use a Group 1 element or a Group 2 element in the periodic table, which is not exemplified above (e.g., lithium (Li), cesium (Cs), calcium (Ca), or strontium (Sr)), a rare earth metal such as europium (Eu) or ytterbium (Yb), an alloy containing an appropriate combination of any of these elements, graphene, or the like.

The light-emitting device preferably employs a microcavity structure. Therefore, one of the pair of electrodes included in the light-emitting device preferably includes an electrode having properties of transmitting and reflecting visible light (a transflective electrode), and the other preferably includes an electrode having a property of reflecting visible light (a reflective electrode). When the light-emitting device has a microcavity structure, light obtained from the light-emitting layer can be resonated between the electrodes, whereby light emitted from the light-emitting device can be intensified.

The transflective electrode can have a stacked-layer structure of a reflective electrode and an electrode having a property of transmitting visible light (also referred to as a transparent electrode).

The transparent electrode has a light transmittance higher than or equal to 40%. For example, an electrode having a visible light (light at a wavelength longer than or equal to 400 nm and shorter than 750 nm) transmittance higher than or equal to 40% is preferably used in the light-emitting device. The visible light reflectivity of the transflective electrode is higher than or equal to 10% and lower than or equal to 95%, preferably higher than or equal to 30% and lower than or equal to 80%. The visible light reflectivity of the reflective electrode is higher than or equal to 40% and lower than or equal to 100%, preferably higher than or equal to 70% and lower than or equal to 100%. These electrodes preferably have a resistivity of $1\times10^{-2}$ Ωcm or lower.

Either a low molecular compound or a high molecular compound can be used for the light-emitting device, and an inorganic compound may also be included. Each layer included in the light-emitting device can be formed by a method such as an evaporation method (including a vacuum evaporation method), a transfer method, a printing method, an inkjet method, or a coating method.

The light-emitting layer can contain one or more kinds of light-emitting substances. As the light-emitting substance, a substance whose emission color is blue, violet, bluish violet, green, yellowish green, yellow, orange, red, or the like is appropriately used. Alternatively, as the light-emitting substance, a substance that emits near-infrared light can be used.

Examples of the light-emitting substance include a fluorescent material, a phosphorescent material, a TADF material, and a quantum dot material.

Examples of a fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of a phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material or an assist material) in addition to the light-emitting substance (a guest material). As one or more kinds of organic compounds, one or both of a substance having a high hole-transport property (a hole-transport material) and a substance having a high electron-transport property (an electron-transport material) can be used. Alternatively, as one or more kinds of organic compounds, a bipolar material or a TADF material may be used.

The light-emitting layer preferably includes a phosphorescent material and a combination of a hole-transport material and an electron-transport material that easily forms an exciplex, for example. With such a structure, light emission can be efficiently obtained by ExTET (Exciplex-Triplet Energy Transfer), which is energy transfer from the exciplex to the light-emitting substance (a phosphorescent material). When a combination of materials is selected so as to form an exciplex that emits light whose wavelength overlaps with the wavelength of a lowest-energy-side absorption band of the light-emitting substance, energy can be transferred smoothly and light emission can be obtained efficiently. With the above structure, high efficiency, low-voltage driving, and a long lifetime of a light-emitting device can be achieved at the same time.

In addition to the light-emitting layer, the EL layer 763 may further include a layer containing any of a substance having a high hole-injection property, a substance having a high hole-transport property, a hole-blocking material, a substance having a high electron-transport property, a substance having a high electron-injection property, an electron-blocking material, a substance having a bipolar property (a substance having a high electron-transport property and a high hole-transport property), and the like.

The hole-injection layer is a layer that injects holes from the anode to the hole-transport layer, and is a layer that contains a substance having a high hole-injection property. Examples of a substance having a high hole-injection property include an aromatic amine compound and a composite material containing a hole-transport material and an acceptor material (an electron-accepting material).

As the hole-transport material, it is possible to use a substance having a high hole-transport property which can be used for the hole-transport layer and will be described later.

As the acceptor material, an oxide of a metal belonging to any of Group 4 to Group 8 of the periodic table can be used, for example. Specifically, molybdenum oxide, vanadium oxide, niobium oxide, tantalum oxide, chromium oxide, tungsten oxide, manganese oxide, and rhenium oxide are given. Among these, molybdenum oxide is particularly preferable since it is stable in the air, has a low hygroscopic property, and is easy to handle. Alternatively, an organic acceptor material containing fluorine can be used. Alternatively, organic acceptor materials such as a quinodimethane derivative, a chloranil derivative, and a hexaazatriphenylene derivative can be used.

For example, a hole-transport material and a material containing an oxide of a metal belonging to any of Group 4 to Group 8 of the periodic table (typically, molybdenum oxide) may be used as the substance having a high hole-injection property.

The hole-transport layer is a layer that transports holes injected from the anode by the hole-injection layer, into the light-emitting layer. The hole-transport layer is a layer that contains a hole-transport material. As the hole-transport material, a substance having a hole mobility of $1\times10^{-6}$ $cm^2/Vs$ or higher is preferable. Note that other substances can also be used as long as the substances have a hole-transport property higher than an electron-transport property. As the hole-transport material, substances with a high hole-transport property, such as a π-electron rich heteroaromatic compound (e.g., a carbazole derivative, a thiophene derivative, and a furan derivative) and an aromatic amine (a compound having an aromatic amine skeleton), are preferred.

The electron-blocking layer is provided in contact with the light-emitting layer. The electron-blocking layer is a layer that has a hole-transport property and contains a material capable of blocking electrons. Any of the materials having an electron-blocking property among the above hole-transport materials can be used for the electron-blocking layer.

The electron-blocking layer has a hole-transport property, and thus can also be referred to as a hole-transport layer. A layer having an electron-blocking property among the hole-transport layers can also be referred to as an electron-blocking layer.

The electron-transport layer is a layer that transports electrons injected from the cathode by the electron-injection layer, into the light-emitting layer. The electron-transport layer is a layer that contains an electron-transport material. As the electron-transport material, a substance having an electron mobility of $1\times10^{-6}$ $cm^2/Vs$ or higher is preferable. Note that other substances can also be used as long as the substances have an electron-transport property higher than a hole-transport property. As the electron-transport material, any of the following substances with a high electron-transport property can be used, for example: a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, and a π-electron deficient heteroaromatic compound such as a nitrogen-containing heteroaromatic compound.

The hole-blocking layer is provided in contact with the light-emitting layer. The hole-blocking layer is a layer that has an electron-transport property and contains a material capable of blocking holes. Any of the materials having a hole-blocking property among the above electron-transport materials can be used for the hole-blocking layer.

The hole-blocking layer has an electron-transport property, and thus can also be referred to as an electron-transport layer. A layer having a hole-blocking property among the electron-transport layers can also be referred to as a hole-blocking layer.

The electron-injection layer is a layer that injects electrons from the cathode to the electron-transport layer, and is a layer that contains a substance having a high electron-injection property. As the substance having a high electron-injection property, an alkali metal, an alkaline earth metal, or a compound thereof can be used. As the substance having a high electron-injection property, a composite material containing an electron-transport material and a donor material (electron-donating material) can also be used.

The difference between the LUMO level of the substance having a high electron-injection property and the work function value of the material used for the cathode is preferably small (specifically, smaller than or equal to 0.5 eV).

For the electron-injection layer, it is possible to use an alkali metal, an alkaline earth metal, or a compound thereof, such as lithium, cesium, ytterbium, lithium fluoride (LiF), cesium fluoride (CsF), calcium fluoride ($CaF_x$, where X is a given number), 8-(quinolinolato) lithium (abbreviation: Liq), 2-(2-pyridyl) phenolatolithium (abbreviation: LiPP), 2-(2-pyridyl)-3-pyridinolato lithium (abbreviation: LiPPy), 4-phenyl-2-(2-pyridyl) phenolatolithium (abbreviation: LiPPP), lithium oxide ($LiO_x$), or cesium carbonate, for example. The electron-injection layer may have a stacked-layer structure of two or more layers. As the stacked-layer structure, for example, a structure in which lithium fluoride is used for the first layer and ytterbium is provided for the second layer is given.

The electron-injection layer may contain an electron-transport material. For example, a compound having an unshared electron pair and an electron deficient heteroaromatic ring can be used as the electron-transport material. Specifically, it is possible to use a compound having at least one of a pyridine ring, a diazine ring (a pyrimidine ring, a pyrazine ring, and a pyridazine ring), and a triazine ring.

Note that the lowest unoccupied molecular orbital (LUMO) level of the organic compound having an unshared electron pair is preferably greater than or equal to −3.6 eV and less than or equal to −2.3 eV. In general, the highest occupied molecular orbital (HOMO) level and the LUMO level of an organic compound can be estimated by CV (cyclic voltammetry), photoelectron spectroscopy, optical absorption spectroscopy, inverse photoelectron spectroscopy, or the like.

For example, 4,7-diphenyl-1,10-phenanthroline (abbreviation: BPhen), 2,9-di(naphthalen-2-yl)-4,7-diphenyl-1,10-phenanthroline (abbreviation: NBPhen), diquinoxalino[2,3-a: 2',3'-c] phenazine (abbreviation: HATNA), 2,4,6-tris[3'-(pyridin-3-yl) biphenyl-3-yl]-1,3,5-triazine (abbreviation: TmPPPyTz), or the like can be used as the organic compound having an unshared electron pair. Note that NBPhen has a higher glass transition temperature (Tg) than BPhen and thus has high heat resistance.

In the case of manufacturing a light-emitting device having a tandem structure, a charge-generation layer (also referred to as an intermediate layer) is provided between two light-emitting units. The intermediate layer has a function of injecting electrons into one of the two light-emitting units and injecting holes to the other when voltage is applied between the pair of electrodes.

For the charge-generation layer, for example, a material that can be used for the electron-injection layer, such as lithium, can be suitably used. For the charge-generation layer, for example, a material that can be used for the hole-injection layer can be suitably used. For the charge-generation layer, a layer containing a hole-transport material and an acceptor material (an electron-accepting material) can be used. For the charge-generation layer, a layer containing an electron-transport material and a donor material can be used. Forming such a charge-generation layer can inhibit an increase in the driving voltage that would be caused by stacking light-emitting units.

The charge-generation layer includes at least a charge-generation region. The charge-generation region preferably contains an acceptor material, and for example, preferably contains a hole-transport material and an acceptor material which can be used for the above-described hole-injection layer.

The charge-generation layer preferably includes a layer containing a substance having a high electron-injection property. The layer can also be referred to as an electron-injection buffer layer. The electron-injection buffer layer is preferably provided between the charge-generation region and the electron-transport layer. By provision of the electron-injection buffer layer, an injection barrier between the charge-generation region and the electron-transport layer can be lowered; thus, electrons generated in the charge-generation region can be easily injected into the electron-transport layer.

The electron-injection buffer layer preferably contains an alkali metal or an alkaline earth metal, and for example, can be configured to contain an alkali metal compound or an alkaline earth metal compound. Specifically, the electron-injection buffer layer preferably contains an inorganic compound containing an alkali metal and oxygen or an inorganic compound containing an alkaline earth metal and oxygen, further preferably contains an inorganic compound containing lithium and oxygen (e.g., lithium oxide ($Li_2O$)). Alternatively, a material that can be used for the electron-injection layer can be favorably used for the electron-injection buffer layer.

The charge-generation layer preferably includes a layer containing a substance having a high electron-transport property. The layer can also be referred to as an electron-relay layer. The electron-relay layer is preferably provided between the charge-generation region and the electron-injection buffer layer. In the case where the charge-generation layer does not include an electron-injection buffer layer, the electron-relay layer is preferably provided between the charge-generation region and the electron-transport layer. The electron-relay layer has a function of preventing interaction between the charge-generation region and the electron-injection buffer layer (or the electron-transport layer) and smoothly transferring electrons.

A phthalocyanine-based material such as copper (II) phthalocyanine (abbreviation: CuPc) or a metal complex having a metal-oxygen bond and an aromatic ligand is preferably used for the electron-relay layer.

Note that the charge-generation region, the electron-injection buffer layer, and the electron-relay layer cannot be clearly distinguished from each other in some cases on the basis of the cross-sectional shapes, properties, or the like.

Note that the charge-generation layer may contain a donor material instead of an acceptor material. For example, the charge-generation layer may include a layer containing an electron-transport material and a donor material, which can be used for the electron-injection layer.

When the light-emitting units are stacked, provision of a charge-generation layer between two light-emitting units can suppress an increase in driving voltage.

This embodiment can be combined with the other embodiments as appropriate.

Embodiment 7

In this embodiment, a light-receiving device that can be used for the display device of one embodiment of the present invention and a display device having a light-emitting and light-receiving function will be described.

For example, a pn or pin photodiode can be used as the light-receiving device. The light-receiving device functions as a photoelectric conversion device (also referred to as a photoelectric conversion element) that detects light entering the light-receiving device and generates electric charge. The amount of electric charge generated from the light-receiving device depends on the amount of light entering the light-receiving device.

It is particularly preferable to use an organic photodiode including a layer containing an organic compound, as the light-receiving device. An organic photodiode, which is easily made thin, lightweight, and large in area and has a high degree of freedom for shape and design, can be used for a variety of display devices.

[Light-Receiving Device]

Figure 37A:
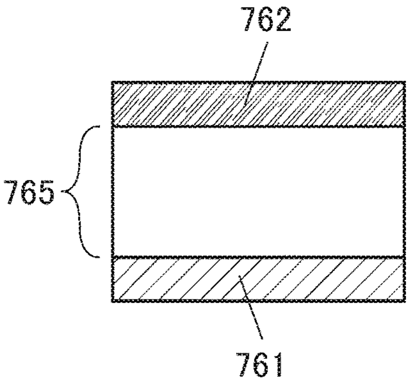
FIG. 37A and FIG. 37B are diagrams illustrating structure examples of a light-receiving device.

As illustrated in FIG. 37A, the light-receiving device includes a layer 765 between a pair of electrodes (the lower electrode 761 and the upper electrode 762). The layer 765 includes at least one active layer, and may further include another layer.

Figure 37B:
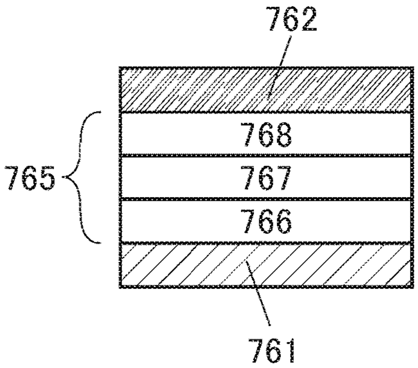

FIG. 37B is a variation example of the layer 765 included in the light-receiving device illustrated in FIG. 37A. Specifically, the light-receiving device illustrated in FIG. 37B includes a layer 766 over the lower electrode 761, an active layer 767 over the layer 766, a layer 768 over the active layer 767, and the upper electrode 762 over the layer 768.

The active layer 767 functions as a photoelectric conversion layer.

In the case where the lower electrode 761 is an anode and the upper electrode 762 is a cathode, the layer 766 includes one or both of a hole-transport layer and an electron-blocking layer. The layer 768 includes one or both of an electron-transport layer and a hole-blocking layer. In the case where the lower electrode 761 is a cathode and the upper electrode 762 is an anode, the structures of the layers 766 and 768 are replaced with each other.

Here, the display device of one embodiment of the present invention may include a layer used in common to the light-receiving device and the light-emitting device (also referred to as a continuous layer shared by the light-receiving device and the light-emitting device). Such a layer may have different functions in the light-emitting device and the light-receiving device. In this specification, the name of a component is based on its function in the light-emitting device in some cases. For example, a hole-injection layer functions as a hole-injection layer in the light-emitting device and functions as a hole-transport layer in the light-receiving device. Similarly, an electron-injection layer functions as an electron-injection layer in the light-emitting device and functions as an electron-transport layer in the light-receiving device. A layer used in common to the light-receiving device and the light-emitting device may have the same function in both the light-emitting device and the light-receiving device. The hole-transport layer functions as a hole-transport layer in both the light-emitting device and the light-receiving device, and the electron-transport layer functions as an electron-transport layer in both the light-emitting device and the light-receiving device.

Next, materials that can be used for the light-receiving device will be described.

Either a low molecular compound or a high molecular compound can be used for the light-receiving device, and an inorganic compound may also be included. Each layer included in the light-receiving device can be formed by a method such as an evaporation method (including a vacuum evaporation method), a transfer method, a printing method, an inkjet method, or a coating method.

The active layer included in the light-receiving device includes a semiconductor. Examples of the semiconductor include an inorganic semiconductor such as silicon and an organic semiconductor including an organic compound. This embodiment describes an example in which an organic semiconductor is used as the semiconductor included in the active layer. The use of an organic semiconductor is preferable because the light-emitting layer and the active layer can be formed by the same method (e.g., a vacuum evaporation method) and thus the same manufacturing apparatus can be used.

Examples of an n-type semiconductor material included in the active layer include electron-accepting organic semiconductor materials such as fullerene (e.g., $C_{60}$ and $C_{70}$) and fullerene derivatives. Examples of the fullerene derivative include [6,6]-Phenyl-C71-butyric acid methyl ester (abbreviation: PC70BM), [6,6]-Phenyl-C61-butyric acid methyl ester (abbreviation: PC60BM), and 1',1",4',4"-Tetrahydro-di [1,4] methanonaphthaleno[1,2:2',3',56,60:2",3"] [5,6] fullerene-C60 (abbreviation: ICBA).

Other examples of an n-type semiconductor material include perylenetetracarboxylic acid derivatives such as N,N'-dimethyl-3,4,9,10-perylenetetracarboxylic diimide (abbreviation: Me-PTCDI) and 2,2'-(5,5'-(thieno[3,2-b]thiophene-2,5-diyl)bis(thiophene-5,2-diyl))bis(methan-1-yl-1-ylidene)dimalononitrile (abbreviation: FT2TDMN).

Other examples of an n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the active layer include electron-donating organic semiconductor materials such as copper (II) phthalocyanine (CuPc), tetraphenyldibenzoperiflanthene (DBP), zinc phthalocyanine (ZnPc), tin phthalocyanine (SnPc), quinacridone, and rubrene.

Other examples of a p-type semiconductor material include a carbazole derivative, a thiophene derivative, a furan derivative, and a compound having an aromatic amine skeleton. Other examples of a p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a rubrene derivative, a tetracene derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can increase the carrier-transport property.

For the active layer, a high molecular compound such as Poly[[4,8-bis[5-(2-ethylhexyl)-2-thienyl]benzo[1,2-b: 4,5-b']dithiophene-2,6-diyl]-2,5-thiophenediyl[5,7-bis(2-ethylhexyl)-4,8-dioxo-4H,8H-benzo[1,2-c: 4,5-c']dithiophene-1,3-diyl]]polymer (abbreviation: PBDB-T) or a PBDB-T derivative, which functions as a donor, can be used. For example, a method in which an acceptor material is dispersed to PBDB-T or a PBDB-T derivative can be used.

For example, the active layer is preferably formed by co-evaporation of an n-type semiconductor and a p-type semiconductor. Alternatively, the active layer may be formed by stacking an n-type semiconductor and a p-type semiconductor.

Three or more kinds of materials may be used for the active layer. For example, a third material may be mixed with an n-type semiconductor material and a p-type semiconductor material in order to extend the absorption wavelength range. The third material may be a low molecular compound or a high molecular compound.

In addition to the active layer, the light-receiving device may further include a layer containing a substance with a high hole-transport property, a substance with a high electron-transport property, a substance with a bipolar property (a substance with a high electron-transport property and a high hole-transport property), or the like. Without limitation to the above, the light-receiving device may further include a layer containing a substance with a high hole-injection property, a hole-blocking material, a substance with a high electron-injection property, an electron-blocking material, or the like. Layers other than the active layer included in the light-receiving device can be formed using a material that can be used for the light-emitting device.

As the hole-transport material or the electron-blocking material, a high molecular compound such as poly(3,4-ethylenedioxythiophene)/poly(styrenesulfonic acid) (PEDOT/PSS), or an inorganic compound such as molybdenum oxide or copper iodide (CuI) can be used, for example. As the electron-transport material or the hole-blocking material, an inorganic compound such as zinc oxide (ZnO), or an organic compound such as polyethylenimine ethoxylate (PEIE) can be used. The light-receiving device may include a mixed film of PEIE and ZnO, for example.

[Display Device Having Light Detection Function]

In the display device of one embodiment of the present invention, the light-emitting devices are arranged in a matrix in a display portion, and an image can be displayed on the display portion. Furthermore, the light-receiving devices are arranged in a matrix in the display portion, and the display portion has one or both of an image capturing function and a sensing function in addition to an image displaying function. The display portion can be used as an image sensor or a touch sensor. That is, by detecting light with the display portion, an image can be captured or the approach or contact of a target (e.g., a finger, a hand, or a pen) can be detected.

Furthermore, in the display device of one embodiment of the present invention, the light-emitting devices can be used as a light source of the sensor. In the display device of one embodiment of the present invention, when an object reflects (or scatters) light emitted by the light-emitting device included in the display portion, the light-receiving device can detect reflected light (or scattered light); thus, image capturing or touch detection is possible even in a dark place.

Accordingly, a light-receiving portion and a light source do not need to be provided separately from the display device; hence, the number of components of an electronic device can be reduced. For example, a biometric authentication device, a capacitive touch panel for scroll operation, or the like is not necessarily provided separately from the electronic device. Thus, with the use of the display device of one embodiment of the present invention, the electronic device can be provided with reduced manufacturing cost.

Specifically, the display device of one embodiment of the present invention includes a light-emitting device and a light-receiving device in a pixel. In the display device of one embodiment of the present invention, an organic EL device is used as the light-emitting device, and an organic photodiode is used as the light-receiving device. The organic EL device and the organic photodiode can be formed over the same substrate. Thus, the organic photodiode can be incorporated in the display device including the organic EL device.

In the display device including light-emitting devices and a light-receiving device in each pixel, the pixel has a light-receiving function; thus, the display device can detect a contact or approach of an object while displaying an image. For example, all the subpixels included in the display device can display an image; alternatively, some of the subpixels can emit light as a light source, some of the rest of the subpixels can detect light, and the other subpixels can display an image.

In the case where the light-receiving device is used as an image sensor, the display device can capture an image with the use of the light-receiving device. For example, the display device of this embodiment can be used as a scanner.

For example, image capturing for personal authentication with the use of a fingerprint, a palm print, the iris, the shape of a blood vessel (including the shape of a vein and the shape of an artery), a face, or the like can be performed using the image sensor.

For example, an image of the periphery, surface, or inside (e.g., fundus) of an eye of a user of a wearable device can be captured using the image sensor. Therefore, the wearable device can have a function of detecting one or more selected from blinking, movement of an iris, and movement of an eyelid of the user.

The light-receiving device can be used for a touch sensor (also referred to as a direct touch sensor), a near touch sensor (also referred to as a hover sensor, a hover touch sensor, a contactless sensor, or a touchless sensor), or the like.

Here, the touch sensor or the near touch sensor can detect the approach or contact of an object (e.g., a finger, a hand, or a pen).

The touch sensor can detect an object when the display device and the object come in direct contact with each other. The near touch sensor can detect an object even when the object is not in contact with the display device. For example, the display device is preferably capable of detecting an object when the distance between the display device and the object is greater than or equal to 0.1 mm and less than or equal to 300 mm, preferably greater than or equal to 3 mm and less than or equal to 50 mm. With this structure, the display device can be operated without direct contact of an object. In other words, the display device can be operated in a contactless (touchless) manner. With the above structure, the display device can have a reduced risk of being dirty or damaged, or can be operated without the object directly touching a dirt (e.g., dust or a virus) attached to the display device.

The refresh rate can be variable in the display device of one embodiment of the present invention. For example, the refresh rate is adjusted (adjusted in the range from 1 Hz to 240 Hz, for example) in accordance with contents displayed on the display device, whereby power consumption can be reduced. The driving frequency of the touch sensor or the near touch sensor may be changed in accordance with the refresh rate. For example, when the refresh rate of the display device is 120 Hz, the driving frequency of the touch sensor or the near touch sensor can be higher than 120 Hz (can typically be 240 Hz). With this structure, low power consumption can be achieved, and the response speed of the touch sensor or the near touch sensor can be increased.

Figure 37C:
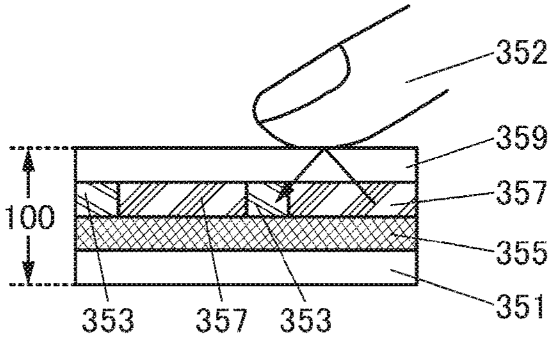
FIG. 37C to FIG. 37E are diagrams illustrating structure examples of a display device.
Figure 37D:
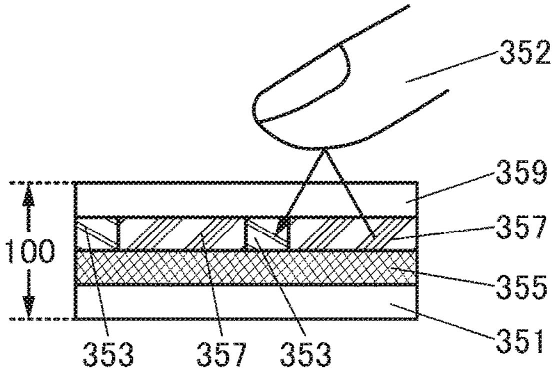
Figure 37E:
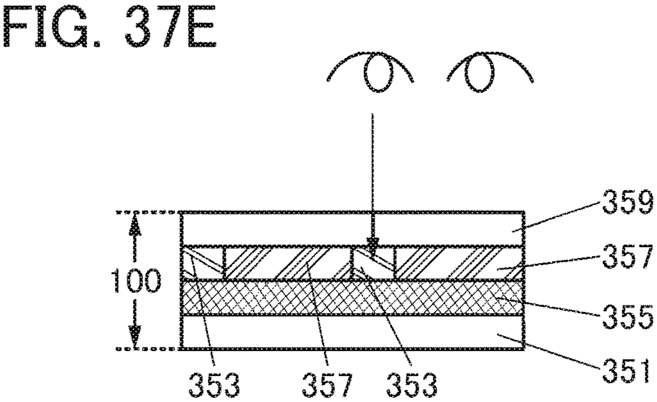

The display device 100 illustrated in FIG. 37C to FIG. 37E includes a layer 353 including a light-receiving device, a functional layer 355, and a layer 357 including a light-emitting device, between a substrate 351 and a substrate 359.

The functional layer 355 includes a circuit for driving a light-receiving device and a circuit for driving a light-emitting device. One or more of a switch, a transistor, a capacitor, a resistor, a wiring, a terminal, and the like can be provided in the functional layer 355. Note that in the case where the light-emitting device and the light-receiving device are driven by a passive-matrix method, a structure including neither a switch nor a transistor may be employed.

For example, after light emitted by the light-emitting device in the layer 357 including the light-emitting device is reflected by a finger 352 in contact with the display device 100 as illustrated in FIG. 37C, the light-receiving device in the layer 353 including the light-receiving device detects the reflected light. Thus, the contact of the finger 352 with the display device 100 can be detected.

Alternatively, the display device may have a function of detecting an object that is approaching (i.e., that is not in contact with) the display device as illustrated in FIG. 37D and FIG. 37E or capturing an image of such an object. FIG. 37D illustrates an example in which a human finger is detected, and FIG. 37E illustrates an example in which information on the periphery, surface, or inside of the human eye (e.g., the number of blinks, movement of an eyeball, and movement of an eyelid) is detected.

This embodiment can be combined with the other embodiments as appropriate.

Embodiment 8

In this embodiment, electronic devices of embodiments of the present invention will be described with reference to FIG. 38 to FIG. 40.

Electronic devices of this embodiment each include the display device of one embodiment of the present invention in a display portion. The display device of one embodiment of the present invention can be easily increased in resolution and definition. Thus, the display device of one embodiment of the present invention can be used for a display portion of a variety of electronic devices.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or notebook personal computer, a monitor of a computer or the like, digital signage, and a large game machine such as a pachinko machine.

In particular, the display device of one embodiment of the present invention can have high resolution, and thus can be suitably used for an electronic device including a relatively small display portion. Examples of such an electronic device include watch-type and bracelet-type information terminals (wearable devices) and wearable devices capable of being worn on a head, such as a VR device like a head-mounted display, a glasses-type AR device, and an MR device.

The definition of the display device of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840× 2160), or 8K (number of pixels: 7680× 4320). In particular, the definition is preferably 4K, 8K, or higher. The pixel density (resolution) of the display device of one embodiment of the present invention is preferably higher than or equal to 100 ppi, further preferably higher than or equal to 300 ppi, further preferably higher than or equal to 500 ppi, further preferably higher than or equal to 1000 ppi, still further preferably higher than or equal to 2000 ppi, still further preferably higher than or equal to 3000 ppi, still further preferably higher than or equal to 5000 ppi, yet further preferably higher than or equal to 7000 ppi. The use of the display device having one or both of such high definition and high resolution can further increase realistic sensation, sense of depth, and the like. There is no particular limitation on the screen ratio (aspect ratio) of the display device of one embodiment of the present invention. For example, the display device is compatible with a variety of screen ratios such as 1:1 (a square), 4:3, 16:9, and 16:10.

The electronic device in this embodiment may include a sensor (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Examples of a wearable device capable of being worn on a head are described with reference to FIG. 38A to FIG. 38D. These wearable devices have at least one of a function of displaying AR contents, a function of displaying VR contents, a function of displaying SR contents, and a function of displaying MR contents. The electronic device having a function of displaying contents of at least one of AR, VR, SR, MR, and the like enables a user to feel a higher sense of immersion.

Figure 38A:
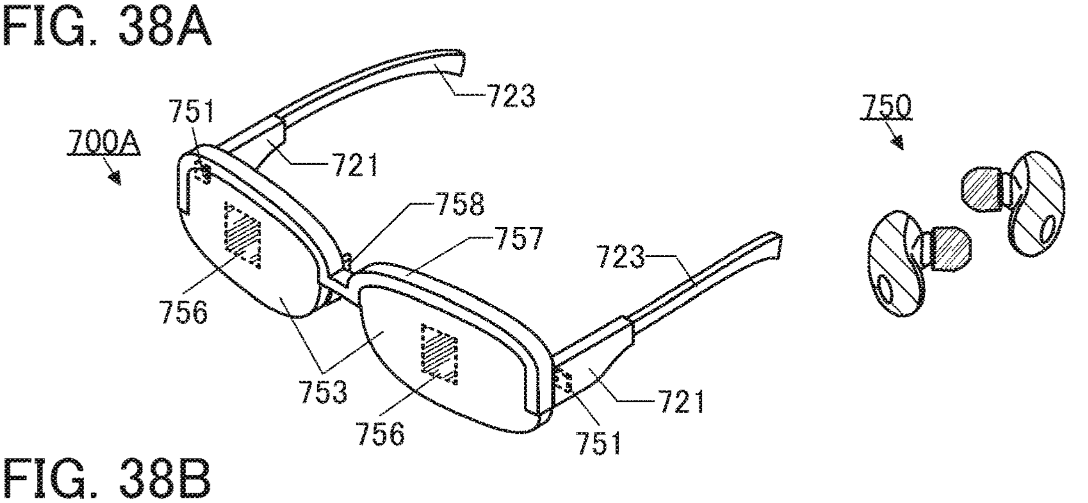
FIG. 38A to FIG. 38D are diagrams illustrating examples of electronic devices.
Figure 38B:
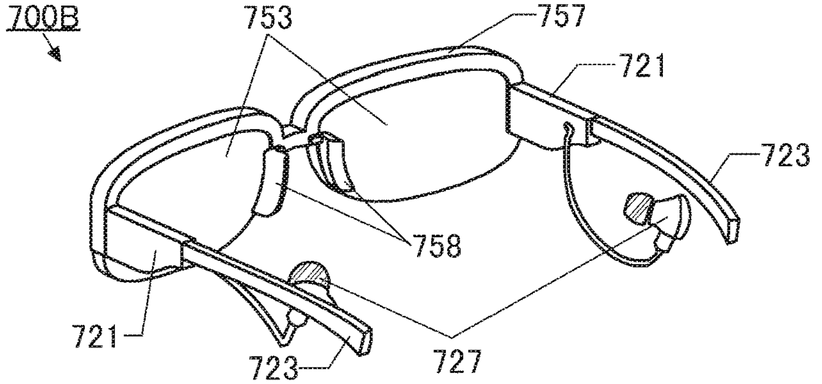

An electronic device 700A illustrated in FIG. 38A and an electronic device 700B illustrated in FIG. 38B each include a pair of display panels 751, a pair of housings 721, a communication portion (not illustrated), a pair of wearing portions 723, a control portion (not illustrated), an image capturing portion (not illustrated), a pair of optical members 753, a frame 757, and a pair of nose pads 758.

The display device of one embodiment of the present invention can be used for the display panels 751. Thus, the electronic device can perform display with extremely high resolution.

The electronic device 700A and the electronic device 700B can each project images displayed on the display panels 751 onto display regions 756 of the optical members 753. Since the optical members 753 have a light-transmitting property, a user can see images displayed on the display regions, which are superimposed on transmission images seen through the optical members 753. Accordingly, the electronic device 700A and the electronic device 700B are electronic devices capable of AR display.

In each of the electronic device 700A and the electronic device 700B, a camera capable of capturing images of the front side may be provided as the image capturing portion. Furthermore, when the electronic device 700A and the electronic device 700B are each provided with an acceleration sensor such as a gyroscope sensor, the orientation of the user's head can be sensed and an image corresponding to the orientation can be displayed on the display regions 756.

The communication portion includes a wireless communication device, and a video signal and the like can be supplied by the wireless communication device. Note that instead of the wireless communication device or in addition to the wireless communication device, a connector to which a cable for supplying a video signal and a power supply potential can be connected may be provided.

The electronic device 700A and the electronic device 700B are each provided with a battery so that they can be charged wirelessly and/or by wire.

A touch sensor module may be provided in the housing 721. The touch sensor module has a function of detecting touch on the outer surface of the housing 721. A tap operation or a slide operation, for example, by the user can be detected with the touch sensor module, whereby a variety of processing can be executed. For example, processing such as a pause or a restart of a moving image can be executed by a tap operation, and processing such as fast forward and fast rewind can be executed by a slide operation. The touch sensor module is provided in each of the two housings 721, whereby the range of the operation can be increased.

A variety of touch sensors can be used for the touch sensor module. For example, any of touch sensors of various types such as a capacitive type, a resistive type, an infrared type, an electromagnetic induction type, a surface acoustic wave type, and an optical type can be employed. In particular, a capacitive sensor or an optical sensor is preferably used for the touch sensor module.

In the case of using an optical touch sensor, a photoelectric conversion device (also referred to as a photoelectric conversion element) can be used as a light-receiving device. One or both of an inorganic semiconductor and an organic semiconductor can be used for an active layer of the photoelectric conversion device.

Figure 38C:
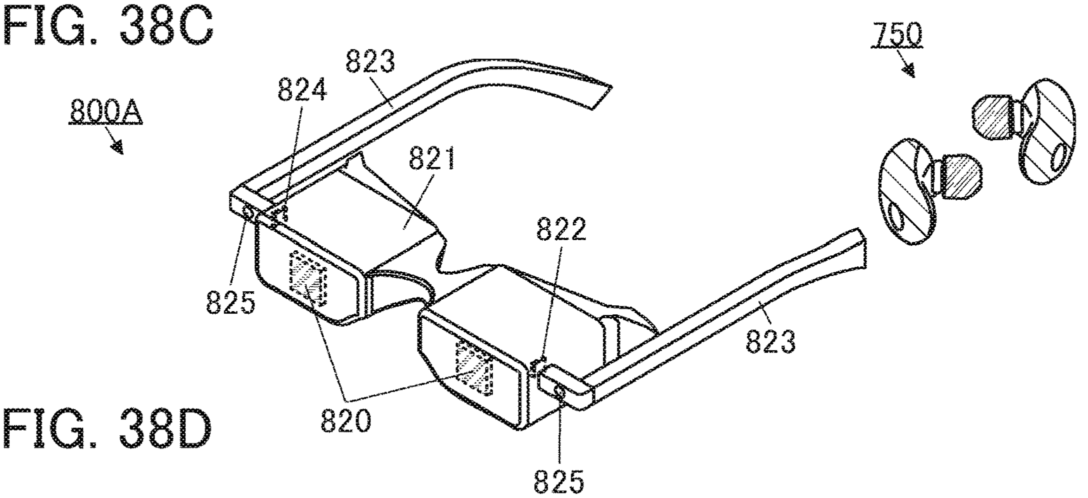
Figure 38D:
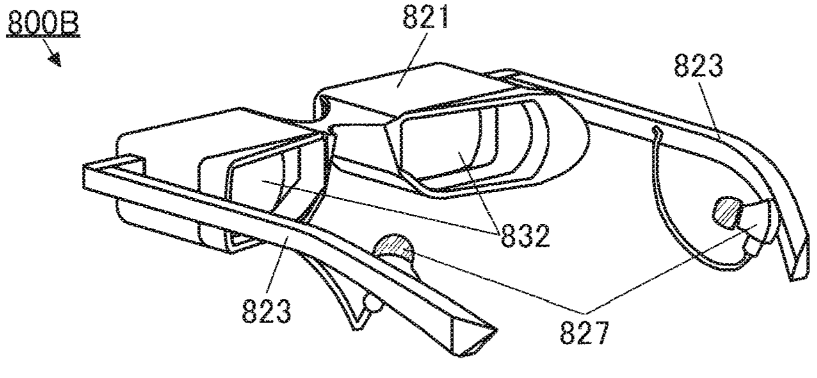

An electronic device 800A illustrated in FIG. 38C and an electronic device 800B illustrated in FIG. 38D each include a pair of display portions 820, a housing 821, a communication portion 822, a pair of wearing portions 823, a control portion 824, a pair of image capturing portions 825, and a pair of lenses 832.

The display device of one embodiment of the present invention can be used for the display portions 820. Thus, the electronic device can perform display with extremely high resolution. This enables a user to feel high sense of immersion.

The display portions 820 are provided at a position inside the housing 821 so as to be seen through the lenses 832. When the pair of display portions 820 display different images, three-dimensional display using parallax can be performed.

The electronic device 800A and the electronic device 800B can be regarded as electronic devices for VR. The user who wears the electronic device 800A or the electronic device 800B can see images displayed on the display portions 820 through the lenses 832.

The electronic device 800A and the electronic device 800B each preferably include a mechanism for adjusting the lateral positions of the lenses 832 and the display portions 820 so that the lenses 832 and the display portions 820 are positioned optimally in accordance with the positions of the user's eyes. Moreover, the electronic device 800A and the electronic device 800B each preferably include a mechanism for adjusting focus by changing the distance between the lenses 832 and the display portions 820.

The electronic device 800A or the electronic device 800B can be mounted on the user's head with the wearing portions 823. FIG. 38C and the like illustrate examples where the wearing portion 823 has a shape like a temple of glasses; however, one embodiment of the present invention is not limited thereto. The wearing portion 823 can have any shape with which the user can wear the electronic device, for example, a shape of a helmet or a band.

The image capturing portion 825 has a function of obtaining information on the external environment. Data obtained by the image capturing portion 825 can be output to the display portion 820. An image sensor can be used for the image capturing portion 825. Moreover, a plurality of cameras may be provided so as to cover a plurality of fields of view, such as a telescope field of view and a wide field of view.

Although an example of including the image capturing portion 825 is described here, a range sensor (hereinafter, also referred to as a sensing portion) that is capable of measuring a distance from an object may be provided. That is, the image capturing portion 825 is one embodiment of the sensing portion. As the sensing portion, an image sensor or a distance image sensor such as LIDAR (Light Detection and Ranging) can be used, for example. With the use of images obtained by the camera and images obtained by the distance image sensor, more pieces of information can be obtained and a gesture operation with higher accuracy is possible.

The electronic device 800A may include a vibration mechanism that functions as bone-conduction earphones. For example, a structure including the vibration mechanism can be employed for any one or more of the display portion 820, the housing 821, and the wearing portion 823. Thus, without additionally requiring an audio device such as headphones, earphones, or a speaker, the user can enjoy video and sound only by wearing the electronic device 800A.

The electronic device 800A and the electronic device 800B may each include an input terminal. To the input terminal, a cable for supplying a video signal from a video output device or the like, electric power for charging a battery provided in the electronic device, and the like can be connected.

The electronic device of one embodiment of the present invention may have a function of performing wireless communication with earphones 750. The earphones 750 include a communication portion (not illustrated) and have a wireless communication function. The earphones 750 can receive information (e.g., audio data) from the electronic device with the wireless communication function. For example, the electronic device 700A illustrated in FIG. 38A has a function of transmitting information to the earphones 750 with the wireless communication function. As another example, the electronic device 800A illustrated in FIG. 38C has a function of transmitting information to the earphones 750 with the wireless communication function.

The electronic device may include an earphone portion. The electronic device 700B illustrated in FIG. 38B includes earphone portions 727. For example, the earphone portion 727 and the control portion can be connected to each other by wire. Part of a wiring that connects the earphone portion 727 and the control portion may be positioned inside the housing 721 or the wearing portion 723.

Similarly, the electronic device 800B illustrated in FIG. 38D includes earphone portions 827. For example, the earphone portion 827 and the control portion 824 can be connected to each other by wire. Part of a wiring that connects the earphone portion 827 and the control portion 824 may be positioned inside the housing 821 or the wearing portion 823. Alternatively, the earphone portions 827 and the wearing portions 823 may include magnets. This is preferred because the earphone portions 827 can be fixed to the wearing portions 823 with magnetic force and thus can be easily housed.

The electronic device may include an audio output terminal to which earphones, headphones, or the like can be connected. The electronic device may include one or both of an audio input terminal and an audio input mechanism. As the audio input mechanism, a sound collecting device such as a microphone can be used, for example. The electronic device may have a function of what is called a headset by including the audio input mechanism.

As described above, both the glasses-type device (e.g., the electronic device 700A and the electronic device 700B) and the goggles-type device (e.g., the electronic device 800A and the electronic device 800B) are preferable as the electronic device of one embodiment of the present invention.

The electronic device of one embodiment of the present invention can transmit information to earphones by wire or wirelessly.

Figure 39A:
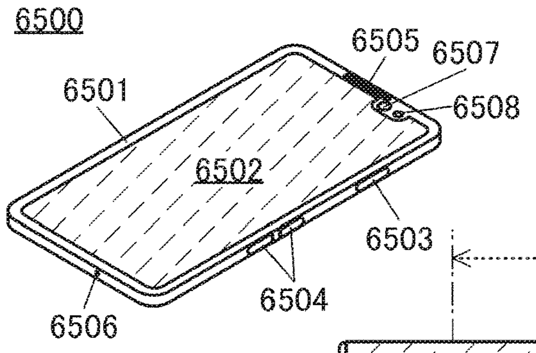
FIG. 39A to FIG. 39F are diagrams illustrating examples of electronic devices.

An electronic device 6500 illustrated in FIG. 39A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used for the display portion 6502.

Figure 39B:
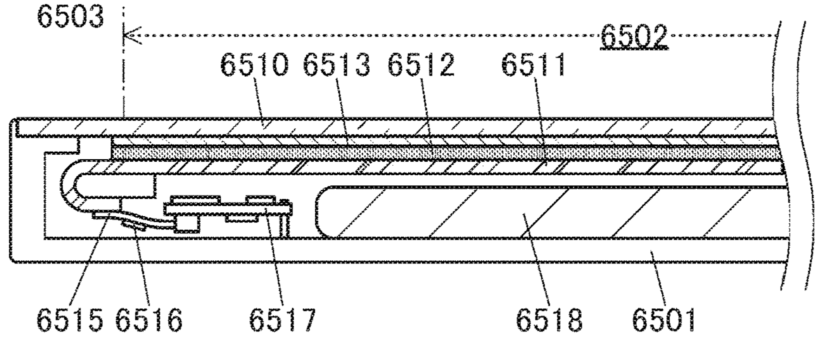

FIG. 39B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are placed in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be obtained. Since the display panel 6511 is extremely thin, the battery 6518 with high capacity can be mounted while an increase in thickness of the electronic device is suppressed. Moreover, part of the display panel 6511 is folded back so that a connection portion with the FPC 6515 is provided on the back side of the pixel portion, whereby an electronic device with a narrow bezel can be obtained.

Figure 39C:
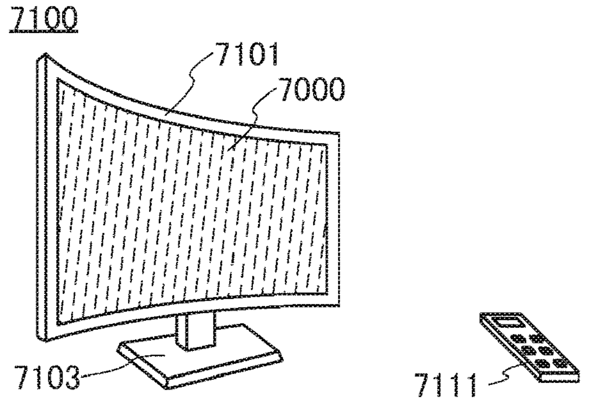

FIG. 39C illustrates an example of a television device. In a television device 7100, a display portion 7000 is incorporated in a housing 7101. Here, a structure in which the housing 7101 is supported by a stand 7103 is illustrated.

The display device of one embodiment of the present invention can be used for the display portion 7000.

Operation of the television device 7100 illustrated in FIG. 39C can be performed with an operation switch provided in the housing 7101 and a separate remote control 7111. Alternatively, the display portion 7000 may include a touch sensor, and the television device 7100 may be operated by touch on the display portion 7000 with a finger or the like. The remote control 7111 may include a display portion for displaying information output from the remote control 7111. With operation keys or a touch panel provided in the remote control 7111, channels and volume can be controlled and videos displayed on the display portion 7000 can be controlled.

Note that the television device 7100 has a structure in which a receiver, a modem, and the like are provided. A general television broadcast can be received with the receiver. When the television device is connected to a communication network by wire or wirelessly via the modem, one-way (from a transmitter to a receiver) or two-way (between a transmitter and a receiver or between receivers, for example) data communication can be performed.

Figure 39D:
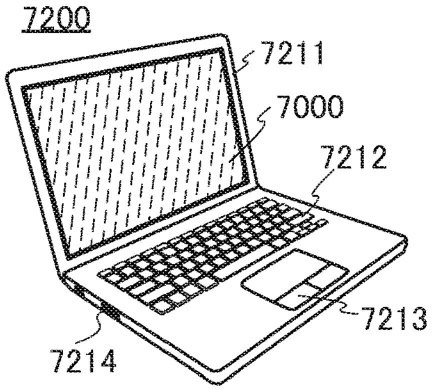

FIG. 39D illustrates an example of a notebook personal computer. A notebook personal computer 7200 includes a housing 7211, a keyboard 7212, a pointing device 7213, an external connection port 7214, and the like. In the housing 7211, the display portion 7000 is incorporated. The display device of one embodiment of the present invention can be used for the display portion 7000.

Figure 39E:
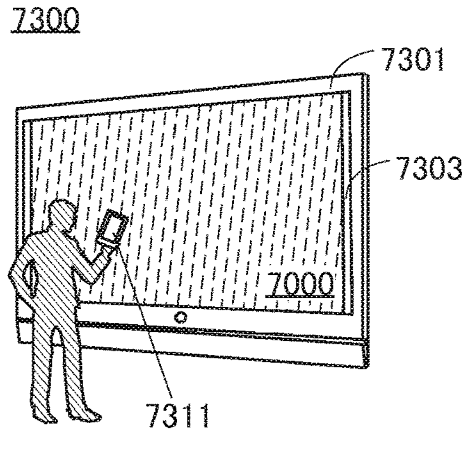
Figure 39F:
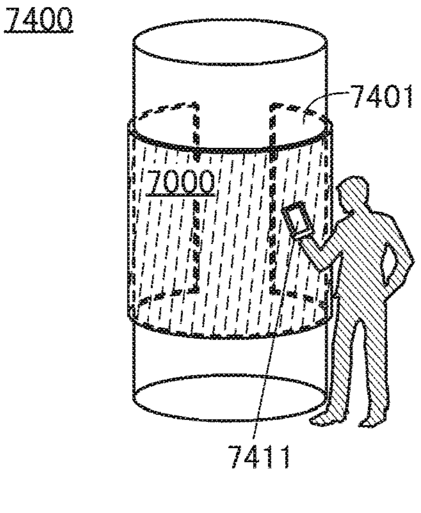

FIG. 39E and FIG. 39F illustrate examples of digital signage.

Digital signage 7300 illustrated in FIG. 39E includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 39F is digital signage 7400 attached to a cylindrical pillar 7401. The digital signage 7400 includes the display portion 7000 provided along a curved surface of the pillar 7401.

The display device of one embodiment of the present invention can be used for the display portion 7000 in each of FIG. 39E and FIG. 39F.

A larger area of the display portion 7000 can increase the amount of information that can be provided at a time. The larger the display portion 7000 attracts more attention, so that the effectiveness of the advertisement can be increased, for example.

A touch panel is preferably used in the display portion 7000, in which case intuitive operation by a user is possible in addition to display of an image or a moving image on the display portion 7000. Moreover, for an application for providing information such as route information or traffic information, usability can be enhanced by intuitive operation.

As illustrated in FIG. 39E and FIG. 39F, it is preferable that the digital signage 7300 or the digital signage 7400 can work with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operating the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Electronic devices illustrated in FIG. 40A to FIG. 40G each include a housing 9000, a display portion 9001, a speaker 9003, an operation key 9005 (including a power switch or an operation switch), a connection terminal 9006, a sensor 9007 (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The display device of one embodiment of the present invention can be used for the display portion 9001 in FIG. 40A to FIG. 40G.

The electronic devices illustrated in FIG. 40A to FIG. 40G have a variety of functions. For example, the electronic devices can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may each include a plurality of display portions. The electronic devices may each be provided with a camera or the like and have a function of taking a still image or a moving image and storing the taken image in a storage medium (an external storage medium or a storage medium incorporated in the camera), a function of displaying the taken image on the display portion, or the like.

The electronic devices illustrated in FIG. 40A to FIG. 40G are described in detail below.

Figure 40A:
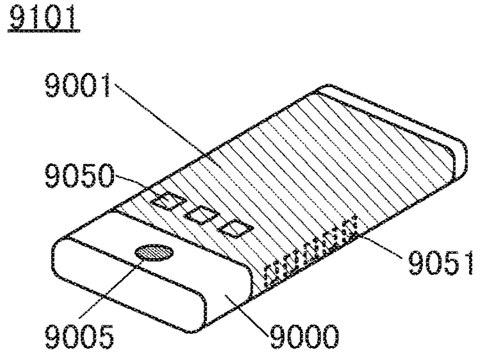
FIG. 40A to FIG. 40G are diagrams illustrating examples of electronic devices.

FIG. 40A is a perspective view illustrating a portable information terminal 9101. For example, the portable information terminal 9101 can be used as a smartphone. Note that the portable information terminal 9101 may be provided with the speaker 9003, the connection terminal 9006, the sensor 9007, or the like. The portable information terminal 9101 can display characters and image information on its plurality of surfaces. FIG. 40A illustrates an example in which three icons 9050 are displayed. Furthermore, information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the radio field intensity. Alternatively, the icon 9050 or the like may be displayed at the position where the information 9051 is displayed.

Figure 40B:
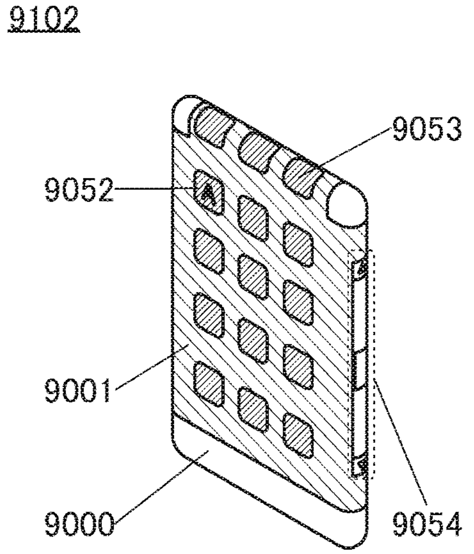

FIG. 40B is a perspective view illustrating a portable information terminal 9102. The portable information terminal 9102 has a function of displaying information on three or more surfaces of the display portion 9001. Shown here is an example in which information 9052, information 9053, and information 9054 are displayed on different surfaces. For example, a user can check the information 9053 displayed such that it can be seen from above the portable information terminal 9102, with the portable information terminal 9102 put in a breast pocket of his/her clothes. The user can see the display without taking out the portable information terminal 9102 from the pocket and decide whether to answer the call, for example.

Figure 40C:
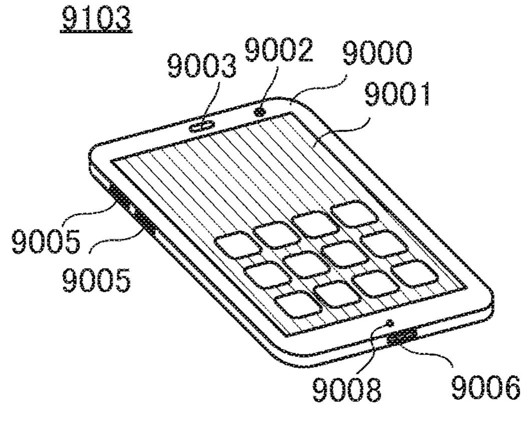

FIG. 40C is a perspective view illustrating a tablet terminal 9103. The tablet terminal 9103 is capable of executing a variety of applications such as mobile phone calls, e-mailing, viewing and editing texts, music reproduction, Internet communication, and a computer game. The tablet terminal 9103 includes the display portion 9001, a camera 9002, the microphone 9008, and the speaker 9003 on the front surface of the housing 9000; the operation keys 9005 as buttons for operation on the left side surface of the housing 9000; and the connection terminal 9006 on the bottom surface of the housing 9000.

Figure 40D:
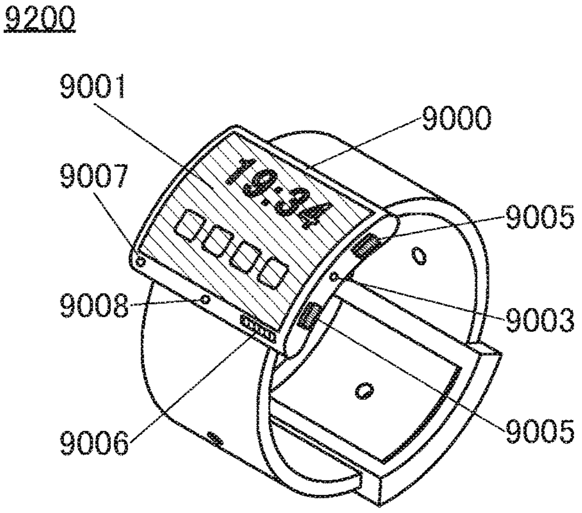

FIG. 40D is a perspective view illustrating a watch-type portable information terminal 9200. For example, the portable information terminal 9200 can be used as a Smartwatch (registered trademark). The display surface of the display portion 9001 is curved, and an image can be displayed on the curved display surface. Furthermore, intercommunication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 40E:
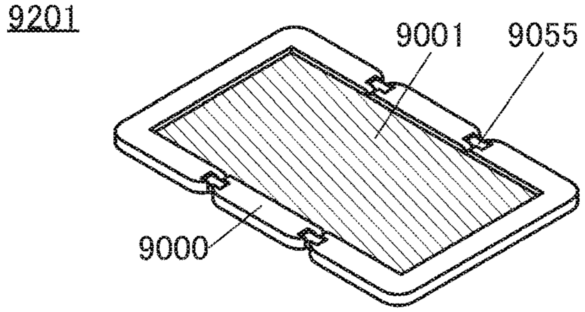
Figure 40F:
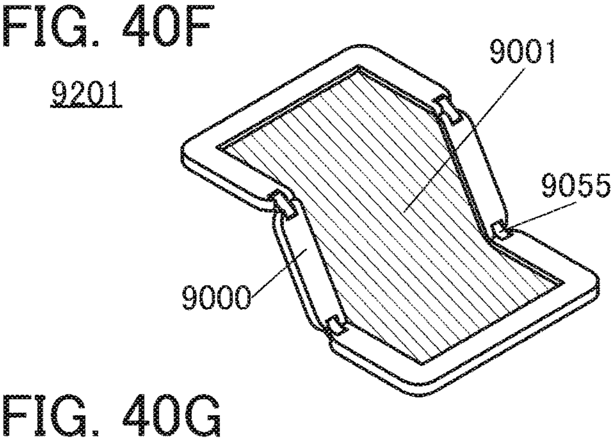
Figure 40G:
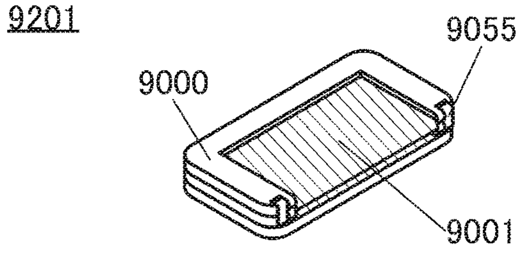

FIG. 40E to FIG. 40G are perspective views illustrating a foldable portable information terminal 9201. FIG. 40E is a perspective view of an opened state of the portable information terminal 9201, FIG. 40G is a perspective view of a folded state thereof, and FIG. 40F is a perspective view of a state in the middle of change from one of FIG. 40E and FIG. 40G to the other. The portable information terminal 9201 is highly portable in the folded state and is highly browsable in the opened state because of a seamless large display region. The display portion 9001 of the portable information terminal 9201 is supported by three housings 9000 joined together by hinges 9055. The display portion 9001 can be folded with a radius of curvature greater than or equal to 0.1 mm and less than or equal to 150 mm, for example.

This embodiment can be combined with the other embodiments as appropriate.

REFERENCE NUMERALS

100A: display device, 100B: display device, 100C: display device, 100D: display device, 100E: display device, 100F: display device, 100G: display device, 100H: display device, 100J: display device, 100: display device, 101: layer, 103: region, 110*a*: subpixel, 110B: subpixel, 110*b*: subpixel, 110*c*: subpixel, 110*d*: subpixel, 110*e*: subpixel, 110G: subpixel, 110R: subpixel, 110: pixel, 111*a*: pixel electrode, 111*b*: pixel electrode, 111*c*: pixel electrode, 111*d*: pixel electrode, 112*a*: conductive layer, 112*b*: conductive layer, 112*c*: conductive layer, 112*d*: conductive layer, 113_1: first region, 113_2: second region, 113A: film, 113: first layer, 114*a*: common layer, 114*b*: common layer, 114: common layer, 115: common electrode, 116*a*: layer, 116*b*: layer, 116*c*: layer, 116*d*: layer, 116*e*: layer, 116*f*: layer, 116*g*: layer, 117: light-blocking layer, 118*a*: mask layer, 118A: mask film, 118*b*: mask layer, 119*a*: mask layer, 119A: mask film, 120: substrate, 121*a*: plasma, 122: resin layer, 123: conductive layer, 124*a*: pixel, 124*b*: pixel, 125A: insulating film, 125: insulating layer, 126*a*: conductive layer, 126*b*: conductive layer, 126*c*: conductive layer, 126*d*: conductive layer, 127*a*: insulating film, 127*b*: insulating layer, 127: insulating layer, 128: layer, 129*a*: conductive layer, 129*b*: conductive layer, 129*c*: conductive layer, 129*d*: conductive layer, 130*a*: light-emitting device, 130B: light-emitting device, 130*b*: light-emitting device, 130*c*: light-emitting device, 130G: light-emitting device, 130R: light-emitting device, 131*a*: protective layer, 131*b*: protective layer, 131: protective layer, 132B: coloring layer, 132G: coloring layer, 132R: coloring layer, 133: lens array, 134: insulating layer, 135: mask, 136: mask layer, 140: connection portion, 142: adhesive layer, 150: light-receiving device, 151: substrate, 152: substrate, 153: insulating layer, 155: second layer, 162: display portion, 164: circuit, 165: wiring, 166: conductive layer, 172: FPC, 173: IC, 190*a*: resist mask, 201: transistor, 204: connection portion, 205: transistor, 209: transistor, 210: transistor, 211: insulating layer, 213: insulating layer, 214: insulating layer, 215: insulating layer, 218: insulating layer, 221: conductive layer, 222*a*: conductive layer, 222*b*: conductive layer, 223: conductive layer, 225: insulating layer, 231*i*: channel formation region, 231*n*: low-resistance region, 231: semiconductor layer, 240: capacitor, 241: conductive layer, 242: connection layer, 243: insulating layer, 245: conductive layer, 251: conductive layer, 252: conductive layer, 254: insulating layer, 255*a*: insulating layer, 255*b*: insulating layer, 255*c*: insulating layer, 256: plug, 261: insulating layer, 262: insulating layer, 263: insulating layer, 264: insulating layer, 265: insulating layer, 271: plug, 274*a*: conductive layer, 274*b*: conductive layer, 274: plug, 280: display module, 281: display portion, 282: circuit portion, 283*a*: pixel circuit, 283: pixel circuit portion, 284*a*: pixel, 284: pixel portion, 285: terminal portion, 286: wiring portion, 290: FPC, 291: substrate, 292: substrate, 301A: substrate, 301B: substrate, 301: substrate, 310A: transistor, 310B: transistor, 310: transistor, 311: conductive layer, 312: low-resistance region, 313: insulating layer, 314: insulating layer, 315: element isolation layer, 320A: transistor, 320B: transistor, 320: transistor, 321: semiconductor layer, 323: insulating layer, 324: conductive layer, 325: conductive layer, 326: insulating layer, 327: conductive layer, 328: insulating layer, 329: insulating layer, 331:

substrate, 332: insulating layer, 335: insulating layer, 336: insulating layer, 341: conductive layer, 342: conductive layer, 343: plug, 344: insulating layer, 345: insulating layer, 346: insulating layer, 347: bump, 348: adhesive layer, 351: substrate, 352: finger, 353: layer, 355: functional layer, 357: layer, 359: substrate, 700A: electronic device, 700B: electronic device, 721: housing, 723: wearing portion, 727: earphone portion, 750: earphone, 751: display panel, 753: optical member, 756: display region, 757: frame, 758: nose pad, 761: lower electrode, 762: upper electrode, 763*a*: EL layer, 763*b*: EL layer, 763: EL layer, 764: layer, 765: layer, 766: layer, 767: active layer, 768: layer, 771: light-emitting layer, 772: light-emitting layer, 773: light-emitting layer, 780: layer, 781: layer, 782: layer, 785: charge-generation layer, 790: layer, 791: layer, 792: layer, 800A: electronic device, 800B: electronic device, 820: display portion, 821: housing, 822: communication portion, 823: wearing portion, 824: control portion, 825: image capturing portion, 827: earphone portion, 832: lens, 6500: electronic device, 6501: housing, 6502: display portion, 6503: power button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote control, 7200: notebook personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 9000: housing, 9001: display portion, 9002: camera, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9103: tablet terminal, 9200: portable information terminal, 9201: portable information terminal

The invention claimed is:

1. A display device comprising:
a first light-emitting device;
a second light-emitting device;
a first coloring layer;
a second coloring layer;
a first insulating layer; and
a second insulating layer,
wherein the first light-emitting device comprises:
a first pixel electrode;
a first layer over the first pixel electrode; and
a common electrode over the first layer,
wherein the second light-emitting device comprises:
a second pixel electrode;
a second layer over the second pixel electrode; and
the common electrode over the second layer,
wherein the first layer and the second layer each comprise a first light-emitting material emitting blue light and a second light-emitting material emitting light having a longer wavelength than blue light,
wherein the first layer and the second layer are separated from each other,
wherein the first coloring layer overlaps with the first light-emitting device,
wherein the second coloring layer overlaps with the second light-emitting device,
wherein the second coloring layer and the first coloring layer transmit light of different colors,
wherein the first insulating layer covers a side surface and part of a top surface of the first layer and a side surface and part of a top surface of the second layer,
wherein the second insulating layer overlaps with the side surface and the part of the top surface of the first layer and the side surface and the part of the top surface of the second layer through the first insulating layer,
wherein the second insulating layer comprises a portion positioned between the side surface of the first layer and the side surface of the second layer,
wherein the common electrode covers the second insulating layer,
wherein, in a cross-sectional view, an end portion of the second insulating layer has a tapered shape with a taper angle greater than 0° and less than 90°,
wherein the first layer comprises a first region and a second region outside the first region,
wherein the first region is positioned between the first pixel electrode and the common electrode,
wherein the second region overlaps with at least one of the first insulating layer and the second insulating layer, and
wherein a width of the second region is greater than or equal to 1 nm and is less than or equal to 50% of a width of the first region.

2. The display device according to claim 1,
wherein a top surface of the second insulating layer has a convex shape.

3. The display device according to claim 1,
wherein, in the cross-sectional view, an end portion of the first insulating layer has a tapered shape with a taper angle greater than 0° and less than 90°.

4. The display device according to claim 1,
wherein the second insulating layer covers at least part of a side surface of an end portion of the first insulating layer.

5. The display device according to claim 4,
wherein the end portion of the second insulating layer is positioned more outwardly than the end portion of the first insulating layer.

6. The display device according to claim 1,
wherein the first layer and the second layer each comprise a light-emitting layer and a functional layer over the light-emitting layer, and
wherein the functional layer comprises at least one of a hole-injection layer, an electron-injection layer, a hole-transport layer, an electron-transport layer, a hole-blocking layer, and an electron-blocking layer.

7. The display device according to claim 1,
wherein the first insulating layer and the second insulating layer each comprise a portion overlapping with a top surface of the first pixel electrode and a portion overlapping with a top surface of the second pixel electrode.

8. The display device according to claim 1,
wherein the first layer covers a side surface of the first pixel electrode, and
wherein the second layer covers a side surface of the second pixel electrode.

9. The display device according to claim 1,
wherein, in the cross-sectional view, an end portion of the first pixel electrode and an end portion of the second pixel electrode each have a tapered shape with a taper angle greater than 0° and less than 90°.

10. The display device according to claim 1, wherein the first insulating layer is an inorganic insulating layer, and wherein the second insulating layer is an organic insulating layer.

11. The display device according to claim 1, wherein the first insulating layer comprises aluminum oxide.

12. The display device according to claim 1, wherein the second insulating layer comprises an acrylic resin.

13. The display device according to claim 1, wherein the first light-emitting device comprises a common layer between the first layer and the common electrode, wherein the second light-emitting device comprises the common layer between the second layer and the common electrode, and wherein the common layer is positioned between the second insulating layer and the common electrode.

14. A display device comprising:

a first light-emitting device;

a second light-emitting device;

a first coloring layer;

a second coloring layer;

a first insulating layer; and a second insulating layer, wherein the first light-emitting device comprises:

a first pixel electrode;

a first layer over the first pixel electrode;

a common layer over the first layer; and a common electrode over the common layer, wherein the second light-emitting device comprises:

a second pixel electrode;

a second layer over the second pixel electrode;

the common layer over the second layer; and the common electrode over the common layer, wherein the first layer and the second layer each comprise a first light-emitting material emitting blue light and a second light-emitting material emitting light having a longer wavelength than blue light, wherein the first layer and the second layer are separated from each other, wherein the first layer comprises a first functional layer in contact with the common layer, wherein the second layer comprises a second functional layer in contact with the common layer, wherein the first coloring layer overlaps with the first light-emitting device, wherein the second coloring layer overlaps with the second light-emitting device, wherein the second coloring layer and the first coloring layer transmit light of different colors, wherein the first insulating layer covers a side surface and part of a top surface of the first layer and a side surface and part of a top surface of the second layer, wherein the second insulating layer overlaps with the side surface and the part of the top surface of the first layer and the side surface and the part of the top surface of the second layer through the first insulating layer, wherein the second insulating layer comprises a portion positioned between the side surface of the first layer and the side surface of the second layer, wherein the common layer covers the second insulating layer, wherein the common electrode covers the second insulating layer with the common layer therebetween, wherein, in a cross-sectional view, an end portion of the second insulating layer has a tapered shape with a taper angle greater than 0° and less than 90°, and wherein the first functional layer, the second functional layer, and the common layer comprise the same material.

15. The display device according to claim 14, wherein the first functional layer and the second functional layer each comprise one or both of a first carrier-transport layer and a carrier-blocking layer.

16. The display device according to claim 15, wherein the common layer comprises a second carrier-transport layer and a carrier-injection layer over the second carrier-transport layer.

* * * * *